US012572247B2

(12) United States Patent
Lim

(10) Patent No.: US 12,572,247 B2
(45) Date of Patent: *Mar. 10, 2026

(54) ELECTRONIC DEVICE COMPRISING SUBSTRATE, CIRCUIT LAYER, AND LIGHT EMITTING ELEMENT LAYER ON THE CIRCUIT LAYER

(71) Applicant: Samsung Display Co., Ltd., Yongin-si (KR)

(72) Inventor: Sanghyun Lim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/963,095

(22) Filed: Nov. 27, 2024

(65) Prior Publication Data

US 2025/0094008 A1     Mar. 20, 2025

Related U.S. Application Data

(63) Continuation of application No. 18/821,686, filed on Aug. 30, 2024, now Pat. No. 12,236,054.

(30) Foreign Application Priority Data

Sep. 14, 2023    (KR) ........................ 10-2023-0122502

(51) Int. Cl.
*G06F 3/044*       (2006.01)
*G06F 3/041*       (2006.01)
*H10K 59/40*      (2023.01)

(52) U.S. Cl.
CPC .......... *G06F 3/0446* (2019.05); *G06F 3/0412* (2013.01); *G06F 3/0443* (2019.05);
(Continued)

(58) Field of Classification Search
CPC .. G06F 3/0446; G06F 3/0448; G06F 3/04164; G06F 3/0443; G06F 3/0412;
(Continued)

(56) References Cited

U.S. PATENT DOCUMENTS 9,817,533 B2    11/2017  Bulea et al.
11,726,625 B2    8/2023  Kim et al.
(Continued)

FOREIGN PATENT DOCUMENTS

EP         4123429 A1    1/2023
EP         4421596 A1    8/2024
(Continued)

OTHER PUBLICATIONS

EPO Extended European Search Report dated Jan. 13, 2025, issued in European Patent Application No. 24199996.0 (10 pages).

*Primary Examiner* — Deeprose Subedi
(74) *Attorney, Agent, or Firm* — Womble Bond Dickinson (US) LLP

(57)            ABSTRACT

An electronic device includes: a substrate; a circuit layer on the substrate; a light emitting element layer on the circuit layer; and a sensor layer on the light emitting element layer, and including: a first sensing electrode including first patterns, and a first bridge pattern electrically connected to the first patterns; a second sensing electrode extending in a first direction crossing the first sensing electrode; a first electrode extending in a second direction crossing the first direction; and a second electrode including second patterns, and a second bridge pattern electrically connected to the second patterns. One of the first patterns includes a first region overlapping with the first electrode; one of the second patterns includes a second region overlapping with the second sensing electrode; and a first area of the first region is less than a second area of the second region.

20 Claims, 83 Drawing Sheets

(52) U.S. Cl.
CPC .............. *G06F 2203/04107* (2013.01); *G06F 2203/04111* (2013.01); *H10K 59/40* (2023.02)

(58) Field of Classification Search
CPC ........... G06F 3/046; G06F 2203/04107; G06F 2203/04111; G06F 2203/04112; G06F 2203/04106; H10K 59/40
See application file for complete search history.

(56) References Cited

U.S. PATENT DOCUMENTS

| | | | |
|---|---|---|---|
| 2016/0041677 A1 | 2/2016 | Tahara | |
| 2021/0342053 A1* | 11/2021 | Cho .................... | G06F 3/04164 |
| 2025/0053269 A1 | 2/2025 | Kim et al. | |

FOREIGN PATENT DOCUMENTS

| | | |
|---|---|---|
| EP | 4455851 A1 | 10/2024 |
| JP | 5819565 B1 | 11/2015 |
| KR | 10-2261698 B1 | 6/2021 |
| KR | 10-2022-0169972 A | 12/2022 |
| WO | 2023/068872 A1 | 4/2023 |
| WO | 2023/121023 A1 | 6/2023 |

* cited by examiner 1000-1

WDa

OCA
POL
DP
PFa

FOD  C-FPC

CSL  MMP  CUSa

DP 200
140
130  100
120
110

DR3

DR2  DR1

PN 1000  2000  3000

1000C  200C  L  C

200

100

1000P  100C

FIG. 21A
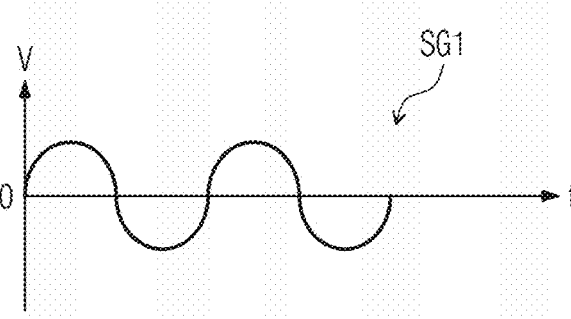
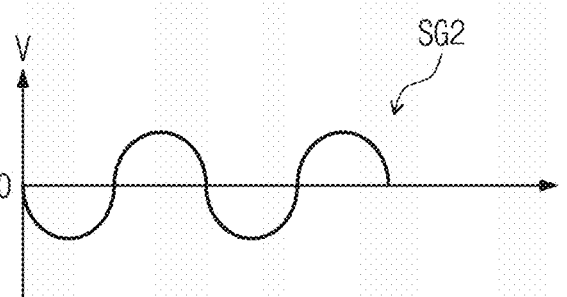
FIG. 21B
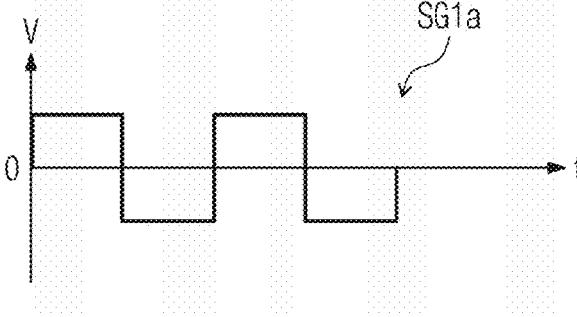
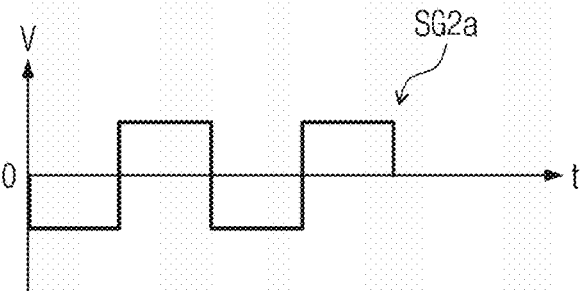

|  | 232t | 230ch1 | 230ch2 | 230ch3 | 230ch4 | 230ch5 | 230ch6 | 230ch7 | 230ch8 | 230ch9 | 230ch10 | 233t |
|---|---|---|---|---|---|---|---|---|---|---|---|---|
| t1 | SG2 | FL | FL | SG1 | SG1 | FL | FL | FL | FL | FL | FL | FL |
| t2 | SG2 | SG2 | FL | FL | SG1 | SG1 | FL | FL | FL | FL | FL | FL |
| t3 | FL | SG2 | SG2 | FL | FL | SG1 | SG1 | FL | FL | FL | FL | FL |
| t4 | FL | FL | SG2 | SG2 | FL | FL | SG1 | SG1 | FL | FL | FL | FL |
| t5 | FL | FL | FL | SG2 | SG2 | FL | FL | SG1 | SG1 | FL | FL | FL |
| t6 | FL | FL | FL | FL | SG2 | SG2 | FL | FL | SG1 | SG1 | FL | FL |
| t7 | FL | FL | FL | FL | FL | SG2 | SG2 | FL | FL | SG1 | SG1 | FL |
| t8 | FL | FL | FL | FL | FL | FL | SG2 | SG2 | FL | FL | SG1 | SG1 |
| t9 | FL | FL | FL | FL | FL | FL | FL | SG2 | SG2 | FL | FL | SG1 |

FIG. 22B

|  | 232t | 230ch1 | 230ch2 | 230ch3 | 230ch4 | 230ch5 | 230ch6 | 230ch7 | 230ch8 | 230ch9 | 230ch10 | 233t |
|---|---|---|---|---|---|---|---|---|---|---|---|---|
| t1 | SG2 | SG2 | FL | FL | SG1 | SG1 | FL | FL | FL | FL | FL | FL |
| t2 | FL | SG2 | SG2 | FL | FL | SG1 | SG1 | FL | FL | FL | FL | FL |
| t3 | FL | FL | SG2 | SG2 | FL | FL | SG1 | SG1 | FL | FL | FL | FL |
| t4 | FL | FL | FL | SG2 | SG2 | FL | FL | SG1 | SG1 | FL | FL | FL |
| t5 | FL | FL | FL | FL | SG2 | SG2 | FL | FL | SG1 | SG1 | FL | FL |
| t6 | FL | FL | FL | FL | FL | SG2 | SG2 | FL | FL | SG1 | SG1 | FL |
| t7 | FL | FL | FL | FL | FL | FL | SG2 | SG2 | FL | FL | SG1 | SG1 |

FIG. 24A

| | 232t | 230ch1 | 230ch2 | 230ch3 | 230ch4 | 230ch5 | 230ch6 | 230ch7 | 230ch8 | 230ch9 | 230ch10 | 233t |
|---|---|---|---|---|---|---|---|---|---|---|---|---|
| t1 | FL | FL | SG2 | SG2 | FL | FL | SG1 | SG1 | FL | FL | FL | FL |
| t2 | FL | FL | FL | SG2 | SG2 | FL | FL | SG1 | SG1 | FL | FL | FL |
| t3 | FL | FL | FL | FL | SG2 | SG2 | FL | FL | SG1 | SG1 | FL | FL |

|  | 232t | 230ch1 | 230ch2 | 230ch3 | 230ch4 | 230ch5 | 230ch6 | 230ch7 | 230ch8 | 230ch9 | 230ch10 | 233t |
|---|---|---|---|---|---|---|---|---|---|---|---|---|
| t1 | FL | SG2 | SG2 | FL | FL | SG1 | SG1 | FL | FL | FL | FL | FL |
| t2 | FL | FL | SG2 | SG2 | FL | FL | SG1 | SG1 | FL | FL | FL | FL |
| t3 | FL | FL | FL | SG2 | SG2 | FL | FL | SG1 | SG1 | FL | FL | FL |
| t4 | FL | FL | FL | FL | SG2 | SG2 | FL | FL | SG1 | SG1 | FL | FL |
| t5 | FL | FL | FL | FL | FL | SG2 | SG2 | FL | FL | SG1 | SG1 | FL |

PN-dt

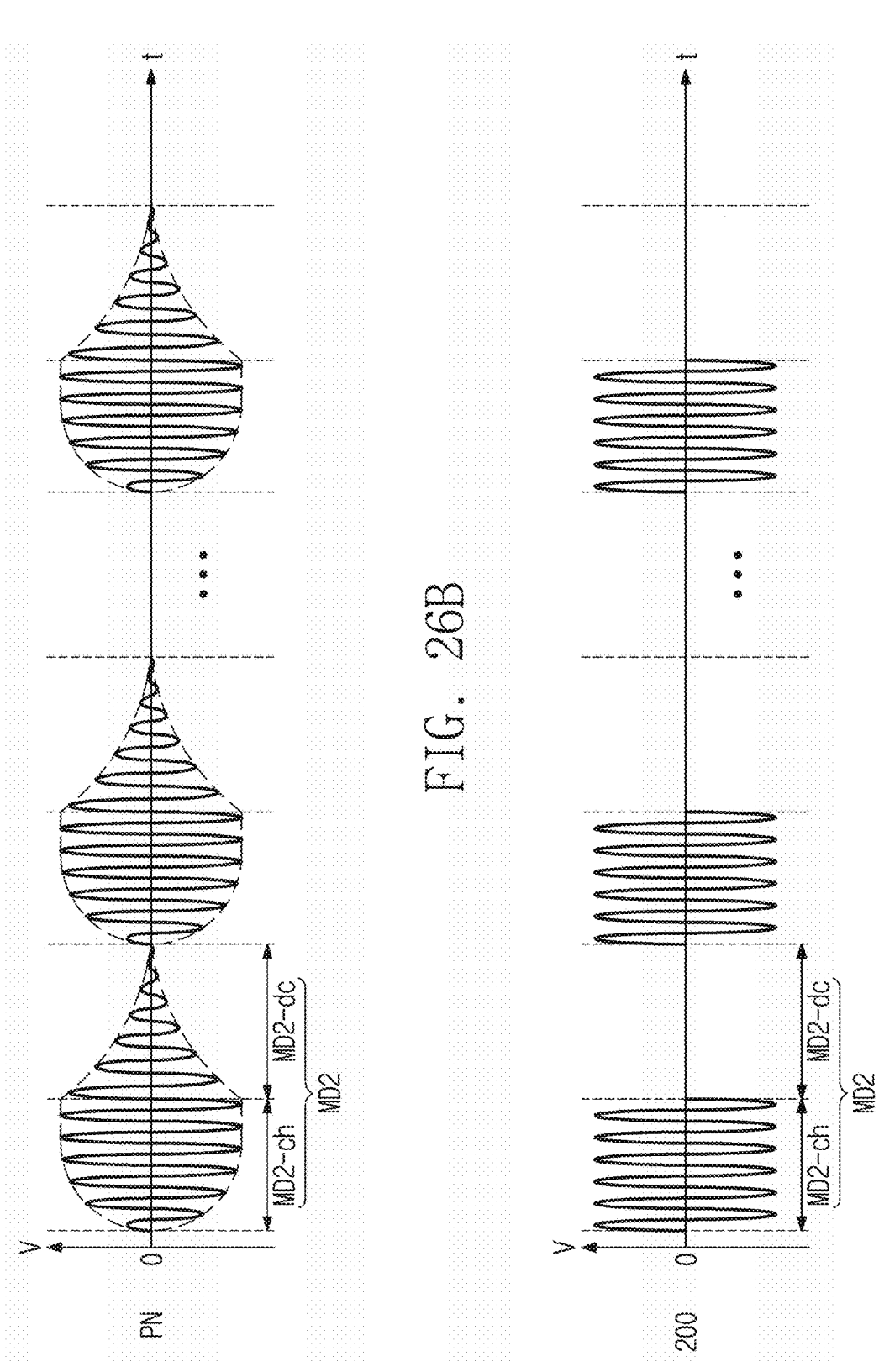

FIG. 61

ELECTRONIC DEVICE COMPRISING SUBSTRATE, CIRCUIT LAYER, AND LIGHT EMITTING ELEMENT LAYER ON THE CIRCUIT LAYER

CROSS-REFERENCE TO RELATED APPLICATIONS

The present application is a continuation of U.S. patent application Ser. No. 18/821,686, filed on Aug. 30, 2024, which claims priority to and the benefit of Korean Patent Application No. 10-2023-0122502, filed on Sep. 14, 2023, in the Korean Intellectual Property Office, the entire disclosures of all of which are incorporated by reference herein.

BACKGROUND

Aspects of embodiments of the present disclosure relate to an electronic device capable of sensing an input by a pen.

A multimedia electronic device, such as a television (TV), a mobile phone, a tablet computer, a notebook, a navigation system, or a game console, includes a display device for displaying an image. Further, in addition to a general input device, such as a button, a keyboard, or a mouse, an electronic device may include a sensor layer (e.g., an input sensor) capable of providing a touch-based input manner that allows a user to enter information or a command easily and intuitively. The sensor layer may sense a user touch or pressure. Meanwhile, there may be an increasing demand for the ability to use a pen for a fine touch input for a user who is accustomed to entering information by using writing instruments, or for a specific application (e.g. an application program for sketching or drawing).

The above information disclosed in this Background section is for enhancement of understanding of the background of the present disclosure, and therefore, it may contain information that does not constitute prior art.

SUMMARY

One or more embodiments of the present disclosure may be directed to an electronic device capable of sensing an input by a pen.

According to one or more embodiments of the present disclosure, an electronic device includes: a substrate; a circuit layer on the substrate, and including a transistor; a light emitting element layer on the circuit layer, and including a light-emitting element electrically connected to the transistor; and a sensor layer on the light emitting element layer, and including: a first sensing electrode including first patterns, and a first bridge pattern electrically connected to the first patterns; a second sensing electrode extending in a first direction crossing the first sensing electrode; a first electrode extending in a second direction crossing the first direction; and a second electrode including second patterns, and a second bridge pattern electrically connected to the second patterns. One of the first patterns includes a first region overlapping with the first electrode; one of the second patterns includes a second region overlapping with the second sensing electrode; and a first area of the first region is less than a second area of the second region.

In an embodiment, a length of the first sensing electrode may be longer than a length of the second sensing electrode, and a length of the first electrode may be longer than a length of the second electrode.

In an embodiment, the second patterns may be spaced from each other in the first direction, with the first electrode located therebetween, the first patterns may be spaced from each other in the second direction, with the second sensing electrode located therebetween, and a maximum width of the first electrode in the first direction may be less than or equal to a maximum width of the second patterns in the second direction.

In an embodiment, the first bridge pattern, the second patterns, and the first electrode may be located at a first layer, and the second bridge pattern, the first patterns, and the second sensing electrode may be located at a second layer.

In an embodiment, the second layer may be spaced farther away from the light emitting element layer than the first layer.

In an embodiment, the first electrode may include: connection portions spaced from each other in the first direction; and pattern portions spaced from each other in the second direction, with the connection portions located therebetween. The connection portions and the pattern portions may be connected to each other, and may be located at a same layer as each other.

In an embodiment, the second patterns may be spaced from each other, with the connection portions located therebetween, and the second bridge pattern may overlap with the connection portions.

In an embodiment, the sensor layer may be configured to operate in: a first mode in which a first driving signal is provided to the first sensing electrode or the second sensing electrode to sense a touch input; or a second mode in which a second driving signal is provided to the first electrode or the second electrode to sense a pen input.

According to one or more embodiments of the present disclosure, an electronic device includes: a substrate; a circuit layer on the substrate, and including a transistor; a light emitting element layer on the circuit layer, and including a light-emitting element electrically connected to the transistor; and a sensor layer on the light emitting element layer, and including: a first sensing electrode including first patterns, and a first bridge pattern electrically connected to the first patterns; a second sensing electrode crossing the first sensing electrode, and including second patterns, and a second bridge pattern electrically connected to the second patterns; a first electrode including third patterns, and a third bridge pattern electrically connected to the third patterns; and a second electrode including fourth patterns, and a fourth bridge pattern electrically connected to the fourth patterns. A first width of one of the third patterns is less than a second width of the second electrode. The first width is parallel to a first direction, and the second width is parallel to a second direction crossing the first direction.

In an embodiment, the third bridge pattern may have a third width parallel to the first direction, and the first width may be greater than the third width.

In an embodiment, the second patterns and the second bridge pattern may be connected to each other, and may be located at a same layer as each other. The third patterns and the third bridge pattern may be connected to each other, and may be located at a same layer as each other.

In an embodiment, a maximum width of the first electrode in the first direction may be less than a maximum width of the second electrode in the second direction.

In an embodiment, the fourth patterns may be spaced from each other, with the third bridge pattern located therebetween, and the fourth bridge pattern may overlap with the third bridge pattern.

In an embodiment, the first patterns may be spaced from each other, with the second bridge pattern located therebetween, and the first bridge pattern may overlap with the second bridge pattern.

In an embodiment, a length of the first sensing electrode may be longer than a length of the second sensing electrode, and a length of the first electrode may be longer than a length of the second electrode.

In an embodiment, the sensor layer may be configured to operate in: a first mode in which a first driving signal is provided to the first sensing electrode or the second sensing electrode to sense a touch input; or a second mode in which a second driving signal is provided to the first electrode or the second electrode to sense a pen input.

According to one or more embodiments of the present disclosure, an electronic device includes: a substrate; a circuit layer on the substrate, and including a transistor; a light emitting element layer on the circuit layer, and including a light-emitting element electrically connected to the transistor; and a sensor layer on the light emitting element layer, and including: a first sensing electrode; a second sensing electrode crossing the first sensing electrode; a first electrode overlapping with the first sensing electrode; and a second electrode overlapping with the second sensing electrode. The first sensing electrode includes first patterns, and a first bridge pattern electrically connected to the first patterns; the second electrode includes second patterns, and a second bridge pattern electrically connected to the second patterns; the first electrode, the second patterns, and the first bridge pattern are located at a same layer as each other; the first patterns, the second sensing electrode, and the second bridge pattern are located at a same layer as each other; and the first bridge pattern and the second bridge pattern cross each other.

In an embodiment, the second patterns may be spaced from each other, with the first electrode and the first bridge pattern located therebetween.

In an embodiment, the first electrode may have an opening defined therein, and the first bridge pattern may overlap with the opening.

In an embodiment, the first patterns may be spaced from each other, with the second sensing electrode and the second bridge pattern located therebetween.

In an embodiment, the second sensing electrode may have an opening defined therein, and the second bridge pattern may overlap with the opening.

In an embodiment, the second bridge pattern may be spaced farther away from the light emitting element layer than the first bridge pattern.

In an embodiment, the sensor layer may be configured to operate in: a first mode in which a first driving signal is provided to the first sensing electrode or the second sensing electrode to sense a touch input; or a second mode in which a second driving signal is provided to the first electrode or the second electrode to sense a pen input.

According to one or more embodiments of the present disclosure, an electronic device includes: a substrate; a circuit layer on the substrate, and including a transistor; a light emitting element layer on the circuit layer, and including a light-emitting element electrically connected to the transistor; and a sensor layer on the light emitting element layer, and including: a first sensing electrode including first patterns, and a first bridge pattern electrically connected to the first patterns; a second sensing electrode crossing the first sensing electrode; a first electrode crossing the second sensing electrode; and a second electrode including second patterns, and a second bridge pattern electrically connected to the second patterns. The sensor layer has a sensing area defined therein, the first sensing electrode, the second sensing electrode, the first electrode, and the second electrode being located at the sensing area; a width of the sensing area in a first direction is less than a width of the sensing area in a second direction crossing the first direction; the first electrode extends in the second direction, and the second electrode extends in the first direction; and a capacitance of a first capacitor defined between one of the first patterns and the first electrode overlapping with the one of the first patterns is less than a capacitance of a second capacitor defined between one of the second patterns and the second sensing electrode overlapping with the one of the second patterns.

In an embodiment, the sensor layer may be configured to operate in: a first mode in which a first driving signal is provided to the first sensing electrode or the second sensing electrode to sense a touch input; or a second mode in which a second driving signal is provided to the first electrode or the second electrode to sense a pen input.

In an embodiment, a length of the first sensing electrode may be longer than a length of the second sensing electrode, and a length of the first electrode may be longer than a length of the second electrode.

In an embodiment, the first sensing electrode may include first patterns, and a first bridge pattern electrically connected to the first patterns; the second electrode may include second patterns, and a second bridge pattern electrically connected to the second patterns; and the first bridge pattern and the second bridge pattern may cross each other.

In an embodiment, the first bridge pattern, the second patterns, and the first electrode may be located at a first layer, and the second bridge pattern, the first patterns, and the second sensing electrode may be located at a second layer.

In an embodiment, the second layer may be spaced farther away from the light emitting element layer than the first layer.

In an embodiment, the first electrode may have an opening defined therein, and the first bridge pattern may overlap with the opening.

However, the present disclosure is not limited to the aspects and features described above. Additional aspects and features will be set forth, in part, in the detailed description that follows with reference to the drawings, and in part, may be apparent therefrom, or may be learned by practicing one or more of the presented embodiments of the present disclosure.

BRIEF DESCRIPTION OF THE FIGURES

The above and other aspects and features of the present disclosure will be more clearly understood from the following detailed description of the illustrative, non-limiting embodiments with reference to the accompanying drawings.

FIG. 5B is a cross-sectional view of an electronic device according to an embodiment of the present disclosure.

FIG. 21A illustrates graphs of waveforms of a first signal and a second signal according to an embodiment of the present disclosure.

FIG. 21B illustrates graphs of waveforms of a first signal and a second signal according to an embodiment of the present disclosure.

FIG. 21C illustrates graphs of waveforms of a first signal and a second signal according to an embodiment of the present disclosure.

FIG. 22A illustrates a table of signals provided to a sensor layer according to an embodiment of the present disclosure.

FIG. 22B illustrates a table of signals provided to a sensor layer according to an embodiment of the present disclosure.

FIG. 24A illustrates a table of signals provided to a sensor layer according to an embodiment of the present disclosure.

FIG. 24B illustrates a table of signals provided to a sensor layer according to an embodiment of the present disclosure.

FIG. 26A is a diagram illustrating an operation of a pen according to an embodiment of the present disclosure.

FIG. 26B is a diagram illustrating an operation of a pen according to an embodiment of the present disclosure.

FIG. 61 is a diagram illustrating four channels according to an embodiment of the present disclosure.

DETAILED DESCRIPTION

Figure 1A:
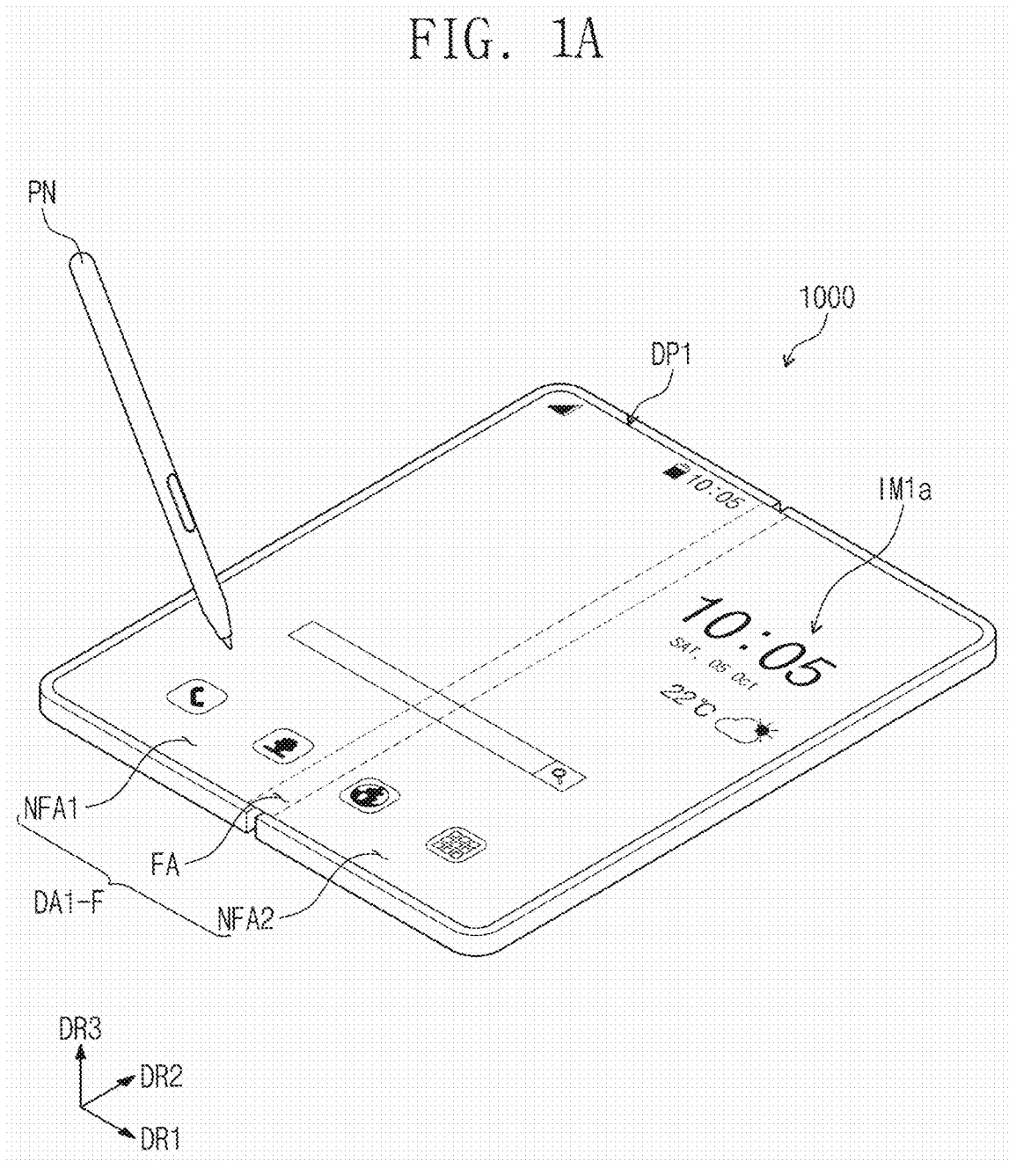
FIG. 1A is a perspective view of an electronic device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis (e.g., DR1-axis), the y-axis (e.g., DR2-axis), and the z-axis (e.g., DR3-axis) are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

As used herein, the terms "part" and "unit" may refer to a software component or a hardware component that performs a specific function. The hardware component may include, for example, a field-programmable gate array (FPGA) or an application-specific integrated circuit (ASIC). The software component may refer to executable code and/or data used by the executable code in an addressable storage medium. Thus, software components may be, for example, object-oriented software components, class components, and/or task components, and may include processes, functions, properties, procedures, subroutines, program code segments, drivers, firmware, microcode, circuits, data, database, data structures, tables, arrays, or variables.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
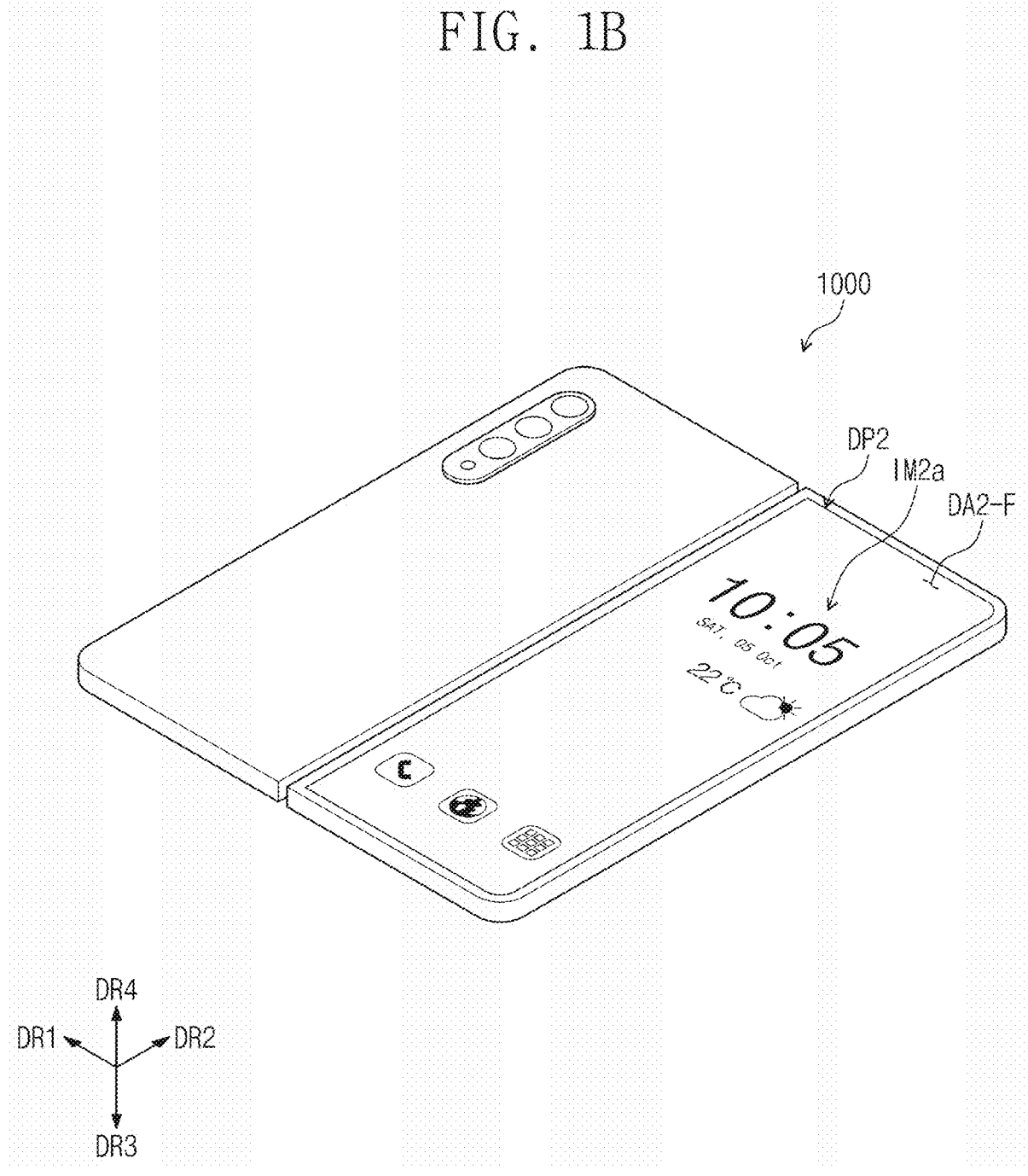
FIG. 1B is a rear perspective view of an electronic device according to an embodiment of the present disclosure.

FIG. 1A is a perspective view of an electronic device 1000 according to an embodiment of the present disclosure. FIG. 1B is a rear perspective view of the electronic device 1000 according to an embodiment of the present disclosure.

Referring to FIGS. 1A and 1B, the electronic device 1000 may refer to a device that is activated depending on an electrical signal. For example, the electronic device 1000 may display an image, and may sense inputs (e.g., external inputs) applied from the outside. The external input may be an input of a user. The input of the user may include various suitable kinds of external inputs, such as a part of a user's body (e.g., the user's finger), a pen PN, light, heat, and/or pressure.

The electronic device 1000 may include a first display panel DP1 and a second display panel DP2. The first display panel DP1 and the second display panel DP2 may be independent panels that are separated from each other. The first display panel DP1 may be referred to as a "main display panel", and the second display panel DP2 may be referred to as an "auxiliary display panel" or an "external display panel".

The first display panel DP1 may include a first display part DA1-F, and the second display panel DP2 may include a second display part DA2-F. The size (e.g., the area) of the second display panel DP2 may be smaller than the size of the first display panel DP1. The size of the first display part DA1-F, which corresponds to the size of the first display panel DP1, may be greater than the size of the second display part DA2-F, which corresponds to the size of the second display panel DP2.

The first display part DA1-F may have a plane that is parallel to or substantially parallel to a first direction DR1 and a second direction DR2, when the electronic device 1000 is unfolded. A thickness direction of the electronic device 1000 may be parallel to or substantially parallel to a third direction DR3 crossing or intersecting the first direction DR1 and the second direction DR2. Accordingly, front surfaces (e.g., top/upper surfaces) and rear surfaces (e.g., bottom/lower surfaces) of various members constituting the electronic device 1000 may be defined with respect to the third direction DR3.

The first display panel DP1 or the first display part DA1-F may include a folding area FA to be folded and unfolded, and a plurality of non-folding areas NFA1 and NFA2 that are spaced from each other with the folding area FA interposed therebetween. The second display panel DP2 may overlap with one of the plurality of non-folding areas NFA1 and NFA2. For example, the second display panel DP2 may overlap with the first non-folding area NFA1.

A display direction of a first image IM1*a* that is displayed in a portion of the first display panel DP1, for example, such as in the first non-folding area NFA1, may face away from a display direction of a second image IM2*a* that is displayed in the second display panel DP2. For example, the first image IM1*a* may be displayed in the third direction DR3, and the second image IM2*a* may be displayed in a fourth direction DR4 facing away from (e.g., opposite to) the third direction DR3.

In an embodiment of the present disclosure, the folding area FA may be bent around a folding axis extending in a direction parallel to or substantially parallel to a long side (e.g., a long edge) of the electronic device 1000, for example, such as in a direction parallel to or substantially parallel to the second direction DR2. The folding area FA may have a desired curvature (e.g., a given or predetermined curvature) and a desired radius of curvature (e.g., a give or predetermined radius of curvature), when the electronic device 1000 is folded. The first non-folding area NFA1 and the second non-folding area NFA2 may face each other when the electronic device 1000 is folded. In this case, the electronic device 1000 may be inner-folded, such that the first display part DA1-F is not exposed to the outside.

In an embodiment of the present disclosure, the electronic device 1000 may be outer-folded, such that the first display part DA1-F is exposed to the outside. In an embodiment of the present disclosure, the electronic device 1000 may support both the inner-folding operation and the outer-folding operation in the unfolded state, but the present disclosure is not limited thereto.

An example in which one folding area FA is defined in the electronic device 1000 is illustrated in FIG. 1A, but the present disclosure is not limited thereto. For example, a plurality of folding axes and a plurality of folding areas corresponding to the plurality of folding axes may be defined in the electronic device 1000, and the electronic device 1000 may be inner-folded and/or outer-folded in the unfolded state for each of the plurality of folding areas.

According to an embodiment of the present disclosure, at least one of the first display panel DP1 and/or the second display panel DP2 may sense an input by the pen PN, even though a digitizer is not included therein. In other words, at least one of the first display panel DP1 and/or the second display panel DP2 may sense the input by the pen PN without using a digitizer. Accordingly, because the digitizer for sensing the pen PN may not be included (e.g., may be omitted), an increase in the thickness of the electronic device 1000 due to the digitizer, an increase in the weight of the electronic device 1000 due to the digitizer, and a decrease in a flexibility of the electronic device 1000 due to the digitizer may be prevented or substantially prevented. Accordingly, in some embodiments, both the first display panel DP1 and the second display panel DP2 may be designed to sense the pen PN.

Figure 2:
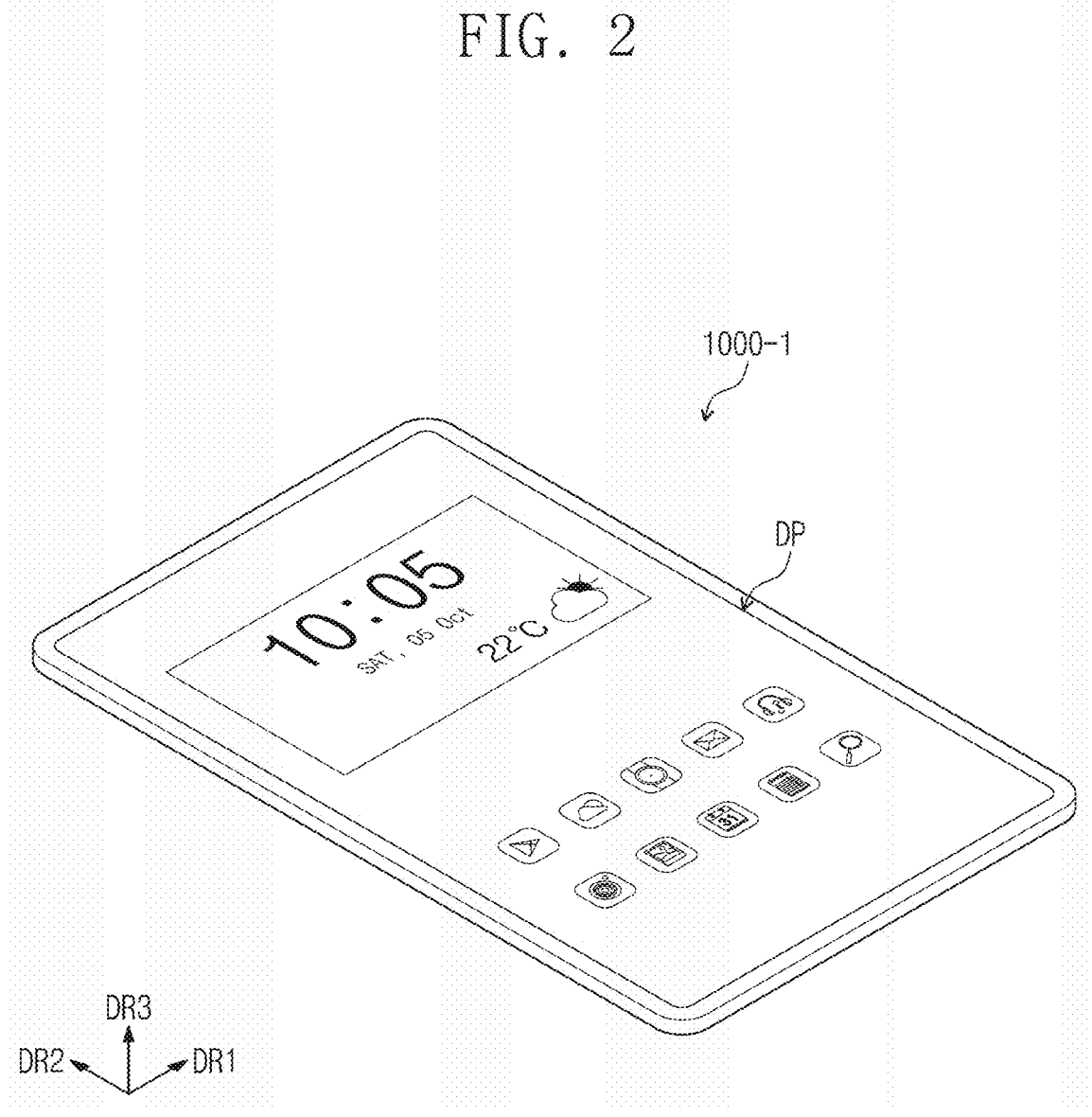
FIG. 2 is a perspective view of an electronic device according to an embodiment of the present disclosure.
Figure 3:
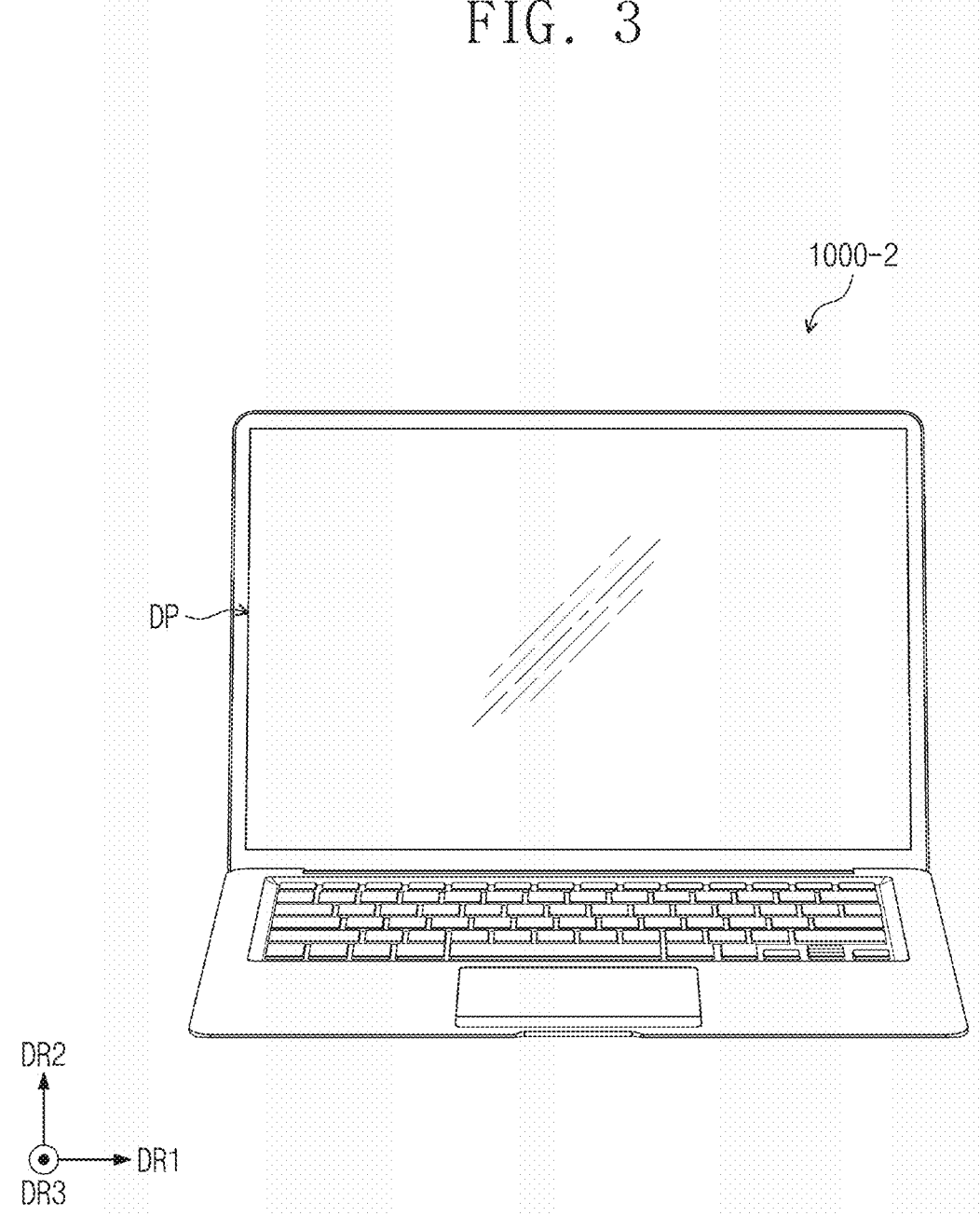
FIG. 3 is a perspective view of an electronic device according to an embodiment of the present disclosure.

FIG. 2 is a perspective view of an electronic device 1000-1 according to an embodiment of the present disclosure. FIG. 3 is a perspective view of an electronic device 1000-2 according to an embodiment of the present disclosure.

For convenience, an example in which the electronic device 1000-1 is a mobile phone is illustrated in FIG. 2, and the electronic device 1000-1 may include a display panel DP. For convenience, an example in which the electronic device 1000-2 is a notebook is illustrated in FIG. 3, and the electronic device 1000-2 may include a display panel DP. Although FIG. 3 is the perspective view of an electronic device 1000-2, the coordinate axes included in FIG. 3 are displayed based on the display panel DP within the electronic device 1000-2.

In an embodiment of the present disclosure, the display panel DP may sense various inputs applied from the outside (e.g., external inputs). The external input may be an input of a user. The input of the user may include various suitable kinds of external inputs, such as a part of a user's body (e.g., the user's finger), the pen PN (e.g., refer to FIG. 1A), light, heat, and/or pressure.

According to an embodiment of the present disclosure, even though the display panel DP may not include the digitizer, the display panel DP may sense an input by the pen PN. Accordingly, because the digitizer for sensing the pen PN may not be included (e.g., may be omitted), an increase in the thickness of the electronic device 1000-1 or 1000-2 due to the digitizer may be prevented, and an increase in the weight of the electronic device 1000-1 or 1000-2 due to the digitizer may be prevented.

An example in which the electronic device 1000 is of a foldable kind of device is illustrated in FIG. 1A, and an example in which the electronic device 1000-1 is of a bar kind of device is illustrated in FIG. 2. However, the present disclosure is not limited thereto. For example, the embodiments of the electronic device described in more detail hereinafter may be applied to various suitable kinds of electronic devices, such as a rollable electronic device, a slidable electronic device, and a stretchable electronic device.

Figure 4:
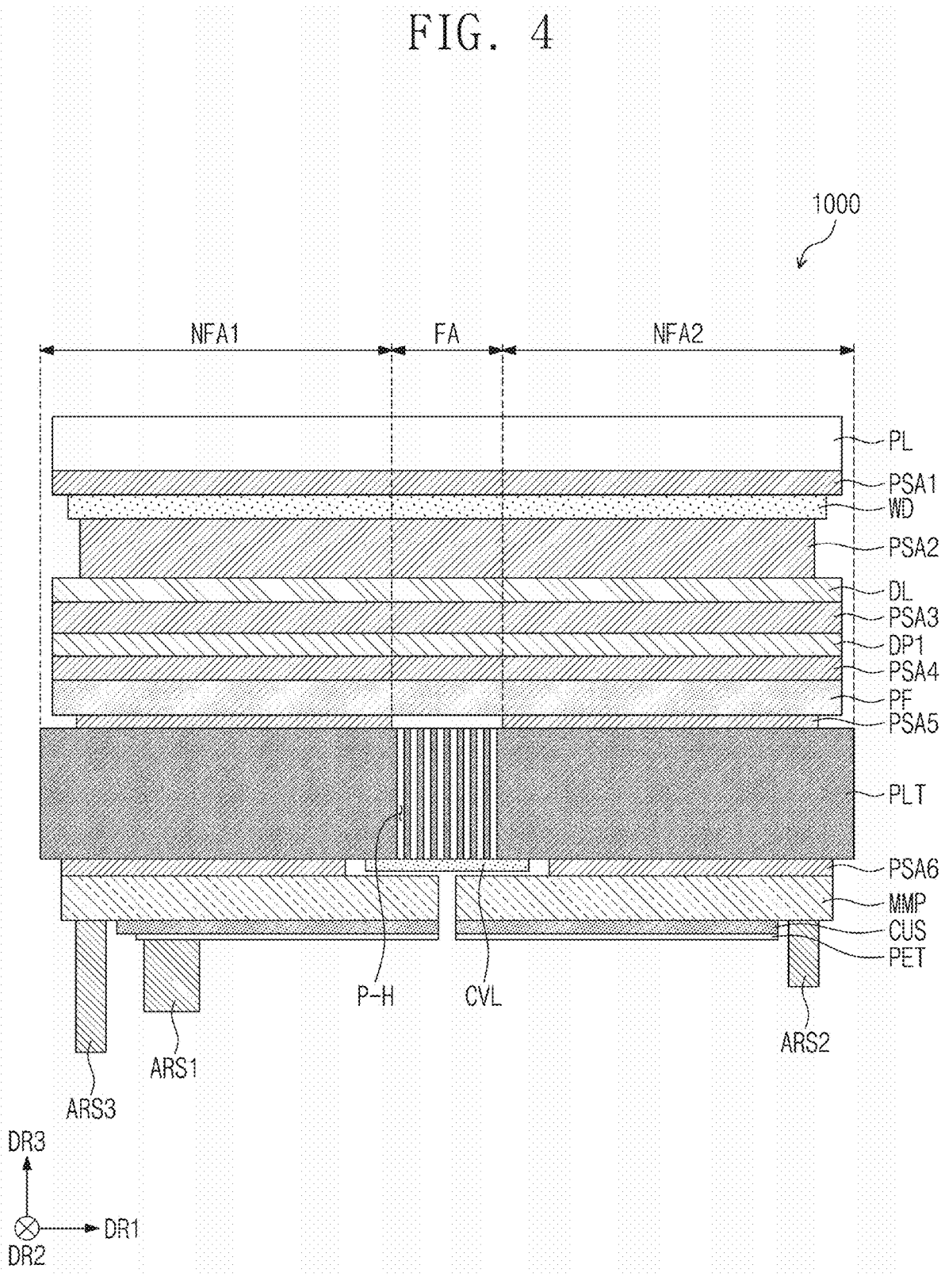
FIG. 4 is a cross-sectional view of an electronic device according to an embodiment of the present disclosure.

FIG. 4 is a cross-sectional view of the electronic device 1000 according to an embodiment of the present disclosure. The cross-sectional view illustrated in FIG. 4 may be a cross-sectional view illustrating a portion of the electronic device 1000 illustrated in FIG. 1A including the first display panel DP1.

Referring to FIG. 4, the electronic device 1000 may include the first display panel DP1, upper functional layers, and lower functional layers. The upper functional layers may include various components disposed on the upper surface of the first display panel DP1, and the lower functional layers may include various components disposed on the lower surface of the first display panel DP1.

The first display panel DP1 may be a component that generates an image, and senses an input applied from the outside (e.g., an external input). For example, the first display panel DP1 may include a display layer 100 (e.g., refer to FIG. 6), and a sensor layer 200 (e.g., refer to FIG. 6).

The upper functional layers may include a protection layer PL, a window WD, an impact absorption layer DL, and first to third adhesive layers PSA1, PSA2, and PSA3. However, the components that are included in the upper functional layers are not limited thereto. At least some of the above-described components may be omitted as needed or desired, and any other suitable components may be further included in the upper functional layers.

The protection layer PL may protect the components disposed under the protection layer PL. The thickness of the protection layer PL may be 60 micrometers to 70 micrometers, for example, such as 65 micrometers, but the thickness of the protection layer PL is not limited thereto.

The protection layer PL may further include a hard coating layer, an anti-fingerprint layer, and/or the like to improve chemical-resistant and abrasion-resistant characteristics. For example, the hard coating layer that is a functional layer for improving usage characteristics of the electronic device 1000 may be coated on the protection layer PL. For example, an anti-fingerprint characteristic, an anti-contamination characteristic, an anti-scratch characteristic, and/or the like may be improved by the hard coating layer. For example, the thickness of the hard coating layer may be 5 micrometers, but the present disclosure is not limited thereto.

The window WD may be disposed under the protection layer PL. The first adhesive layer PSA1 may be interposed between the window WD and the protection layer PL. The thickness of the first adhesive layer PSA1 may be 30 micrometers to 40 micrometers, for example, such as 35 micrometers, but the thickness of the first adhesive layer PSA1 is not limited thereto. In an embodiment of the present disclosure, a bezel pattern may be interposed between the first adhesive layer PSA1 and the protection layer PL.

The window WD may include an optically transparent insulating material. For example, the window WD may include a glass substrate or a synthetic resin film. The window WD may be of a multi-layered structure or a single-layer structure. For example, the window WD may include a plurality of synthetic resin films that are bonded to one another by an adhesive, or may include a glass substrate and a synthetic resin film that are bonded to each other by an adhesive. When the window WD includes (e.g., is) a glass substrate, the thickness of the window WD may be 80 micrometers or less, for example, such as 30 micrometers, but the thickness of the window WD is not limited thereto.

The impact absorption layer DL may be disposed under the window WD. The second adhesive layer PSA2 may be interposed between the window WD and the impact absorption layer DL. The thickness of the second adhesive layer PSA2 may be 70 micrometers to 80 micrometers, for example, such as 75 micrometers, but the thickness of the second adhesive layer PSA2 is not limited thereto.

The impact absorption layer DL may absorb an impact applied toward the first display panel DP1, and may protect the first display panel DP1. The impact absorption layer DL may be manufactured in the form of a stretchable film. For example, the impact absorption layer DL may include a flexible plastic material. The flexible plastic material may be defined as a synthetic resin film. For example, the impact absorption layer DL may include a flexible plastic material, such as polyimide or polyethylene terephthalate. The thickness of the impact absorption layer DL may be 18 micrometers to 28 micrometers, for example, such as 23 micrometers, but the thickness of the impact absorption layer DL is not limited thereto. In an embodiment of the present disclosure, the impact absorption layer DL may be omitted as needed or desired.

The third adhesive layer PSA3 may be interposed between the impact absorption layer DL and the first display panel DP1. The thickness of the third adhesive layer PSA3 may be 45 micrometers to 55 micrometers, for example, such as 50 micrometers, but the thickness of the third adhesive layer PSA3 is not limited thereto.

The lower functional layers may include a protection film PF, a plate PLT, a cover layer CVL, a shielding layer MMP, a lower sheet CUS, an insulating film PET, step compensation members ARS1, ARS2, and ARS3, and fourth to sixth adhesive layers PSA4, PSA5, and PSA6. However, the components that are included in the lower functional layer are not limited thereto. At least some of the above-described components may be omitted as needed or desired, and any other suitable components may be further included in the lower functional layers.

The protection film PF may be connected to (e.g., attached to or coupled to) the rear surface of the first display panel DP1 through the fourth adhesive layer PSA4. The thickness of the fourth adhesive layer PSA4 may be 20 micrometers to 30 micrometers, for example, such as 25 micrometers, but the thickness of the fourth adhesive layer PSA4 is not limited thereto.

The protection film PF may prevent or substantially prevent the rear surface of the first display panel DP1 from being scratched in a process of manufacturing the first display panel DP1. The protection film PF may be a colored polyimide film. For example, the protection film PF may be an opaque yellow film, but the present disclosure is not limited thereto. The thickness of the protection film PF may be 45 micrometers to 55 micrometers, for example, such as 50 micrometers, but the thickness of the protection film PF is not limited thereto.

The plate PLT may be disposed under the protection film PF. The fifth adhesive layer PSA5 may be interposed between the plate PLT and the protection film PF. The thickness of the fifth adhesive layer PSA5 may be 11 micrometers to 21 micrometers, for example, such as 16 micrometers, but the thickness of the fifth adhesive layer PSA5 is not limited thereto.

The plate PLT may include carbon fiber reinforced plastic (CFRP), a metal, or a metal alloy. The plate PLT may support the components disposed thereon. Openings P-H may be defined (e.g., formed or provided) in a portion of the plate PLT. For example, the plate PLT may include the openings P-H having shapes penetrating the upper surface and the lower surface of the plate PLT. The openings P-H may be defined in an area overlapping with the folding area FA. In a plan view, or in other words, for example, when viewed in the third direction DR3 or the thickness direction of the plate PLT, the openings P-H may overlap with the folding area FA. The shape of the portion of the plate PLT may be more easily changed (e.g., more easily folded and unfolded) by the openings P-H. The thickness of the plate PLT may be 160 micrometers to 180 micrometers, for example, such as 170 micrometers, but the thickness of the plate PLT is not limited thereto.

The cover layer CVL may be attached to the plate PLT. The cover layer CVL may cover the openings P-H of the plate PLT. Accordingly, the cover layer CVL may prevent or substantially prevent foreign materials from being introduced into the openings P-H. The cover layer CVL may include thermoplastic polyurethane, but the present disclosure is not limited thereto. The thickness of the cover layer CVL may be 11 micrometers to 21 micrometers, for example, such as 16 micrometers, but the thickness of the cover layer CVL is not limited thereto.

The shielding layer MMP may be disposed under the plate PLT and the cover layer CVL. The sixth adhesive layer PSA6 may be interposed between the shielding layer MMP and the plate PLT. The thickness of the sixth adhesive layer PSA6 may be 15 micrometers to 25 micrometers, for example, such as 20 micrometers, but the thickness of the sixth adhesive layer PSA6 is not limited thereto.

The shielding layer MMP may include a magnetic metal powder. The shielding layer MMP may be referred to as a "ferrite sheet", a "magnetic metal powder layer", a "magnetic layer", a "magnetic circuit layer", or a "magnetic path layer". The shielding layer MMP may shield a magnetic field passing through the first display panel DP1. For example, the shielding layer MMP may play a role in inducing a direction of the passing magnetic field to any other suitable direction. Accordingly, the magnetic field reaching the shielding layer MMP may be shielded without being leaked out to the outside, for example, such as downwards to the shielding layer MMP. The thickness of the shielding layer MMP may be 53 micrometers to 63 micrometers, for example, such as 58 micrometers, but the thickness of the shielding layer MMP is not limited thereto.

The lower sheet CUS may be disposed under the shielding layer MMP. The lower sheet CUS may be a sheet playing a role in reflecting the magnetic field toward the shielding layer MMP. The lower sheet CUS may include metal or a metal alloy; for example, the lower sheet CUS may include aluminum, copper, or a copper alloy. The thickness of the lower sheet CUS may be 15 micrometers to 25 micrometers, for example, such as 20 micrometers, but the thickness of the lower sheet CUS is not limited thereto.

The insulating film PET may be disposed under the lower sheet CUS. The insulating film PET may include polyethylene terephthalate, but the present disclosure is not limited thereto. The insulating film PET may prevent or substantially prevent static electricity from being introduced. For example, the insulating film PET may prevent an electrical interference between members disposed above the insulating film PET and members disposed under the insulating film PET. The thickness of the insulating film PET may be 3 micrometers to 9 micrometers, for example, such as 6 micrometers, but the thickness of the insulating film PET is not limited thereto.

The step compensation members ARS1, ARS2, and ARS3 may include the first step compensation member ARS1 attached to the insulating film PET, the second step compensation member ARS2 attached to the shielding layer MMP, and the third step compensation member ARS3 attached to the shielding layer MMP. The thickness of each of the first to third step compensation members ARS1, ARS2, and ARS3 may be variously determined depending on a product structure or a placement relationship of the components. For example, the thickness of the first step compensation member ARS1 may be 90 micrometers, the thickness of the second step compensation member ARS2 may be 87 micrometers, and the thickness of the third step compensation member ARS3 may be 87 micrometers, but the thickness of each of the first to third step compensation members ARS1, ARS2, and ARS3 is not limited thereto.

In an embodiment of the present disclosure, each of the sixth adhesive layer PSA6, the shielding layer MMP, the lower sheet CUS, and the insulating film PET may be divided in an area overlapping with the folding area FA. For example, each of the sixth adhesive layer PSA6, the shielding layer MMP, the lower sheet CUS, and the insulating film PET may be divided into two or more components that are spaced from each other with a gap (e.g., a given or predetermined gap) in the area overlapping with the folding area FA. The gap may be 0.6 mm to 1.7 mm, but the present disclosure is not limited thereto.

Figure 5A:
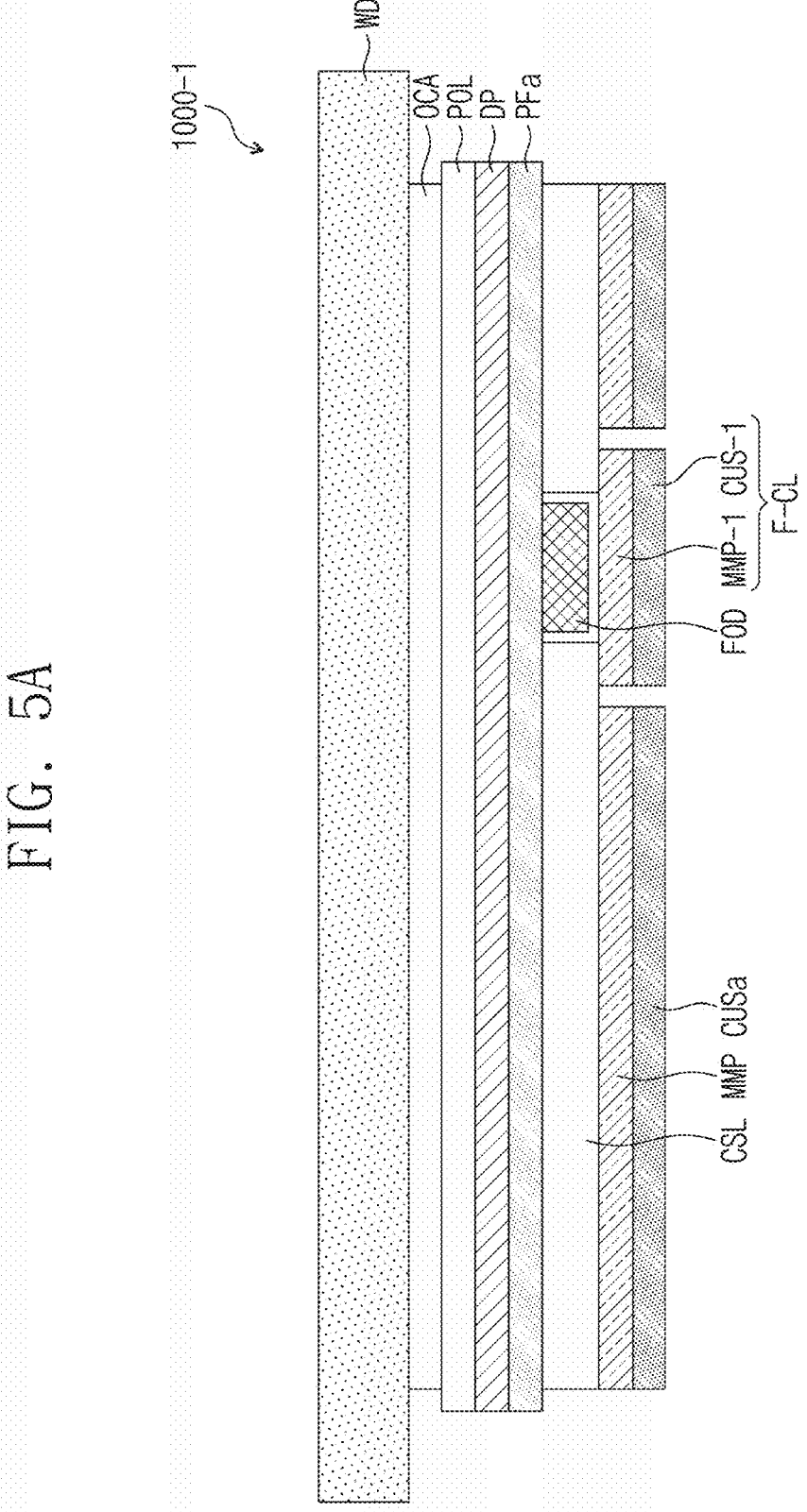
FIG. 5A is a cross-sectional view of an electronic device according to an embodiment of the present disclosure.

FIG. 5A is a cross-sectional view of the electronic device 1000-1 according to an embodiment of the present disclosure.

Referring to FIG. 5A, the electronic device 1000-1 may include the display panel DP, upper functional layers, and lower functional layers. The upper functional layers may include a window WDa, an adhesive layer OCA, and an anti-reflection layer POL. The lower functional layers may include a protection film PFa, a first lower layer CSL, the shielding layer MMP, a second lower layer CUSa, a fingerprint sensor FOD, and a cover layer F-CL. The components included in the upper functional layers and the components included in the lower functional layers are not limited to the above-described components. At least some of the above-described components may be omitted as needed or desired, and/or any other suitable components may be further included in the upper functional layers and/or the lower functional layers.

The window WDa may include an optically transparent insulating material. For example, the window WDa may include a glass substrate or a synthetic resin film, and may have a multi-layered structure or a single-layer structure. For example, the window WDa may be a glass substrate. In this case, the thickness of the window WDa may be 0.43 mm to 0.53 mm, for example, such as 0.48 mm, but the thickness of the window WDa is not limited thereto.

The anti-reflection layer POL may be disposed under the window WDa. The adhesive layer OCA may be interposed between the anti-reflection layer POL and the window WDa. The thickness of the adhesive layer OCA may be 0.10 mm to 0.20 mm, for example, such as 0.15 mm, but the thickness of the adhesive layer OCA is not limited thereto.

The anti-reflection layer POL may reduce a reflectance of external light incident from the outside of the electronic device 1000-1. The anti-reflection layer POL may include a stretch-type synthetic resin film. For example, the anti-reflection layer POL may be implemented by dyeing an iodine compound on a polyvinyl alcohol (PVA) film. However, the present disclosure is not limited thereto. For example, the material of the anti-reflection layer POL is not limited to the above-described example. The thickness of the anti-reflection layer POL may be 50 micrometers to 60 micrometers, for example, such as 55 micrometers, but the thickness of the anti-reflection layer POL is not limited thereto.

In an embodiment of the present disclosure, the anti-reflection layer POL may be omitted. In another embodiment, the anti-reflection layer POL may be embedded in the display panel DP. In this case, the anti-reflection layer POL may include a partition layer for blocking light and a plurality of color filters, or may include an optical layer for preventing or substantially preventing reflection and a partition layer for blocking light.

The protection film PFa may be connected to (e.g., attached to or coupled to) the rear surface of the display panel DP. The thickness of the protection film PFa may be 83 micrometers to 93 micrometers, for example, such as 88 micrometers, but the thickness of the protection film PFa is not limited thereto.

The first lower layer CSL may be disposed under the protection film PFa. The first lower layer CSL may have a multi-layered structure. For example, the first lower layer CSL may include an embo sheet and a cushion layer. The embo sheet may absorb the light passing through the display panel DP. Also, to prevent or substantially prevent bubbles from being generated when the first lower layer CSL is attached to the protection film PFa, the embo sheet may include an embo pattern. The cushion layer may protect the display panel DP from an impact transferred from under the cushion layer. The impact-resistant characteristic of the electronic device 1000-1 may be improved by the cushion layer.

An opening may be defined in the first lower layer CSL, and the fingerprint sensor FOD may be disposed in the opening. The fingerprint sensor FOD may be attached to the protection film PFa. In an embodiment of the present disclosure, the fingerprint sensor FOD and the opening may be omitted.

The shielding layer MMP may be disposed under the first lower layer CSL. The shielding layer MMP may shield a magnetic field passing through the display panel DP. Accordingly, the magnetic field reaching the shielding layer MMP may be shielded without being leaked out to the outside, for example, such as downwards from the shielding layer MMP. The thickness of the shielding layer MMP may be 20 micrometers to 30 micrometers, for example, such as 25 micrometers, but the thickness of the shielding layer MMP is not limited thereto.

The second lower layer CUSa may be disposed under the shielding layer MMP. The second lower layer CUSa may include a metal or a metal alloy. For example, the second lower layer CUSa may include aluminum, copper, or a copper alloy. The thickness of the second lower layer CUSa may be 7 micrometers to 17 micrometers, for example, such as 12 micrometers, but the thickness of the second lower layer CUSa is not limited thereto.

An opening corresponding to an area where the fingerprint sensor FOD is disposed may be defined in the shielding layer MMP and the second lower layer CUSa. The cover layer F-CL may be disposed in the opening defined in the shielding layer MMP and the second lower layer CUSa, and may cover the opening defined in the first lower layer CSL. In other words, the cover layer F-CL may be attached to the first lower layer CSL to cover the fingerprint sensor FOD. In an embodiment, the cover layer F-CL may include a first cover layer MMP-1 including the same material as that of the shielding layer MMP, and a second cover layer CUS-1 including the same material as that of the second lower layer CUSa.

Figure 5B:
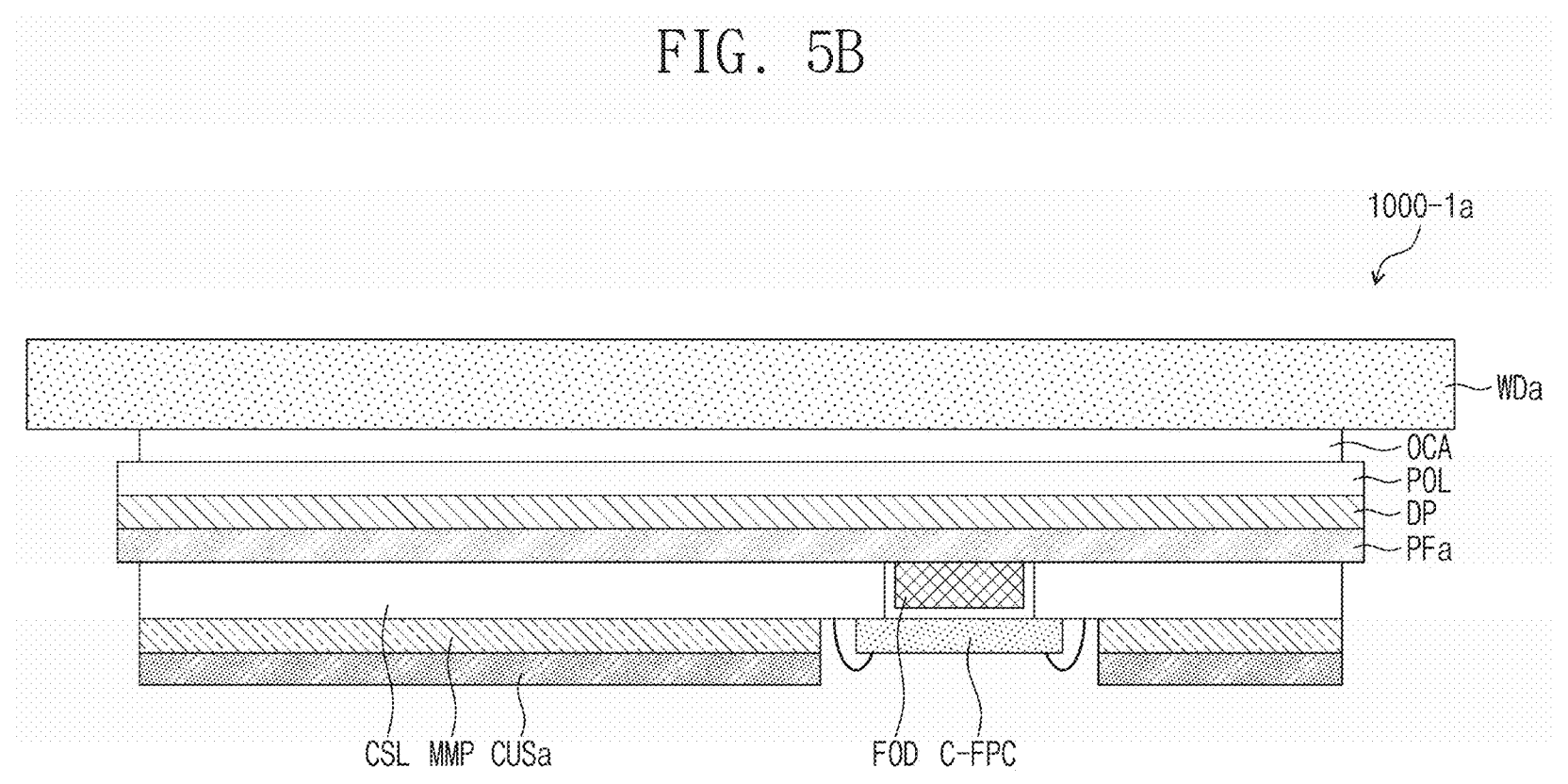

FIG. 5B is a cross-sectional view of an electronic device 1000-1a according to an embodiment of the present disclosure. In FIG. 5B, the components that are the same or substantially the same as those described above with reference to FIG. 5A are denoted by the same reference numerals/ signs, and thus, redundant description may not be repeated.

Referring to FIG. 5B, the electronic device 1000-1a may not include the cover layer F-CL (e.g., refer to FIG. 5A). The fingerprint sensor FOD may be covered by a sensing circuit board C-FPC for controlling the operation of the fingerprint sensor FOD.

An opening corresponding to an area where the fingerprint sensor FOD is disposed may be defined in the shielding layer MMP and the second lower layer CUSa. The sensing circuit board C-FPC may be disposed in the opening defined in the shielding layer MMP and the second lower layer CUSa, and may cover the opening defined in the first lower layer CSL. For example, the sensing circuit board C-FPC may overlap with the fingerprint sensor FOD, and may be connected to (e.g., attached to or coupled to) the first lower layer CSL.

Figures 6, 7:
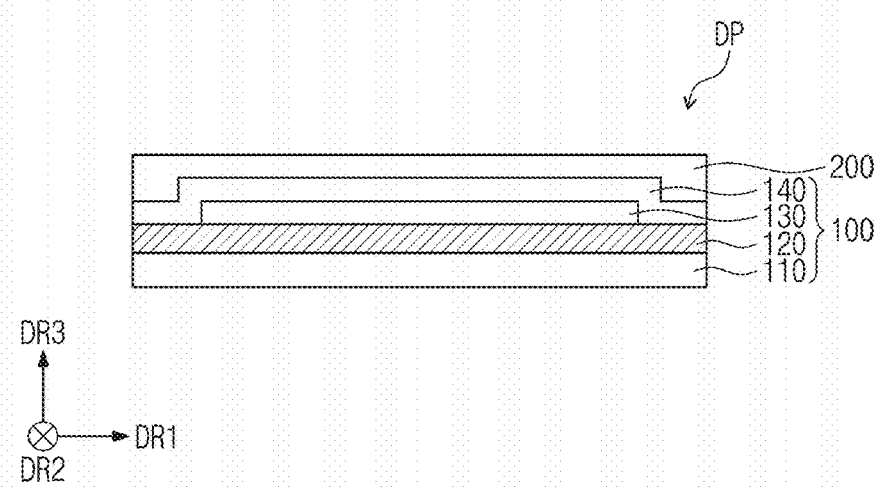
FIG. 6 is a cross-sectional view of a display panel according to an embodiment of the present disclosure.
FIG. 7 is a diagram illustrating an operation of an electronic device according to an embodiment of the present disclosure.

FIG. 6 is a cross-sectional view of the display panel DP according to an embodiment of the present disclosure.

Referring to FIG. 6, the display panel DP may include the display layer 100 and the sensor layer 200.

The display layer 100 may be a component that generates or substantially generates an image. The display layer 100 may be a light emitting display layer. For example, the display layer 100 may be an organic light emitting display layer, an inorganic light emitting display layer, an organic-inorganic light emitting display layer, a quantum dot display layer, a micro-LED display layer, or a nano-LED display layer. The display layer 100 may include a base layer 110, a circuit layer 120, a light emitting element layer 130, and an encapsulation layer 140.

The base layer 110 may be a member that provides a base surface on which the circuit layer 120 is disposed. The base layer 110 may be of a multi-layered structure or a single-layer structure. The base layer 110 may be implemented with a glass substrate, a metal substrate, a silicon substrate, or a polymer substrate, but the present disclosure is not limited thereto.

The circuit layer 120 may be disposed on the base layer 110. The circuit layer 120 may include an insulating layer, a semiconductor pattern, a conductive pattern, a signal line, and the like. An insulating layer, a semiconductor layer, and a conductive layer may be formed on the base layer 110 by a coating or deposition process, and the insulating layer, the semiconductor layer, and the conductive layer may then be selectively patterned through a plurality of photolithography processes.

The light emitting element layer 130 may be disposed on the circuit layer 120. The light emitting element layer 130 may include a light emitting element. For example, the light emitting element layer 130 may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from foreign substances, such as moisture, oxygen, and/or dust particles.

The sensor layer 200 may be disposed on the display layer 100. The sensor layer 200 may sense an external input applied from the outside. The sensor layer 200 may be a sensor that is integrally formed to be continuous in the process of manufacturing the display layer 100, or the sensor layer 200 may be an external sensor attached to the display layer 100. The sensor layer 200 may be referred to as a "sensor", an "input sensing layer", an "input sensing panel", or an "electronic device dedicated to sense input coordinates".

According to an embodiment of the present disclosure, the sensor layer 200 may sense both an input provided by a passive type input means, such as a user's body, and an input provided by an input device generating a magnetic field of a suitable resonant frequency (e.g., a given or predetermined resonant frequency). The input device may be referred to as a "pen", an "input pen", a "magnetic pen", a "stylus pen", or "an electromagnetic resonance pen".

FIG. 7 is a diagram illustrating an operation of the electronic device 1000 according to an embodiment of the present disclosure.

Referring to FIG. 7, the electronic device 1000 may include the display layer 100, the sensor layer 200, a display driver 100C (e.g., a first driver circuit), a sensor driver 200C (e.g., a second driver circuit), a main driver 1000C (e.g., a third driver circuit), and a power supply circuit 1000P.

The sensor layer 200 may sense a first input 2000 or a second input 3000 applied from the outside. Each of the first input 2000 and the second input 3000 may be an input means capable of providing a change in the capacitance of the sensor layer 200, or may be an input means capable of causing an induced current in the sensor layer 200. For example, the first input 2000 may be a passive-type input means, such as a user's body. The second input 3000 may be an input by the pen PN or an input by an RFIC tag. For example, the pen PN may be a passive-type pen or an active-type pen.

In an embodiment of the present disclosure, the pen PN may be a device that generates a magnetic field of a suitable resonant frequency (e.g., a given or predetermined resonant frequency). The pen PN may transmit an output signal that is based on an electromagnetic resonance manner. The pen PN may be referred to as an "input device", an "input pen", a "magnetic pen", a "stylus pen", or an "electromagnetic resonance pen".

The pen PN may include an RLC resonant circuit, and the RLC resonant circuit may include an inductor "L" and a capacitor "C". In an embodiment of the present disclosure, the RLC resonant circuit may be a variable resonant circuit having a resonant frequency that is variable. In this case, the inductor "L" may be a variable inductor, and/or the capacitor "C" may be a variable capacitor. However, the present disclosure is not limited thereto.

The inductor "L" generates a current based on the magnetic field formed in the sensor layer 200. However, the present disclosure is not limited thereto. For example, when the pen PN operates in an active type, the pen PN may generate a current even though a magnetic field is not provided from the outside. The generated current is transferred to the capacitor "C". The capacitor "C" charges the current transferred from the inductor "L", and discharges the charged current to the inductor "L". Afterwards, the inductor "L" may form the magnetic field of the resonant frequency. The induced current may flow in the sensor layer 200 by the magnetic field formed by the pen PN, and the induced current may be transferred to the sensor driver 200C as a receive signal (e.g., a sensing signal or a signal).

The main driver 1000C may control the overall operations of the electronic device 1000. For example, the main driver 1000C may control the operations of the display driver 100C and the sensor driver 200C. The main driver 1000C may include at least one microprocessor. The main driver 1000C may further include a graphics processor. The main driver 1000C may be referred to as an "application processor", a "central processing unit", or a "main processor".

The display driver 100C may drive the display layer 100. The display driver 100C may receive image data and a control signal from the main driver 1000C. The control signal may include various suitable signals. For example, the control signal may include an input vertical synchronization signal, an input horizontal synchronization signal, a main clock signal, a data enable signal, and/or the like.

The sensor driver 200C may drive the sensor layer 200. The sensor driver unit 200C may receive a control signal from the main driver 1000C. The control signal may include a clock signal of the sensor driver 200C. Also, the control signal may further include a mode selection signal for selecting a driving mode of the sensor driver 200C and the sensor layer 200.

The sensor driver 200C may be implemented with an integrated circuit (IC), and may be electrically connected to the sensor layer 200. For example, the sensor driver 200C may be directly mounted in a suitable area (e.g., a given or predetermined area) of the display panel, or for the electrical connection with the sensor layer 200, the sensor driver 200C may be mounted on a separate printed circuit board in a chip-on-film (COF) manner.

The sensor driver 200C and the sensor layer 200 may selectively operate in a first mode or a second mode. For example, the first mode may be a mode of sensing a touch input, for example, such as the first input 2000. The second mode may be a mode of sensing an input by the pen PN, for example, such as the second input 3000. The first mode may be referred to as a "touch sensing mode", and the second mode may be referred to as a "pen sensing mode".

A switch (e.g., a change, a transition, or the like) between the first mode and the second mode may be made in various suitable manners. For example, the sensor driver 200C and the sensor layer 200 may be driven in the first mode and the second mode in a time division manner, and may sense the first input 2000 and the second input 3000. As another example, the switch between the first mode and the second mode may be made by a selection of the user, or by a specific action of the user. As another example, one of the first mode and/or the second mode may be enabled or disabled by the activation or deactivation of a specific application, or the switch from the first mode to the second mode or from the second mode to the first mode may be made. As another example, while the sensor driver 200C and the sensor layer 200 alternately operate in the first mode and the second mode, the first mode may be maintained when the first input 2000 is sensed, or the second mode may be maintained when the second input 3000 is sensed.

The sensor driver 200C may calculate coordinate information of an input based on the signal received from the sensor layer 200, and may provide a coordinate signal including the coordinate information to the main driver 1000C. The main driver 1000C performs an operation corresponding to the user input based on the coordinate signal. For example, the main driver 1000C may drive the display driver 100C, such that a new application image is displayed in the display layer 100.

The power supply circuit 1000P may include a power management integrated circuit (PMIC). The power supply circuit 1000P may generate a plurality of driving voltages for driving the display layer 100, the sensor layer 200, the display driver 100C, and the sensor driver 200C. For example, the plurality of driving voltages may include a high gate voltage, a low gate voltage, a first driving voltage (e.g., an ELVSS voltage), a second driving voltage (e.g., an ELVDD voltage), an initialization voltage, and the like, but the present disclosure is not limited thereto.

Figure 8:
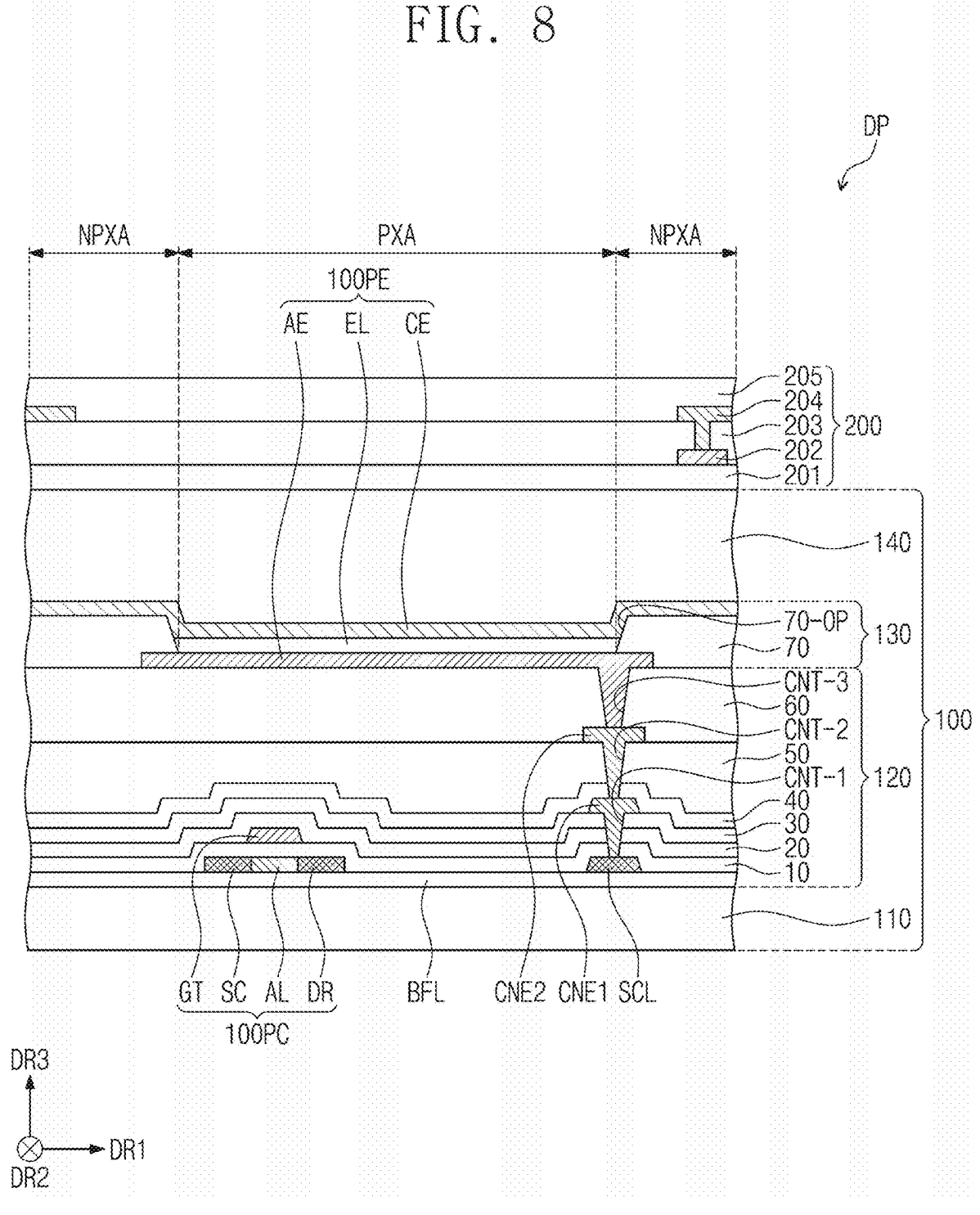
FIG. 8 is a cross-sectional view of a display panel according to an embodiment of the present disclosure.

FIG. 8 is a cross-sectional view of the display panel DP according to an embodiment of the present disclosure.

Referring to FIG. 8, at least one buffer layer BFL is formed on an upper surface of the base layer 110. The buffer layer BFL may improve a bonding force between the base layer 110 and a semiconductor pattern. The buffer layer BFL may be formed in a multi-layered structure. As another example, the display layer 100 may further include a barrier layer. The buffer layer BFL may include at least one of silicon oxide, silicon nitride, and/or silicon oxynitride. For example, the buffer layer BFL may include a structure in which a silicon oxide layer and a silicon nitride layer are stacked alternately on one another.

A semiconductor pattern (e.g., SC, AL, DR, SCL) may be disposed on the buffer layer BFL. The semiconductor pattern (e.g., SC, AL, DR, SCL) may include polysilicon. However, the present disclosure is not limited thereto. For example, the semiconductor pattern (e.g., SC, AL, DR, SCL) may include amorphous silicon, low-temperature polycrystalline silicon, or an oxide semiconductor.

FIG. 8 shows a portion of the semiconductor pattern (e.g., SC, AL, DR, SCL), and the semiconductor pattern (e.g., SC, AL, DR, SCL) may be further disposed in any other suitable area. The semiconductor pattern (e.g., SC, AL, DR, SCL) may be arranged across the pixels in compliance with a specific rule. The electrical property of the semiconductor pattern (e.g., SC, AL, DR, SCL) may be differently determined depending on whether or not it is doped. The semiconductor pattern (e.g., SC, AL, DR, SCL) may include a first area (e.g., SC, DR, SCL) having a conductivity that is relatively high, and a second area AL having a conductivity that is relatively low. The first area (e.g., SC, DR, SCL) may be doped with an N-type dopant or a P-type dopant. A P-type transistor may include an area doped with the P-type dopant, and an N-type transistor may include an area doped with the N-type dopant. The second area AL may be a non-doping area, or may be a doping area having a concentration that is lower than the concentration of the first area (e.g., SC, DR, SCL).

The conductivity of the first area (e.g., SC, DR, SCL) may be greater than the conductivity of the second area AL, and may serve or substantially serve as an electrode or a signal line. The second area AL may correspond to or substantially correspond to an active area (e.g., a channel) AL of a transistor 100PC. In other words, a portion AL of the semiconductor pattern (e.g., SC, AL, DR, SCL) may be the active area AL of the transistor 100PC, another portion (e.g., SC, DR) thereof may be a source area SC or a drain area DR of the transistor 100PC, and another portion SCL thereof may be a connection electrode or a connection signal line SCL.

Each pixel may be expressed by an equivalent circuit including 7 transistors, one capacitor, and a light emitting element, but the equivalent circuit of the pixel may be modified in various suitable forms. One transistor 100PC and one light emitting element 100PE that are included in the pixel are illustrated in FIG. 8 as a representative example.

The source area SC, the active area AL, and the drain area DR of the transistor 100PC may be formed from the semiconductor pattern (e.g., SC, AL, DR, SCL). The source area SC and the drain area DR may extend in directions facing away from each other from the active area AL in a cross-sectional view. A portion of the connection signal line SCL formed from the semiconductor pattern (e.g., SC, AL, DR, SCL) is illustrated in FIG. 8. The connection signal line SCL may be connected to the drain area DR of the transistor 100PC in a plan view.

A first insulating layer 10 may be disposed on the buffer layer BFL. The first insulating layer 10 may overlap with a plurality of pixels in common, and may cover the semiconductor pattern (e.g., SC, AL, DR, SCL). The first insulating layer 10 may be an inorganic layer and/or an organic layer, and may have a single-layer or multi-layered structure. The first insulating layer 10 may include at least one of aluminum oxide, titanium oxide, silicon oxide, silicon nitride, silicon oxynitride, zirconium oxide, and/or hafnium oxide. In an embodiment, the first insulating layer 10 may be a single silicon oxide layer. In addition to the first insulating layer 10, an insulating layer of the circuit layer 120 to be described in more detail below may be an inorganic layer and/or an organic layer, and may have a single-layer or multilayered structure. The inorganic layer may include at least one of the above-described materials, but the present disclosure is not limited thereto.

A gate GT of the transistor 100PC is disposed on the first insulating layer 10. The gate GT may be a portion of a metal pattern. The gate GT overlaps with the active area AL. The gate GT may function as a mask in the process of doping or reducing the semiconductor pattern (e.g., SC, AL, DR, SCL).

A second insulating layer 20 may be disposed on the first insulating layer 10, and may cover the gate GT. The second insulating layer 20 may overlap with the pixels in common. The second insulating layer 20 may be an inorganic layer and/or an organic layer, and may have a single-layer or multi-layered structure. The second insulating layer 20 may include at least one of silicon oxide, silicon nitride, and/or silicon oxynitride. In an embodiment, the second insulating layer 20 may have a multi-layered structure including a silicon oxide layer and a silicon nitride layer.

A third insulating layer 30 may be disposed on the second insulating layer 20. The third insulating layer 30 may have a single-layer or multi-layered structure. In an embodiment, the third insulating layer 30 may have a multi-layered structure including a silicon oxide layer and a silicon nitride layer.

A first connection electrode CNE1 may be disposed on the third insulating layer 30. The first connection electrode CNE1 may be connected to the connection signal line SCL through a contact hole CNT-1 penetrating the first, second, and third insulating layers 10, 20, and 30.

A fourth insulating layer 40 may be disposed on the third insulating layer 30. The fourth insulating layer 40 may be a single silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

A sixth insulating layer 60 may be disposed on the fifth insulating layer 50, and may cover the second connection electrode CNE2. The sixth insulating layer 60 may be an organic layer.

The light emitting element layer 130 may be disposed on the circuit layer 120. The light emitting element layer 130 may include the light emitting element 100PE. For example, the light emitting element layer 130 may include an organic light emitting material, an inorganic light emitting material, an organic-inorganic light emitting material, a quantum dot, a quantum rod, a micro-LED, or a nano-LED. An example in which the light emitting element 100PE is an organic light emitting element will be described in more detail below, but the present disclosure is not limited thereto.

The light emitting element 100PE includes a first electrode AE, an emission layer EL, and a second electrode CE.

The first electrode AE may be disposed on the sixth insulating layer 60. The first electrode AE may be connected to the second connection electrode CNE2 through a contact hole CNT-3 penetrating the sixth insulating layer 60.

A pixel defining layer 70 may be disposed on the sixth insulating layer 60, and may cover a portion of the first electrode AE. An opening 70-OP is defined in the pixel defining layer 70. The opening 70-OP of the pixel defining layer 70 exposes at least a portion of the first electrode AE.

The first display part DA1-F (e.g., refer of FIG. 1A) may include an emission area PXA, and a non-emission area NPXA adjacent to the emission area PXA. The non-emission area NPXA may surround (e.g., around a periphery of) the emission area PXA. In an embodiment, the emission area PXA is defined to correspond to a partial area of the first electrode AE, which is exposed by the opening 70-OP.

The emission layer EL may be disposed on the first electrode AE. The emission layer EL may be disposed in an area defined by the opening 70-OP. In other words, the emission layer EL may be independently formed for each pixel. When the emission layer EL is independently formed for each pixel, each of the emission layers EL may emit light of at least one of a blue color, a red color, and/or a green color. However, the present disclosure is not limited thereto. For example, the emission layer EL may have an integrated shape, and may be included in a plurality of pixels in common. In this case, the emission layer EL may provide blue light, or may provide white light.

The second electrode CE may be disposed on the emission layer EL. The second electrode CE may have an integrated shape, and may be included in a plurality of pixels in common.

In an embodiment of the present disclosure, a hole control layer may be interposed between the first electrode AE and the emission layer EL. The hole control layer may be disposed in common in the emission area PXA and the non-emission area NPXA. The hole control layer may include at least a hole transport layer, and may further include a hole injection layer. An electron control layer may be interposed between the emission layer EL and the second electrode CE. The electron control layer may include at least an electron transport layer, and may further include an electron injection layer. The hole control layer and the electron control layer may be formed, in common, in a plurality of pixels by using an open mask or an inkjet process.

The encapsulation layer 140 may be disposed on the light emitting element layer 130. The encapsulation layer 140 may include an inorganic layer, an organic layer, and an inorganic layer sequentially stacked on one another, but the layers constituting the encapsulation layer 140 are not limited thereto. The inorganic layers may protect the light emitting element layer 130 from moisture and oxygen, and the organic layer may protect the light emitting element layer 130 from a foreign material, such as dust particles. The inorganic layers may include a silicon nitride layer, a silicon oxynitride layer, a silicon oxide layer, a titanium oxide layer, or an aluminum oxide layer. The organic layer may include an acrylic-based organic layer, but the present disclosure is not limited thereto.

The sensor layer 200 may include a base layer 201, a first conductive layer 202, an intermediate insulating layer 203, a second conductive layer 204, and a cover insulating layer 205.

The base layer 201 may be an inorganic layer including at least one of silicon nitride, silicon oxynitride, and/or silicon oxide. As another example, the base layer 201 may be an organic layer including an epoxy resin, an acrylate resin, or an imide-based resin. The base layer 201 may have a single-layer structure, or may have a structure in which multiple layers are stacked in the third direction DR3.

Each of the first conductive layer 202 and the second conductive layer 204 may have a single-layer structure, or may have a structure in which multiple layers are stacked in the third direction DR3.

Each of the first conductive layer 202 and the second conductive layer 204 that have the single-layer structure may include a metal layer or a transparent conductive layer. The metal layer may include molybdenum, silver, titanium, copper, aluminum, or a suitable alloy thereof. The transparent conductive layer may include a transparent conductive oxide, such as indium tin oxide (ITO), indium zinc oxide (IZO), zinc oxide (ZnO), or indium zinc tin oxide (IZTO). In addition, the transparent conductive layer may include a conductive polymer, such as poly(3,4-ethylenedioxythiophene) (PEDOT), a metal nanowire, graphene, and/or the like.

Each of the first conductive layer 202 and the second conductive layer 204 that have the multi-layered structure may include a plurality of metal layers. The metal layers may have, for example, a three-layered structure of titanium/aluminum/titanium. The conductive layer of the multi-layered structure may include at least one metal layer and at least one transparent conductive layer.

At least one of the intermediate insulating layer 203 and/or the cover insulating layer 205 may include an inorganic layer. The inorganic layer may include at least one of aluminum oxide, titanium oxide, silicon oxide, silicon nitride, silicon oxynitride, zirconium oxide, and/or hafnium oxide.

At least one of the intermediate insulating layer 203 and/or the cover insulating layer 205 may include an organic layer. The organic layer may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and/or a perylene-based resin.

Figure 9:
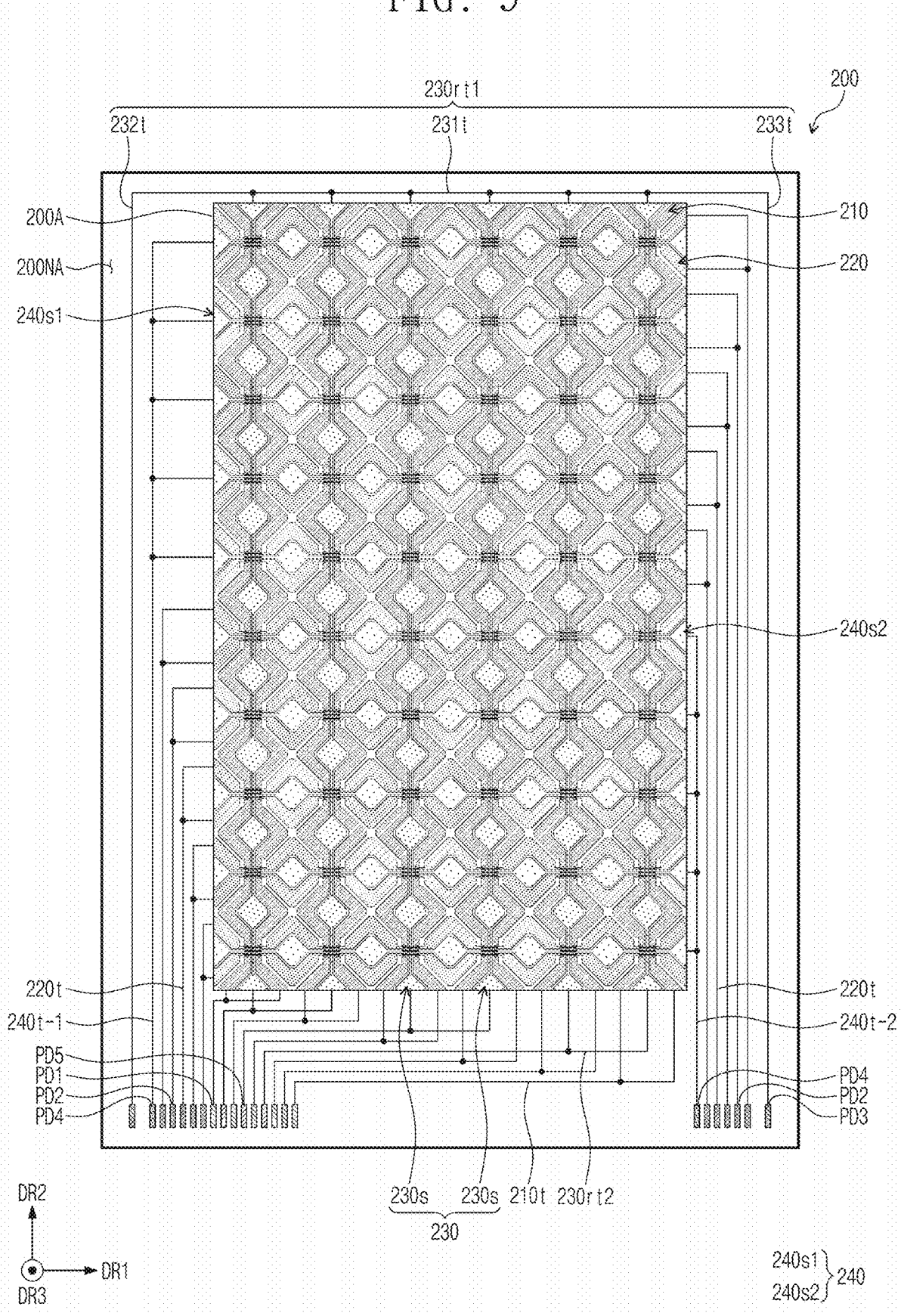
FIG. 9 is a plan view of a sensor layer according to an embodiment of the present disclosure.
Figure 10:
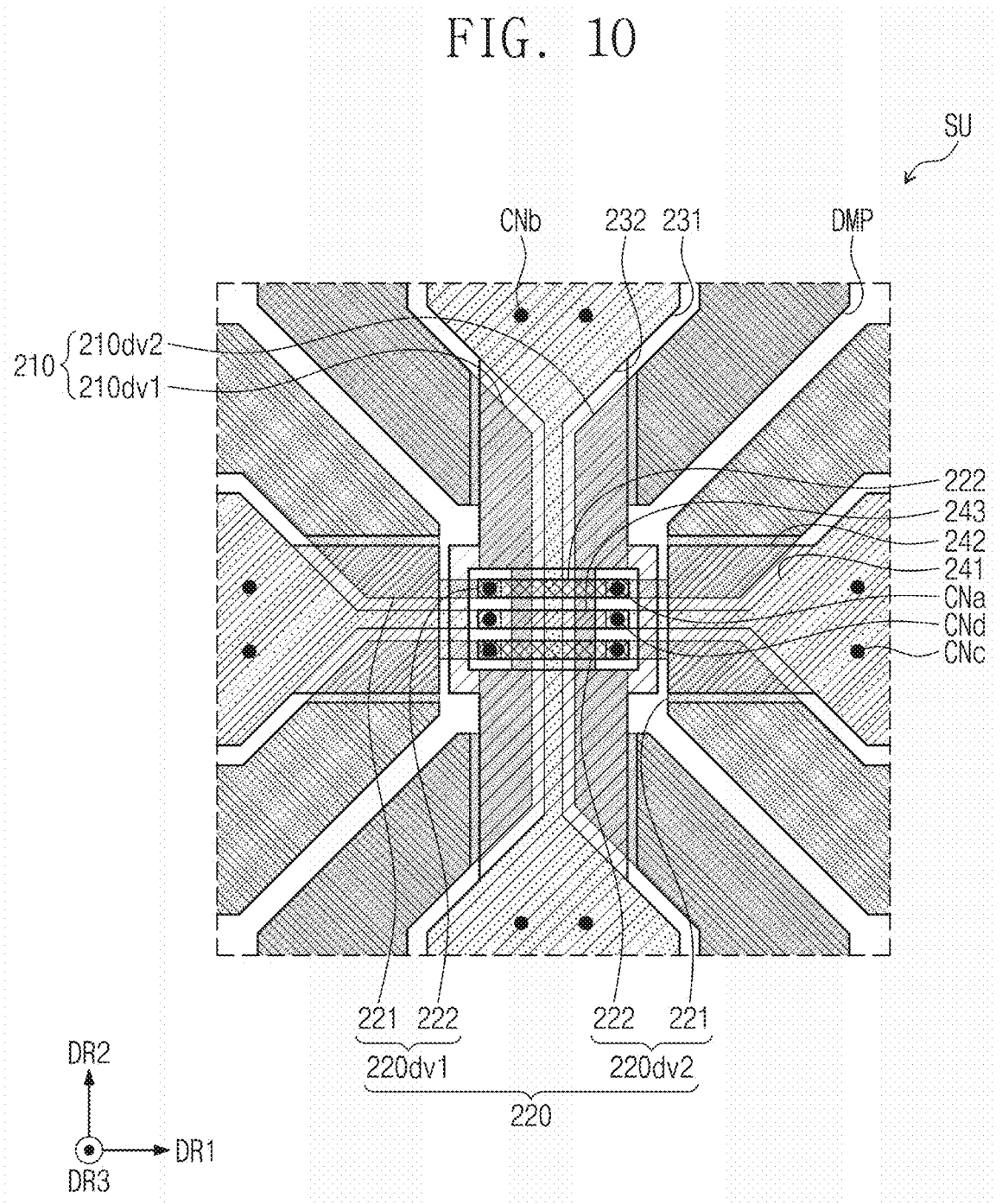
FIG. 10 is an enlarged plan view illustrating one sensing unit according to an embodiment of the present disclosure.
Figure 11A:
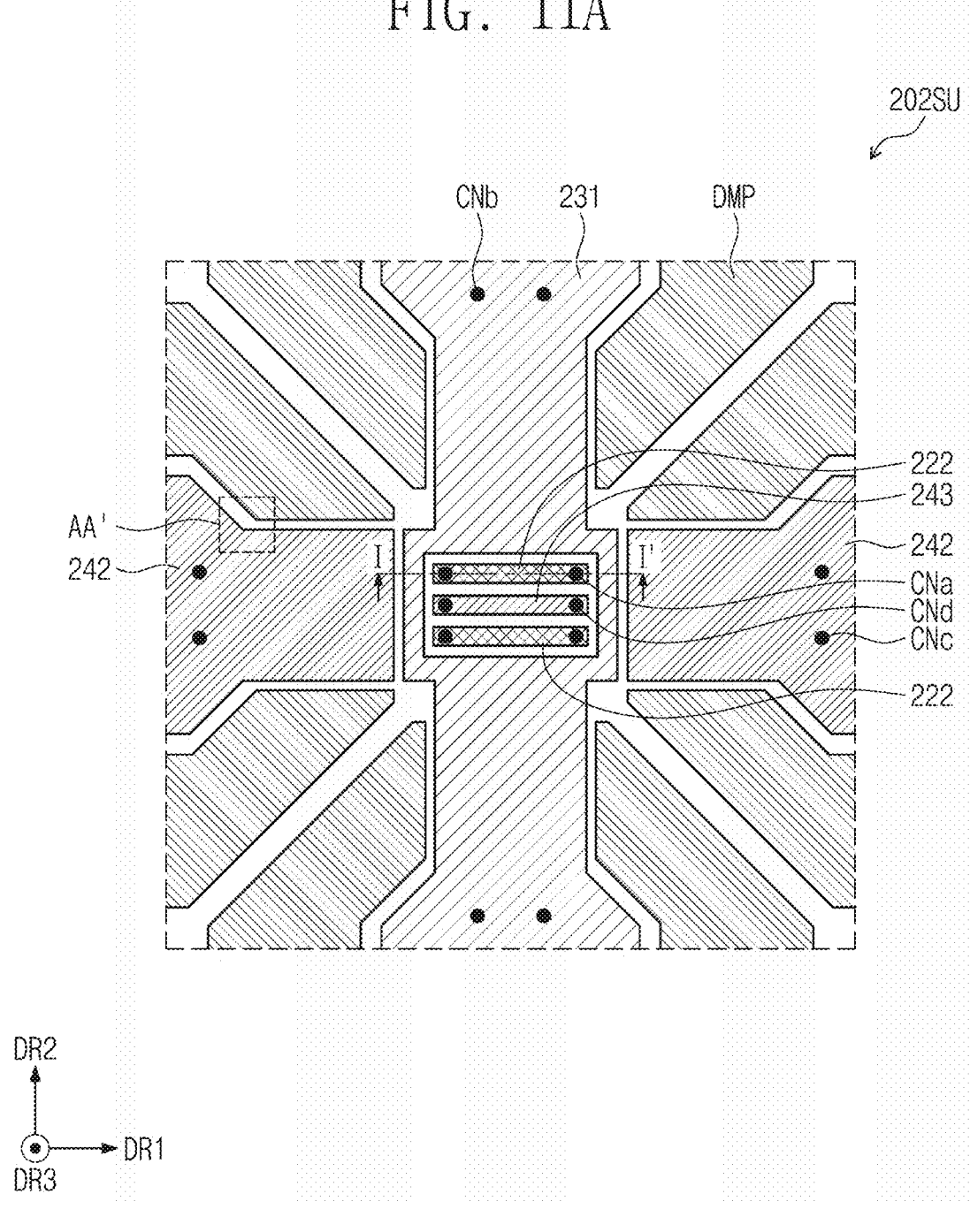
FIG. 11A is a plan view illustrating a first conductive layer of a sensing unit according to an embodiment of the present disclosure.
Figure 11B:
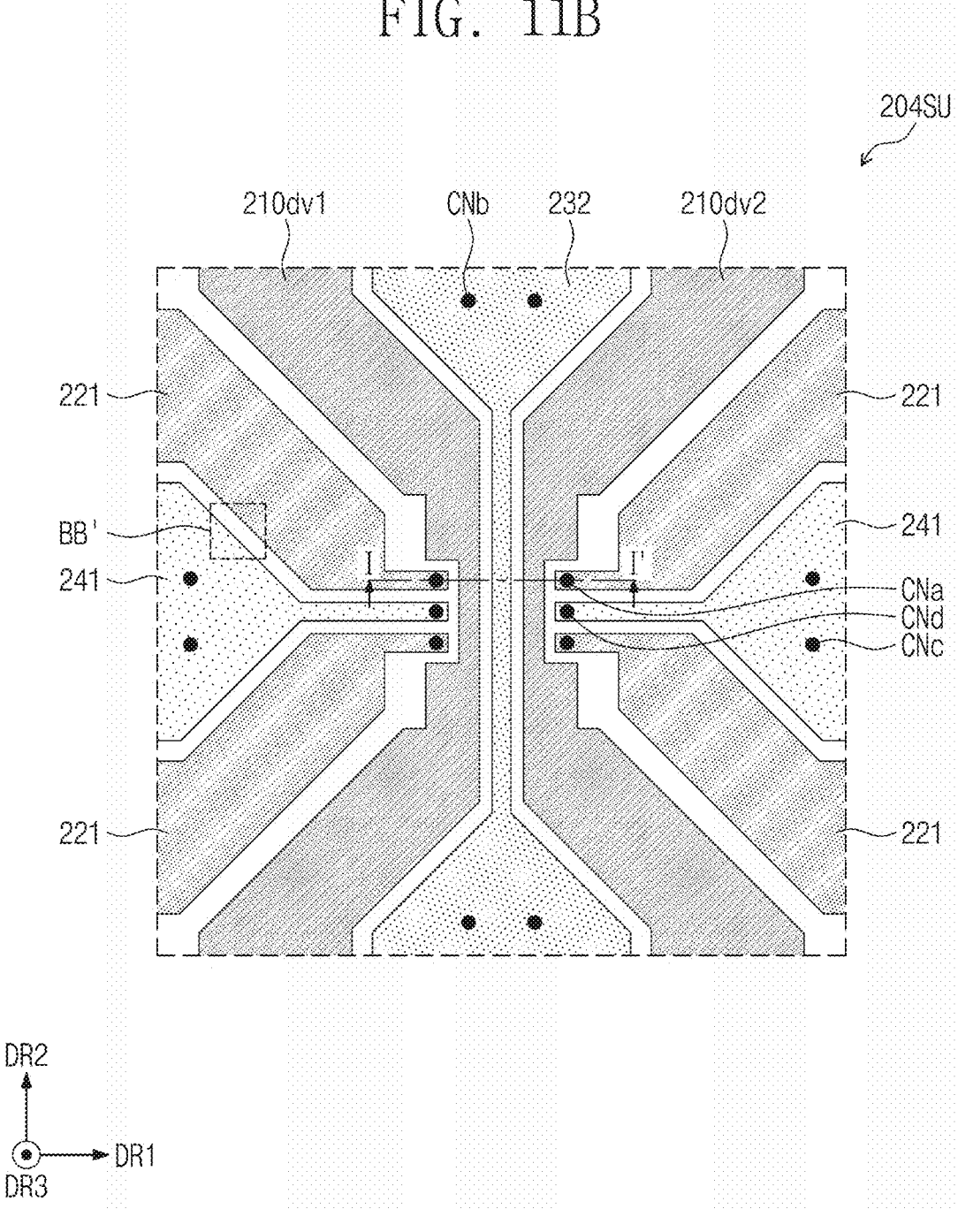
FIG. 11B is a plan view illustrating a second conductive layer of a sensing unit according to an embodiment of the present disclosure.
Figure 12:
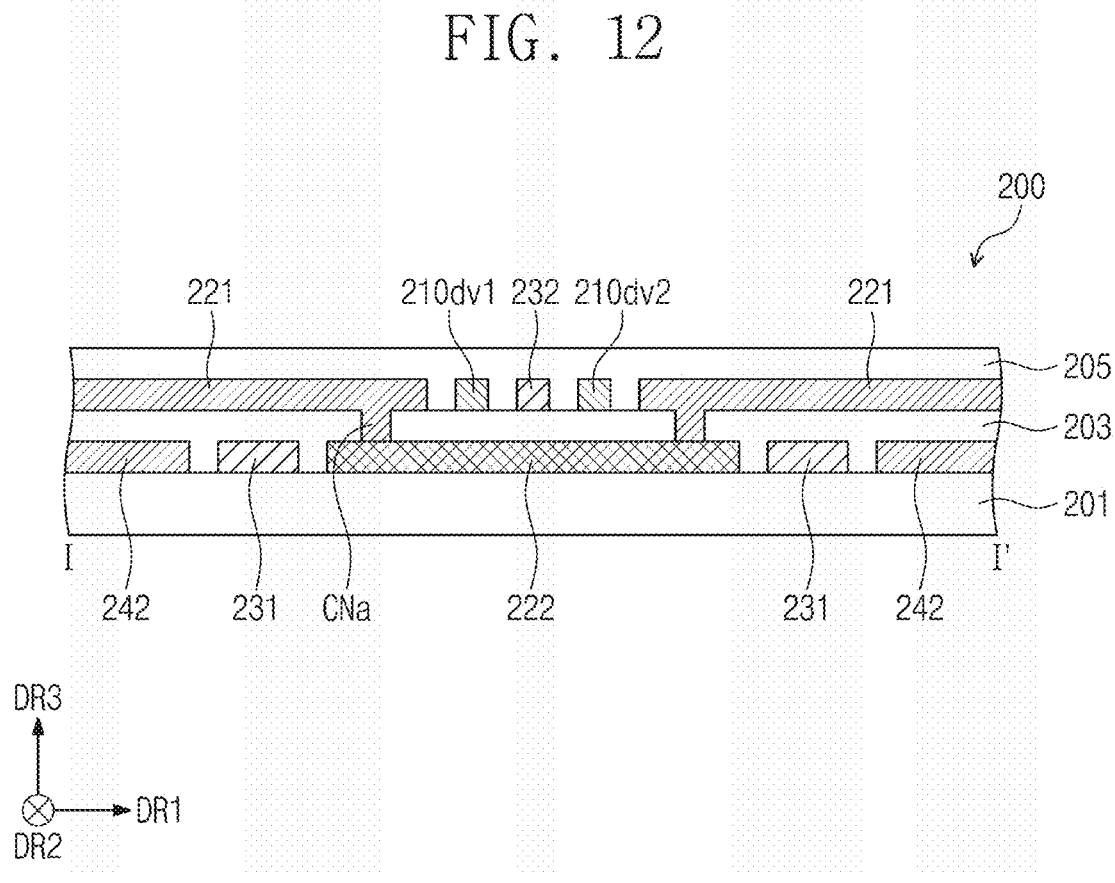
FIG. 12 is a cross-sectional view of a sensor layer taken along the lines I-I' of FIGS. 11A and 11B according to an embodiment of the present disclosure.

FIG. 9 is a plan view of the sensor layer 200 according to an embodiment of the present disclosure. FIG. 10 is an enlarged plan view illustrating one sensing unit SU according to an embodiment of the present disclosure. FIG. 11A is a plan view illustrating a first conductive layer 202SU of the sensing unit SU according to an embodiment of the present disclosure. FIG. 11B is a plan view illustrating a second conductive layer 204SU of the sensing unit SU according to an embodiment of the present disclosure. FIG. 12 is a cross-sectional view of the sensor layer 200 taken along the lines I-I' of FIGS. 11A and 11B according to an embodiment of the present disclosure.

Referring to FIG. 9, a sensing area 200A and a peripheral area 200NA adjacent to the sensing area 200A may be defined in the sensor layer 200. A width of the sensing area 200A in the first direction DR1 may be less than the width of the sensing area 200A in the second direction DR2 that crosses the first direction DR1.

The sensor layer 200 may include a plurality of first electrodes (also referred to as first sensing electrodes) 210, a plurality of second electrodes (also referred to as second sensing electrodes) 220, a plurality of third electrodes 230, and a plurality of fourth electrodes 240, which are disposed in the sensing area 200A.

Each of the plurality of first electrodes 210 may cross or intersect the plurality of second electrodes 220. Each of the plurality of first electrodes 210 may extend in the second direction DR2, and the plurality of first electrodes 210 may be arranged to be spaced from each other in the first direction DR1. Each of the plurality of second electrodes 220 may extend in the first direction DR1, and the plurality of second electrodes 220 may be arranged to be spaced from each other in the second direction DR2. The sensing unit SU of the sensor layer 200 may refer to an area in which one first electrode 210 and one second electrode 220 cross each other. A length of the first electrode 210 may be longer than a length of the second electrode 220.

In FIG. 9, 6 first electrodes 210 and 10 second electrodes 220 are illustrated as an example, and 60 sensing units SU are illustrated as an example. However, the number of first electrodes 210 and the number of second electrodes 220 are not limited thereto.

Referring to FIGS. 9 and 10, each of the first electrodes 210 may include first division electrodes 210dv1 and 210dv2. The first division electrodes 210dv1 and 210dv2 may extend in the second direction DR2, and may be spaced from each other in the first direction DR1. The first division electrodes 210dv1 and 210dv2 may be symmetric with respect to a line extending in the second direction DR2.

Each of the plurality of second electrodes 220 may include second division electrodes 220dv1 and 220dv2. The second electrodes 220 may extend in the first direction DR1 and may be spaced from each other in the second direction DR2. The second division electrodes 220dv1 and 220dv2 may be symmetric or substantially symmetric with each other with respect to a line extending in the first direction DR1.

Referring to FIGS. 10, 11A, 11B, and 12, each of the second division electrodes 220dv1 and 220dv2 may include a sensing pattern 221 and a bridge pattern 222. The sensing pattern 221 and the bridge pattern 222 may be disposed at (e.g., in or on) different layers from each other, and the sensing pattern 221 and the bridge pattern 222 may be electrically connected to each other through a first contact CNa. For example, the bridge pattern 222 may be included in the first conductive layer 202SU, and the sensing pattern 221 and the first division electrodes 210dv1 and 210dv2 may be included in the second conductive layer 204SU. The first conductive layer 202SU may be included in the first conductive layer 202 of FIG. 8, and the second conductive layer 204SU may be included in the second conductive layer 204 of FIG. 8.

Each of the third electrodes 230 may extend in the second direction DR2, and the plurality of third electrodes 230 may be arranged to be spaced from each other in the first direction DR1. In an embodiment of the present disclosure, each of the third electrodes 230 may include a plurality of first auxiliary electrodes (also referred to as first electrodes) 230s electrically connected in parallel with each other. The number of first auxiliary electrodes 230s included in each of the third electrodes 230 may be variously modified as needed or desired. For example, as the number of the first auxiliary electrodes 230s included in each of the third electrodes 230 increases, the resistance of each of the third electrodes 230 may decrease. As such, the efficiency of power may be improved and the sensitivity of sensing may be improved. On the other hand, when the number of first auxiliary electrodes 230s included in each of the third electrodes 230 decreases, a loop coil pattern that is formed by using the third electrodes 230 may be implemented in various desired shapes.

An example in which one third electrode 230 includes two first auxiliary electrodes 230s is illustrated in FIG. 9, but the present disclosure is not limited thereto. The first auxiliary electrodes 230s may be disposed to correspond to the first electrodes 210, respectively. Accordingly, one sensing unit SU may include a portion of one first auxiliary electrode 230s.

A coupling capacitor may be defined between one first electrode 210 and one first auxiliary electrode 230s. In this case, the induced current that is generated in sensing a pen may be transferred from the first auxiliary electrode 230s to the first electrode 210 through the coupling capacitor. In other words, the first auxiliary electrode 230s may play a role in supplementing a signal transferred from the first electrode 210 to the sensor driver 200C. Accordingly, when a phase of a signal induced in the first auxiliary electrode 230s and a phase of a signal induced in the first electrode 210 are matched, the greatest effect may be obtained. Accordingly, the center of each of the first electrodes 210 in the second direction DR2 and the center of each of the corresponding first auxiliary electrodes 230s in the second direction DR2 may overlap with each other. Also, the center of each of the first electrodes 210 in the first direction DR1 and the center of each of the corresponding first auxiliary electrodes 230s in the first direction DR1 may overlap with each other.

In an embodiment of the present disclosure, because one third electrode 230 includes two first auxiliary electrodes 230s, the one third electrode 230 may correspond to (e.g., overlap with) two first electrodes 210. Accordingly, the number of first electrodes 210 included in the sensor layer 200 may be more than the number of third electrodes 230. For example, the number of first electrodes 210 may be equal to the product of the number of third electrodes 230 included in the sensor layer 200 and the number of first auxiliary electrodes 230s included in each of the third electrodes 230. In FIG. 9, the number of first electrodes 210 may be 6 (six), the number of third electrodes 230 may be 3 (three), and the number of first auxiliary electrodes 230s included in each of the third electrodes 230 may be 2 (two).

Each of the fourth electrodes 240 may be arranged along the second direction DR2. Each of the fourth electrodes 240 may extend in the first direction DR1. In an embodiment of the present disclosure, the fourth electrodes 240 may include second auxiliary electrodes (also referred to as second electrodes) 240s1 and 240s2 that are electrically connected to each other. The second auxiliary electrode 240s1 may be referred to as a "2-1st auxiliary electrode 240s1", and the second auxiliary electrode 240s2 may be referred to as a "2-2nd auxiliary electrode 240s2".

A routing direction of the second auxiliary electrode 240s1 may be different from a routing direction of the second auxiliary electrode 240s2. In FIG. 9, two fourth electrodes 240, and five second auxiliary electrodes 240s1 or 240s2 included in each of the fourth electrodes 240 are illustrated as a representative example.

As used herein, when the routing directions are referred to as being different from each other, the connection locations of the electrodes to the trace lines are different from each other. For example, a first connection position where the second auxiliary electrode 240s1 is electrically connected to a fourth trace line 240t-1 may be different from a second connection position where the second auxiliary electrode 240s2 is electrically connected to a fourth trace line 240t-2. The first connection position may correspond to the left end of the second auxiliary electrode 240s1, and the second connection position may correspond to the right end of the second auxiliary electrode 240s2.

In an embodiment of the present disclosure, the sensor layer 200 may include one fourth electrode. In this case, the fourth electrode may include 10 (ten) second auxiliary electrodes that are electrically connected to each other in parallel. The number of second auxiliary electrodes illustrated in FIG. 9 is provided as a representative example, and the number of second auxiliary electrodes included in the fourth electrode is not limited to thereto.

An example in which five second auxiliary electrodes 240s1 are electrically connected to each other at the left end and five second auxiliary electrodes 240s2 are electrically connected to each other at the right end is illustrated in FIG. 9. In other words, a ratio of the area of one fourth electrode 240 and the area of another fourth electrode 240, or a ratio of the number of second auxiliary electrodes included in the one fourth electrode 240 and the number of second auxiliary electrodes included in the other fourth electrode 240, may be 1:1. However, the present disclosure is not limited thereto. For example, the second auxiliary electrode 240s1 and the second auxiliary electrode 240s2 may be different in number from each other.

In an embodiment of the present disclosure, when each of the fourth electrodes 240 includes the second auxiliary electrodes 240s1 or 240s2 connected in parallel with each other, the area of one fourth electrode 240 may be increased. Also, the resistance of each of the fourth electrodes 240 may be decreased, and thus, the sensitivity of sensing of the second input 3000 (e.g., refer to FIG. 7) may be improved. A length of the first auxiliary electrode 230s may be longer than a length of the second auxiliary electrode 240s1 or 240s2.

A coupling capacitor may be defined between one second electrode 220 and one second auxiliary electrode 240s1. In this case, the induced current that is generated in sensing a pen may be transferred from the second auxiliary electrode 240s1 to the second electrode 220 through the coupling capacitor. In other words, the second auxiliary electrode 240s1 may play a role in supplementing a signal transferred from the second electrode 220 to the sensor driver 200C. Accordingly, when a phase of a signal induced in the second auxiliary electrode 240s1 and a phase of a signal induced in the second electrode 220 are matched with each other, the greatest effect may be obtained. As such, the center of each of the second electrodes 220 in the first direction DR1 and the center of each of the corresponding second auxiliary electrodes 240s1 or 240s2 in the first direction DR1 may overlap with each other (e.g., in the third direction DR3). Also, the center of each of the second electrodes 220 in the second direction DR2 and the center of each of the corresponding second auxiliary electrodes 240s1 or 240s2 in the second direction DR2 may overlap with each other (e.g., in the third direction DR3).

Referring to FIGS. 9, 11A, and 11B, each of the first auxiliary electrodes 230s included in the third electrode 230 may include a 3-1st pattern 231 and a 3-2nd pattern 232. The 3-1st pattern 231 and the 3-2nd pattern 232 may be disposed at (e.g., in or on) different layers from each other, and the 3-1st pattern 231 and the 3-2nd pattern 232 may be electrically connected to each other through a second contact CNb. The 3-1st pattern 231 may be included in the first conductive layer 202SU, and the 3-2nd pattern 232 may be included in the second conductive layer 204SU.

In an embodiment of the present disclosure, a portion of the 3-1st pattern 231 may overlap with a portion of each of the first division electrodes 210dv1 and 210dv2. Accordingly, a coupling capacitance may be provided (e.g., formed) between the first electrode 210 and the third electrode 230.

Referring to FIGS. 9, 11A, and 11B, each of the second auxiliary electrodes 240s1 or 240s2 included in the fourth electrode 240 may include a 4-1st pattern 241, a 4-2nd pattern 242, and a 4-3rd pattern 243. The 4-2nd pattern 242 and the 4-3rd pattern 243 may be disposed at (e.g., in or on) the same layer as each other, and the 4-1st pattern 241 may be disposed at (e.g., in or on) a layer different from the layer at (e.g., in or on) which the 4-2nd pattern 242 and the 4-3rd pattern 243 are disposed. The 4-1st pattern 241 and the 4-2nd pattern 242 may be electrically connected to each other through a third contact CNc, and the 4-1st pattern 241 and the 4-3rd pattern 243 may be electrically connected to each other through a fourth contact CNd. The 4-2nd pattern 242 and the 4-3rd pattern 243 may be included in the first conductive layer 202SU, and the 4-1st pattern 241 may be included in the second conductive layer 204SU.

In an embodiment of the present disclosure, a portion of the 4-2nd pattern 242 may overlap with a portion of each of the sensing patterns 221 of each of the second division electrodes 220dv1 and 220dv2. Accordingly, a coupling capacitance may be provided (e.g., formed) between the second electrode 220 and the fourth electrode 240.

In an embodiment of the present disclosure, the first conductive layer 202SU may further include dummy patterns DMP. Each of the dummy patterns DMP may be electrically floated or may be electrically grounded. In an embodiment of the present disclosure, the dummy patterns DMP may be omitted as needed or desired. Because the dummy patterns DMP may be disposed in empty spaces, a probability of specific patterns being recognized due to a reflection of external light may be reduced. In other words, the electronic device 1000 (e.g., see FIG. 1A) having improved visibility due to a reflection of external light may be provided.

The sensor layer 200 may further include a plurality of first trace lines 210t, a plurality of first pads PD1, a plurality of second trace lines 220t, and a plurality of second pads PD2, which are disposed in the peripheral area 200NA (e.g., see FIG. 9). The plurality of first trace lines 210t may be connected to the plurality of first pads PD1, respectively, in a one-to-one correspondence. The plurality of second trace lines 220t may be connected to the plurality of second pads PD2, respectively, in a one-to-one correspondence.

The first trace lines 210t may be electrically connected to the first electrodes 210 in a one-to-one correspondence. Two first division electrodes 210dv1 and 210dv2 included in one first electrode 210 may be connected to one of the first trace lines 210t. Each of the first trace lines 210t may include a plurality of branch parts for the connection with two corresponding first division electrodes 210dv1 and 210dv2. In an embodiment of the present disclosure, two first division electrodes 210dv1 and 210dv2 may be connected to each other within the sensing area 200A.

The second trace lines 220t may be electrically connected to the second electrodes 220 in a one-to-one correspondence. Two second division electrodes 220dv1 and 220dv2 included in one second electrode 220 may be connected to one of the second trace lines 220t. Each of the second trace lines 220t may include a plurality of branch parts for the connection with two corresponding second division electrodes 220dv1 and 220dv2. In an embodiment of the present disclosure, two second division electrodes 220dv1 and 220dv2 may be connected to each other within the sensing area 200A.

The sensor layer 200 may further include a third trace line 230rt1, a plurality of third pads PD3, fourth trace lines 240t-1 and 240t-2, a plurality of fourth pads PD4, fifth trace lines 230rt2, and fifth pads PD5, which are disposed in the peripheral area 200NA. The third pads PD3 may be connected to a first end and a second end of the third trace line 230rt1. The fourth pads PD4 may be connected to the fourth trace lines 240t-1 and 240t-2 in a one-to-one correspondence. The fifth pads PD5 may be connected to the fifth trace lines 230rt2 in a one-to-one correspondence.

The third trace line 230rt1 may be electrically connected to at least one of the first auxiliary electrodes 230s. In an embodiment of the present disclosure, the third trace line 230rt1 may be electrically connected to all of the first auxiliary electrodes 230s. In other words, the third trace line 230rt1 may be electrically connected to all of the third electrodes 230. The third trace line 230rt1 may include a first line portion 231t that extends in the first direction DR1 and is electrically connected to the third electrodes 230, a second line portion 232t that extends from a first end of the first line portion 231t in the second direction DR2, and a third line portion 233t that extends from a second end of the first line portion 231t in the second direction DR2.

In an embodiment of the present disclosure, each of a resistance of the second line portion 232$t$ and a resistance of the third line portion 233$t$ may be the same or substantially the same as a resistance of one of the third electrodes 230. Accordingly, the second line portion 232$t$ and the third line portion 233$t$ may serve as the third electrodes 230, and thus, the same effect as that of the third electrodes 230 may be disposed in the peripheral area 200NA and may be obtained. For example, one of the second line portion 232$t$ and/or the third line portion 233$t$ and one of the third electrodes 230 may form a coil. Accordingly, a pen that is close to the peripheral area 200NA may also be sufficiently charged by a loop including the second line portion 232$t$ or the third line portion 233$t$.

In an embodiment of the present disclosure, to adjust the resistance of the second line portion 232$t$ and the resistance of the third line portion 233$t$, the width of the second line portion 232$t$ in the first direction DR1 and the width of the third line portion 233$t$ in the first direction DR1 may be variously modified. However, the present disclosure is not limited thereto. For example, the first to third line portions 231$t$, 232$t$, and 233$t$ may have the same or substantially the same width as each other.

The fifth trace lines 230$rt$2 may be connected to the third electrodes 230 in a one-to-one correspondence. In other words, the number of fifth trace lines 230$rt$2 may correspond to the number of third electrodes 230. Three fifth trace lines 230$rt$2 are illustrated in FIG. 9 as an example.

In an embodiment of the present disclosure, the fifth trace lines 230$rt$2 and the fifth pads PD5 may be omitted as needed or desired, and a charging driving mode for charging a pen may be omitted as needed or desired. In this case, the sensor layer 200 may sense an input by an active-type pen that is capable of forming a magnetic field, even though a magnetic field is not provided from the sensor layer 200.

The fourth trace lines 240$t$-1 and 240$t$-2 may be spaced from each other with the sensing area 200A interposed therebetween. The fourth trace line 240$t$-1 may be electrically connected to at least one of the second auxiliary electrodes 240$s$1. For example, first ends of the second auxiliary electrodes 240$s$1 may be connected to the fourth trace line 240$t$-1. The fourth trace line 240$t$-2 may be electrically connected to at least one of the second auxiliary electrodes 240$s$2. For example, second ends (which are opposite to the first ends) of the second auxiliary electrodes 240$s$2 may be connected to the fourth trace line 240$t$-2.

Figure 13A:
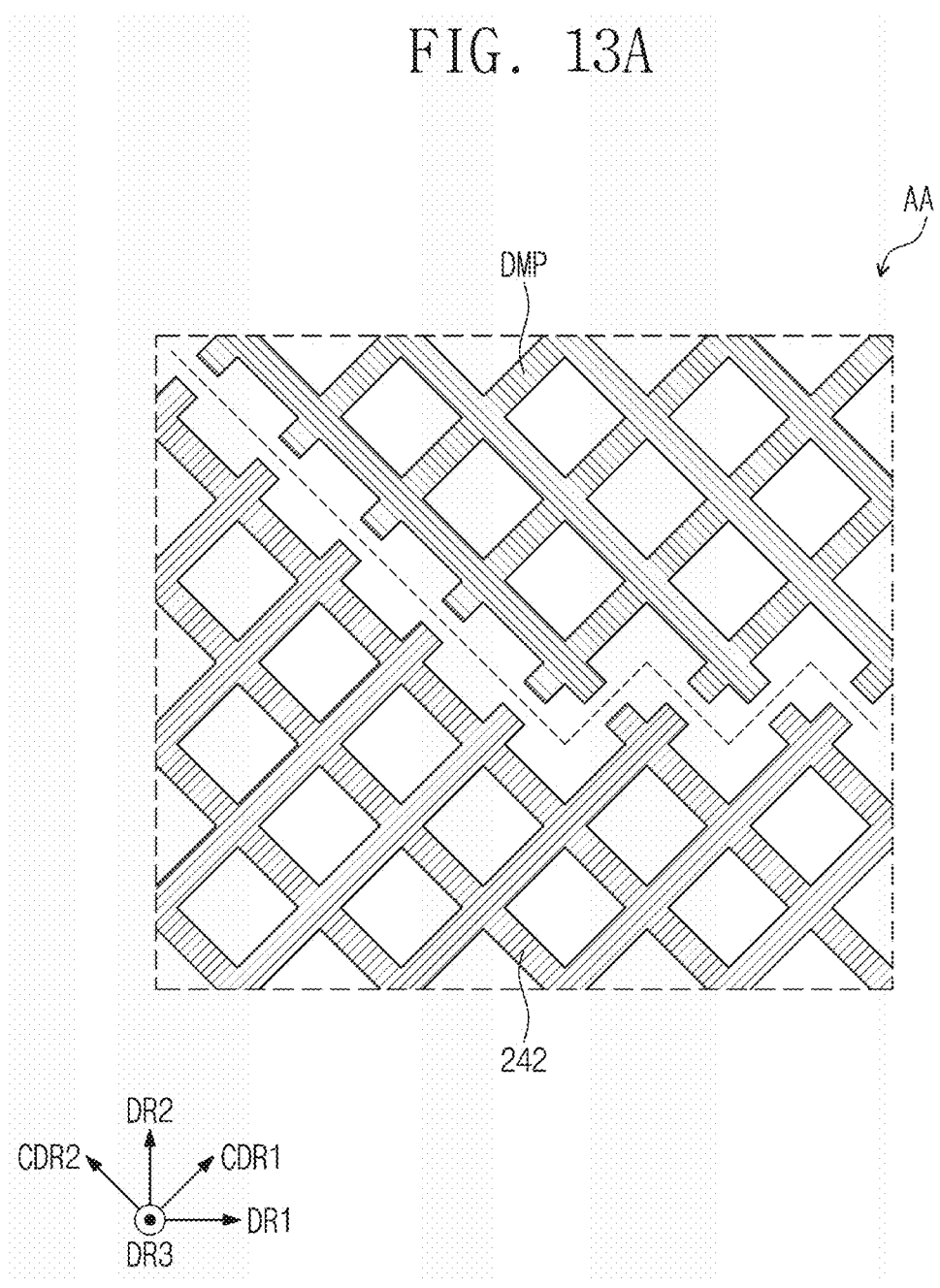
FIG. 13A is an enlarged plan view of the area AA' illustrated in FIG. 11A.
Figure 13B:
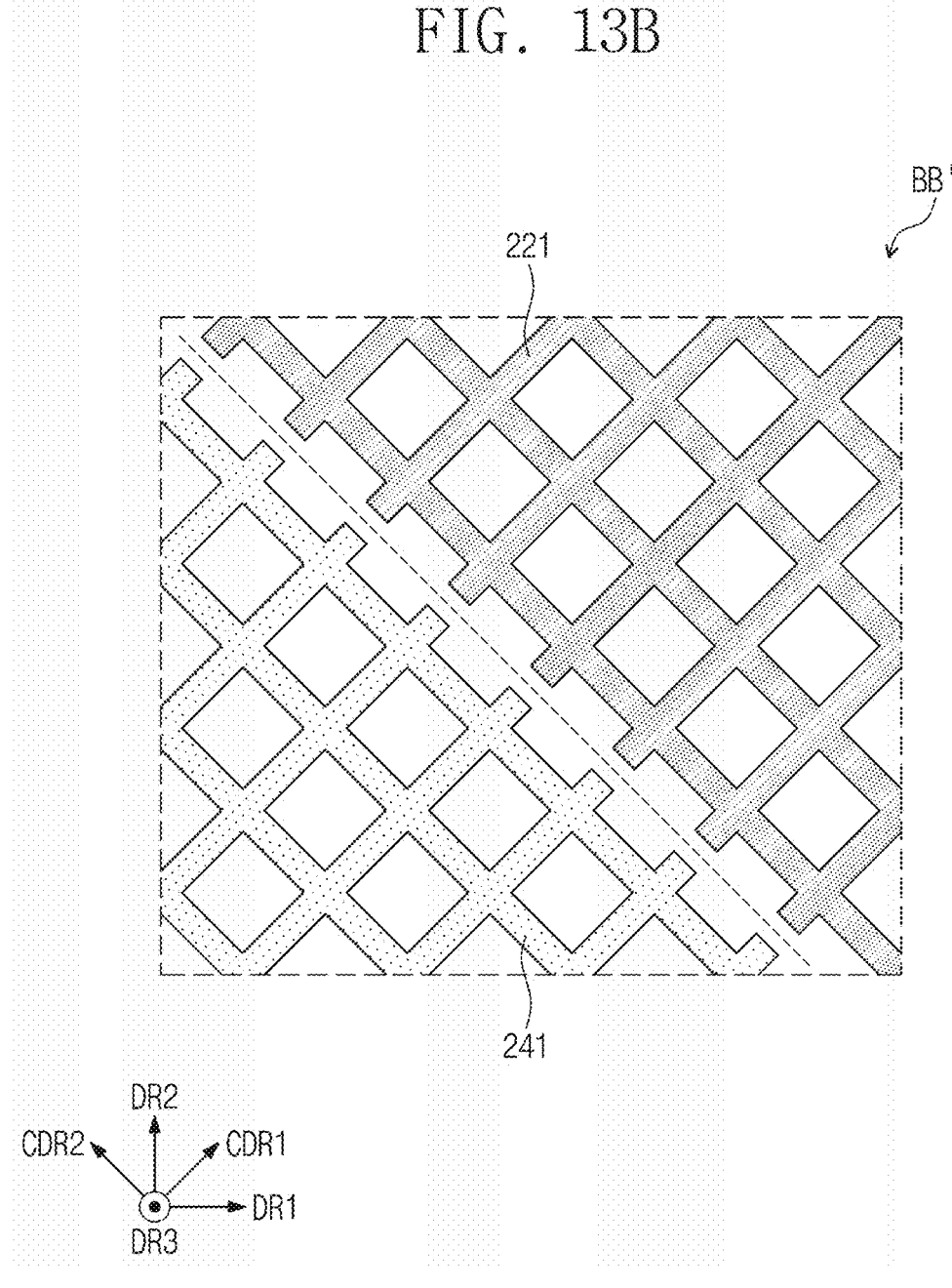
FIG. 13B is an enlarged plan view of the area BB' illustrated in FIG. 11B.

FIG. 13A is an enlarged plan view of the area AA' illustrated in FIG. 11A. FIG. 13B is an enlarged plan view of area BB' illustrated in FIG. 11B.

Referring to FIGS. 11A, 11B, 13A, and 13B, each of the first electrodes 210, the second electrodes 220, the third electrodes 230, the fourth electrodes 240, and the dummy patterns DMP may have a mesh structure. Each of the mesh structures may include a plurality of mesh lines. Each of the plurality of mesh lines may have a suitable shape extending in a suitable direction (e.g., a given or predetermined direction), and the plurality of mesh lines may be connected to one another. The shape may have various suitable shapes, such as a straight line, a line with protrusions, or an uneven line. Openings where the mesh structure is not disposed may be defined (e.g., formed) in each of the first electrodes 210, the second electrodes 220, the third electrodes 230, the fourth electrodes 240, and the dummy patterns DMP.

An example in which the mesh structure includes the mesh lines extending in a first cross direction CDR1 crossing or intersecting the first direction DR1 and the second direction DR2, and mesh lines extending in a second cross direction CDR2 crossing or intersecting the first cross direction CDR1, is illustrated in FIGS. 13A and 13B. However, the directions in which the mesh lines constituting the mesh structure extend are not limited to those shown in FIGS. 13A and 13B. For example, the mesh structure may include only mesh lines extending in the first direction DR1 and the second direction DR2, or may include mesh lines extending the first direction DR1, the second direction DR2, the first cross direction CDR1, and the second cross direction CDR2. In other words, the mesh structure may be variously modified into various suitable shapes as needed or desired.

Figure 14:
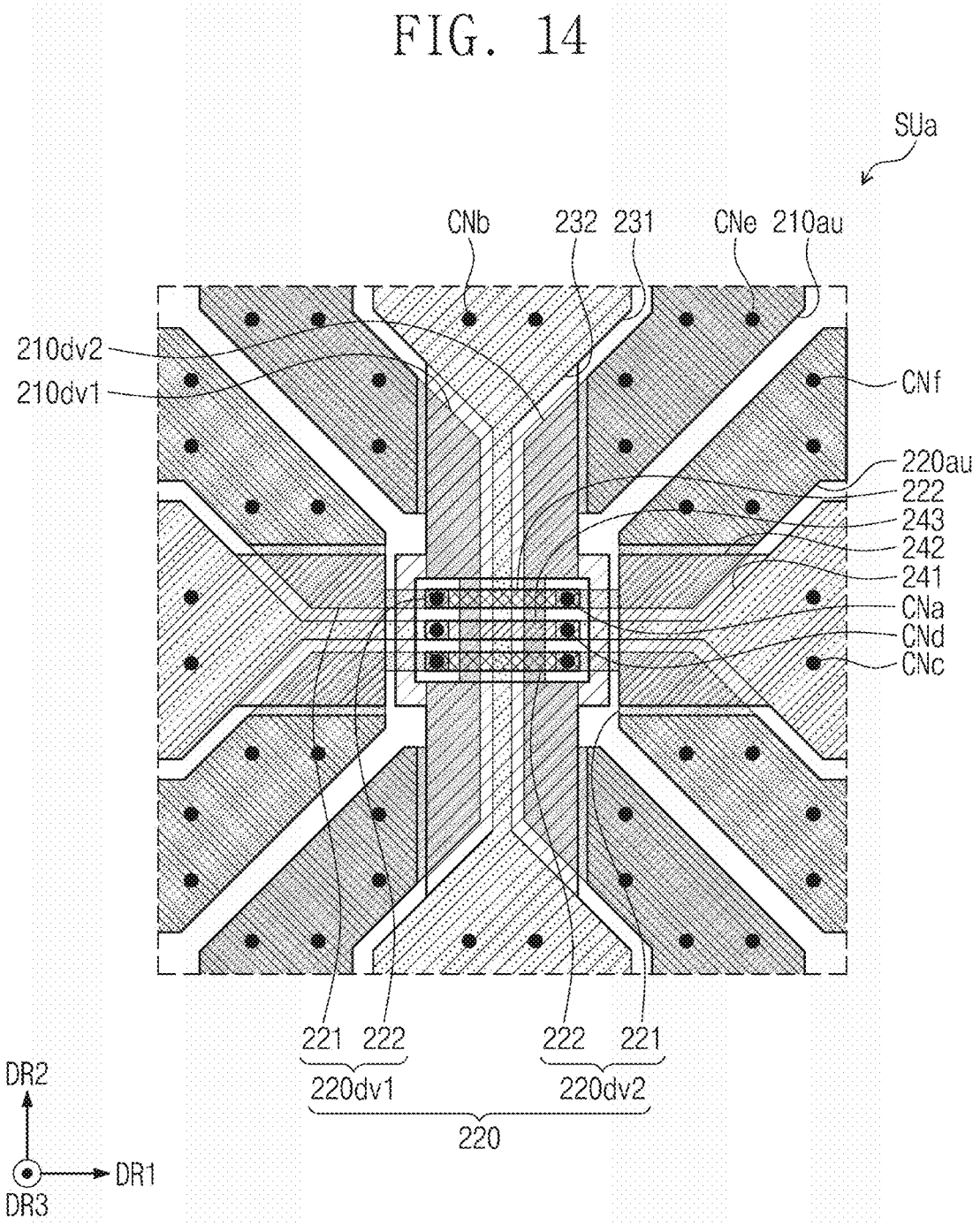
FIG. 14 is an enlarged plan view illustrating one sensing unit according to an embodiment of the present disclosure.
Figure 15A:
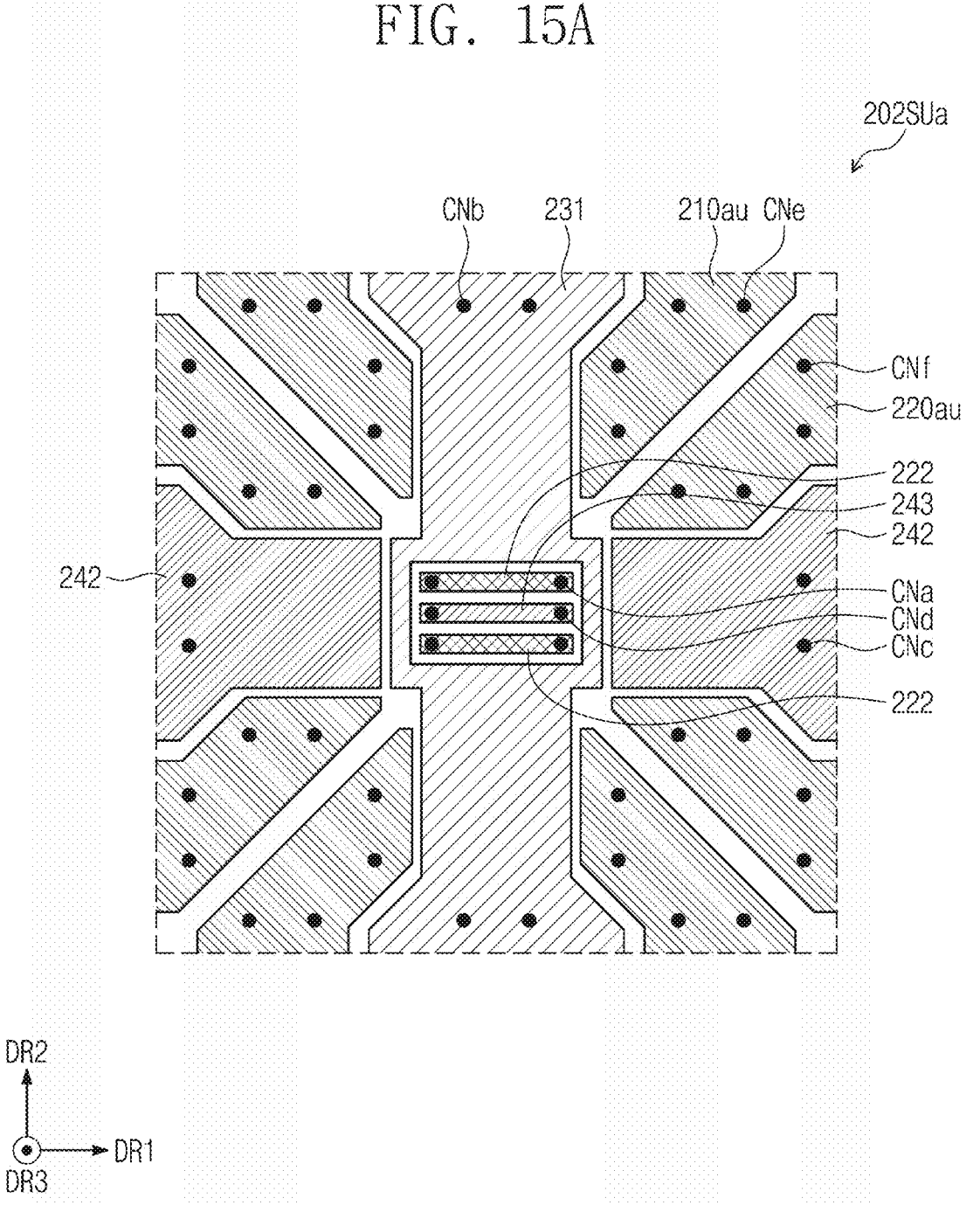
FIG. 15A is a plan view illustrating a first conductive layer of a sensing unit according to an embodiment of the present disclosure.
Figure 15B:
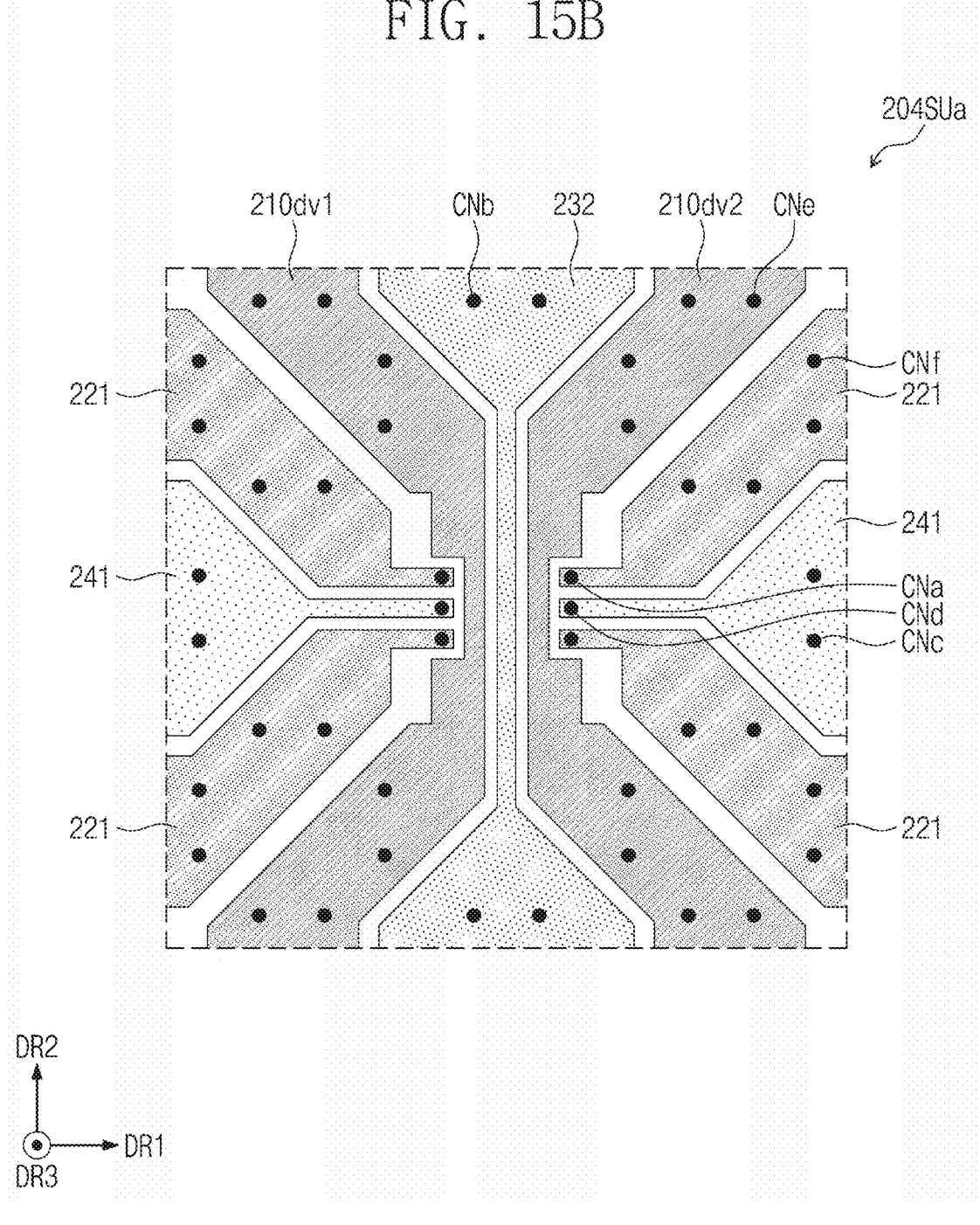
FIG. 15B is a plan view illustrating a second conductive layer of a sensing unit according to an embodiment of the present disclosure.

FIG. 14 is an enlarged plan view illustrating one sensing unit SUa according to an embodiment of the present disclosure. FIG. 15A is a plan view illustrating a first conductive layer 202SUa of the sensing unit SUa according to an embodiment of the present disclosure. FIG. 15B is a plan view illustrating a second conductive layer 204SUa of the sensing unit SUa according to an embodiment of the present disclosure.

According to the embodiment illustrated in FIGS. 14, 15A, and 15B, the dummy patterns DMP illustrated in FIG. 11A may be electrically connected to the first electrode 210 or the second electrode 220. For example, first electrode auxiliary patterns 210$au$ and second electrode auxiliary patterns 220$au$ may be disposed in the first conductive layer 202SUa. The first electrode auxiliary patterns 210$au$ may overlap with the first division electrodes 210$dv$1 and 210$dv$2, and may be electrically connected to the first division electrodes 210$dv$1 and 210$dv$2 through fifth contacts CNe. The second electrode auxiliary patterns 220$au$ may overlap with the sensing patterns 221, and may be electrically connected to the sensing patterns 221 through sixth contacts CNf.

Figure 16:
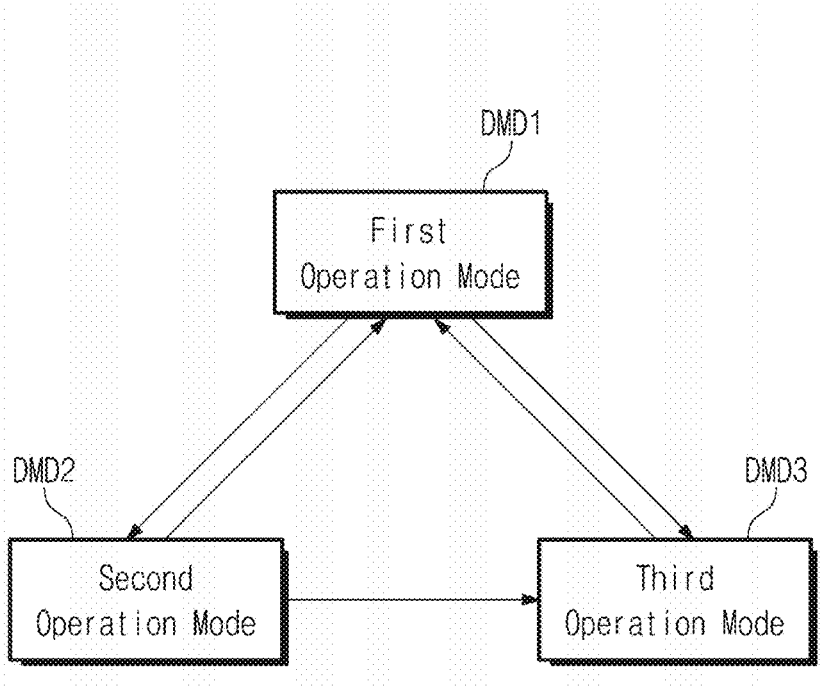
FIG. 16 is a block diagram illustrating an operation of a sensor driver according to an embodiment of the present disclosure.

FIG. 16 is a block diagram illustrating an operation of the sensor driver 200C according to an embodiment of the present disclosure.

Referring to FIGS. 7 and 16, the sensor driver 200C may be selectively driven in one of a first operation mode DMD1, a second operation mode DMD2, and/or a third operation mode DMD3.

The first operation mode DMD1 may be referred to as a "touch and pen standby mode". The second operation mode DMD2 may be referred to as a "touch enable and pen standby mode". The third operation mode DMD3 may be referred to as a "pen enable mode". The first operation mode DMD1 may be a mode of waiting for the first input 2000 and the second input 3000. The second operation mode DMD2 may be a mode of sensing the first input 2000, and waiting for the second input 3000. The third operation mode DMD3 may be a mode of sensing the second input 3000.

In an embodiment of the present disclosure, the sensor driver 200C may be first driven in the first operation mode DMD1. When the first input 2000 is sensed in the first operation mode DMD1, the sensor driver 200C may switch (e.g., change or transition) to the second operation mode DMD2. As another example, when the second input 3000 is sensed in the first operation mode DMD1, the sensor driver 200C may switch (e.g., change or transition) to the third operation mode DMD3.

In an embodiment of the present disclosure, when the second input 3000 is sensed in the second operation mode DMD2, the sensor driver 200C may switch (e.g., change or transition) to the third operation mode DMD3. When the first input 2000 is released (e.g., is not sensed) in the second operation mode DMD2, the sensor driver 200C may switch to the first operation mode DMD1. When the second input 3000 is released (e.g., is not sensed) in the third operation mode DMD3, the sensor driver 200C may switch to the first operation mode DMD1.

Figure 17:
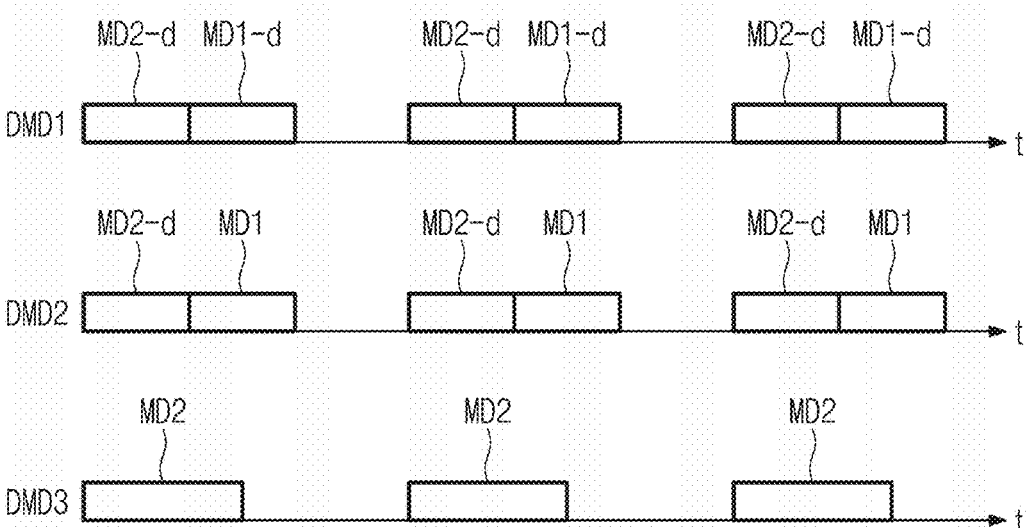
FIG. 17 is a timing diagram illustrating an operation of a sensor driver according to an embodiment of the present disclosure.

FIG. 17 is a timing diagram illustrating an operation of the sensor driver 200C according to an embodiment of the present disclosure.

Referring to FIGS. 7, 16, and 17, operations in the first to third operation modes DMD1, DMD2, and DMD3 over time (t) are illustrated as an example.

In the first operation mode DMD1, the sensor driver 200C may be repeatedly driven in a second mode MD2-*d* and a first mode MD1-*d*. During the second mode MD2-*d*, the sensor layer 200 may be scanned and driven to detect the second input 3000. During the first mode MD1-*d*, the sensor layer 200 may be scanned and driven to detect the first input 2000. An example in which the sensor driver 200C operates in the first mode MD1-*d* immediately after (e.g., continuous to) the second mode MD2-*d* is illustrated in FIG. 17, but the order of the first mode MD1-*d* and the second mode MD2-*d* is not limited thereto.

In the second operation mode DMD2, the sensor driver 200C may be repeatedly driven in the second mode MD2-*d* and a first mode MD1. During the second mode MD2-*d*, the sensor layer 200 may be scanned and driven to detect the second input 3000. During the first mode MD1, the sensor layer 200 may be scanned and driven to detect coordinates of the first input 2000.

In the third operation mode DMD3, the sensor driver 200C may be driven in a second mode MD2. During the second mode MD2, the sensor layer 200 may be scanned and driven to detect coordinates of the second input 3000. In the third operation mode DMD3, the sensor driver 200C may not operate in the first mode MD1-*d* or MD1 until the second input 3000 is released (e.g., is not sensed).

Referring to FIG. 9 together, in the first mode MD1-*d* and the first mode MD1, both the third electrodes 230 and the fourth electrodes 240 may be grounded. Accordingly, a touch noise may be prevented or substantially prevented from being introduced through the third electrodes 230 and the fourth electrodes 240.

In the second mode MD2-*d* and the second mode MD2, a first end of each of the third electrodes 230 and the fourth electrodes 240 may be floated. Also, in the second mode MD2-*d* and the second mode MD2, a second end of each of the third electrodes 230 and the fourth electrodes 240 may be grounded or floated. Accordingly, a sensing signal may be maximally compensated for by the coupling between the first electrodes 210 and the third electrodes 230, and the coupling between the second electrodes 220 and the fourth electrodes 240.

Figure 18A:
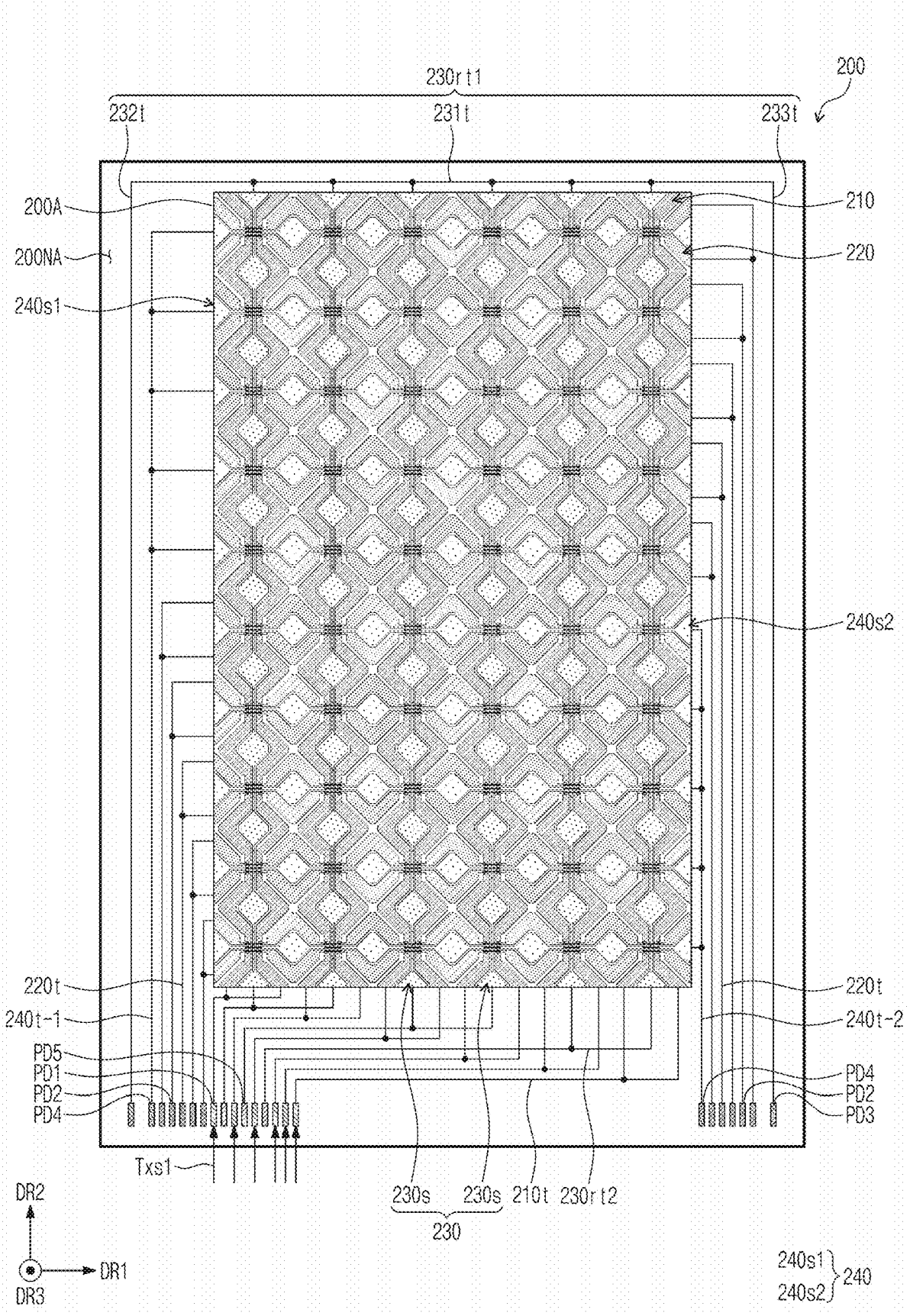
FIG. 18A is a diagram illustrating a first mode according to an embodiment of the present disclosure.
Figure 18B:
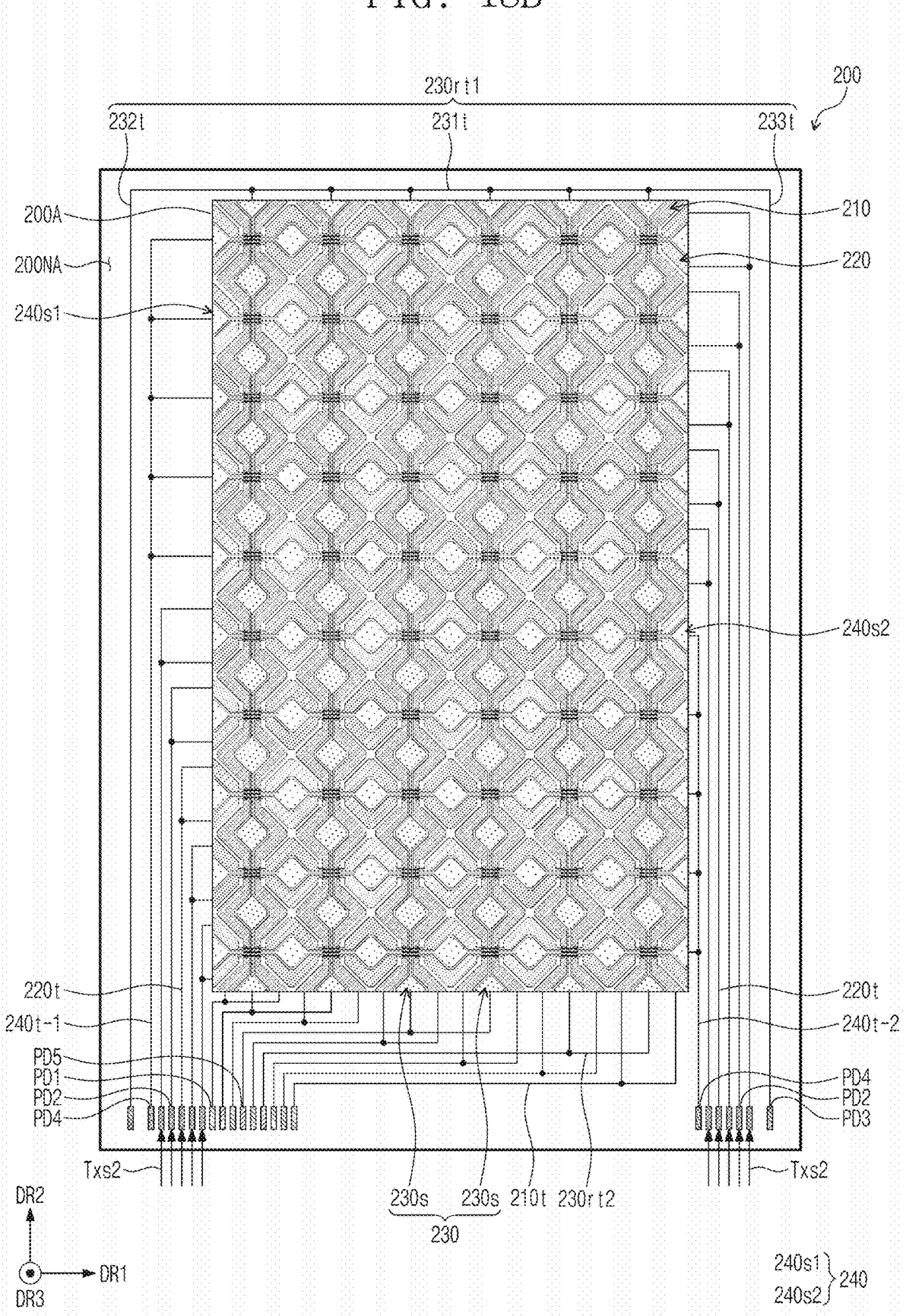
FIG. 18B is a diagram illustrating a first mode according to an embodiment of the present disclosure.

FIG. 18A is a diagram illustrating a first mode according to an embodiment of the present disclosure. FIG. 18B is a diagram illustrating a first mode according to an embodiment of the present disclosure.

Referring to FIGS. 17, 18A, and 18B, the first mode MD1-*d* of the first operation mode DMD1 and the first mode MD1 of the second operation mode DMD2 may include a self-capacitance detection mode. The self-capacitance detection mode may include a first sub-period and a second sub-period. FIG. 18A illustrates an operation in the first sub-period, and FIG. 18B illustrates an operation in the second sub-period.

In the self-capacitance detection mode, the sensor driver 200C may output driving signals Txs1 and Txs2 to the first electrodes 210 and the second electrodes 220, to sense a change in a capacitance of each of the first electrodes 210 and the second electrodes 220, and to calculate input coordinates based on a sensing result.

Referring to FIG. 18A, in the first sub-period (e.g., a first sub-interval), the sensor driver 200C may output the driving signals Txs1 to the first trace lines 210*t*. Referring to FIG. 18B, in the second sub-period (e.g., a second sub-interval), the sensor driver 200C may output the driving signals Txs2 to the second trace lines 220*t*. The first sub-period and the second sub-period may be operated separately from each other at different timings. However, the present disclosure is not limited thereto. For example, the first sub-period and the second sub-period may overlap with each other in time. In other words, at the same or substantially the same timing, the sensor driver 200C may output the driving signals Txs1 to the first trace lines 210*t* and the driving signals Txs2 to the second trace lines 220*t*.

The third electrodes 230 may be electrically connected to the third trace line 230*rt*1 and the fifth trace lines 230*rt*2, and the fourth electrodes 240 may be electrically connected to the fourth trace lines 240*t*-1 and 240*t*-2. In the self-capacitance detection mode, both the third electrodes 230 and the fourth electrodes 240 may be grounded. Accordingly, a noise may not be introduced through the third electrodes 230 and the fourth electrodes 240.

Figure 19:
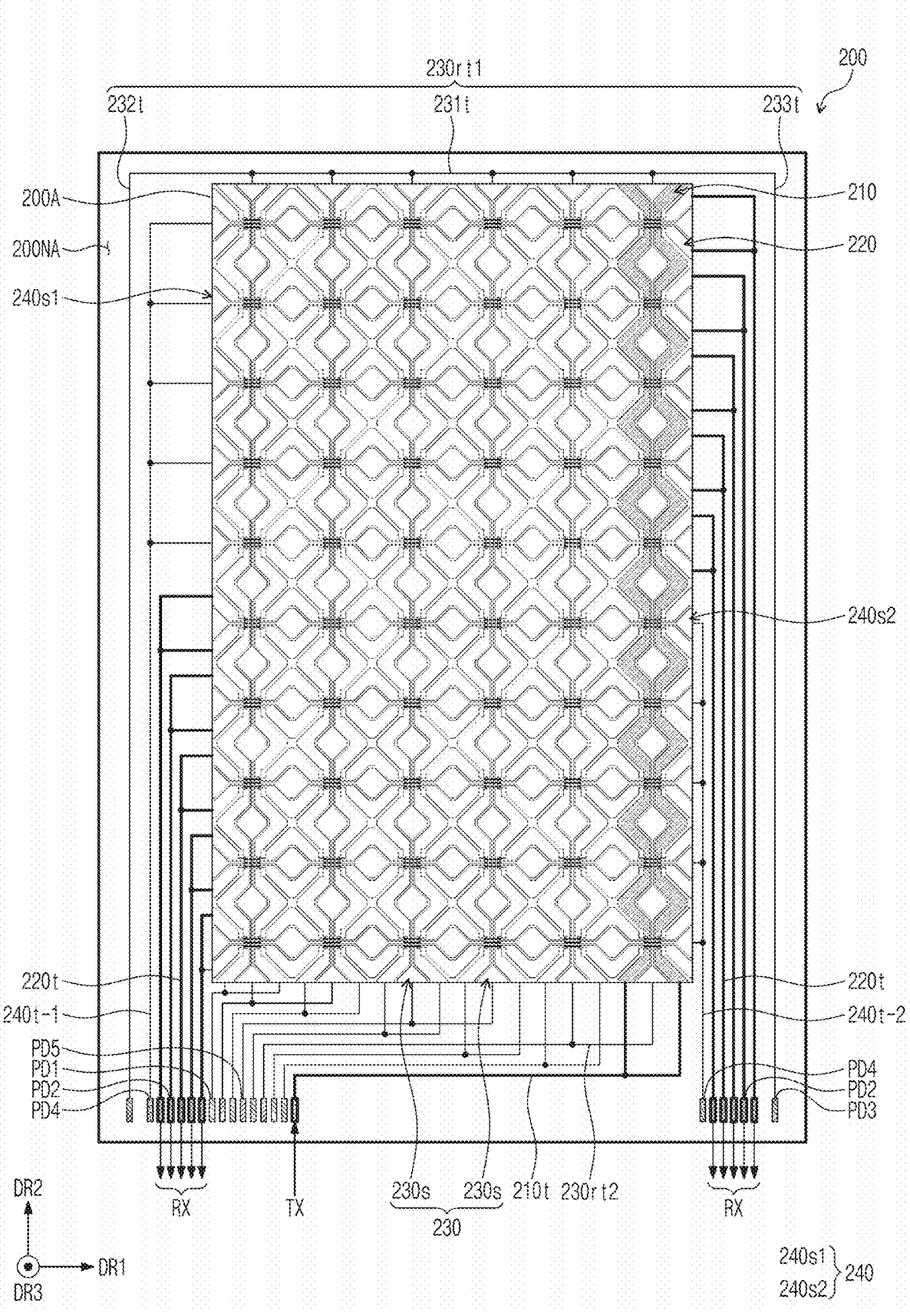
FIG. 19 is a diagram illustrating a first mode according to an embodiment of the present disclosure.

FIG. 19 is a diagram illustrating a first mode according to an embodiment of the present disclosure.

Referring to FIGS. 7, 17, and 19, the first mode MD1-*d* and the first mode MD1 may further include a mutual capacitance detection mode. FIG. 19 illustrates the mutual capacitance detection mode in the first mode MD1-*d* and the first mode MD1.

In the mutual capacitance detection mode, the sensor driver 200C may provide a transmit signal TX sequentially to the first electrodes 210, and may detect coordinates of the first input 2000 by using a receive signal RX detected through the second electrodes 220. For example, the sensor driver 200C may sense a change in a mutual capacitance between the first electrodes 210 and the second electrodes 220, and may calculate input coordinates based on a sensing result.

An example in which the transmit signal TX is provided to one first electrode 210 and the receive signal RX is output from one second electrode 220 is illustrated in FIG. 19. For convenience of illustration, in FIG. 19, only one first electrode 210 to which the transmit signal TX is provided is shown as hatched. The sensor driver 200C may sense a change in a capacitance between the first electrode 210 and each of the second electrodes 220, and may detect input coordinates of the first input 2000 based on a sensing result.

In the mutual capacitance detection mode, both the third electrodes 230 and the fourth electrodes 240 may be grounded. Accordingly, a noise may not be introduced through the third electrodes 230 and the fourth electrodes 240.

In each of the first mode MD1-*d* of the first operation mode DMD1 and the first mode MD1 of the second operation mode DMD2, the sensor layer 200 may alternately repeat the operations described above with reference to FIGS. 18A, 18B, and 19. However, the present disclosure is not limited thereto. For example, in each of the first mode MD1-*d* and the first mode MD1, the sensor layer 200 may repeatedly perform only the operations described above with reference to FIG. 19. As another example, in the first mode MD1-*d*, the sensor layer 200 may repeatedly perform only at least one of the operations described above with reference to FIGS. 18A, 18B, and/or 19, and in the first mode MD1, the sensor layer 200 may alternately repeat the operations described above with reference to FIGS. 18A, 18B, and 19.

Figure 20:
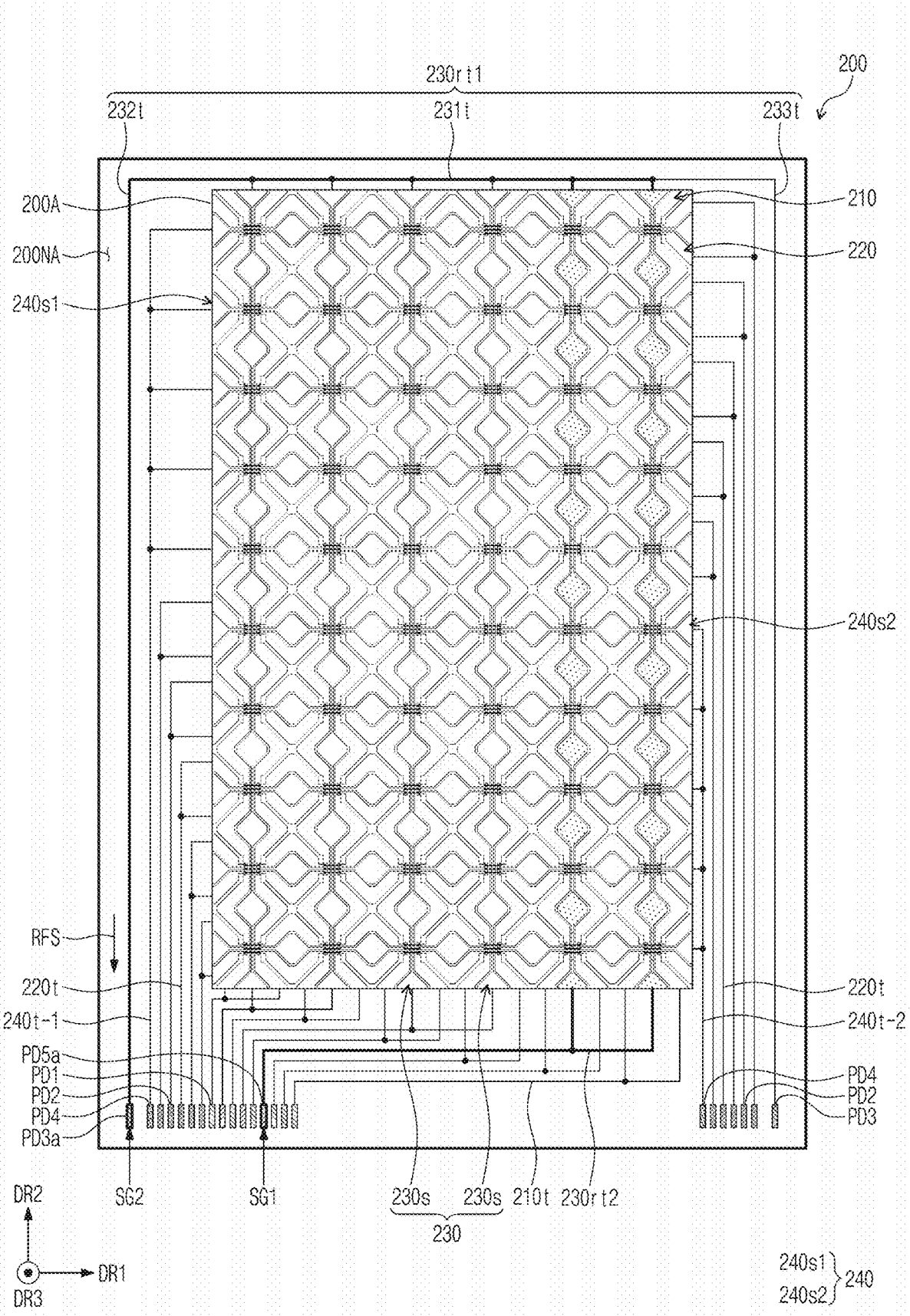
FIG. 20 is a diagram illustrating a second mode according to an embodiment of the present disclosure.
Figure 21C:
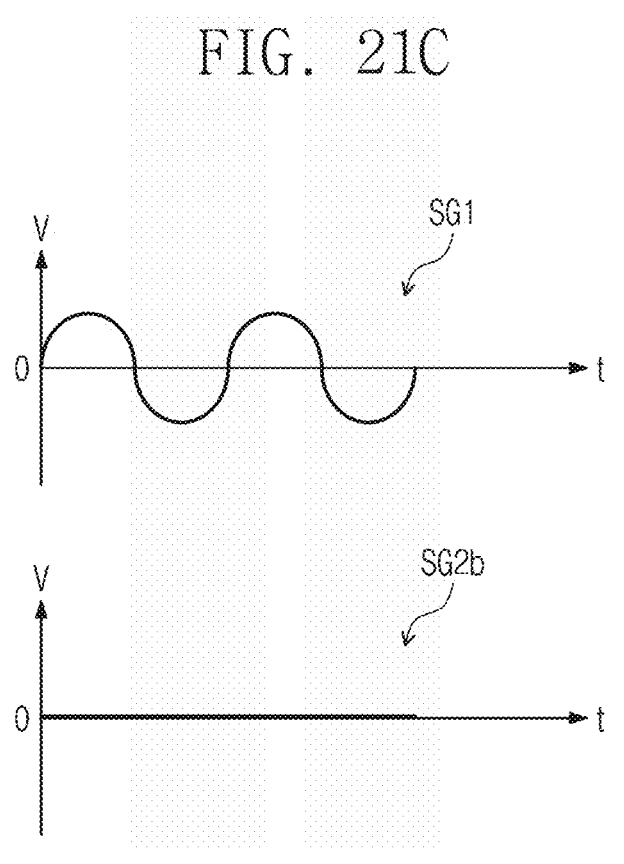

FIG. 20 is a diagram illustrating a second mode according to an embodiment of the present disclosure. FIG. 21A illustrates graphs of waveforms of a first signal and a second signal according to an embodiment of the present disclosure. FIG. 21B illustrates graphs of waveforms of a first signal and a second signal according to an embodiment of the present disclosure. FIG. 21C illustrates graphs of waveforms of a first signal and a second signal according to an embodiment of the present disclosure.

Referring to FIGS. 17 and 20, the second mode MD2 may include a charging driving mode and a pen sensing driving mode. The charging driving mode may include a searching charging driving mode and a tracking charging driving mode. FIG. 20 illustrates the searching charging driving mode.

Referring to FIGS. 17, 20, and 21A, in the charging driving mode, the sensor driver 200C may apply a first signal SG1 to at least one of the third pads PD3 and/or the fifth pads PD5, and may apply a second signal SG2 to at least another thereof. A phase of the second signal SG2 may be opposite to a phase of the first signal SG1. For example, the first signal SG1 may be a sinusoidal signal.

An example in which the first signal SG1 is applied to one pad and the second signal SG2 is applied to another pad is illustrated in FIG. 20, but the present disclosure is not limited thereto. For example, the first signal SG1 may be applied to two or more pads, and the second signal SG2 may be applied to two or more other pads.

Because the first signal SG1 and the second signal SG2 are applied to at least two pads, respectively, there may be formed a current path in which a current RFS flows from at least one pad through at least another pad. Also, because the first signal SG1 and the second signal SG2 are sinusoidal signals having phases that are opposite from each other, a direction of the current RFS may periodically change.

Referring to FIGS. 20 and 21B, each of a first signal SG1a and a second signal SG2a may be a square wave signal. A phase of the second signal SG2a may be opposite to a phase of the first signal SG1a. Because the first signal SG1a and the second signal SG2a are applied to at least two pads, there may be formed a current path in which a current RFS flows from at least one pad through at least another pad. Also, because the first signal SG1a and the second signal SG2 are square wave signals having phases that are opposite to each other, a direction of the current RFS may periodically change.

In FIGS. 21A and 21B, the first signal SG1 or SG1a has an opposite phase relationship with the second signal SG2 or SG2a. Accordingly, the noise caused in the display layer 100 (e.g., refer to FIG. 6) by the first signal SG1 or SG1a may be canceled out by the noise caused by the second signal SG2 or SG2a, and vice versa. Accordingly, a flicker phenomenon may not occur in the display layer 100. As such, a display quality of the display layer 100 may be improved.

Referring to FIGS. 20 and 21C, the first signal SG1 may be a sinusoidal signal. However, the present disclosure is not limited thereto. For example, the first signal SG1 may be a square wave signal. A second signal SG2b may have a constant or substantially constant voltage V (e.g., a given or predetermined constant voltage). For example, the second signal SG2b may have a ground voltage. In other words, a pad to which the second signal SG2b is applied may be regarded as being grounded (e.g., being coupled to ground). Even in this case, the current RFS may flow from at least one pad to at least another pad. Also, even though at least another pad is grounded, because the first signal SG1 is a sinusoidal signal or a square wave signal, a direction of the current RFS may periodically change.

Referring again to FIG. 20, an example in which the second signal SG2 is provided to one third pad PD3a connected to one third trace line 230rt1, and the first signal SG1 is applied to one fifth pad PD5a connected to the third electrode 230, is illustrated. The current RFS may flow through a current path defined by the fifth pad PD5a, a fifth trace line 230rt2 connected to the fifth pad PD5a, the third electrode 230, a portion of the third trace line 230rt1 connected to the third pad PD3a, and the third pad PD3a. The current path may be in the shape of a coil. Accordingly, in the charging driving mode of the second mode MD2, the resonant circuit of the pen PN may be charged by the current path.

According to one or more embodiments of the present disclosure, a current path of a loop coil pattern may be implemented by the components included in the sensor layer 200. Accordingly, the electronic device 1000 (e.g., refer to FIG. 1A) may charge the pen PN by using the sensor layer 200. In other words, because a configuration having a coil for charging the pen PN may not be separately included, an increase in the thickness of the electronic device 1000, an increase in the weight of the electronic device 1000, and a decrease in the flexibility of the electronic device 1000 may not occur.

In the charging driving mode, the first electrodes 210, the second electrodes 220, and the fourth electrodes 240 may be grounded, may be provided with a constant or substantially constant voltage, or may be electrically floated. For example, the first electrodes 210, the second electrodes 220, and the fourth electrodes 240 may be floated. In this case, the current RFS may not flow to the first electrodes 210, the second electrodes 220, and the fourth electrodes 240.

FIG. 22A illustrates a table of signals provided to a sensor layer according to an embodiment of the present disclosure.

Referring to FIGS. 7, 20, 21A, and 22A, the table illustrated in FIG. 22A shows signals provided to pads connected to the second line portion 232t, first to tenth charging channels 230ch1, 230ch2, 230ch3, 230ch4, 230ch5, 230ch6, 230ch7, 230ch8, 230ch9, and 230ch10 (hereinafter referred to as "230ch1 to 230ch10"), and the third line portion 233t or states of the pads, in first to ninth time periods t1, t2, t3, t4, t5, t6, t7, t7, and t9. The first to tenth charging channels 230ch1 to 230ch10 may be referred to as "first to tenth channels", "ten third electrode channels", or "ten third channels".

The first to tenth charging channels 230ch1 to 230ch10 may correspond to the third electrodes 230, respectively. Three third electrodes 230 are illustrated in FIG. 20 as an example, but the sensor layer 200 may include three or more third electrodes 230. Accordingly, the first to tenth charging channels 230ch1 to 230ch10 may correspond to ten third electrodes 230, respectively.

The signals shown in the table of FIG. 22A are signals provided to the sensor layer 200 in the searching charging driving mode. Accordingly, because there is a state where a position of the pen PN is not sensed, the first signal SG1 or the second signal SG2 may be provided to all of the channels included in the sensor layer 200. In other words, the entire area of the sensor layer 200 may be scanned in the searching charging driving mode.

In the second mode MD2, the charging driving mode and the pen sensing driving mode (e.g., refer to FIG. 27A) may be alternately repeated. For example, during the first time period t1, the sensor layer 200 may operate in the charging driving mode, and may then operate in the pen sensing driving mode. When the pen is not sensed, during the second time period t2, the sensor layer 200 may again operate in the charging driving mode. As another example, when the pen is sensed, the sensor layer 200 may operate in the tracking charging driving mode, which will be described in more detail below with reference to FIGS. 23, 24A, and 24B.

In the first time period t1, the second signal SG2 may be provided to the second line portion 232t, and the first signal SG1 may be provided to the third charging channel 230ch3 and the fourth charging channel 230ch4. The third line portion 233t and the other remaining charging channels 230ch1, 230ch2, 230ch5, 230ch6, 230ch7, 230ch8, 230ch9, and 230ch10 to which the first signal SG1 and the second signal SG2 are not provided may be floated (e.g., refer to "FL" in the drawings).

In the second time period t2, the second signal SG2 may be provided to the second line portion 232t and the first charging channel 230ch1, and the first signal SG1 may be provided to the fourth charging channel 230ch4 and the fifth charging channel 230ch5. Afterwards, in the third to ninth time periods t3, t4, t5, t6, t7, t8, and t9, the second signal SG2 and the first signal SG1 may be provided while being shifted by as much as one channel for each time period.

In an embodiment of the present disclosure, in the remaining time periods other than the first time period t1 where the second signal SG2 is provided to the second line portion 232t and the ninth time period t9 where the first signal SG1 is provided to the third line portion 233t, the first signal SG1 may be provided to two channels, and the second signal SG2 may be provided to two channels. When the same signal is provided to a plurality of channels, the resistance may be effectively reduced. In other words, as the resistance is reduced, the power consumption of the sensor layer 200 may be reduced.

However, the number of channels to which the first signal SG1 and the second signal SG2 are provided is not limited to that described above. For example, the first signal SG1 may be provided to one channel, and the second signal SG2 may be provided to another channel. As another example, the first signal SG1 may be provided to three or more channels, and the second signal SG2 may be provided to three or more other channels.

In an embodiment of the present disclosure, the first and second charging channels 230ch1 and 230ch2 between the second line portion 232t and the third charging channel 230ch3 are illustrated as being floated in the first time period t1. In other words, an example in which two floated channels (hereinafter referred to as "gap channels") are present between a channel to which the first signal SG1 is provided and a channel to which the second signal SG2 is provided is illustrated. As the number of gap channels increases, the strength of the magnetic field formed by the current RFS may increase. Accordingly, the number of gap channels may be changed depending on a usage condition of the electronic device 1000 (e.g., refer to FIG. 1A) or a kind of a pen.

FIG. 22B illustrates a table of signals provided to a sensor layer according to an embodiment of the present disclosure.

Referring to FIGS. 20, 21A, and 22B, in the first time period t1, the second signal SG2 may be provided to the second line portion 232t and the first charging channel 230ch1, and the first signal SG1 may be provided to fourth charging channel 230ch4 and the fifth charging channel 230ch5. The third line portion 233t and the other remaining charging channels 230ch2, 230ch3, 230ch6, 230ch7, 230ch8, 230ch9, and 230ch10 to which the first signal SG1 and the second signal SG2 are not provided may be floated (e.g., refer to "FL" in drawings). Afterwards, in the second to seventh time periods t2, t3, t4, t5, t6, and t7, the second signal SG2 and the first signal SG1 may be provided while being shifted by as much as one channel for each time period.

Compared to the driving operation illustrated in FIG. 22A, the driving operation illustrated in FIG. 22B may not include the operation in which the first signal SG1 is provided only to the third line portion 233t and the operation in which the second signal SG2 is provided only to the second line portion 232t. Accordingly, the entire area of the sensor layer 200 may be scanned in the first to seventh time periods t1, t2, t3, t4, t5, t6, and t7. In other words, compared to the embodiment described above with reference to FIG. 22A, according to the embodiment described with reference to FIG. 22B, the entire area of the sensor layer 200 may be scanned during a relatively shorter time.

Figure 23:
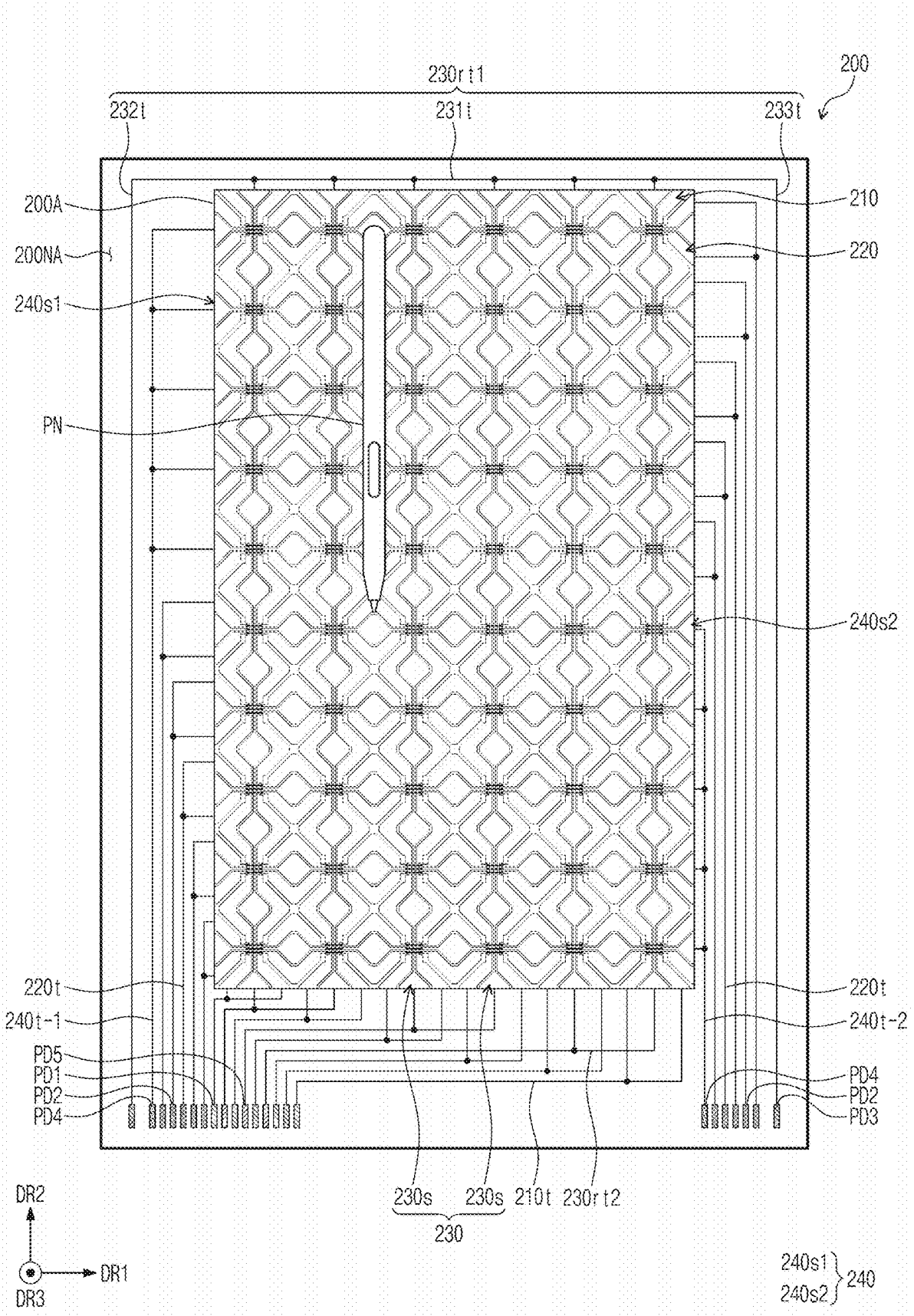
FIG. 23 is a diagram illustrating a second mode according to an embodiment of the present disclosure.

FIG. 23 is a diagram illustrating a second mode according to an embodiment of the present disclosure. FIG. 23 illustrates the tracking charging driving mode of the second mode MD2.

Referring to FIGS. 17 and 23, when the pen PN is sensed in the searching charging driving mode, the sensor layer 200 may operate in the tracking charging driving mode. For example, in the tracking charging driving mode, the sensor driver 200C may sequentially output the first signal SG1 and the second signal SG2 to an area overlapping with a point where the pen PN is sensed, but not to the entire area of the sensor layer 200.

FIG. 24A illustrates a table of signals provided to a sensor layer according to an embodiment of the present disclosure.

Referring to FIGS. 23 and 24A, a position PN-dt of the pen PN sensed in a previous frame is illustrated. An example in which the pen PN is sensed in an area overlapping with the fifth charging channel 230ch5 and the sixth charging channel 230ch6 is illustrated in FIG. 24A. In this case, the sensor driver 200C may provide the first signal SG1 and the second signal SG2 to channels forming a loop that overlaps with the fifth charging channel 230ch5 and the sixth charging channel 230ch6.

In an embodiment of the present disclosure, the sensor driver 200C may provide the first signal SG1 and the second signal SG2 to areas that are left-shifted and right-shifted by as much as one channel with respect to a center loop surrounding (e.g., around a periphery of) the position PN-dt of the pen PN in the previous frame. The center loop may be provided (e.g., formed) by the third and fourth charging channels 230ch3 and 230ch4 and the seventh and eighth charging channels 230ch7 and 230ch8 in the second time period t2 illustrated in FIG. 24A.

In the first time period t1, the second signal SG2 may be provided to the second charging channel 230ch2 and the third charging channel 230ch3, and the first signal SG1 may be provided to the sixth charging channel 230ch6 and the seventh charging channel 230ch7. In the second time period t2, the second signal SG2 may be provided to the third charging channel 230ch3 and the fourth charging channel 230ch4, and the first signal SG1 may be provided to the seventh charging channel 230ch7 and the eighth charging channel 230ch8. In the third time period t3, the second signal SG2 may be provided to the fourth charging channel 230ch4 and the fifth charging channel 230ch5, and the first signal SG1 may be provided to the eighth charging channel 230ch8 and the ninth charging channel 230ch9.

Accordingly, after the position PN-dt of the pen PN is sensed, the channels that correspond to the position PN-dt of the pen PN in the immediately previous frame and are driven in the charging driving mode may be limited. Accordingly, the channels that overlap with an area where a pen is not located may not be driven in the charging driving mode. As such, the efficiency of charging driving may be improved.

FIG. 24B illustrates a table of signals provided to a sensor layer according to an embodiment of the present disclosure.

Referring to FIGS. 23 and 24B, the position PN-dt of the pen PN sensed in the previous frame is illustrated. An example in which the pen PN is sensed in an area overlapping with the fifth charging channel 230ch5 and the sixth charging channel 230ch6 is illustrated. In this case, the sensor driver 200C may provide the first signal SG1 and the second signal SG2 to the channels forming a loop that overlaps with the fifth charging channel 230ch5 and the sixth charging channel 230ch6. For example, the sensor driver 200C may provide the first signal SG1 and the second signal SG2 to areas that are left-shifted and right-shifted by as much as two channels with respect to a center loop surrounding (e.g., around a periphery of) the position PN-dt of the pen PN in the previous frame.

An example in which three loop coils including a center loop are sequentially formed in the tracking charging driving mode has been described above with reference to FIG. 24A, and an example in which five loop coils including a center loop are sequentially formed in the tracking charging driving mode has been described with reference to FIG. 24B. However, the present disclosure is not limited thereto. For example, the number of loop coils that are sequentially formed in the tracking charging driving mode may be variously modified as needed or desired.

Figure 25A:
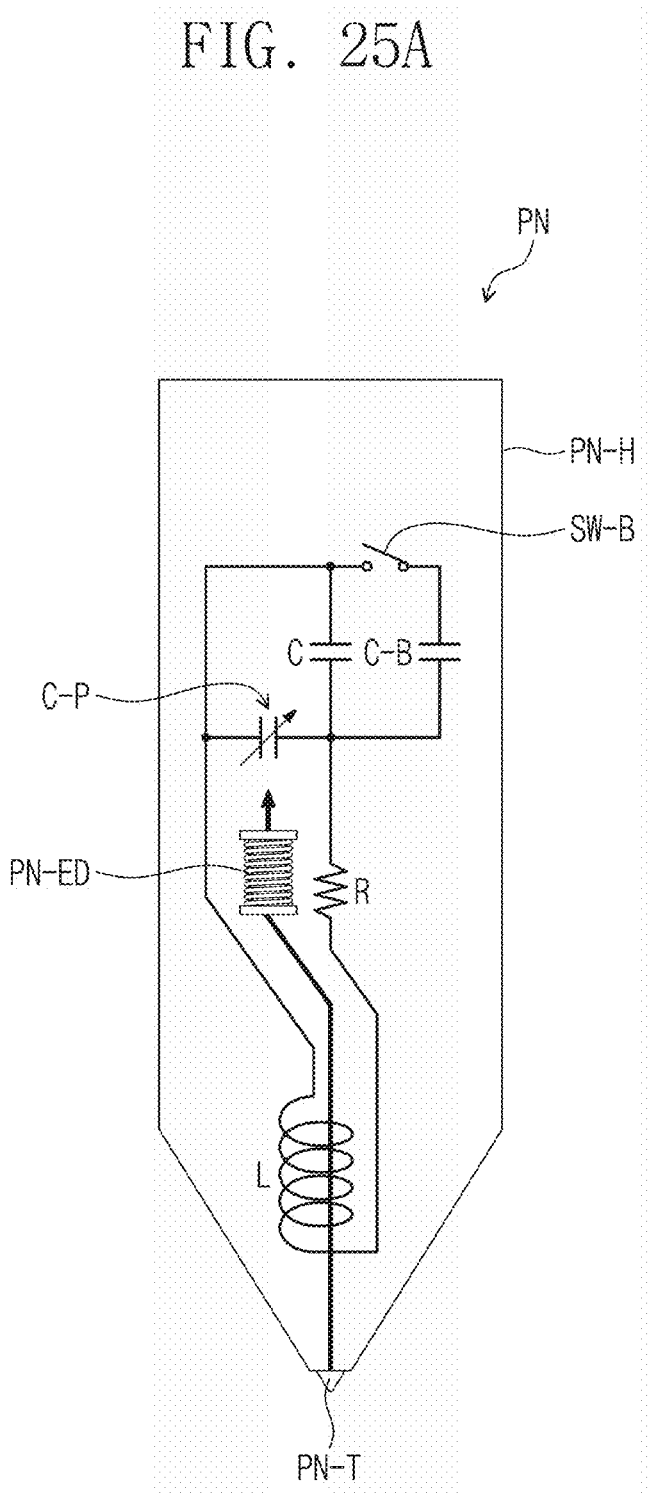
FIG. 25A is a diagram illustrating a pen according to an embodiment of the present disclosure.

FIG. 25A is a diagram illustrating the pen PN according to an embodiment of the present disclosure.

Referring to FIG. 25A, the pen PN may include a housing PN-H, a pen tip PN-T, the inductor "L", the capacitor "C", a resistor "R", an elastic body PN-ED, a pressure capacitor C-P, a switch SW-B, and a button capacitor C-B. The pen PN may not include an active element, such as a power supply, a transistor, or a diode, except for the switch SW-B connected to the button capacitor C-B. The components that are included in the pen PN are not limited to the above described components. At least some of the above described components may be omitted as needed or desired, and any other suitable components may be further included in the pen PN.

In an embodiment of the present disclosure, the pen tip PN-T may include a non-conductive material. The pen tip PN-T may be implemented to protrude to the outside of the housing PN-H. The pen tip PN-T may be connected to (e.g., attached to or coupled to) the housing PN-H in a removable manner (e.g., to be removed from the housing PN-H), and may be a component capable of being replaced.

In an embodiment of the present disclosure, the resistor "R", the inductor "L", and the capacitor "C" may be connected in series. Accordingly, the pen PN may be implemented to have a resonant frequency and a selectivity as characteristics of the RLC serial circuit. In this case, a frequency of signals that are provided to the sensor layer 200 when the sensor layer 200 is driven in the charging driving mode may correspond to the resonant frequency of the pen PN. The capacitor "C", the pressure capacitor C-P, and the button capacitor C-B may be connected in parallel with each other. For example, the button capacitor C-B may be connected in parallel with the capacitor "C" when the switch SW-B is turned on.

In an embodiment of the present disclosure, as the switch SW-B is turned on and turned off, the button capacitor C-B may be electrically connected to or disconnected from the capacitor "C". In other words, the pen PN may be implemented to react to any other suitable resonant frequency by turning on and turning off the switch SW-B. For example, a button may be provided on an outer surface of the housing PN-H. When the button is pushed or pressed, the switch SW-B may be turned on, and the button capacitor C-B may be electrically connected to the capacitor "C". In this case, the entire capacitance of the pen PN may be increased.

In an embodiment of the present disclosure, the capacitor "C" may be implemented by cutting some of a plurality of capacitors that are connected in parallel. For example, to set a target resonant frequency in the process of manufacturing the pen PN, the capacitor "C" of the pen PN may be tuned by cutting some of the plurality of capacitors.

In an embodiment of the present disclosure, when a portion of the pen tip PN-T is inserted into the housing PN-H by a pen pressure, the area, the distance, or the area and distance, which form the capacitance of the pressure capacitor C-P, may be changed. Accordingly, the capacitance of the pressure capacitor C-P may be variable. For example, when the pen pressure is applied to the pen PN, the capacitance of the pressure capacitor C-P may increase. In this case, the resonant frequency of the pen PN may decrease due to the increased capacitance. Afterwards, when the pen pressure is released, the capacitance of the pressure capacitor C-P may be again be restored to an original state by the elastic body PN-ED.

Figure 25B:
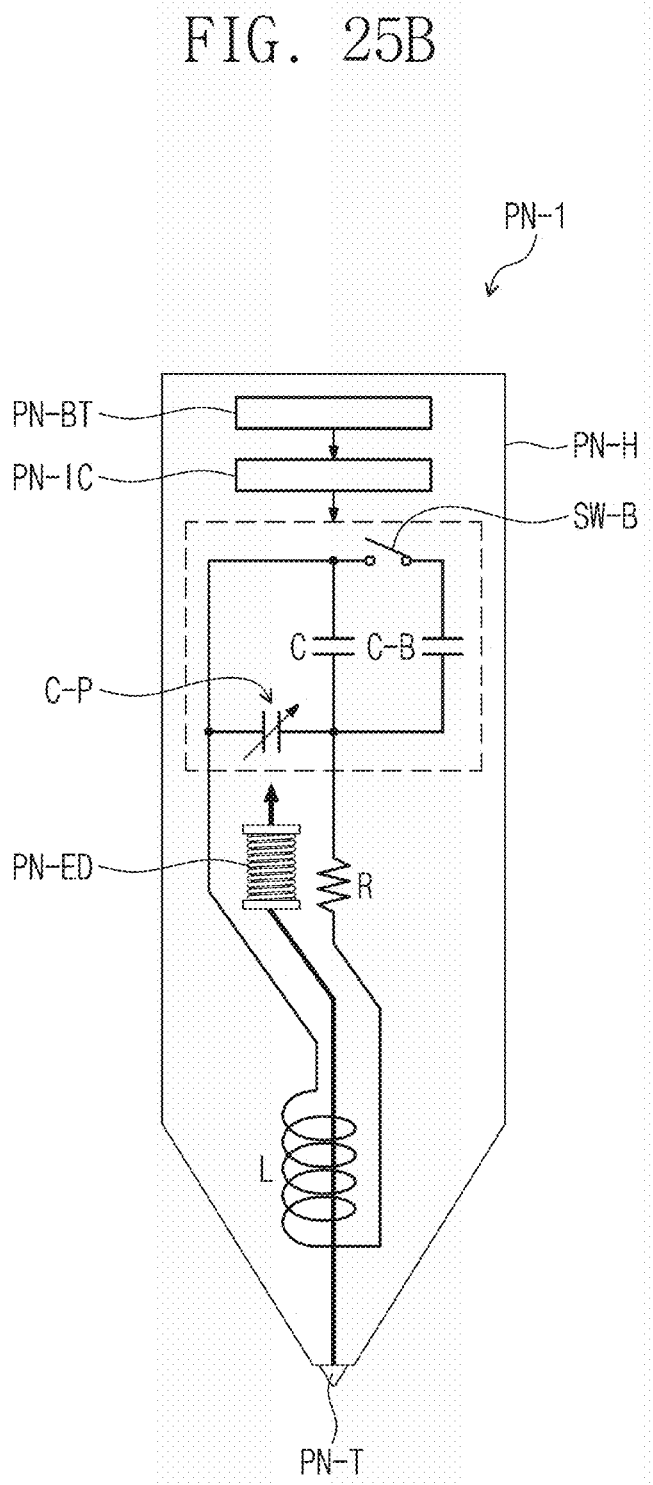
FIG. 25B is a diagram illustrating a pen according to an embodiment of the present disclosure.

FIG. 25B is a diagram illustrating a pen PN-1 according to an embodiment of the present disclosure. In FIG. 25B, the components that are the same or substantially the same as those described above with reference to FIG. 25A are denoted by the same reference numerals/signs, and thus, redundant description may not be repeated.

Compared to the pen PN illustrated in FIG. 25A, the pen PN-1 illustrated in FIG. 25B may further include a power supply unit (e.g., a power supply) PN-BT and a control unit (e.g., a controller) PN-IC. The power supply unit PN-BT may include a battery or a high-capacity capacitor. The control unit PN-IC may be supplied with power from the power supply unit PN-BT, and may adjust a frequency of a signal to be output from the pen PN-1. For example, in some embodiments, the control unit PN-IC may be implemented as an integrated circuit (IC).

According to an embodiment of the present disclosure, because the pen PN-includes the RLC resonant circuit, the power supply unit PN-BT, and the control unit PN-IC, the pen PN-1 may operate as an active-type pen as well as a passive-type pen. Accordingly, even though a magnetic field may not be provided from the sensor layer 200, the pen PN-1 may form a magnetic field. As such, the sensor layer 200 may be capable of sensing an input by the pen PN-1 outputting the magnetic field, without the charging mode in which the magnetic field is formed. When the pen PN-1 described above with reference to FIG. 25B is implemented, the fifth trace lines 230rt2 and the fifth pads PD5 described above with reference to FIG. 9 may be omitted.

Figure 25C:
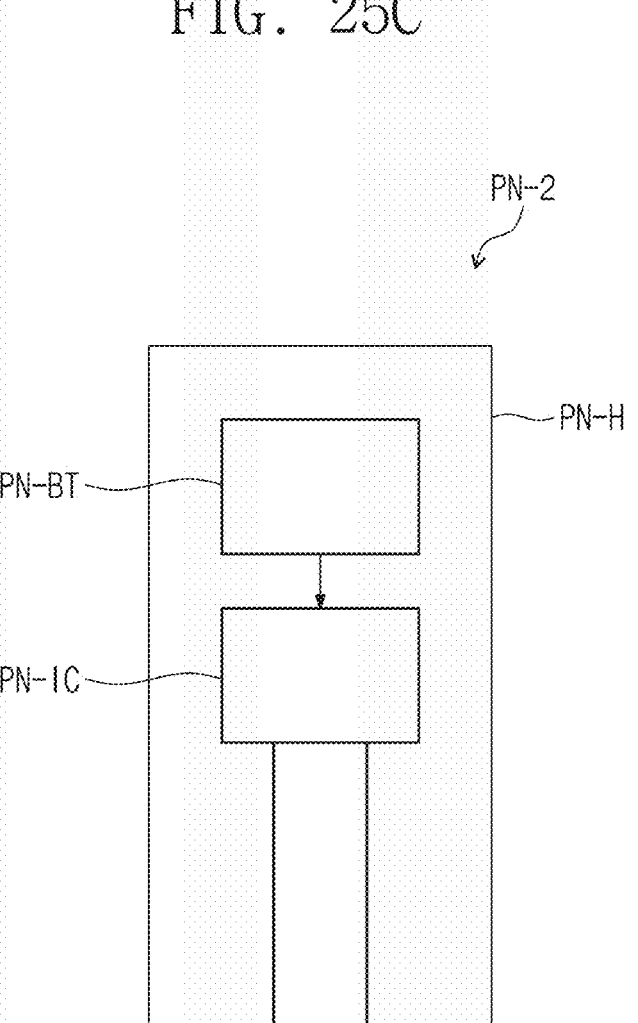
FIG. 25C is a diagram illustrating a pen according to an embodiment of the present disclosure.

FIG. 25C is a diagram illustrating a pen PN-2 according to an embodiment of the present disclosure.

Referring to FIG. 25C, the pen PN-2 may not include the RLC resonant circuit. For example, the pen PN-2 may include the housing PN-H, the inductor "L", the power supply unit PN-BT, and the control unit PN-IC. The power supply unit PN-BT may include a battery or a high-capacity capacitor. The control unit PN-IC may be supplied with power from the power supply unit PN-BT, and may adjust a frequency of a signal to be output from the pen PN-2. For example, in some embodiments, the control unit PN-IC may be implemented as an integrated circuit (IC).

According to an embodiment of the present disclosure, the pen PN-2 may operate as an active-type pen. Accordingly, even though a magnetic field may not be provided from the sensor layer 200, the pen PN-2 may form a magnetic field. When the pen PN-2 described above with reference to FIG. 25C is implemented, the fifth trace lines 230rt2 and the fifth pads PD5 described above with reference to FIG. 9 may be omitted.

FIG. 26A is a diagram illustrating an operation of a pen according to an embodiment of the present disclosure. FIG. 26B is a diagram illustrating an operation of a pen according to an embodiment of the present disclosure.

Referring to FIGS. 20, 25A, 26A, and 26B, the second mode MD2 may include a charging period MD2-ch and a discharging period MD2-dc. The charging period MD2-ch may correspond to the charging driving mode, and the discharging period MD2-dc may correspond to the pen sensing driving mode.

During the first time period t1 (e.g., refer to FIG. 22A), the first signal SG1 and the second signal SG2 may be provided to the sensor layer 200. The first time period t1 may correspond to one charging period MD2-ch.

During the first time period t1, the pen PN that is close to the sensor layer 200 may be charged. For example, the inductor "L" generates a current based on the magnetic field formed in the sensor layer 200. The generated current is transferred to the capacitor "C". The capacitor "C" charges the current from the inductor "L". Afterwards, the capacitor "C" may discharge the charged current to the inductor "L", and the inductor "L" may form a magnetic field of a resonant frequency. A time period where the magnetic field is formed in the pen PN may correspond to the discharging period MD2-dc. The induced current may flow in the sensor layer 200 by the magnetic field formed by the pen PN, and the induced current may be transferred to the sensor driver 200C as a receive signal (e.g., a sensing signal or a signal).

In an embodiment of the present disclosure, a charging driving voltage of the sensor layer 200 may be of a sinusoidal wave or a square wave, and an example where the charging driving voltage is of a sinusoidal wave is illustrated in FIG. 26B. A voltage charged in the pen PN or a voltage discharged from the pen PN may be of a sinusoidal wave.

Figure 27A:
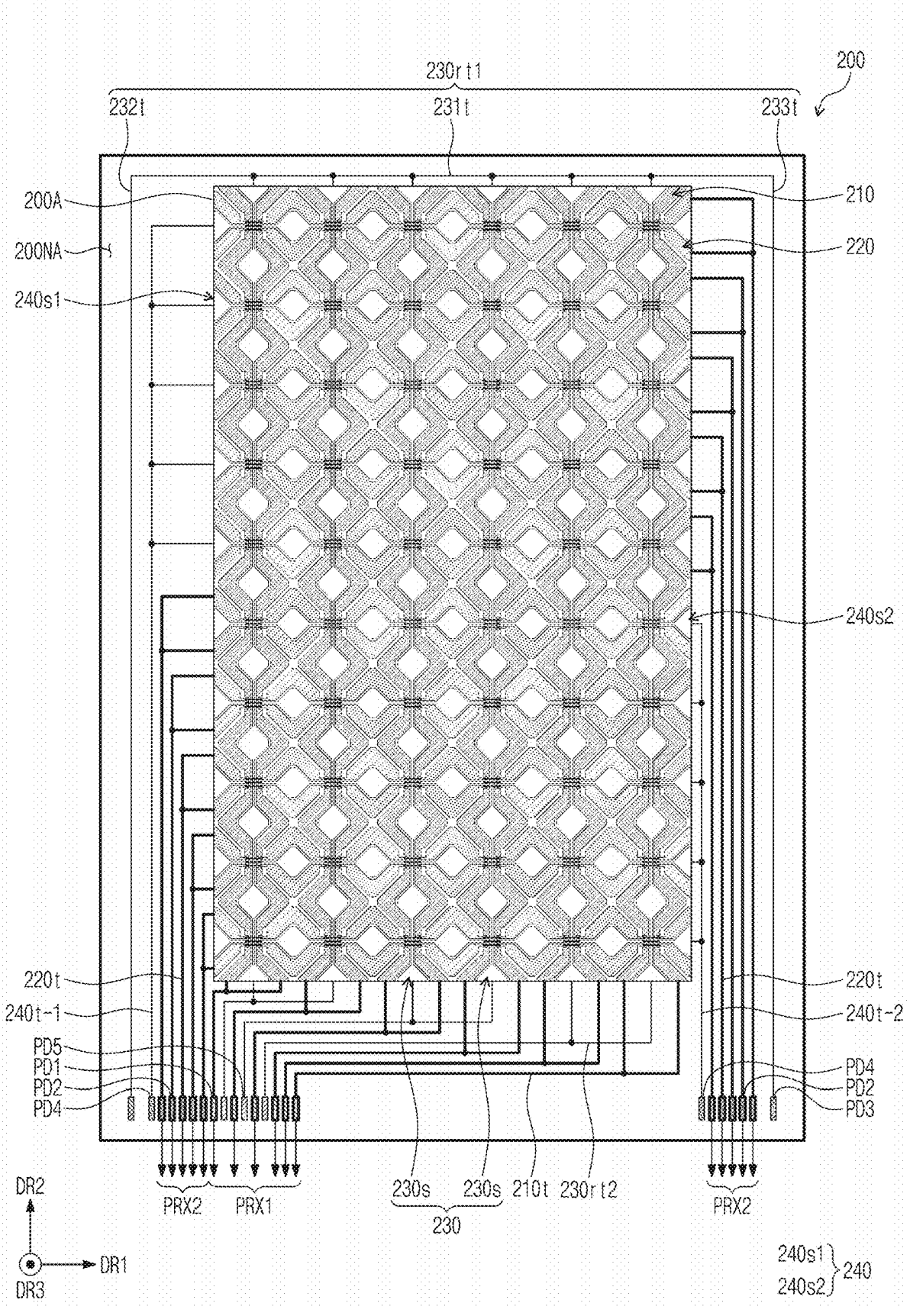
FIG. 27A is a diagram illustrating a second mode according to an embodiment of the present disclosure.
Figure 27B:
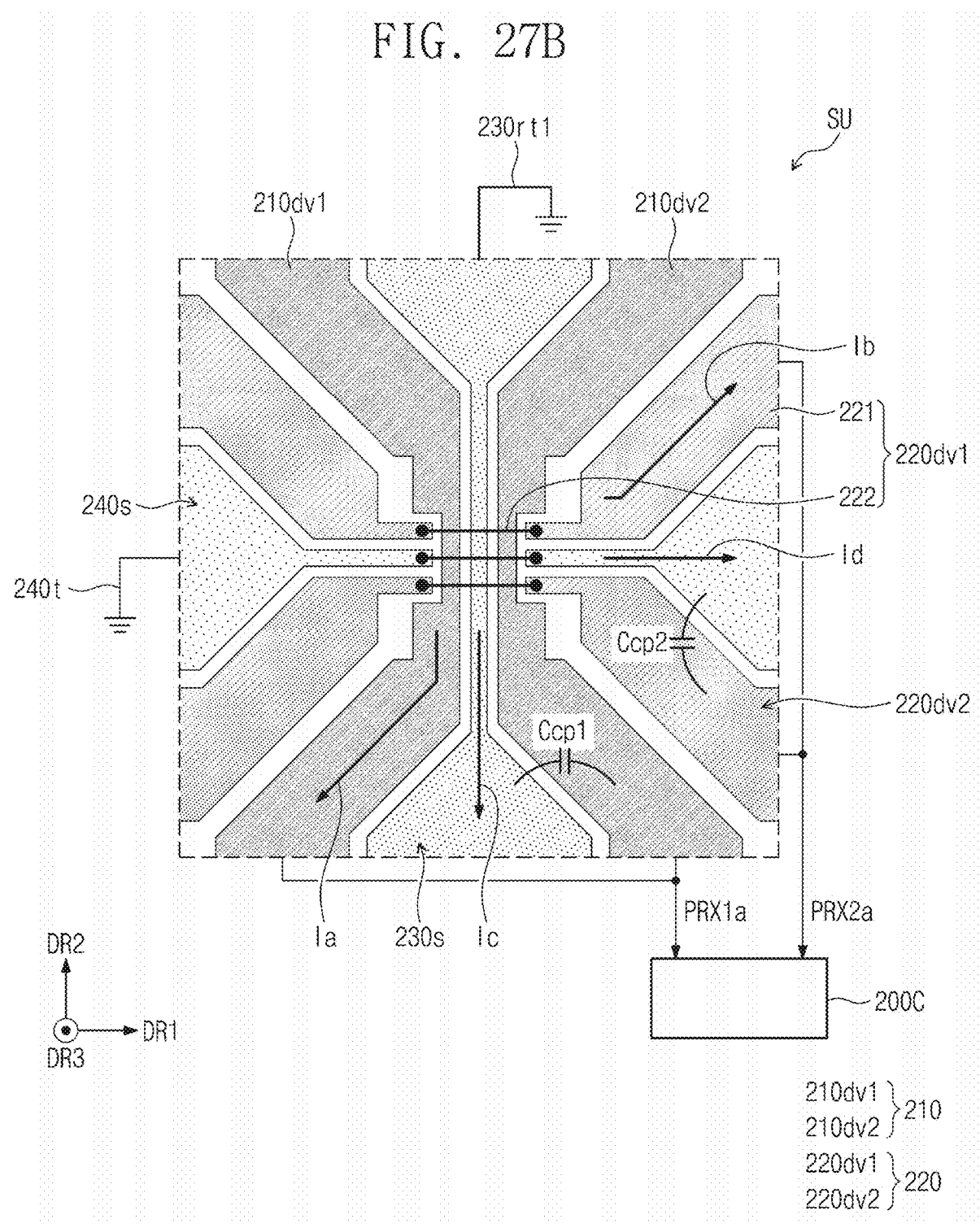
FIG. 27B is a diagram illustrating a second mode based on a sensing unit according to an embodiment of the present disclosure.

FIG. 27A is a diagram illustrating a second mode according to an embodiment of the present disclosure. FIG. 27B is a diagram illustrating a second mode based on a sensing unit SU according to an embodiment of the present disclosure.

Referring to FIGS. 27A and 27B, the second mode may include the charging driving mode and the pen sensing driving mode. FIGS. 27A and 27B illustrate the pen sensing driving mode. One sensing unit SU in which first to fourth induced currents Ia, Ib, Ic, and Id are generated by the pen PN flow is illustrated in FIG. 27B.

In the pen sensing driving mode, the sensor driver 200C may receive first receive signals PRX1 from first electrodes 210 and second receive signals PRX2 from second electrodes 220.

The RLC resonant circuit of the pen PN may form a magnetic field of a resonant frequency while discharging the charged charges. The first induced current Ia may be generated in the first electrode 210 by the magnetic field formed in the pen PN, and the second induced current Ib may be generated in the second electrode 220 by the magnetic field. Also, the third induced current Ic may be generated in the first auxiliary electrode 230s of the third electrode 230 by the magnetic field, and the fourth induced current Id may be generated in the second auxiliary electrode 240s of the fourth electrode 240 by the magnetic field.

A first coupling capacitor Ccp1 may be formed between the first auxiliary electrode 230s and the first electrode 210, and a second coupling capacitor Ccp2 may be formed between the second auxiliary electrode 240s and the second electrode 220. The third induced current Ic may be transferred to the first electrode 210 through the first coupling capacitor Ccp1, and the fourth induced current Id may be transferred to the second electrode 220 through the second coupling capacitor Ccp2.

The sensor driver 200C may receive a first receive signal PRX1a, which is based on the first induced current Ia and the third induced current Ic, from the first electrode 210, and may receive a second receive signal PRX2a, which is based on the second induced current Ib and the fourth induced current Id, from the second electrode 220. The sensor driver 200C may detect input coordinates of the pen PN based on the first receive signal PRX1a and the second receive signal PRX2a.

The sensor driver 200C may receive the first receive signal PRX1a from the first electrodes 210, and may receive the second receive signal PRX2a from the second electrodes 220. In this case, first ends of the third electrodes 230 and the fourth electrodes 240 may be floated. Accordingly, a sensing signal may be maximally compensated for by the coupling between the first electrodes 210 and the third electrodes 230, and the coupling between the second electrodes 220 and the fourth electrodes 240. Also, second ends of the third electrodes 230 and the fourth electrodes 240 may be grounded or floated. Accordingly, the third induced current Ic and the fourth induced current Id may be sufficiently transferred to the first electrodes 210 and the second electrodes 220 by the coupling between the first electrodes 210 and the third electrodes 230, and the coupling between the second electrodes 220 and the fourth electrodes 240.

In an embodiment of the present disclosure, routing directions of an electrode and an auxiliary electrode of the sensor layer 200, which overlap with each other, may be different from each other. For example, a routing direction of the first electrode 210 and a routing direction of the first auxiliary electrode 230s may be different from each other. Also, a routing direction of the second electrode 220 and a routing direction of the second auxiliary electrode 240s may be different from each other. For example, in FIG. 27B, the first electrode 210 and the first trace line 210t may be connected to each other at (e.g., in or on) the bottom (e.g., the bottom side or edge) of the sensing unit SU, and the first auxiliary electrode 230s and the third trace line 230rt1 may be connected to each other at (e.g., in or on) the top (e.g., the top side or edge) of the sensing unit SU. The second electrode 220 and the second trace line 220t may be connected to each other at (e.g., in or on) the left (e.g., the left side or edge) of the sensing unit SU, and the second auxiliary electrode 240s and the fourth trace line 240t may be connected to each other at (e.g., in or on) the right (e.g., the right side or edge) of the sensing unit SU.

Figure 28A:
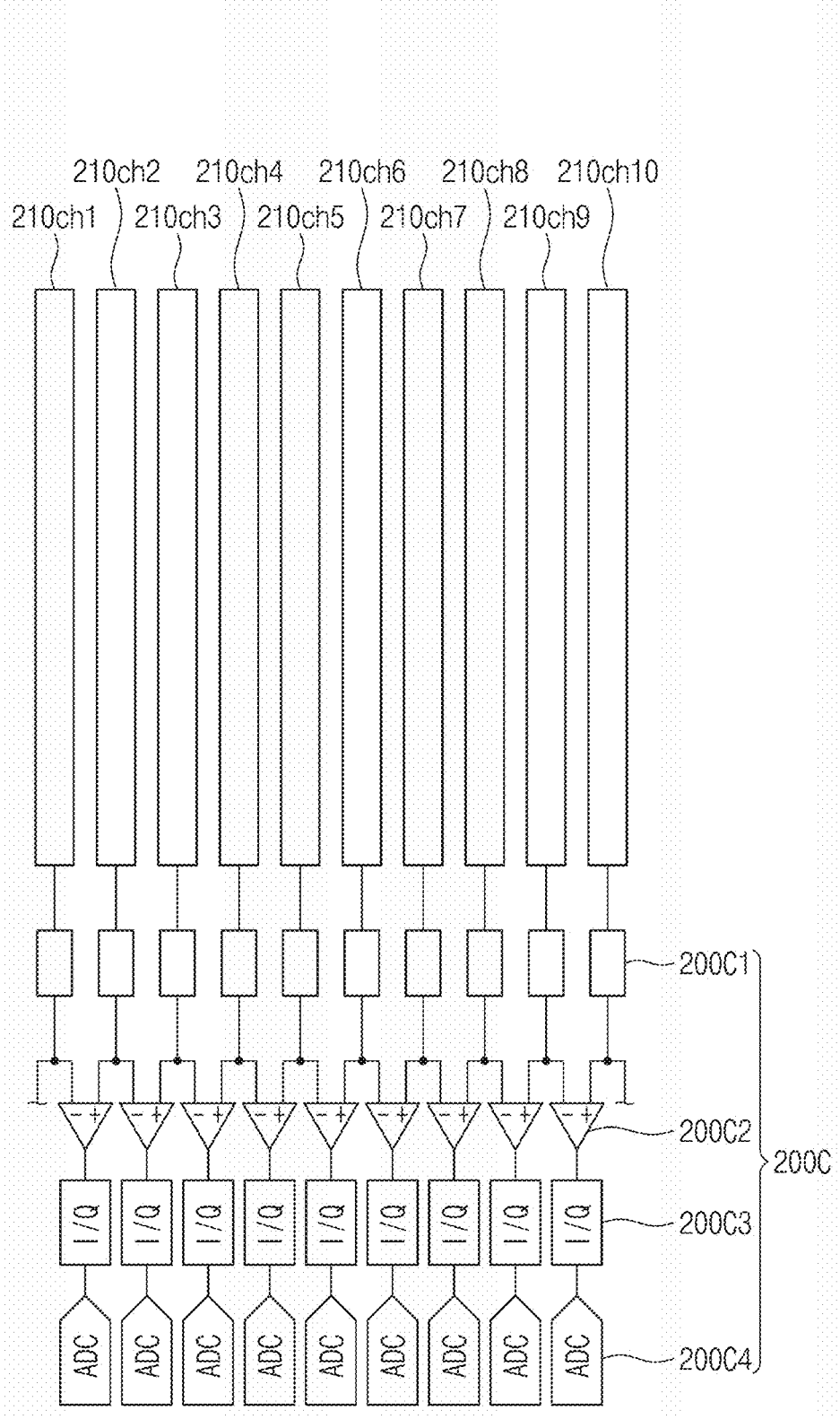
FIG. 28A is a diagram illustrating a second mode according to an embodiment of the present disclosure.

FIG. 28A is a diagram illustrating a second mode according to an embodiment of the present disclosure.

Referring to FIGS. 27A, 27B, and 28A, 10 first channels 210ch1, 210ch2, 210ch3, 210ch4, 210ch5, 210ch6, 210ch7, 210ch8, 210ch9, and 210ch10 corresponding to the first electrodes 210, respectively, are illustrated as a representative example. Second channels corresponding to the second electrodes 220, respectively, may have the same or substantially the same structure as those of the first channels.

The sensor driver 200C may include a current conveyor 200C1, a differential driver 200C2, an I/Q demodulator 200C3, and an analog-to-digital converter (ADC) 200C4.

The components that are included in the sensor driver 200C are not limited to the above described components. At least some of the above described components may be omitted as needed or desired, and any other suitable components may be further included in the sensor driver 200C.

In an embodiment of the present disclosure, one first channel may be electrically connected to an inverting terminal of the differential driver 200C2, and another first channel may be electrically connected to a non-inverting terminal of the differential driver 200C2. For example, two first channels that are adjacent to each other may be electrically connected to the same differential driver 200C2. The sensor driver 200C may output a signal corresponding to a subtraction of the signals received from the two first channels that are adjacent to each other. Accordingly, the noise included in the signals received from the two first channels may be removed.

Figure 28B:
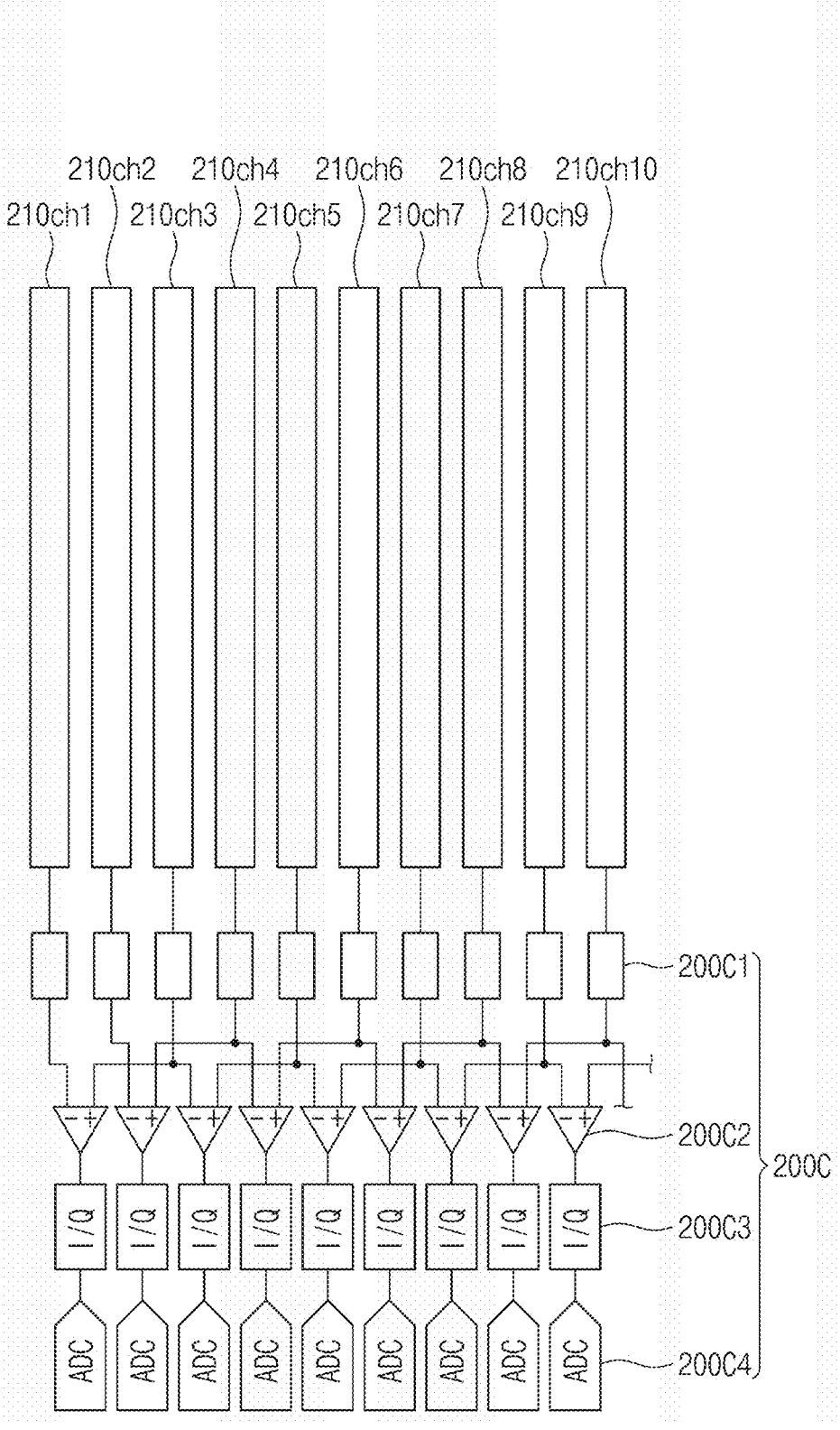
FIG. 28B is a diagram illustrating a second mode according to an embodiment of the present disclosure.

FIG. 28B is a diagram illustrating a second mode according to an embodiment of the present disclosure. In FIG. 28B, the components that are the same or substantially the same as those described above with reference to FIG. 28A are denoted by the same reference numerals/signs, and thus, redundant description may not be repeated.

Referring to FIG. 28B, one first channel may be electrically connected to the inverting terminal of the differential driver 200C2, and another first channel may be electrically connected to the non-inverting terminal of the differential driver 200C2. For example, two first channels that are spaced from each other with "x" first channels interposed therebetween may be electrically connected to the same differential driver 200C2. For example, the "x" may be an integer of 1 or more.

Figure 29:
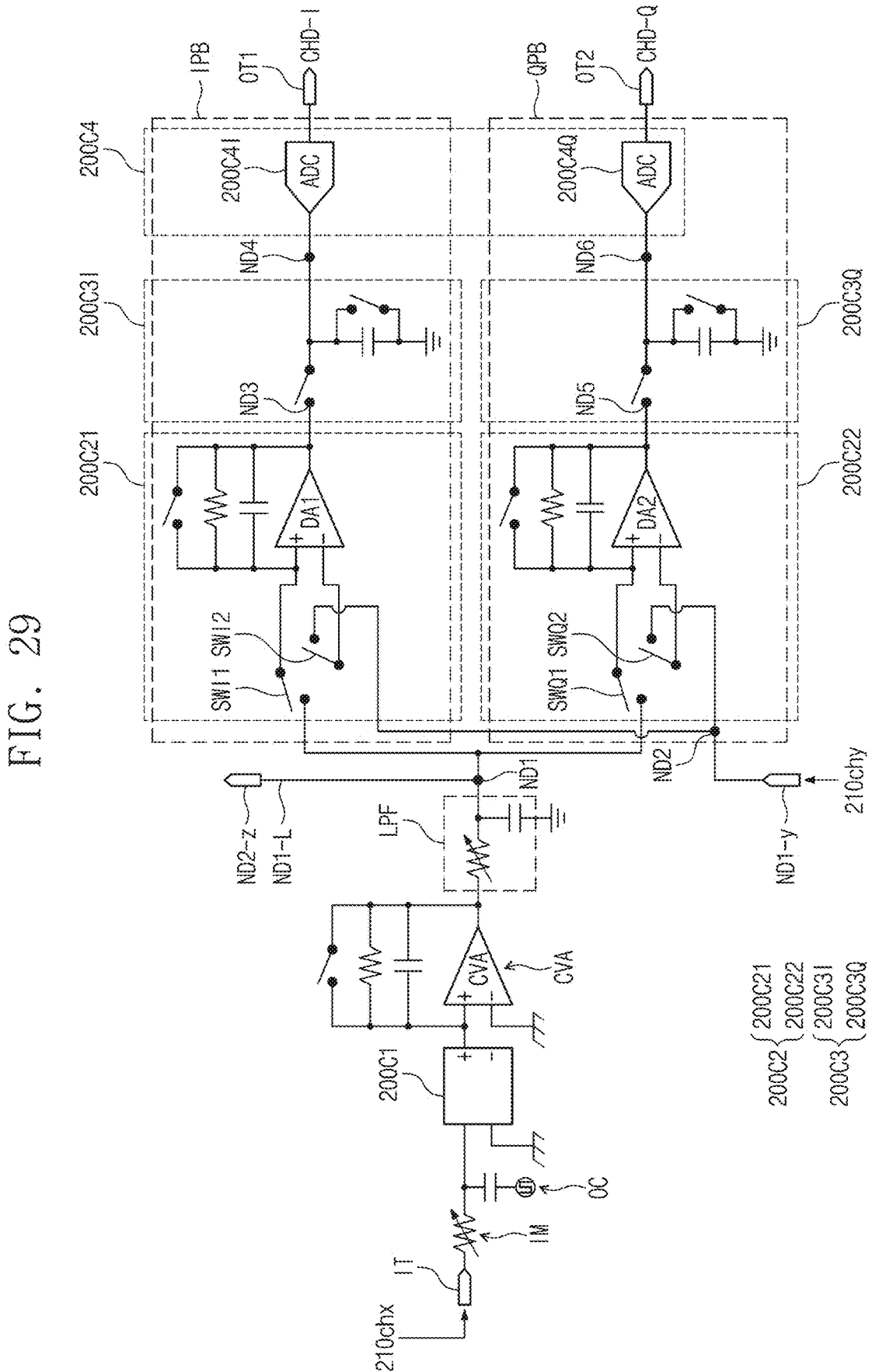
FIG. 29 is an equivalent circuit diagram of a sensor driver according to an embodiment of the present disclosure.

FIG. 29 is an equivalent circuit diagram of a sensor driver according to an embodiment of the present disclosure.

Referring to FIGS. 28A and 29, the sensor driver 200C may include an impedance matching unit (e.g., an impedance matching circuit) IM, an offset correction unit (e.g., an offset correction circuit) OC, the current conveyor 200C1, an integrator CVA, a low pass filter LPF, the differential driver 200C2, the I/Q demodulator 200C3, and the analog-to-digital converter 200C4.

One channel 210chx may be connected to an input terminal IT. The input terminal IT may correspond to one pad that is electrically connected between the sensor driver 200C and the channel 210chx. For example, the input terminal IT may be the first pad PD1 (e.g., refer to FIG. 9).

A signal received from the channel 210chx may be provided to the current conveyor 200C1 through the impedance matching unit IM and the offset correction unit OC. The current conveyor 200C1 may include a plurality of input terminals. One input terminal may receive a signal received from the channel 210chx, and the other input terminal may be supplied with a reference voltage or may be grounded.

The current conveyor 200C1 may be applied between sensor layer 200 and the integrator CVA. In other words, the load of the integrator CVA and the sensor layer 200 may be separated by the current conveyor 200C1. The current conveyor 200C1 may remove a noise component included in the signal received from the channel 210chx. Also, the current conveyor 200C1 may be provided in a plurality, and the plurality of current conveyors 200C1 may be connected to the plurality of channels, respectively.

In an embodiment of the present disclosure, the current conveyor 200C1 may invert a signal received from a channel. The current conveyor 200C1 may include a non-inverting output terminal and an inverting output terminal. For example, the current conveyors 200C1 corresponding to a differential pair may use homogeneous outputs. As another example, the current conveyors 200C1 corresponding to a differential pair connected to the channels having routing directions that are different from each other may use heterogeneous outputs.

First channels corresponding to the first electrodes 210 have the same routing direction as each other. Accordingly, the current conveyors 200C1 corresponding to a differential pair from among the current conveyors 200C1 electrically connected to the first electrodes 210 may use homogeneous outputs. Some of second channels corresponding to the second electrodes 220 may be routed on the left of the sensor layer 200, and the others thereof may be routed on the right of the sensor layer 200. For example, referring to FIG. 18A, five second electrodes 220 disposed on an upper portion of the sensor layer 200 may be routed on the right of the sensor layer 200, and five second electrodes 220 disposed on a lower portion of the sensor layer 200 may be routed on the left of the sensor layer 200. When the routing directions of the second electrodes 220 providing signals to be input to the inverting terminal and the non-inverting terminal of one differential driver 200C2 are different from each other, an output of one current conveyor 200C1 may be output from the non-inverting output terminal, and an output of another current conveyor 200C1 may be output from the inverting output terminal.

The integrator CVA may accumulate charges by the current received by the current conveyor 200C1, and may output a voltage corresponding to the accumulated charges. The integrator CVA may include a charge voltage amplifier, and a resistor, a capacitor, and a switch connected between a non-inverting terminal and an output terminal of the charge voltage amplifier. For example, the non-inverting terminal of the charge voltage amplifier may receive the signal output from the current conveyor 200C1, and the inverting terminal thereof may be supplied with a reference voltage or may be grounded.

The low pass filter LPF may be connected to the integrator CVA. The low pass filter LPF may be a passive low pass filter including (e.g., composed of) a resistor and a capacitor. The voltage from the low pass filter LPF may be provided to the differential driver 200C2. A voltage that is based on the signal provided from the channel 210chx may be transferred to a second node ND2-z of another channel through a line ND1-L connected to a first node ND1.

The differential driver 200C2 may include a first differential driver 200C21 and a second differential driver 200C22. Each of the first differential driver 200C21 and the second differential driver 200C22 may receive the voltage based on the signal provided from the channel 210chx, and a voltage based on a signal provided from a first node ND1-y electrically connected to another channel 210chy. The first node ND1-y of the channel 210chy may be connected to a second node ND2 of the channel 210chx.

The first differential driver 200C21 may include a first differential amplifier DA1, and a resistor, a capacitor, and a switch connected between a non-inverting terminal and an output terminal of the first differential amplifier DA1. The non-inverting terminal of the first differential amplifier DA1 may be connected to a first switch SWI1, and the inverting terminal of the first differential amplifier DA1 may be connected to a second switch SWI2. A connection relationship of the first and second switches SWI1 and SWI2 may be controlled based on a phase of an input signal.

The second differential driver 200C22 may include a second differential amplifier DA2, and a resistor, a capacitor, and a switch connected between a non-inverting terminal and an output terminal of the second differential amplifier DA2. The non-inverting terminal of the second differential amplifier DA2 may be connected to a third switch SWQ1, and the inverting terminal of the second differential amplifier DA2 may be connected to a fourth switch SWQ2. A connection relationship of the third and fourth switches SWQ1 and SWQ2 may be controlled based on a phase of an input signal.

The I/Q demodulator 200C3 may include an in-phase sample and hold circuit 200C3I and a quadrature-phase sample and hold circuit 200C3Q. The first differential amplifier DA1 may be electrically connected to the in-phase sample and hold circuit 200C3I, and the second differential amplifier DA2 may be electrically connected to the quadrature-phase sample and hold circuit 200C3Q.

The analog-to-digital converter 200C4 may include a first analog-to-digital converter 200C4I, and a second analog-to-digital converter 200C4Q. The first analog-to-digital converter 200C4I may be electrically connected to the in-phase sample and hold circuit 200C3I, and the second analog-to-digital converter 200C4Q may be electrically connected to the quadrature-phase sample and hold circuit 200C3Q.

The first differential amplifier DA1, the in-phase sample and hold circuit 200C3I, and the first analog-to-digital converter 200C4I may be referred to as an "in-phase branch IPB". The second differential amplifier DA2, the quadrature-phase sample and hold circuit 200C3Q, and the second analog-to-digital converter 200C4Q may be referred to as a "quadrature-phase branch QPB".

The in-phase branch IPB may integrate a real part component of a differential signal, may sample a maximum value point of the integrated result, and may convert the sampled result to a digital signal. The quadrature-phase branch QPB may integrate an imaginary part component of the differential signal, may sample a maximum value point of the integrated result, and may convert the sampled result to a digital signal. Accordingly, a code CHD-I (hereinafter referred to as "first data") output from an output terminal OT1 connected to the in-phase branch IPB may be of an in-phase magnitude corresponding to the channel 210chx. A code CHD-Q (hereinafter referred to as "second data") output from an output terminal OT2 connected to the quadrature-phase branch QPB may be of a quadrature-phase magnitude corresponding to the channel 210chx.

Figures 30A, 30B:
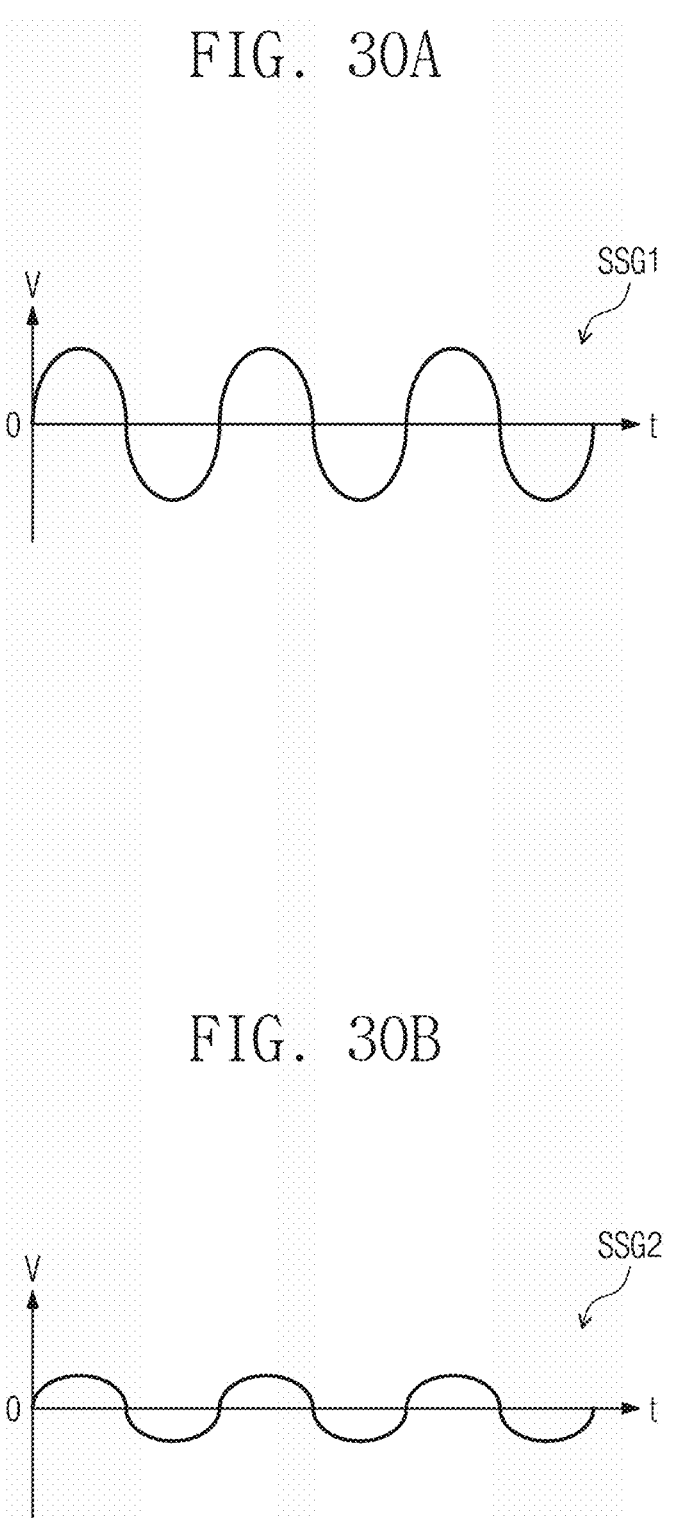
FIG. 30A is a diagram illustrating an example of a first signal of a first node.
FIG. 30B is a diagram illustrating an example of a second signal of a second node.

FIG. 30A is a diagram illustrating an example of a first signal SSG1 of the first node ND1. FIG. 30B is a diagram illustrating an example of a second signal SSG2 of the second node ND2.

Referring to FIGS. 29, 30A, and 30B, the pen PN may be closer to the channel 210chx corresponding to the first node ND1. Accordingly, the amplitude of the first signal SSG1 may be greater than the amplitude of the second signal SSG2.

Figure 31A:
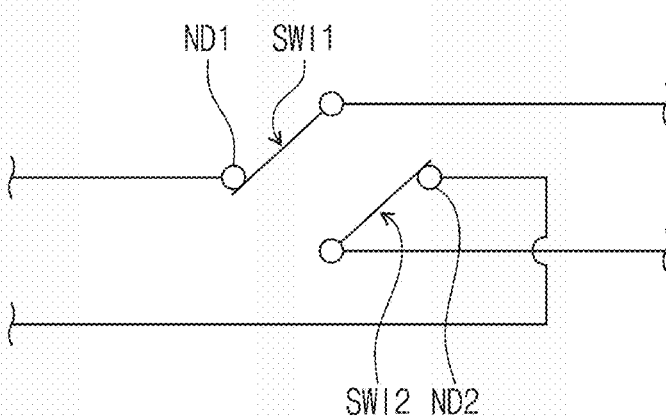
FIG. 31A is a diagram illustrating a connection relationship of a first switch and a second switch in a first phase period.
Figure 31B:
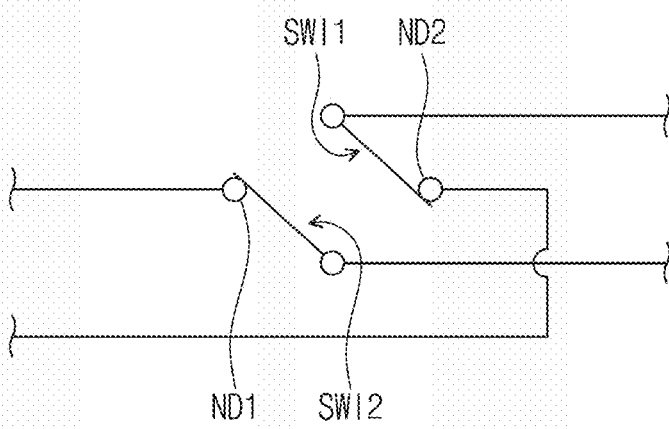
FIG. 31B is a diagram illustrating a connection relationship of a first switch and a second switch in a second phase period.
Figure 32:
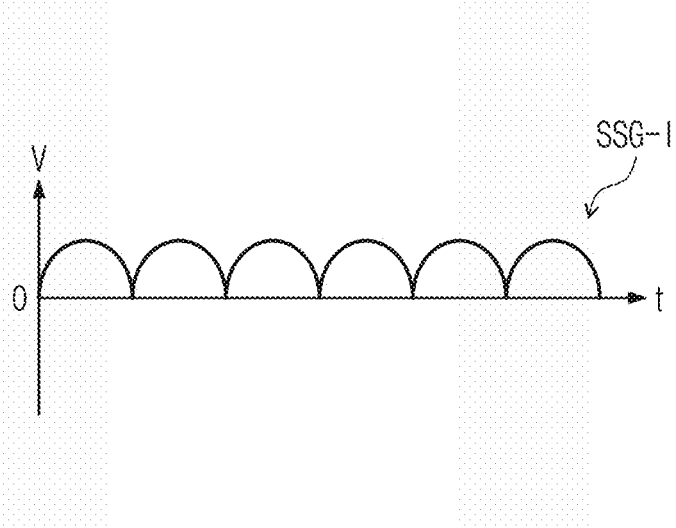
FIG. 32 is a diagram illustrating a signal measured at a third node.
Figure 33:
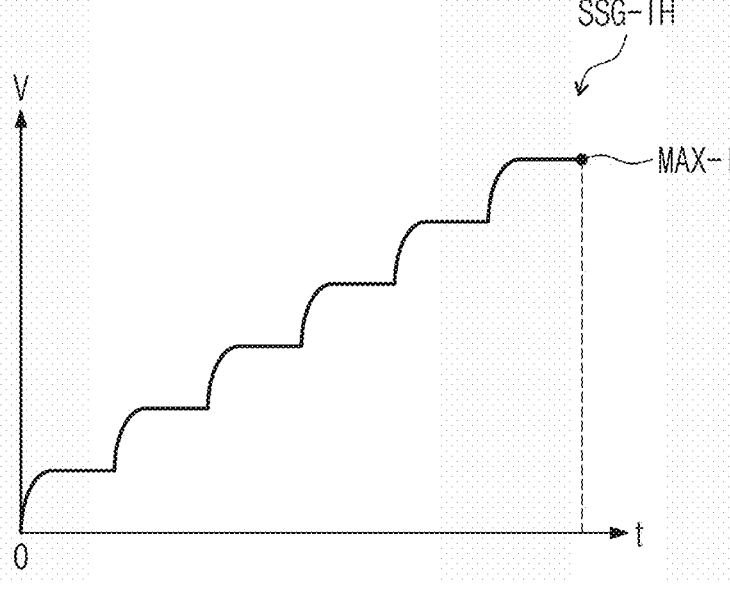
FIG. 33 is a diagram illustrating a signal measured at a fourth node.

FIG. 31A is a diagram illustrating a connection relationship of the first switch SWI1 and the second switch SWI2 in a first phase period. FIG. 31B is a diagram illustrating a connection relationship of the first switch SWI1 and the second switch SWI2 in a second phase period. FIG. 32 is a diagram illustrating a signal measured at a third node ND3. FIG. 33 is a diagram illustrating a signal measured at a fourth node ND4.

Referring to FIGS. 29, 30A, 30B, and 31A, in the first phase period, the first switch SWI1 may be connected to the first node ND1, and the second switch SWI2 may be connected to the second node ND2. The first phase period may be from 0 degree to 180 degrees. For example, the first phase period may be a period in which a phase is 0 degree or more and less than 180 degrees. Accordingly, in the first phase period, a signal corresponding to a subtraction of the second signal SSG2 from the first signal SSG1 may be output from the first differential amplifier DA1.

Referring to FIGS. 29, 30A, 30B, and 31B, in the second phase period, the first switch SWI1 may be connected to the second node ND2, and the second switch SWI2 may be connected to the first node ND1. The second phase period may be from 180 degrees to 360 degrees. For example, the second phase period may be a period in which a phase is 180 degrees or more and less than 360 degrees. Accordingly, in the second phase period, a signal corresponding to a subtraction of the first signal SSG1 from the second signal SSG2 may be output from the first differential amplifier DA1.

Referring to FIG. 32, a signal SSG-I output from the first differential amplifier DA1 may include a real part component. The signal SSG-I may be provided to the in-phase sample and hold circuit 200C3I. The in-phase sample and hold circuit 200C3I may hold the signal SSG-I including the real part component.

Referring to FIG. 33, a signal SSG-IH held by the in-phase sample and hold circuit 200C3I is illustrated. The first analog-to-digital converter 200C4I may sample a maximum value point MAX-I from the held signal SSG-IH, and may convert the sampled result to a digital signal.

Figure 34A:
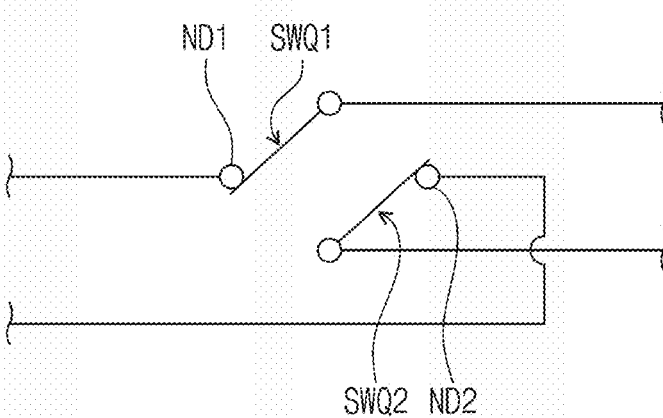
FIG. 34A is a diagram illustrating a connection relationship of a third switch and a fourth switch in a third phase period.
Figure 34B:
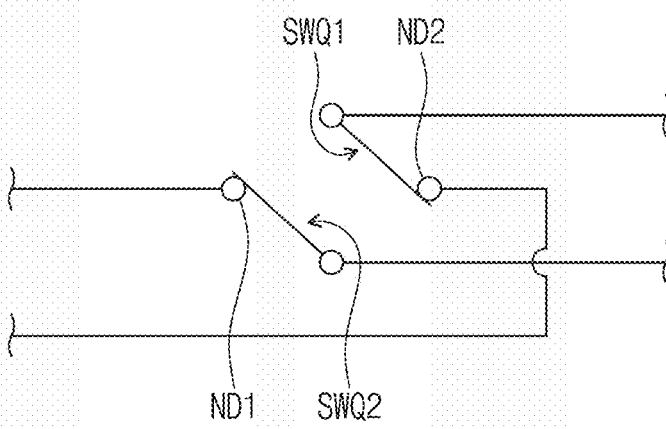
FIG. 34B is a diagram illustrating a connection relationship of a third switch and a fourth switch in a fourth phase period.
Figure 35:
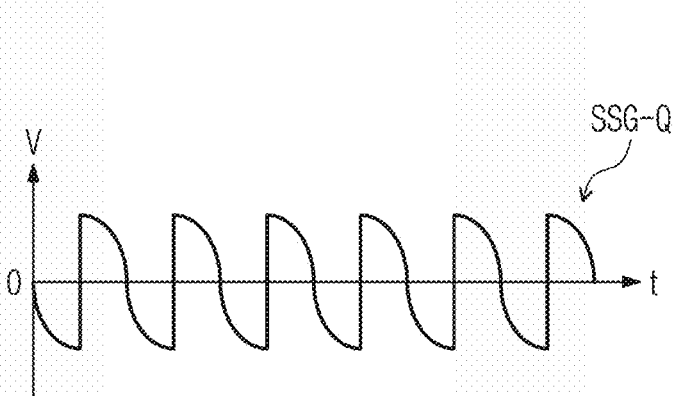
FIG. 35 is a diagram illustrating a signal measured at a fifth node.
Figure 36:
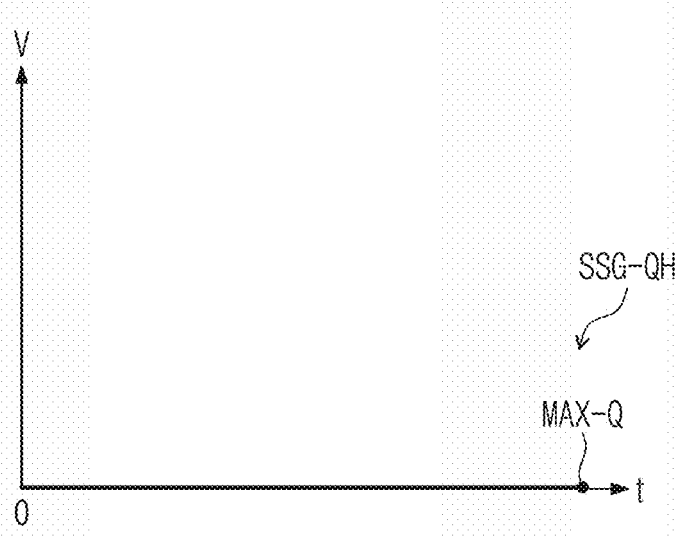
FIG. 36 is a diagram illustrating a signal measured at a sixth node.

FIG. 34A is a diagram illustrating a connection relationship of the third switch SWQ1 and the fourth switch SWQ2 in a third phase period. FIG. 34B is a diagram illustrating a connection relationship of the third switch SWQ1 and the fourth switch SWQ2 in a fourth phase period. FIG. 35 is a diagram illustrating a signal measured at a fifth node ND5. FIG. 36 is a diagram illustrating a signal measured at a sixth node ND6.

Referring to FIGS. 29, 30A, 30B, and 34A, in the third phase period, the third switch SWQ1 may be connected to the first node ND1, and the fourth switch SWQ2 may be connected to the second node ND2. The third phase period may be from 90 degrees to 270 degrees. For example, the third phase period may be a period in which a phase is 90 degrees or more and less than 270 degrees. For example, the third phase period may include 180 degrees. Accordingly, in the third phase period, a signal corresponding to a subtraction of the second signal SSG2 from the first signal SSG1 may be output from the second differential amplifier DA2.

Referring to FIGS. 29, 30A, 30B, and 34B, in the fourth phase period, the third switch SWQ1 may be connected to the second node ND2, and the fourth switch SWQ2 may be connected to the first node ND1. The fourth phase period may be from 270 degrees to 90 degrees. For example, the fourth phase period may be a period in which a phase is 270 degrees or more and less than 90 degrees. For example, the fourth phase period may include 270 degrees to 360 degrees, as well as 0 degree to 90 degrees. Accordingly, in the fourth phase period, a signal corresponding to a subtraction of the first signal SSG1 from the second signal SSG2 may be output from the second differential amplifier DA2.

Referring to FIG. 35, a signal SSG-Q output from the second differential amplifier DA2 may include an imaginary part component. The signal SSG-Q may be provided to the quadrature-phase sample and hold circuit 200C3Q. The quadrature-phase sample and hold circuit 200C3Q may hold the signal SSG-Q including the imaginary part component. Referring to FIG. 36, a signal SSG-QH held by the quadrature-phase sample and hold circuit 200C3Q is illustrated. The second analog-to-digital converter 200C4Q may sample a maximum value point MAX-Q from the held signal SSG-QH, and may convert the sampled result to a digital signal. In an embodiment, the maximum value point MAX-Q may be "0".

Referring back to FIG. 29, a magnitude and a phase change may be calculated based on the first data CHD-I output from the first analog-to-digital converter 200C4I and the second data CHD-Q output from the second analog-to-digital converter 200C4Q. For example, the first data CHD-I may be of an in-phase magnitude, and the second data CHD-Q may be of a quadrature-phase magnitude.

Coordinates or a tilt angle of the pen PN may be calculated or determined based on the magnitude, and the pen pressure may be calculated or determined based on a phase change. The magnitude may correspond to a square root of a value obtained by adding the square of the first data CHD-I and the square of the second data CHD-Q, and the phase change may correspond to an arctangent value of a value obtained by dividing the second data CHD-Q by the first data CHD-I.

Figures 37A, 37B:
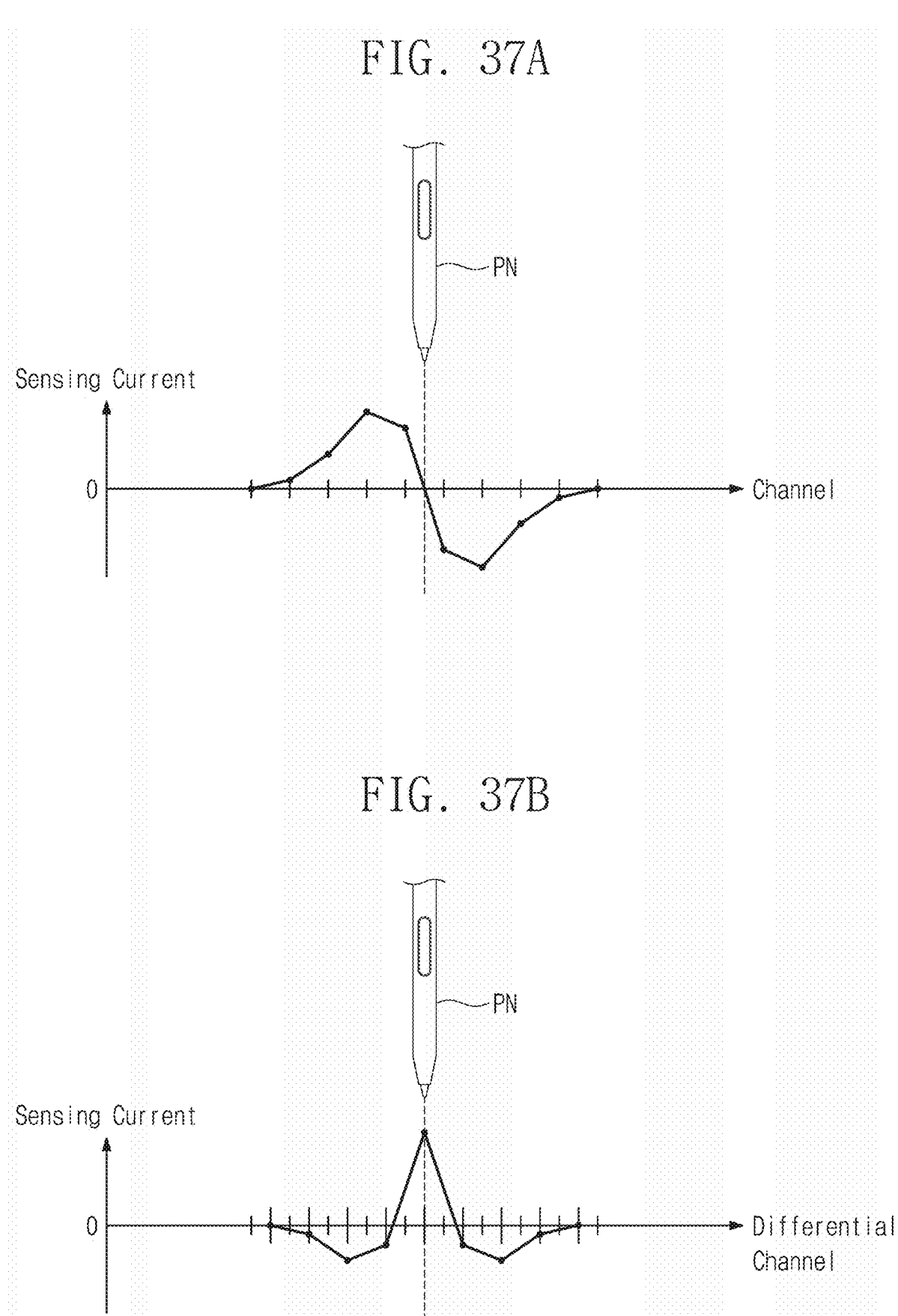
FIG. 37A is a diagram illustrating a current sensed from first channels.
FIG. 37B is a diagram illustrating a current obtained from a differential pair of first channels.
Figure 37C:
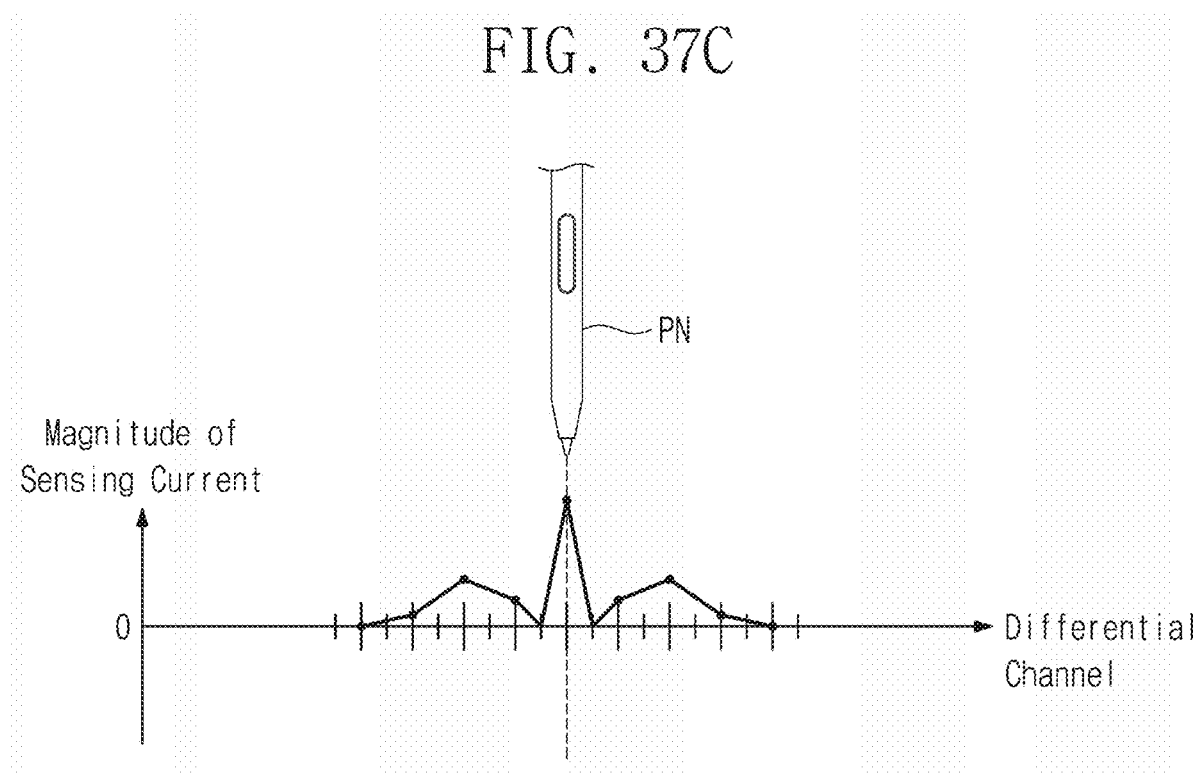
FIG. 37C is a diagram illustrating an absolute value of a current obtained from a differential pair of first channels.

FIG. 37A is a diagram illustrating a current sensed from the first channels 210ch1 to 210ch10. FIG. 37B is a diagram illustrating a current obtained from a differential pair of the first channels 210ch1 to 210ch10. FIG. 37C is a diagram illustrating an absolute value of a current obtained from a differential pair of the first channels 210ch1 to 210ch10.

Referring to FIGS. 28A and 37A, directions of the currents that are sensed from the first channels 210ch1 to 210ch5 and 210ch6 to 210ch10 in a state where a location of a portion where the pen PN is interposed therebetween may be different from each other. Accordingly, a direction of a current flowing to the first channels 210ch1 to 210ch5 placed on the left with respect to the position of the pen PN may be different from a direction of a current flowing to the first channels 210ch6 to 210ch10 placed on the right with respect to the position of the pen PN. Accordingly, the sensor driver 200C may sense the currents flowing in different directions from each other based on the position of the pen PN.

Referring to FIG. 37B, as illustrated in FIG. 28A or 28B, the sensor driver 200C may sense a current by performing differential sensing with respect to the channels, which are adjacent to each other or are spaced from each other, from among the first channels 210ch1 to 210ch10. Referring to FIG. 37C, the sensor driver 200C may obtain absolute data of the current obtained through the differential sensing. The data illustrated in FIG. 37B or 37C may be utilized to process information about an input of the pen PN.

Figure 38:
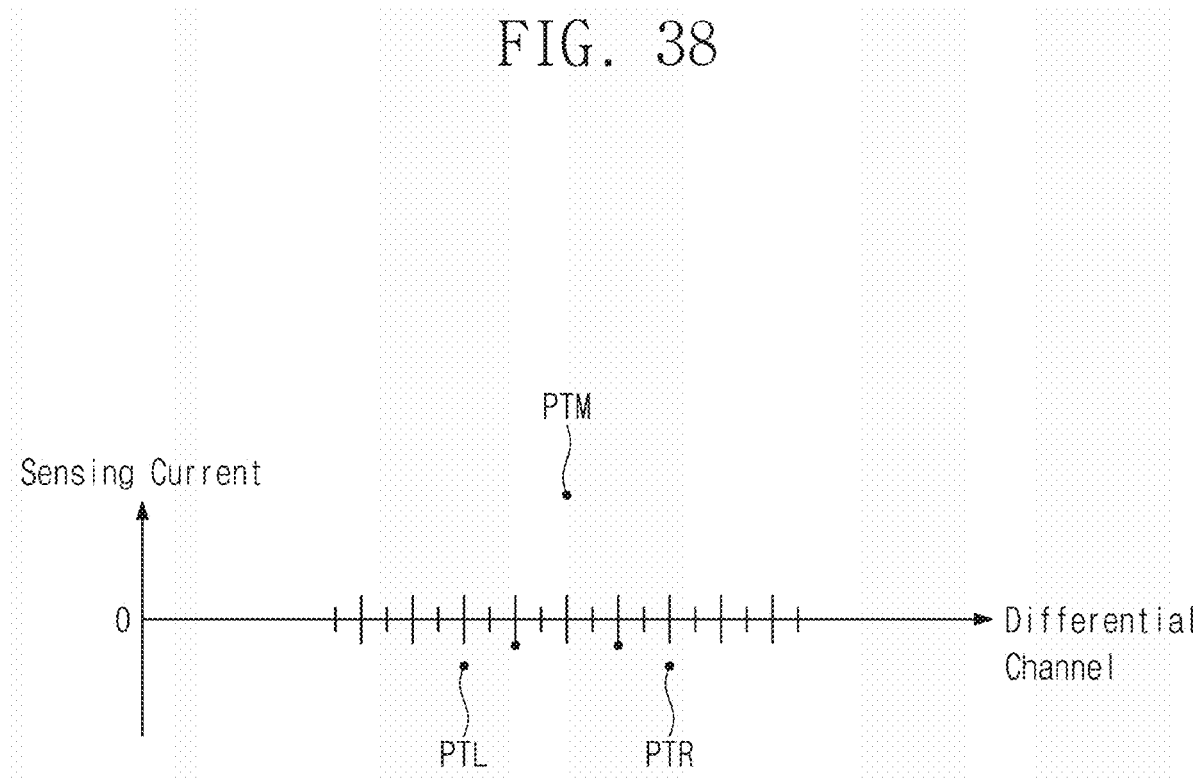
FIG. 38 is a diagram illustrating a method for recognizing a pen position according to an embodiment of the present disclosure.
Figure 39A:
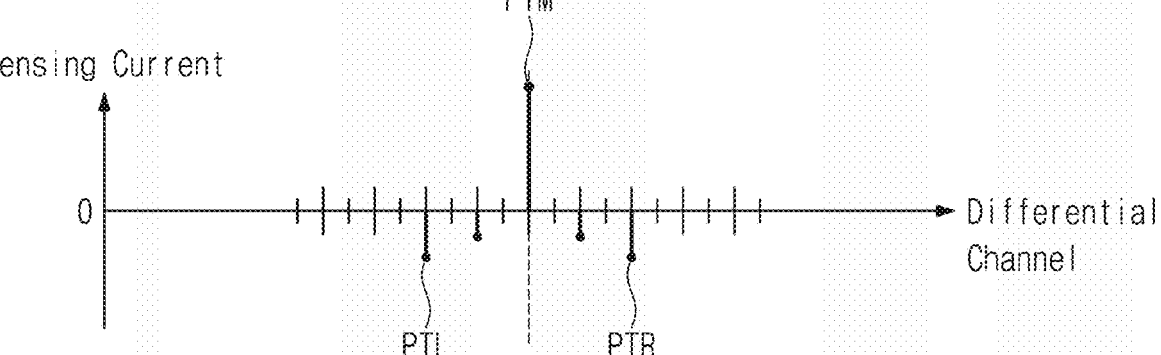
FIG. 39A is a diagram illustrating a method for recognizing a pen position according to an embodiment of the present disclosure.
Figure 39B:
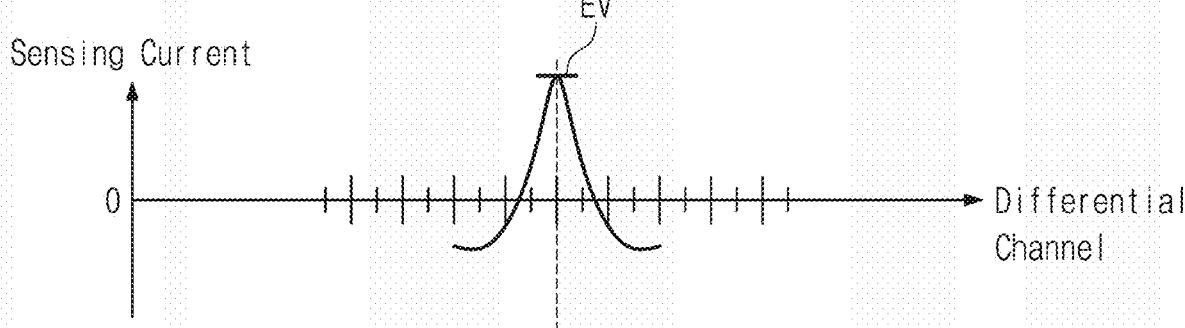
FIG. 39B is a diagram illustrating a method for recognizing a pen position according to an embodiment of the present disclosure.

FIG. 38 is a diagram illustrating a method for recognizing a pen position according to an embodiment of the present disclosure. FIG. 39A is a diagram illustrating a method for recognizing a pen position according to an embodiment of the present disclosure. FIG. 39B is a diagram illustrating a method for recognizing a pen position according to an embodiment of the present disclosure.

Referring to FIGS. 37B and 38, points PTM, PTL, and PTR used to calculate the position coordinates of the pen PN are selected from a sensing current value graph. The max value PTM of a sensing current value, "n" points PTL placed on the left with respect to the max value PTM and adjacent to the max value PTM, and "n" points PTR placed on the right with respect to the max value PTM and adjacent to the max value PTM may be selected as the points PTM, PTL, and PTR. Here, "n" may be 1 or more. In FIG. 38, an example in which "n" is equal to 2 is illustrated.

Referring to FIGS. 38 and 39A, the X-coordinate of the position of the pen PN may be recognized from the selected points PTM, PTL, and PTR by using a centroid method.

Referring to FIGS. 38 and 39B, the X-coordinate of the pen PN may be calculated based on a maximum point EV of a trend line obtained by using the selected points PTM, PTL, and PTR. The X-coordinate detected from the first electrodes 210 and the Y-coordinate detected from the second electrodes 220 may be corrected based on a tilt angle and an azimuth described in more detail below.

Figure 40A:
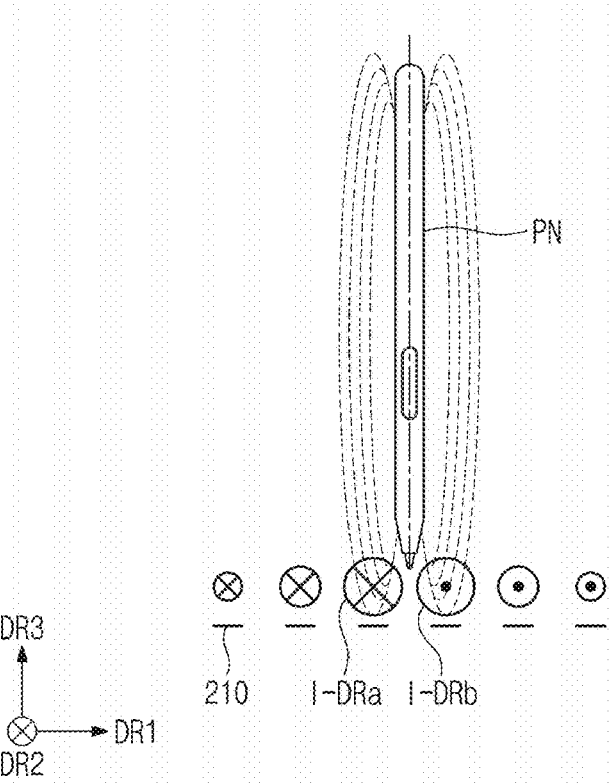
FIG. 40A is a diagram illustrating a magnitude and a direction of an induced current generated at a pen and first electrodes according to an embodiment of the present disclosure.
Figure 40B:
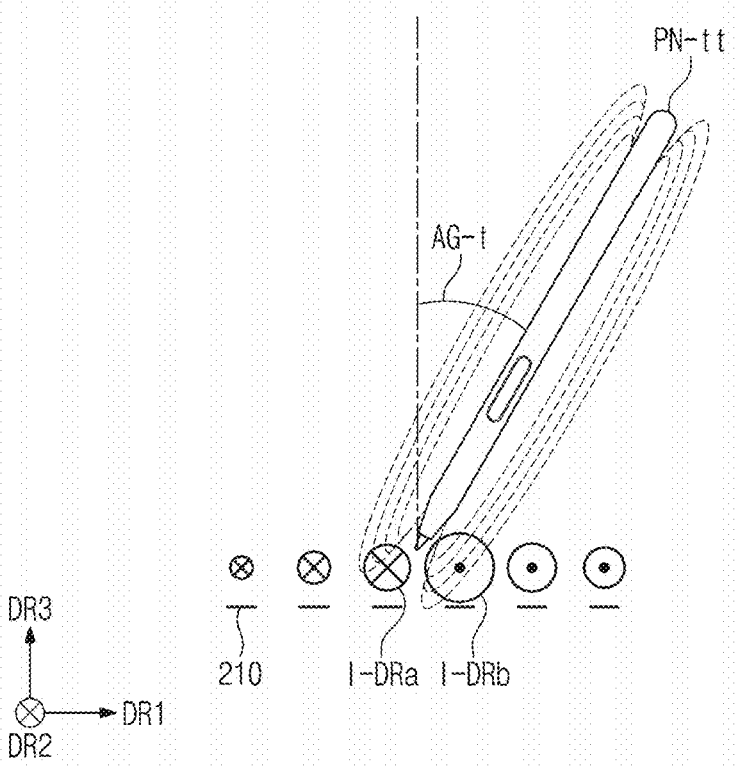
FIG. 40B is a diagram illustrating a magnitude and a direction of an induced current generated at a pen and first electrodes according to an embodiment of the present disclosure.

FIG. 40A is a diagram illustrating a magnitude and a direction of an induced current generated at the pen PN and the first electrodes 210 according to an embodiment of the present disclosure. FIG. 40B is a diagram illustrating a magnitude and a direction of an induced current generated at a pen PN-tt and the first electrodes 210 according to an embodiment of the present disclosure.

Referring to FIGS. 40A and 40B, in the case of the first electrodes 210 placed on the left with respect to the position of the pen PN or PN-tt, an induced current I-DRa may flow in a direction facing the cross-section (e.g., the second direction DR2). In the case of the first electrodes 210 placed on the right with respect to the position of the pen PN or PN-tt, an induced current I-DRb may flow in a direction facing away from the cross-section (e.g., a direction facing away from the second direction DR2).

A magnitude of a circle expressing a direction of each of the induced currents I-DRa and I-DRb illustrated in FIGS. 40A and 40B may correspond to a magnitude of each of the induced currents I-DRa and I-DRb. In other words, referring to FIG. 40A, as a distance from the pen PN increases, the magnitude of each of the induced currents I-DRa and I-DRb may decrease. When the pen PN is provided in the normal direction on a plane defined by the first electrodes 210 without being tilted, the magnitudes of the induced currents I-DRa and I-DRb may be horizontally symmetric to each other with respect to the pen PN. Referring to FIG. 40B, when the pen PN-tt is tilted at an angle (e.g., a given or predetermined angle) AG-t, magnitudes of the induced currents I-DRb in a tilted direction may be greater than magnitudes of the induced currents I-DRa in a direction horizontally symmetric to the tilted direction.

FIGS. 41A to 41B, 42A to 42B, and 43 are diagrams illustrating a method for measuring a tilt angle and an azimuth of a pen.

Figures 41A, 41B:
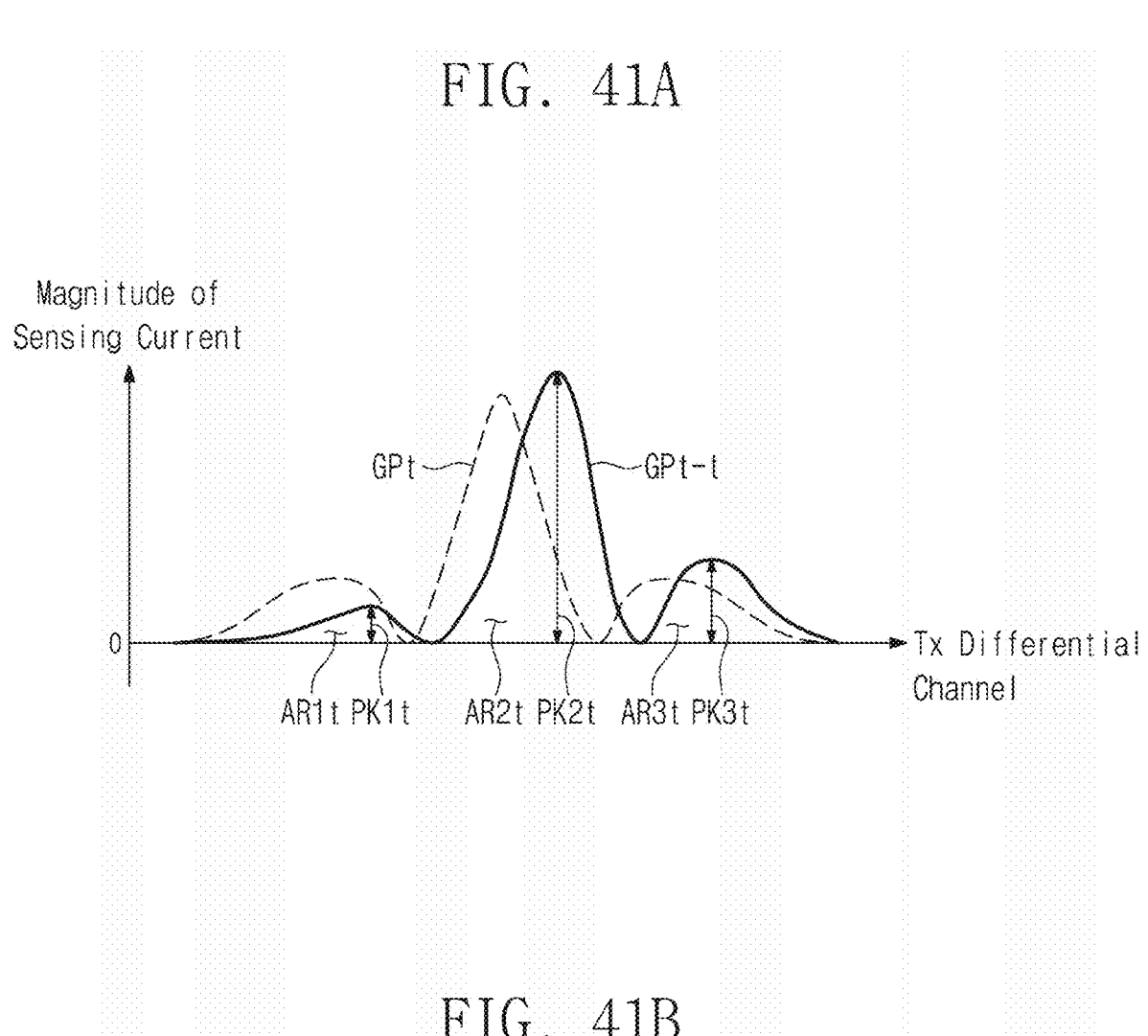
FIGS. 41A-41B, 42A-42B, and 43 are diagrams illustrating a method for measuring a tilt angle and an azimuth of a pen.

Referring to FIGS. 9, 41A, and 41B, a magnitude graph of a sensing current sensed from the first electrodes 210 is illustrated in FIG. 41A, and a magnitude graph of a sensing current sensed from the second electrodes 220 is illustrated in FIG. 41B. For example, the first electrodes 210 may respectively correspond to the first channels, and the second electrodes 220 may respectively correspond to the second channels. The first channels may be differentially sensed, and the second channels may be differentially sensed. In other words, the graph illustrated in FIG. 41A shows absolute magnitudes of the currents obtained from a differential pair of the first channels, and the graph illustrated in FIG. 41B shows absolute magnitudes of the currents obtained from a differential pair of the second channels. A first channel may be referred to as a "Tx channel", and a second channel may be referred to as an "Rx channel".

Referring to FIG. 41A, a first graph GPt indicates an absolute magnitude of a sensing current sensed when a pen is not tilted, and a second graph GPt-t indicates an absolute magnitude of a sensing current sensed when a pen is tilted. For example, when the pen is not tilted, the first graph GPt may be symmetric or substantially symmetric in shape with respect to a peak point. When the pen is tilted, the first graph GPt may be deformed like that of the second graph GPt-t.

Information about first to third peak values PK1$t$, PK2$t$, and PK3$t$ and first to third areas AR1$t$, AR2$t$, and AR3$t$ may be obtained based on the second graph GPt-t. The sensor driver 200C (e.g., refer to FIG. 7) may calculate an X-axis tilt angle based on at least some of the first to third peak values PK1$t$, PK2$t$, and PK3$t$ and/or the first to third areas AR1$t$, AR2$t$, and AR3$t$. The X-axis may be defined as the first direction DR1.

Figures 42A, 42B:
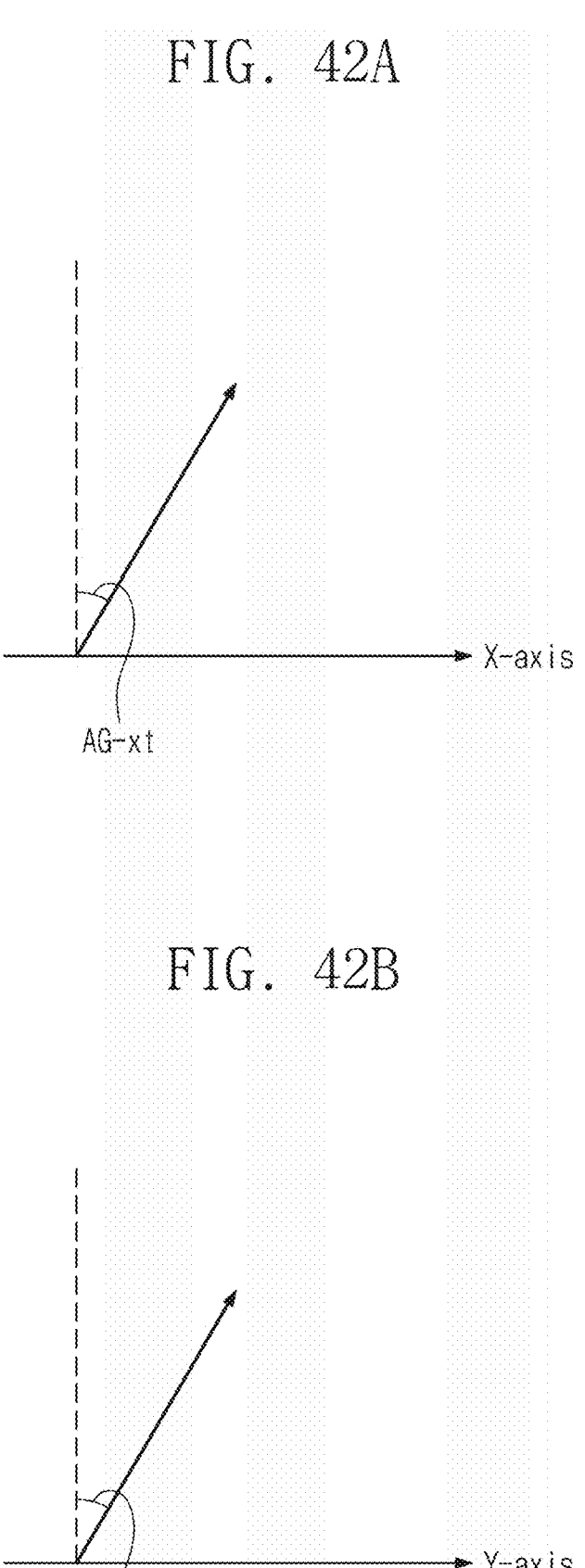

Referring to FIGS. 41A and 42A, the sensor driver 200C may calculate an X-axis tilt angle AG-xt based on: 1) a ratio of two or more of the first to third peak values PK1$t$, PK2$t$, and PK3$t$; 2) each of the first to third peak values PK1$t$, PK2$t$, and PK3$t$; 3) a ratio of two or more of the first to third areas AR1$t$, AR2$t$, and AR3$t$; or 4) each of the first to third areas AR1$t$, AR2$t$, and AR3$t$. In an embodiment of the present disclosure, to calculate an angle efficiently, the sensor driver 200C may further include a look-up table in which a corresponding X-axis tilt angle AG-xt is matched with a ratio or a target value.

The sensor driver 200C may calculate or determine a "COS (90 degrees-X-axis tilt angle)" based on the X-axis tilt angle AG-xt. A value determined by the "COS (90 degrees-X-axis tilt angle)" may be referred to below as a "first axis value COS-x". In an embodiment of the present disclosure, for efficient calculation, the sensor driver 200C may further include a look-up table in which a trigonometrical table for calculating the first axis value COS-x is stored.

Referring to FIGS. 41B and 42B, a third graph GPr-t indicates an absolute magnitude of a sensing current sensed from the second electrodes 220 when the pen is tilted. The sensor driver 200C may obtain information about first to third peak values PK1$r$, PK2$r$, and PK3$r$ and first to third areas AR1$r$, AR2$r$, and AR3$r$ based on the third graph GPr-t. The sensor driver 200C (e.g., refer to FIG. 7) may calculate a Y-axis tilt angle based on at least some of the first to third peak values PK1$r$, PK2$r$, and PK3$r$ and/or the first to third areas AR1$r$, AR2$r$, and AR3$r$. The Y-axis may be defined as the second direction DR2.

The sensor driver 200C may calculate a Y-axis tilt angle AG-yt based on: 1) a ratio of two or more of the first to third peak values PK1$r$, PK2$r$, and PK3$r$; 2) each of the first to third peak values PK1$r$, PK2$r$, and PK3$r$; 3) a ratio of two or more of the first to third areas AR1$r$, AR2$r$, and AR3$r$; or 4) each of the first to third areas AR1$r$, AR2$r$, and AR3$r$. In an embodiment of the present disclosure, to calculate an angle efficiently, the sensor driver 200C may further include a look-up table in which a corresponding Y-axis tilt angle AG-yt is matched with a ratio or a target value.

The sensor driver 200C may calculate or determine a "COS (90 degrees-Y-axis tilt angle)" based on the Y-axis tilt angle AG-yt. A value determined by the "COS (90 degrees-Y-axis tilt angle)" may be referred to below as a "second axis value COS-y". In an embodiment of the present disclosure, for efficient calculation, the sensor driver 200C may further include a look-up table in which a trigonometrical table for calculating the second axis value COS-y is stored.

Figure 43:
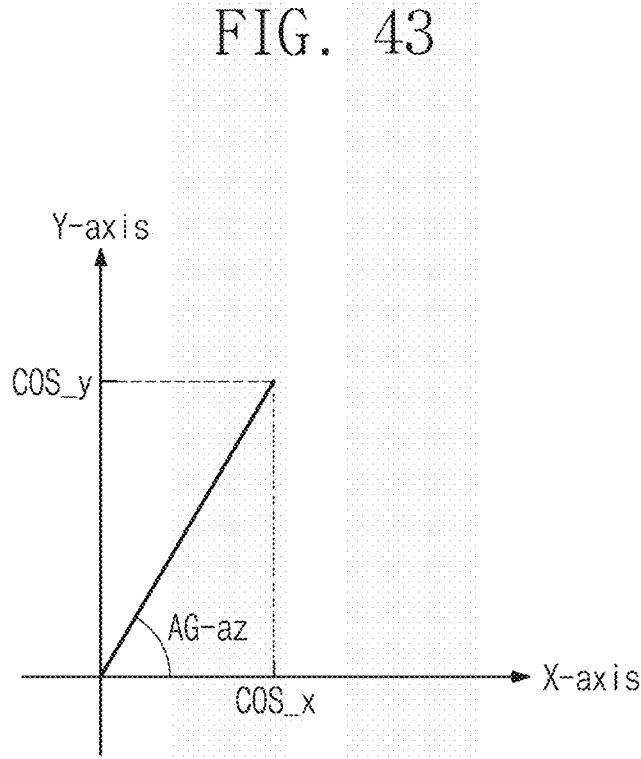

Referring to FIGS. 42A, 42B, and 43, the first axis value COS-x and the second axis value COS-y are marked on the X-axis and the Y-axis, respectively. An azimuth AG-az of the pen may be calculated or determined based on the first axis value COS-x and the second axis value COS-y. For example, the azimuth AG-az may correspond to an "ARCTAN (second axis value/first axis value). In an embodiment of the present disclosure, for efficient calculation, the sensor driver 200C may further include a look-up table in which a trigonometrical table for calculating the azimuth AG-az is stored.

Figure 44A:
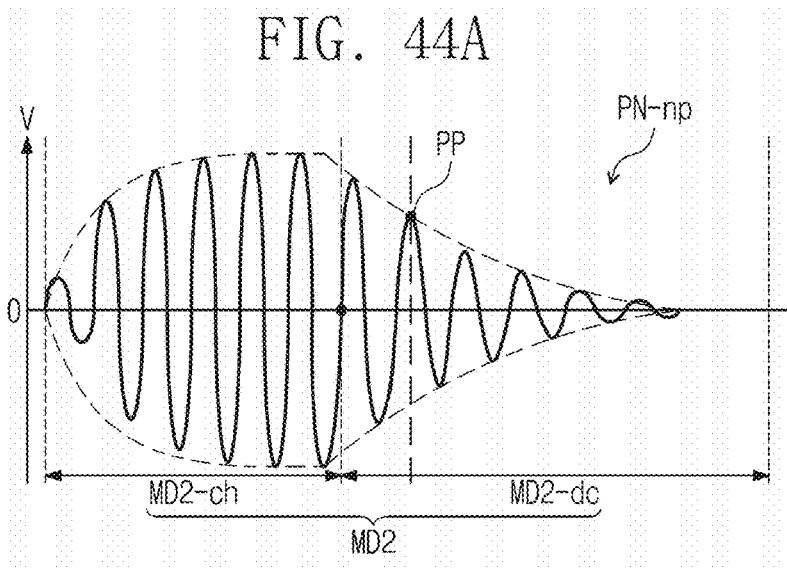
FIGS. 44A-44C are diagrams illustrating a method for measuring a pressure of a pen.
Figure 44B:
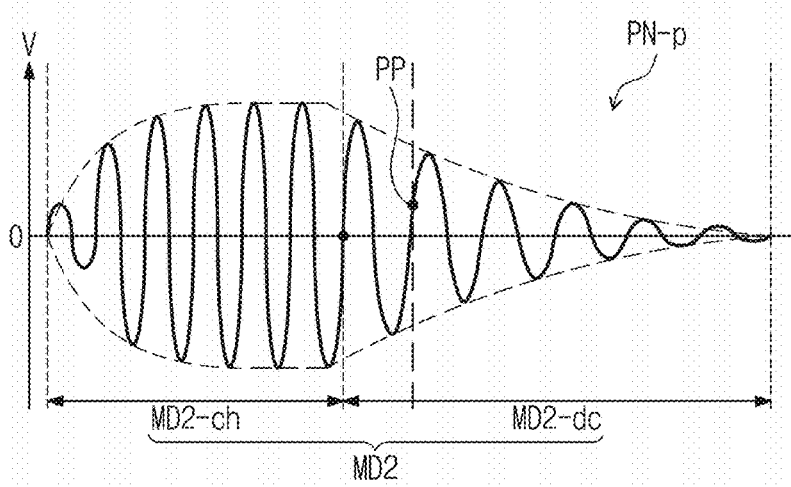
Figure 44C:
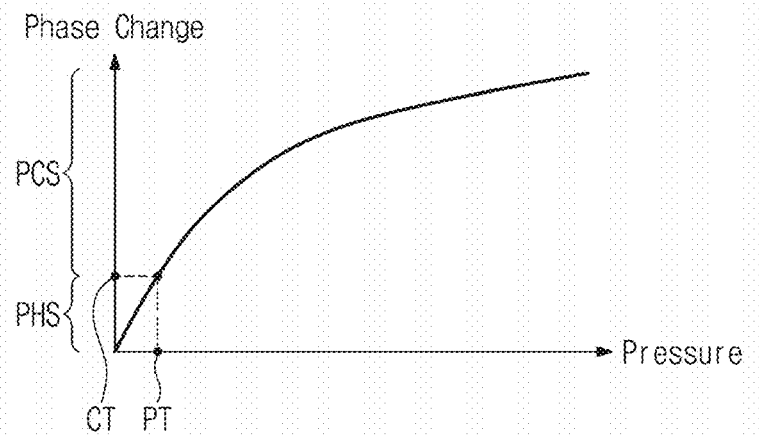

FIGS. 44A through 44C are diagrams illustrating a method for measuring a pressure of a pen.

A voltage induced in a pen PN-np when the pressure is not applied thereto is illustrated in FIG. 44A. A voltage induced in a pen PN-p when the pressure is applied thereto is illustrated in FIG. 44B. The second mode MD2 may include the charging period MD2-$ch$ and the discharging period MD2-$dc$. In the charging period MD2-$ch$, the pen PN-p or PN-np that is close to the sensor layer 200 may be charged. Afterwards, in the discharging period MD2-$dc$, the pen PN-p or PN-np may be discharged.

Referring to FIGS. 44A and 44B, a difference between a phase of the pen PN-np when the pressure is not applied thereto and a phase of the pen PN-p when the pressure is applied thereto occurs at a point PP. For example, the capacitance of the pressure capacitor C-P (e.g., refer to FIG. 25A) in the pen PN may change due to the pen pressure. For example, when the pen pressure is applied to the pen PN, the capacitance of the pressure capacitor C-P may be increased. In this case, the resonant frequency of the pen PN may decrease due to the increased capacitance.

Referring to FIGS. 44A, 44B, and 44C, a contact threshold value CT may be determined based on a phase change according to the pressure. A pressure value PT corresponding to the contact threshold value CT may be determined as a contact pressure. Accordingly, an area having a phase change that is smaller than the contact threshold value CT may be determined as (e.g., may be set to) a pen hover section PHS where the pen PN does not directly contact the electronic device 1000 (e.g., refer to FIG. 1A). Also, an area having a phase change that is greater than the contact threshold value CT may be determined as (e.g., may be set to) a pen contact section PCS where the pen PN directly contacts the electronic device 1000.

Figure 45A:
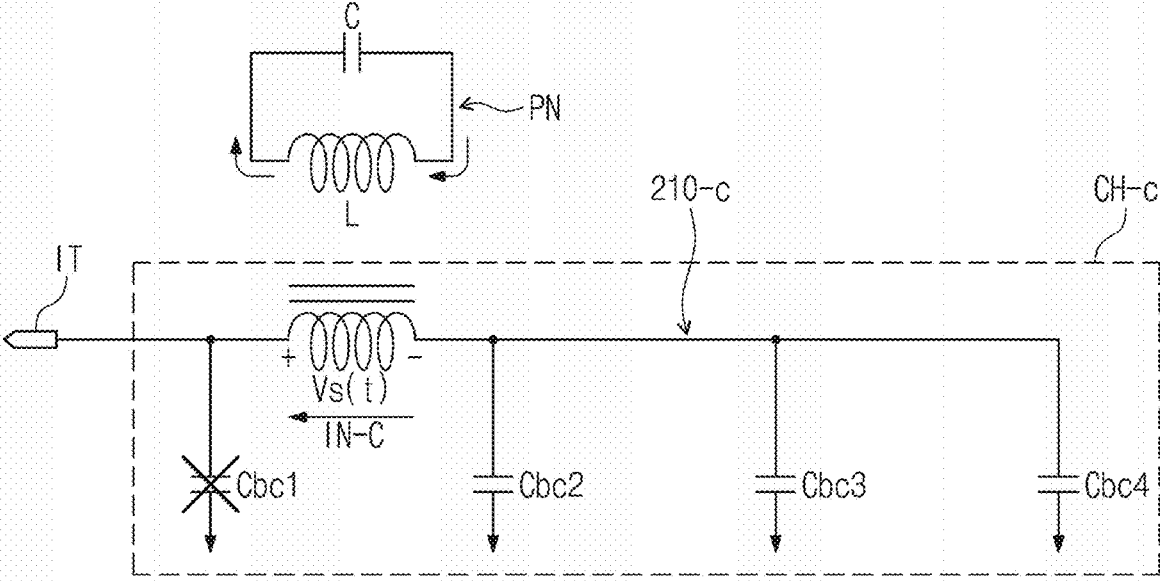
FIG. 45A is an equivalent circuit diagram illustrating a relationship between one channel and a pen according to a comparative example.
Figure 45B:
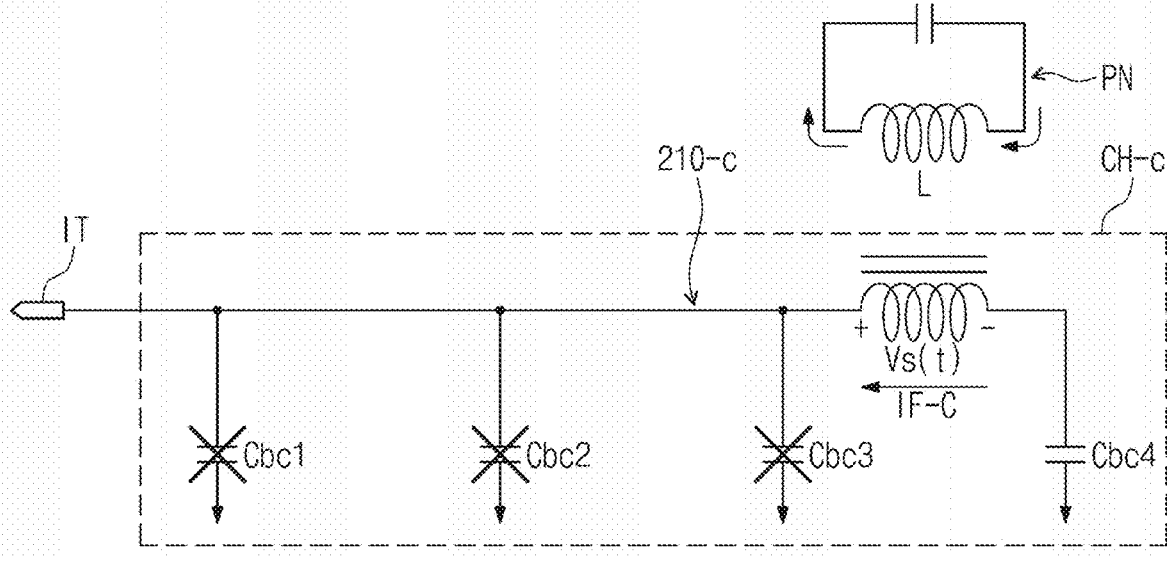
FIG. 45B is an equivalent circuit diagram illustrating a relationship between one channel and a pen according to a comparative example.

FIG. 45A is an equivalent circuit diagram illustrating a relationship between one channel CH-c and the pen PN according to a comparative example. FIG. 45B is an equivalent circuit diagram illustrating a relationship between one channel CH-c and the pen PN according to a comparative example.

Referring to FIGS. 45A and 45B, one channel CH-c may include (e.g., may be composed of) one electrode 210-$c$ connected to the input terminal IT. The input terminal IT may correspond to one pad that is electrically connected between the sensor driver 200C and the electrode 210-$c$.

Capacitors Cbc1, Cbc2, Cbc3, and Cbc4 are defined in the electrode 210-$c$. The capacitors Cbc1, Cbc2, Cbc3, and Cbc4 may be referred to as "parasitic capacitors" or "base capacitors".

Referring to FIG. 45A, when the pen PN is close to the channel CH-c, a first induced electromotive force Vs(t) may be generated in the electrode 210-$c$ by the magnetic field generated by the pen PN. Accordingly, an induced current IN-C may be generated in the channel CH-c. Referring to FIG. 29 together, one of the non-inverting terminal and/or the inverting terminal of the charge voltage amplifier included in the integrator CVA may be electrically connected to the input terminal IT, and the other thereof may be grounded. In this case, the input terminal IT may be regarded as being grounded. Accordingly, because opposite ends of the capacitor Cbc1 from among the capacitors Cbc1, Cbc2, Cbc3, and Cbc4 are grounded, a current may not flow to the capacitor Cbc1.

The induced current IN-C may be proportional to a sum of the capacitances of the capacitors Cbc2, Cbc3, and Cbc4. For example, assuming that the capacitance of each of the capacitors Cbc2, Cbc3, and Cbc4 is Cb, the induced current IN-C over time may be expressed by the Equation below.

$$3Cb\frac{dVs(t)}{dt}$$

Referring to FIG. 45B, when the pen PN is close to the channel CH-c, an induced current IF-C may be generated in the channel CH-c by the magnetic field generated by the pen PN. Because opposite ends of each of the first to third capacitors Cbc1, Cbc2, and Cbc3 from among the capacitors Cbc1, Cbc2, Cbc3, and Cbc4 are grounded, a current may not flow to the first to third capacitors Cbc1, Cbc2, and Cbc3. Assuming that the capacitance of the capacitor Cbc4 is Cb, the induced current IF-C over time may be expressed by the Equation below.

$$Cb\frac{dVs(t)}{dt}$$

Referring to FIGS. 45A and 45B, a magnitude of an induced current when the pen PN is located in an area adjacent to the input terminal IT is different from a magnitude of an induced current when the pen PN is located in an area distant from the input terminal IT. For example, a signal of the pen PN provided in an area distant from the input terminal IT or the sensor driver 200C may be smaller than a signal of the pen PN provided in an area closer to the input terminal IT or the sensor driver 200C. In more detail, the magnitude of the induced current IF-C may not be great enough to sense a pen input.

Figure 46A:
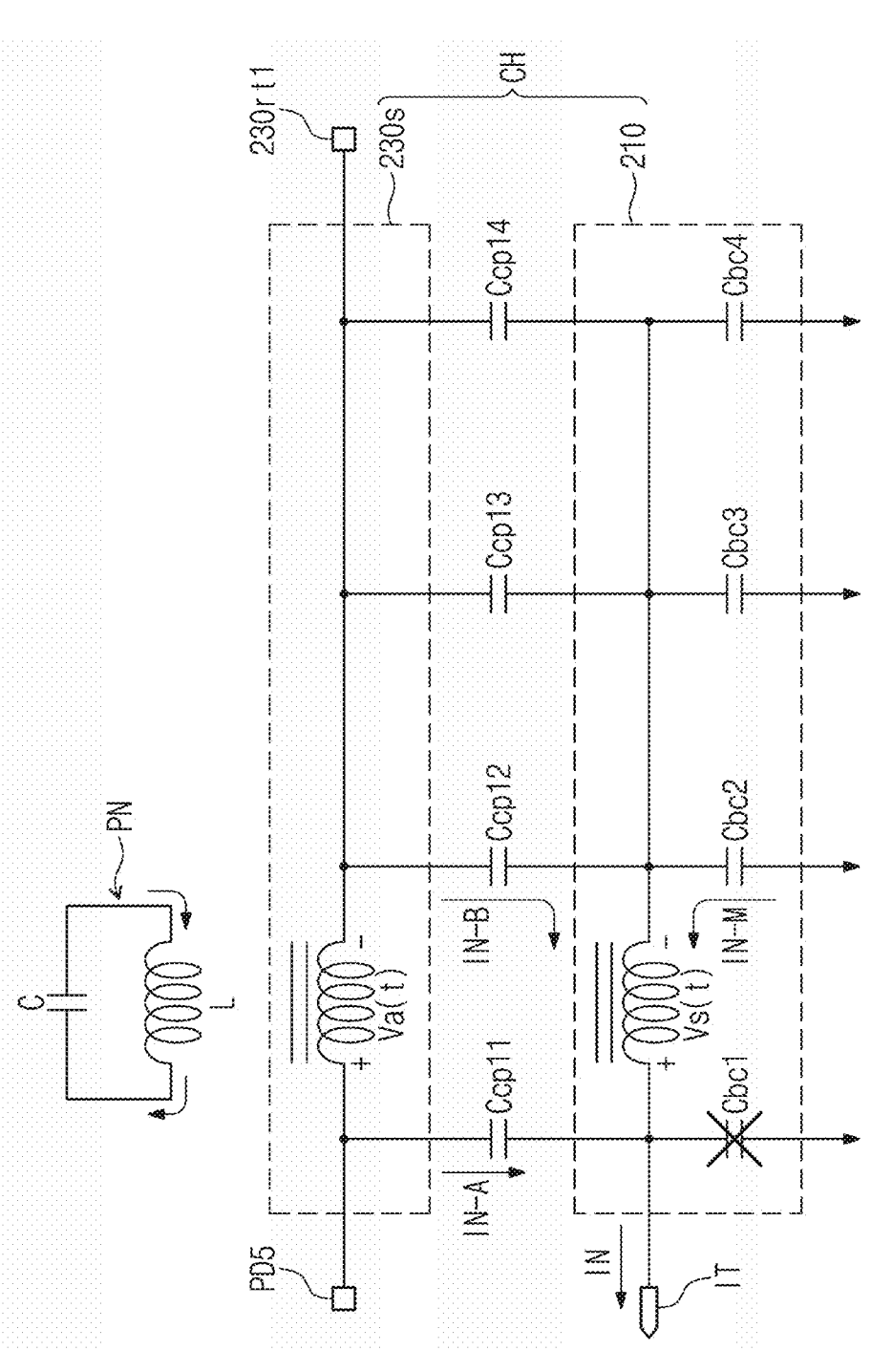
FIG. 46A is an equivalent circuit diagram illustrating a relationship between one channel and a pen according to an embodiment of the present disclosure.
Figure 46B:
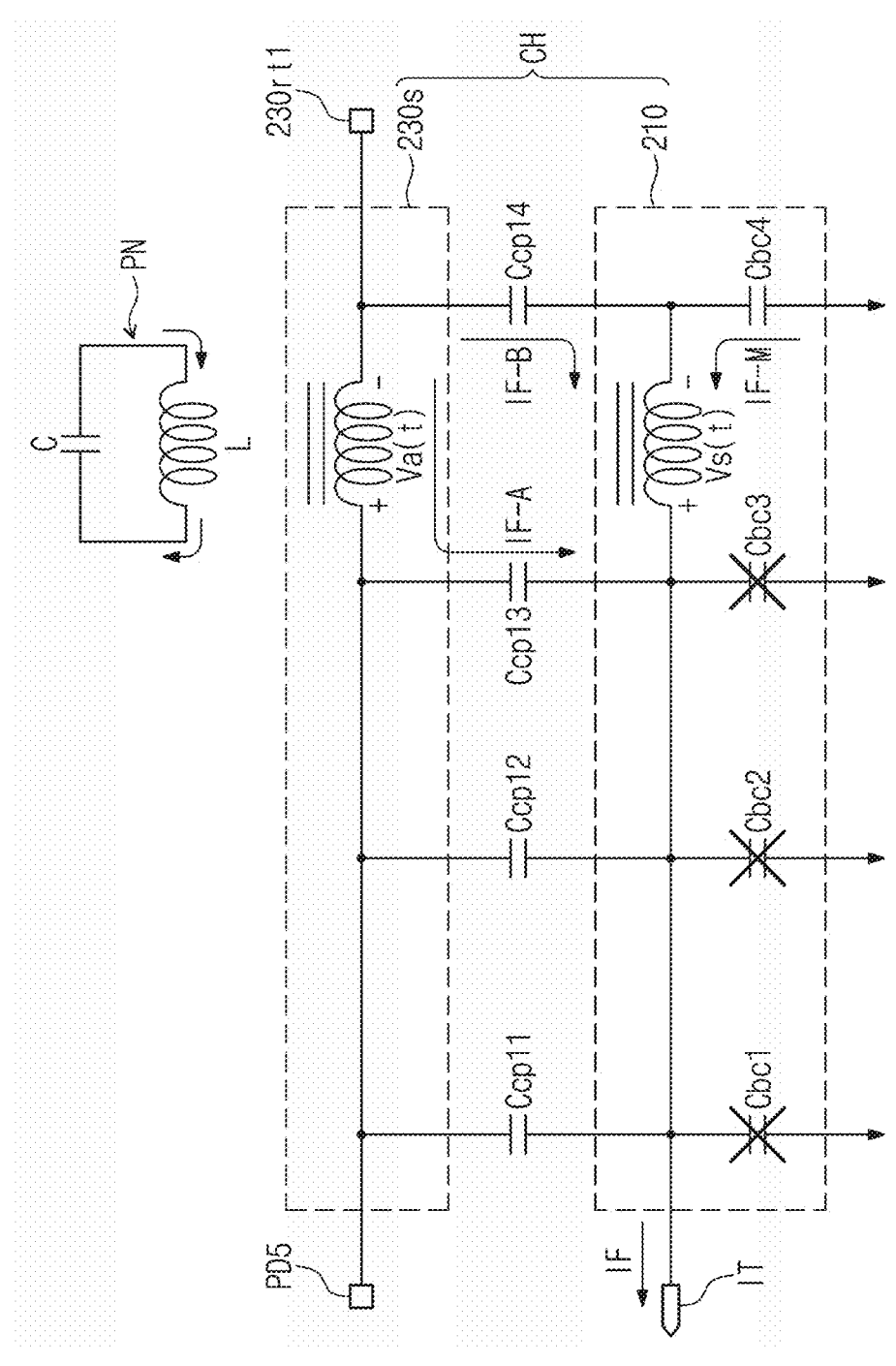
FIG. 46B is an equivalent circuit diagram illustrating a relationship between one channel and a pen according to an embodiment of the present disclosure.

FIG. 46A is an equivalent circuit diagram illustrating a relationship between one channel CH and a pen PN according to an embodiment of the present disclosure. FIG. 46B is an equivalent circuit diagram illustrating a relationship between one channel CH and a pen PN according to an embodiment of the present disclosure.

Referring to FIGS. 9, 46A, and 46B, one channel CH may include the first electrode 210 connected to the input terminal IT, and the first auxiliary electrode 230s of the third electrode 230 that is capacitive-coupled to the first electrode 210.

A plurality of first coupling capacitor Ccp11, Ccp12, Ccp13, and Ccp14 may be defined between the first electrode 210 and the first auxiliary electrode 230s. Capacitors Cbc1, Cbc2, Cbc3, and Cbc4 are defined in the first electrode 210. The capacitors Cbc1, Cbc2, Cbc3, and Cbc4 may be referred to as "parasitic capacitors" or "base capacitors".

The input terminal IT may correspond to one pad that is electrically connected between the sensor driver 200C and the first electrode 210. For example, the input terminal IT may correspond to the first pad PD1. A first end of the first auxiliary electrode 230s may be electrically connected to the fifth pad PD5, and a second end of the first auxiliary electrode 230s may be electrically connected to the third trace line 230rt1. In an embodiment of the present disclosure, the fifth pad PD5 may be floated, and the third trace line 230rt1 may be grounded or may be grounded through a bias capacitor.

Referring to FIG. 46A, when the pen PN is close to the channel CH, the first induced electromotive force Vs(t) may be generated in the first electrode 210 by the magnetic field generated by the pen PN, and a second induced electromotive force Va(t) may be generated in the first auxiliary electrode 230s of the third electrode 230 by the magnetic field generated by the pen PN. A first induced current IN-M and a third induced current IN-B may be generated by the first induced electromotive force Vs(t), and a second induced current IN-A may be generated by the second induced electromotive force Va(t). Accordingly, a total induced current IN flowing to the input terminal IT may correspond to a sum of the first to third induced currents IN-M, IN-A, and IN-B.

For example, assuming that the capacitance of each of the capacitors Cbc1, Cbc2, Cbc3, and Cbc4 is Cb, the first induced current IN-M over time may be expressed by the Equation below.

$$3Cb\frac{dVs(t)}{dt}$$

Assuming that the capacitance of each of the first coupling capacitors Ccp11, Ccp12, Ccp13, and Ccp14 is Cc, second induced current IN-A over time may be expressed by the Equation below.

$$Cc\frac{dVa(t)}{dt}$$

Further, the third induced current IN-B over time may be expressed by the Equation below.

$$3Cc\frac{dVs(t)}{dt}$$

The first induced current IN-M may be an induced current coming from at least some of the capacitors Cbc1, Cbc2, Cbc3, and Cbc4, and may be referred to as an "auxiliary induced current". The first induced current IN-M generated in the first electrode 210 may be referred to as a "first auxiliary induced current", and the first induced current IN-M generated in the second electrode 220 may be referred to as a "second auxiliary induced current". Each of the second induced current IN-A and the third induced current IN-B may be an induced current coming from at least some of the first coupling capacitors Ccp11, Ccp12, Ccp13, and Ccp14, and may be referred to as a "coupling induced current".

Referring to FIG. 46B, when the pen PN is close to the channel CH, the first induced electromotive force Vs(t) may be generated in the first electrode 210 by the magnetic field generated by the pen PN, and the second induced electromotive force Va(t) may be generated in the first auxiliary electrode 230s of the third electrode 230 by the magnetic field generated by the pen PN. Because opposite ends of each of the capacitors Cbc1, Cbc2, and Cbc3 between the first induced electromotive force Vs(t) and the input terminal IT are grounded, a current may not flow to the capacitors Cbc1, Cbc2, and Cbc3.

A first induced current IF-M and a third induced current IF-B may be generated by the first induced electromotive force Vs(t), and a second induced current IF-A may be generated by the second induced electromotive force Va(t). Accordingly, a total induced current IF flowing to the input terminal IT may correspond to a sum of the first to third induced currents IF-M, IF-A, and IF-B.

For example, assuming that the capacitance of each of the capacitors Cbc1, Cbc2, Cbc3, and Cbc4 is Cb, the first induced current IF-M over time may be expressed by the Equation below.

$$Cb\frac{dVs(t)}{dt}$$

Assuming that the capacitance of each of the first coupling capacitors Ccp11, Ccp12, Ccp13, and Ccp14 is Cc, the second induced current IF-A over time may be expressed by the Equation below.

$$3Cc\frac{dVa(t)}{dt}$$

Further, the third induced current IF-B over time may be expressed by the Equation below.

$$Cc\frac{dVs(t)}{dt}$$

Figure 47:
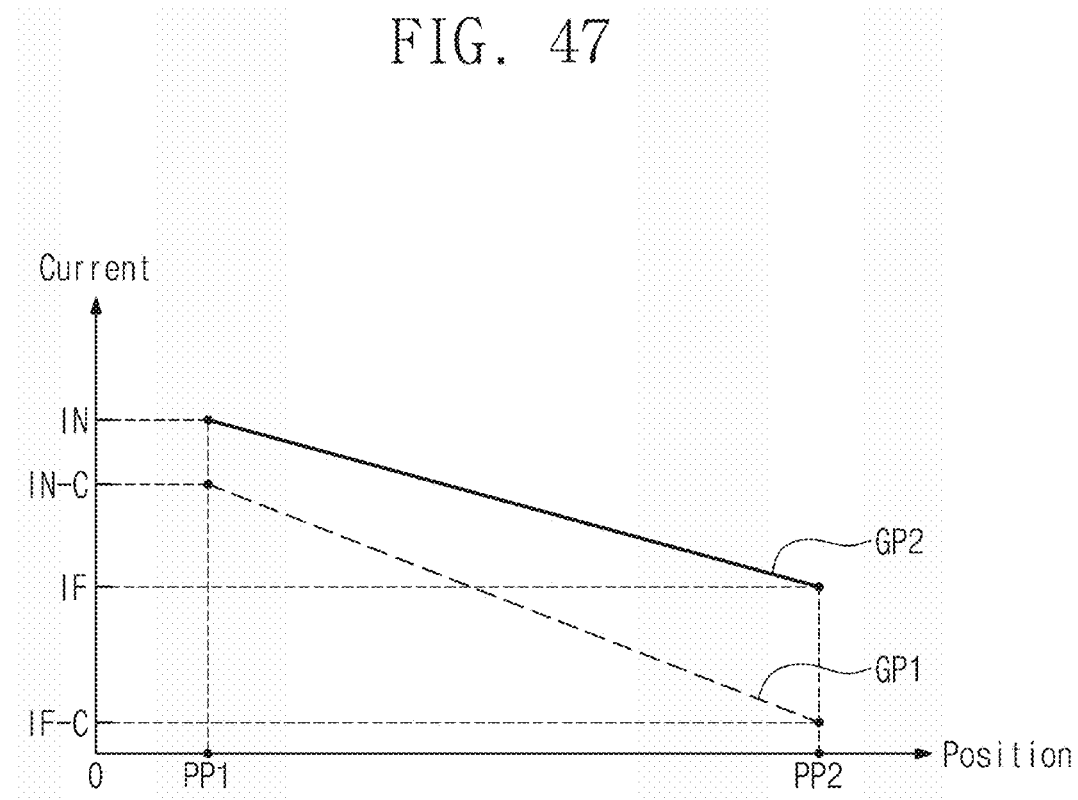
FIG. 47 is a graph illustrating a current magnitude according to a pen position with regard to one channel.

FIG. 47 is a graph illustrating a current magnitude according to a pen position with regard to one channel.

Referring to FIGS. 45A, 45B, 46A, 46B, and 47, a first graph GP1 is a graph showing a current magnitude according to a pen position measured according to the comparative examples of FIGS. 45A and 45B. A second graph GP2 is a graph showing a current magnitude according to a pen position measured according to the embodiment of FIGS. 46A and 46B.

A first point PP1 may correspond to a position of the pen PN illustrated in FIGS. 45A and 46A, and a second point PP2 may correspond to a position of the pen PN illustrated in FIGS. 45B and 46B. In more detail, at the second point PP2, the second induced current IF-A and the third induced current IF-B generated in the third electrode 230 may be additionally generated by the first coupling capacitors Ccp11, Ccp12, Ccp13, and Ccp14. Accordingly, the total induced current IF may be increased compared to the total induced current IF-C according to the comparative example, and the magnitude of the total induced current IF may be great enough to sense a pen input. Also, at the first point PP1, the total induced current IN may be increased compared to the total induced current IN-C according to the comparative example. Accordingly, at the first point PP1 and the second point PP2, the magnitude of each of the total induced currents IN and IF may be secured by as much as a value (e.g., a given or predetermined value) or more.

Figure 48A:
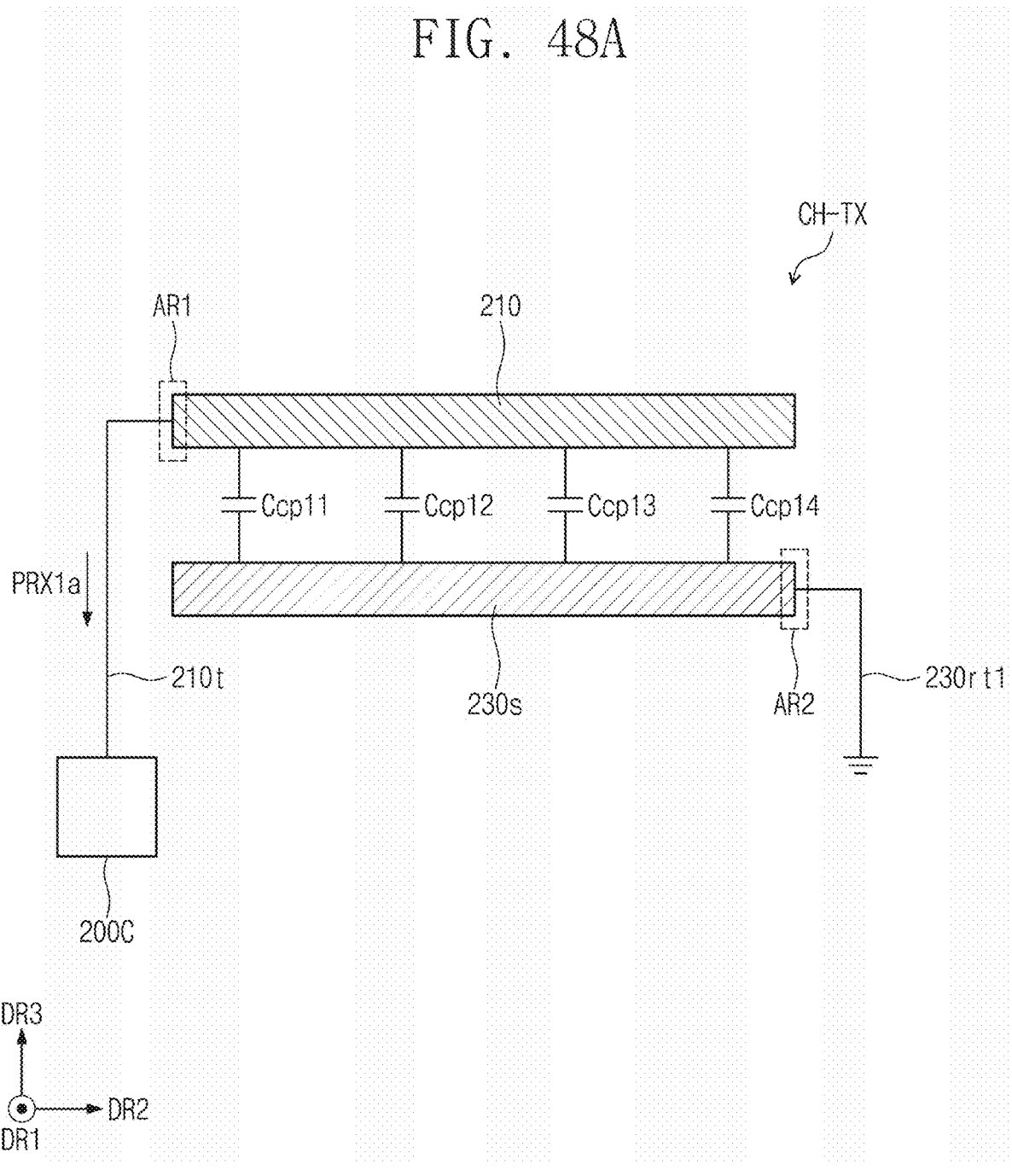
FIG. 48A is a diagram illustrating one channel according to an embodiment of the present disclosure.
Figure 48B:
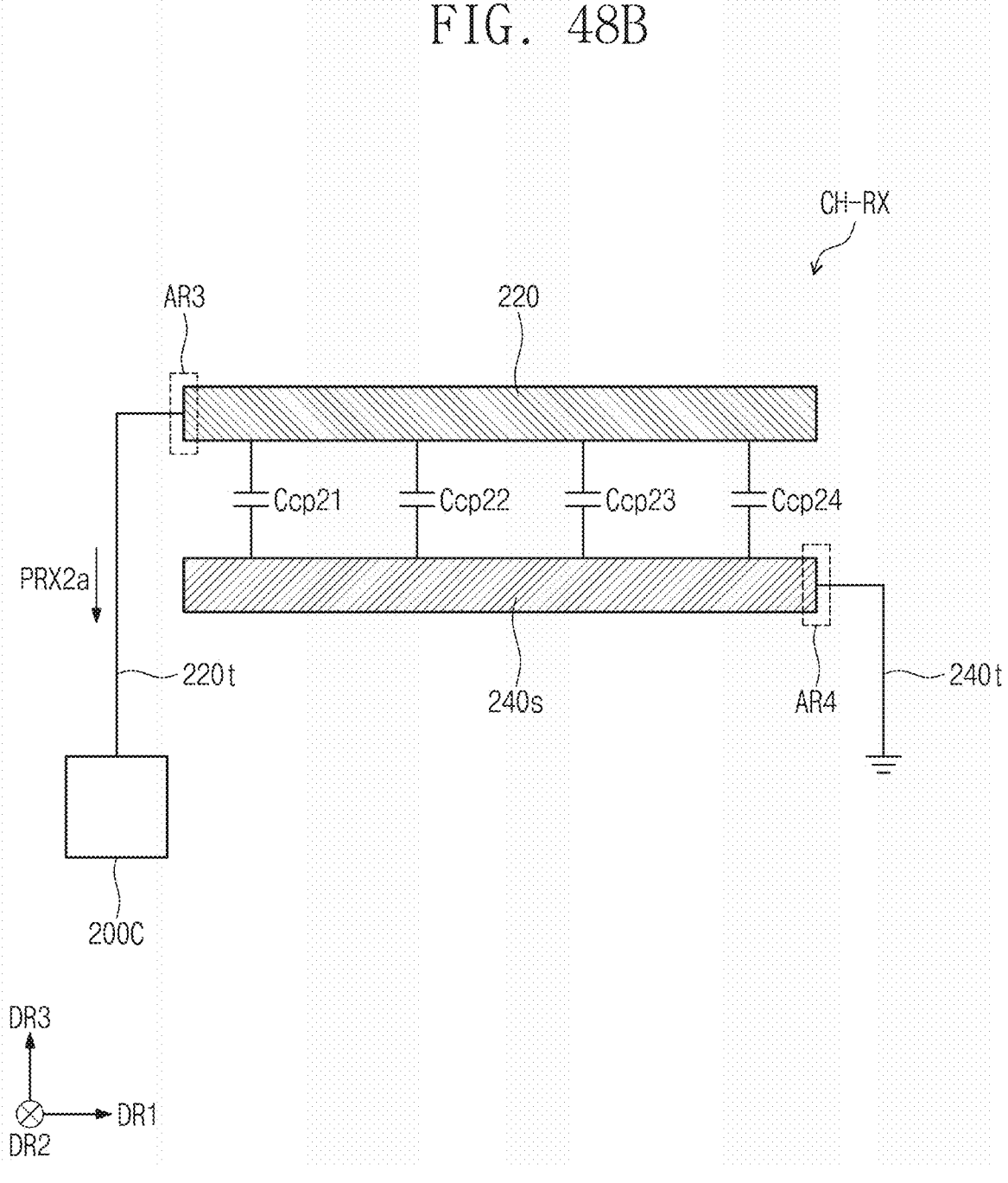
FIG. 48B is a diagram illustrating one channel according to an embodiment of the present disclosure.

FIG. 48A is a diagram illustrating one channel CH-TX according to an embodiment of the present disclosure. FIG. 48B is a diagram illustrating one channel CH-RX according to an embodiment of the present disclosure.

Referring to FIGS. 9, 27B, and 48A, one first channel CH-TX is illustrated. For example, the first channel CH-TX may include the first electrode 210, and the first auxiliary electrode 230s overlapping with the first electrode 210. For example, the first electrode 210 and the first auxiliary electrode 230s may overlap with each other when viewed in the third direction DR3 (e.g., in a plan view). The first electrode 210 may output the first receive signal PRX1a to the sensor driver 200C, and the first auxiliary electrode 230s may be capacitive-coupled to the first electrode 210.

In an embodiment of the present disclosure, in the pen sensing driving mode, the first auxiliary electrode 230s may be electrically connected to ground (e.g., may be coupled to ground). For example, the third trace line 230rt1 electrically connected to the first auxiliary electrode 230s may be grounded (e.g., may be coupled to ground). In other words, the third electrode 230 may be directly connected to ground through the third trace line 230rt1.

The first electrode 210 may be connected to the first trace line 210t at a first area AR1, and the first auxiliary electrode 230s may be connected to the third trace line 230rt1 at a second area AR2. Each of the first electrode 210 and the first auxiliary electrode 230s may extend in the second direction DR2, and the first area AR1 and the second area AR2 may be spaced from each other in the second direction DR2.

The plurality of first coupling capacitor Ccp11, Ccp12, Ccp13, and Ccp14 may be defined between the first electrode 210 and the first auxiliary electrode 230s. In the pen sensing driving mode, the sensor driver 200C may receive an induced current flowing toward the first electrode 210 from the first auxiliary electrode 230s through the first coupling capacitors Ccp11, Ccp12, Ccp13, and Ccp14.

Referring to FIGS. 9, 27B, and 48B, one second channel CH-RX is illustrated. For example, the second channel CH-RX may include the second electrode 220, and the second auxiliary electrode 240s overlapping with the second electrode 220. For example, the second electrode 220 and the second auxiliary electrode 240s may overlap with each other when viewed in the third direction DR3 (e.g., in a plan view). The second electrode 220 may output the second receive signal PRX2a to the sensor driver 200C, and the second auxiliary electrode 240s may be capacitive-coupled to the second electrode 220.

In an embodiment of the present disclosure, in the pen sensing driving mode, the second auxiliary electrode 240s may be electrically connected to ground (e.g., may be coupled to ground). For example, the fourth trace line 240t electrically connected to the second auxiliary electrode 240s may be grounded. In other words, the second auxiliary electrode 240s may be directly connected to ground through the fourth trace line 240t.

The second electrode 220 may be connected to the second trace line 220t at a third area AR3, and the second auxiliary electrode 240s may be connected to the fourth trace line 240t at a fourth area AR4. Each of the second electrode 220 and the second auxiliary electrode 240s may extend in the first direction DR1, and the third area AR3 and the fourth area AR4 may be spaced from each other in the first direction DR1.

A plurality of second coupling capacitors Ccp21, Ccp22, Ccp23, and Ccp24 may be defined between the second electrode 220 and the second auxiliary electrode 240s. In the pen sensing driving mode, the sensor driver 200C may receive a second current flowing toward the second electrode 220 from the second auxiliary electrode 240s through the second coupling capacitors Ccp21, Ccp22, Ccp23, and Ccp24.

Figure 49A:
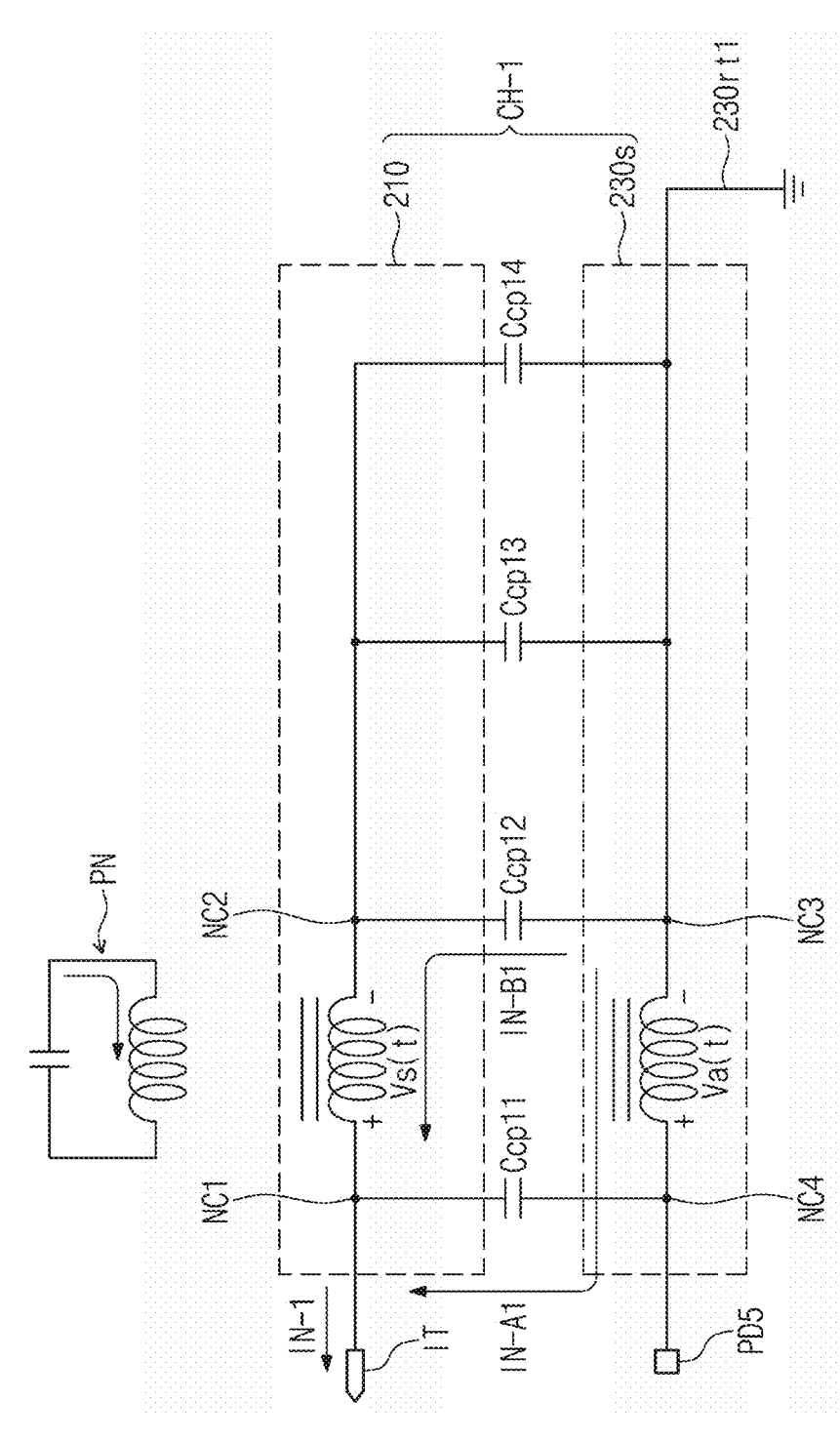
FIG. 49A is an equivalent circuit diagram illustrating a relationship between one channel and a pen according to an embodiment of the present disclosure.
Figure 49B:
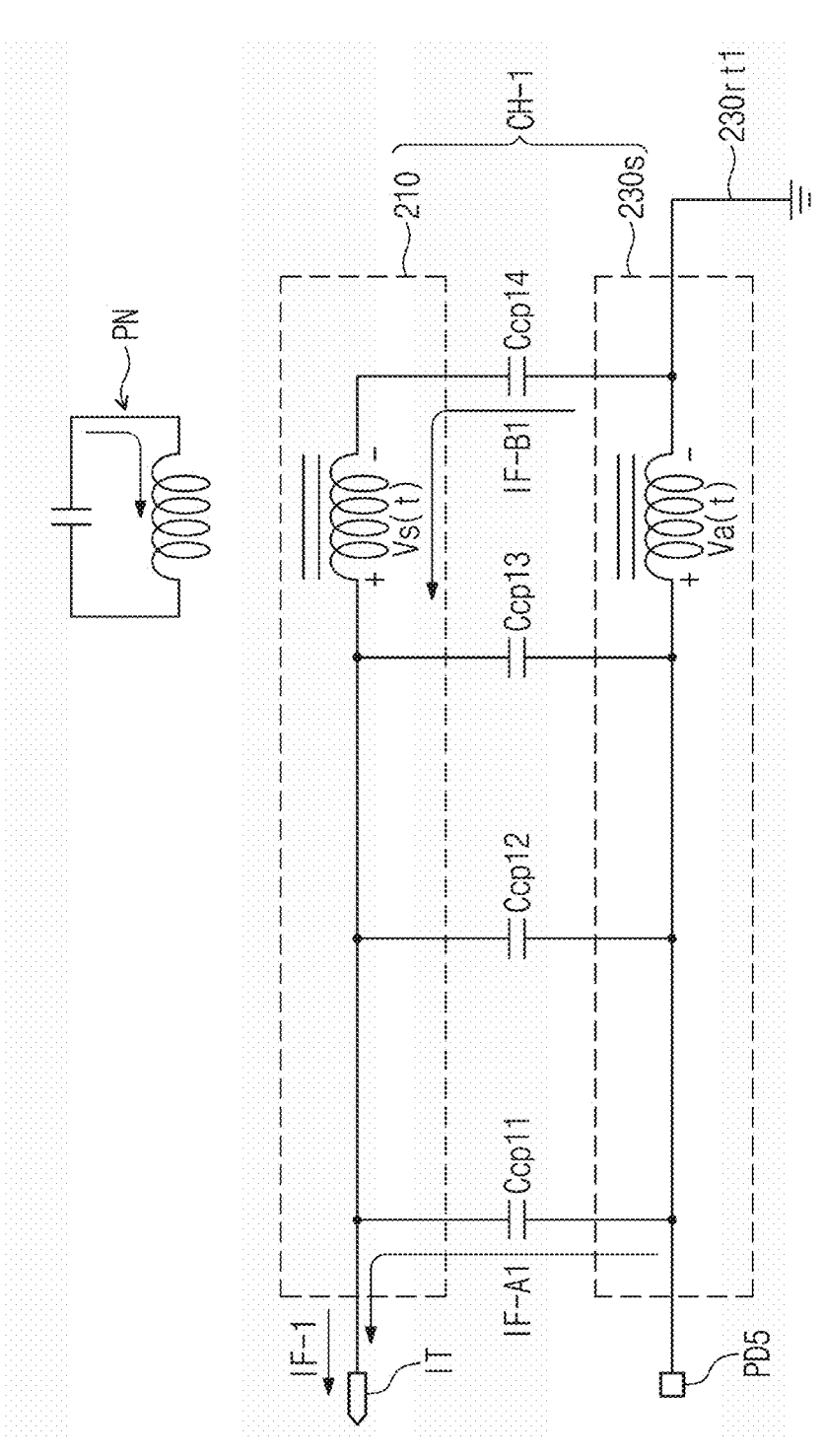
FIG. 49B is an equivalent circuit diagram illustrating a relationship between one channel and a pen according to an embodiment of the present disclosure.

FIG. 49A is an equivalent circuit diagram illustrating a relationship between one channel CH-1 and a pen PN according to an embodiment of the present disclosure. FIG. 49B is an equivalent circuit diagram illustrating a relationship between one channel CH-1 and a pen PN according to an embodiment of the present disclosure.

Referring to FIGS. 49A and 49B, one channel CH-1 may include the first electrode 210 connected to the input terminal IT, and the first auxiliary electrode 230s capacitive-coupled to the first electrode 210. The plurality of first coupling capacitor Ccp11, Ccp12, Ccp13, and Ccp14 may be defined between the first electrode 210 and the first auxiliary electrode 230s. The first auxiliary electrode 230s may be electrically connected to the fifth pad PD5 and the third trace line 230rt1. In an embodiment of the present disclosure, the fifth pad PD5 may be floated, and the third trace line 230rt1 may be grounded.

Referring to FIG. 49A, when the pen PN is close to the channel CH-1, the first induced electromotive force Vs(t) may be generated in the first electrode 210 by the magnetic field generated by the pen PN, and the second induced electromotive force Va(t) may be generated in the first auxiliary electrode 230s by the magnetic field generated by the pen PN.

Each of a first node NC1 and a third node NC3 may have a ground voltage. A voltage of a second node NC2 may be −Vs(t), and a voltage of a fourth node NC4 may be +Va(t). Accordingly, a first induced current IN-B1 may be generated by the first induced electromotive force Vs(t), and a second induced current IN-A1 may be generated by the second induced electromotive force Va(t). Accordingly, a total induced current IN-1 input to the input terminal IT may correspond to a sum of the first induced current IN-B1 and the second induced current IN-A1. For example, it is assumed that the capacitance of each of the first coupling capacitors Ccp11, Ccp12, Ccp13, and Ccp14 is Cc.

In this case, the first induced current IN-B1 over time may be expressed by the Equation below.

$$3Cc\frac{dVs(t)}{dt}$$

The second induced current IN-A1 over time may be expressed by the Equation below.

$$Cc\frac{dVa(t)}{dt}$$

Referring to FIG. 49B, a first induced current IF-B1 may be generated by the first induced electromotive force Vs(t), and a second induced current IF-A1 may be generated by the second induced electromotive force Va(t). Accordingly, a total induced current IF-1 input to the input terminal IT may correspond to a sum of the first induced current IF-B1 and the second induced current IF-A1. For example, it is assumed that the capacitance of each of the first coupling capacitors Ccp11, Ccp12, Ccp13, and Ccp14 is Cc.

In this case, the first induced current IF-B1 over time may be expressed by the Equation below.

$$3Cc\frac{dVa(t)}{dt}$$

The second induced current IF-A1 over time may be expressed by the Equation below.

$$Cc\frac{dVs(t)}{dt}$$

In an embodiment of the present disclosure, the first induced electromotive force Vs(t) may be the same or substantially the same as the second induced electromotive force Va(t). In this case, the total induced current IN-1 input to the input terminal IT when the pen PN is closer to the input terminal IT may be the same or substantially the same as the total induced current IF-1 input to the input terminal IT when the pen PN is relatively distant from the input terminal IT. For example, each of the first induced electromotive force Vs(t) and the second induced electromotive force Va(t) may be expressed by v (t), and each of the total induced currents IN-1 and IF-1 may be expressed by the Equation below.

$$4C_c\frac{dv(t)}{dt}$$

Figure 50:
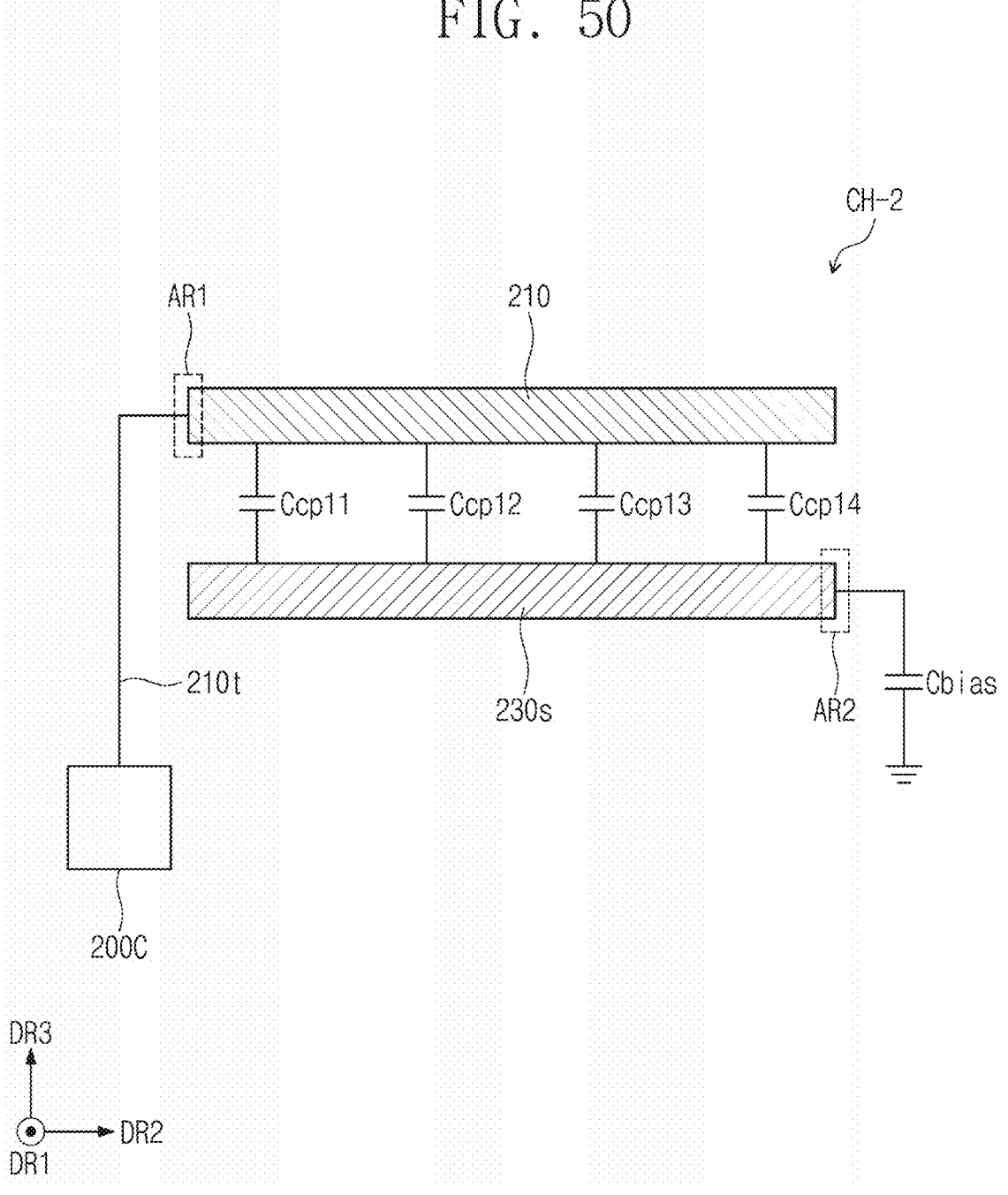
FIG. 50 is a diagram illustrating one channel according to an embodiment of the present disclosure.
Figure 51:
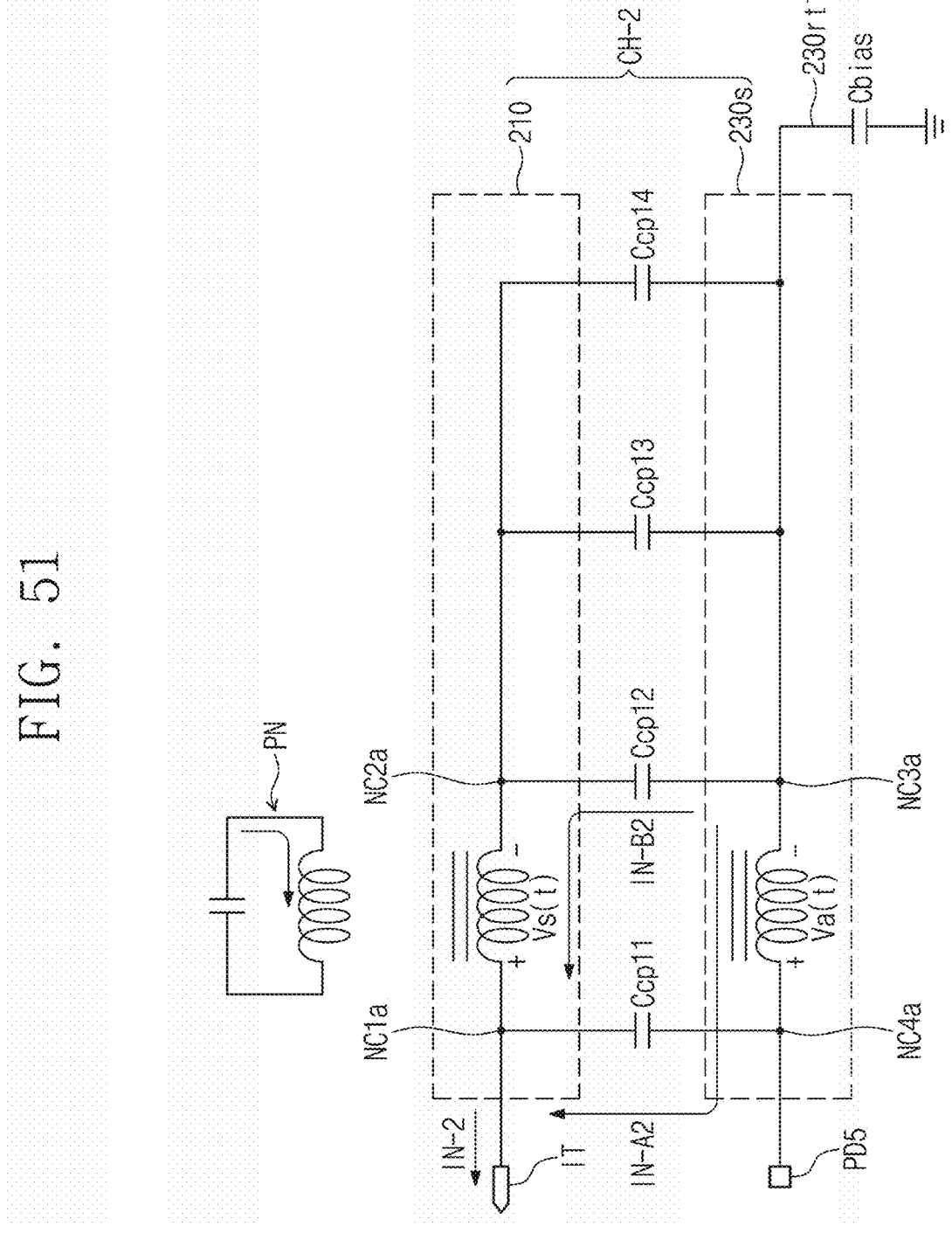
FIG. 51 is an equivalent circuit diagram illustrating a relationship between one channel and a pen according to an embodiment of the present disclosure.

FIG. 50 is a diagram illustrating one channel CH-2 according to an embodiment of the present disclosure. FIG. 51 is an equivalent circuit diagram illustrating a relationship between one channel CH-2 and a pen PN according to an embodiment of the present disclosure.

Referring to FIGS. 50 and 51, one first channel CH-2 is illustrated. For example, the first channel CH-2 may include the first electrode 210, and the first auxiliary electrode 230s capacitive-coupled to the first electrode 210. The first electrode 210 and the first auxiliary electrode 230s may overlap with each other when viewed in the third direction DR3 (e.g., in a plan view).

In an embodiment of the present disclosure, in the pen sensing driving mode, a first end of the first auxiliary electrode 230s may be floated, and a second end of the first auxiliary electrode 230s may be electrically connected to ground (e.g., may be coupled to ground). For example, the second end of the first auxiliary electrode 230s may be grounded (e.g., may be coupled to ground) through a bias capacitor Cbias.

When the pen PN is close to the first channel CH-2, the first induced electromotive force Vs(t) may be generated in the first electrode 210 by the magnetic field generated by the pen PN, and the second induced electromotive force Va(t) may be generated in the first auxiliary electrode 230s by the magnetic field generated by the pen PN. A first induced current IN-B2 may be generated by the first induced electromotive force Vs(t), and a second induced current IN-A2 may be generated by the second induced electromotive force Va(t). Accordingly, a total induced current IN-2 input to the input terminal IT may correspond to a sum of the first induced current IN-B2 and the second induced current IN-A2.

It is assumed that the capacitance of each of the first coupling capacitors Ccp11, Ccp12, Ccp13, and Ccp14 is Cc. It is assumed that the capacitance of the bias capacitor Cbias is Cbi.

In this case, a first node NC1a may have a ground voltage, a voltage of a second node NC2a may be −Vs(t), a voltage of a third node NC3a may be expressed by Equation (1) below, and a voltage of a fourth node NC4a may be expressed by Equation (2) below.

$$-v_s(t)\frac{3C_c}{C_{bi}+3C_c} \qquad \text{Equation (1)}$$

$$+v_a(t)\frac{C_{bi}}{C_{bi}+C_c} \qquad \text{Equation (2)}$$

In an embodiment of the present disclosure, the capacitance of the bias capacitor Cbias may be greater than the capacitance of each of the first coupling capacitors Ccp11, Ccp12, Ccp13, and Ccp14. In this case, a difference between a total induced current input to the input terminal IT when the pen PN is closer to the input terminal IT and a total induced current input to the input terminal IT when the pen PN is relatively distant from the input terminal IT may not be great like that of the difference between the total induced currents described above with reference to FIGS. 45A and 45B.

Figure 52:
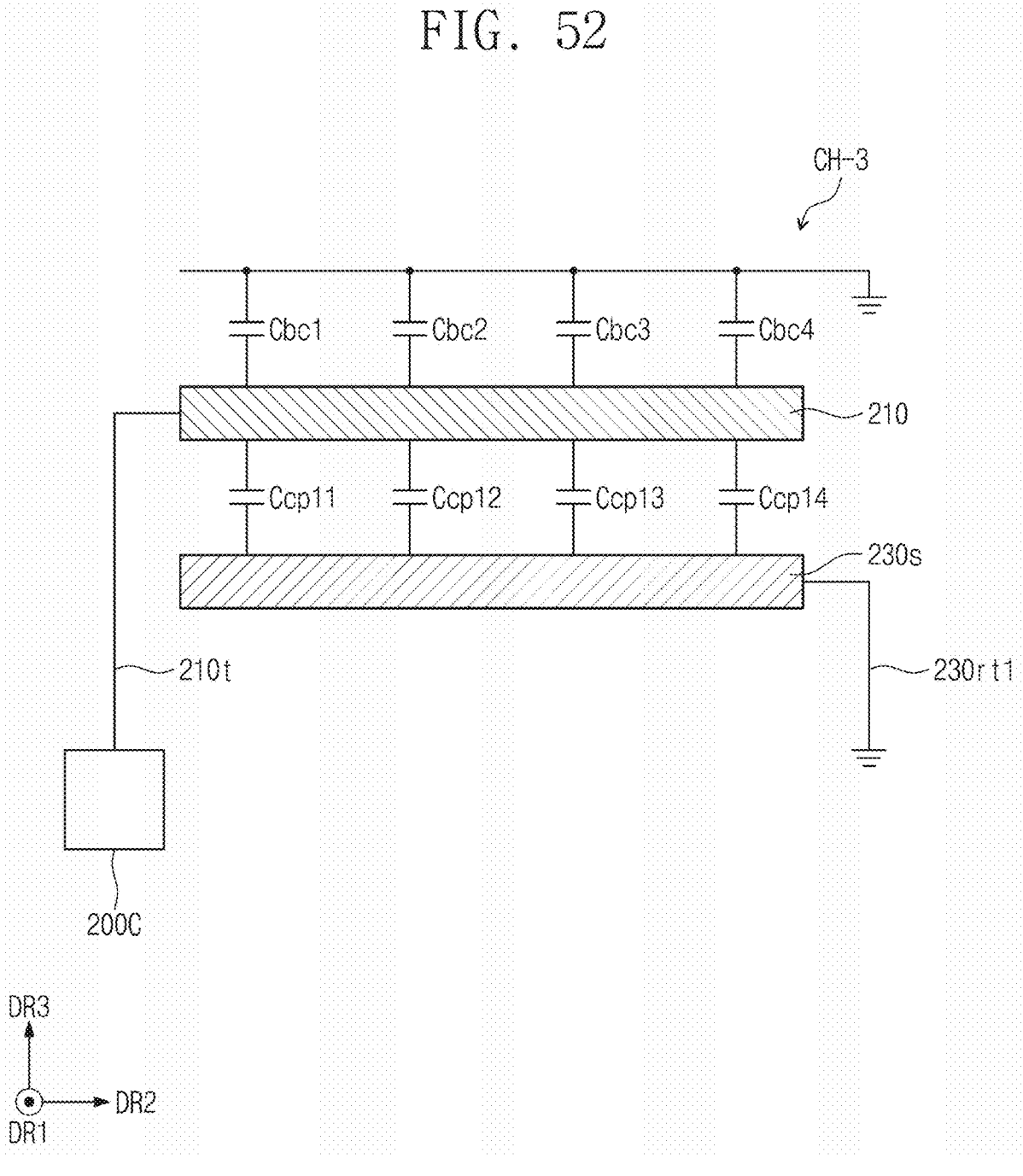
FIG. 52 is a diagram illustrating one channel according to an embodiment of the present disclosure.
Figure 53:
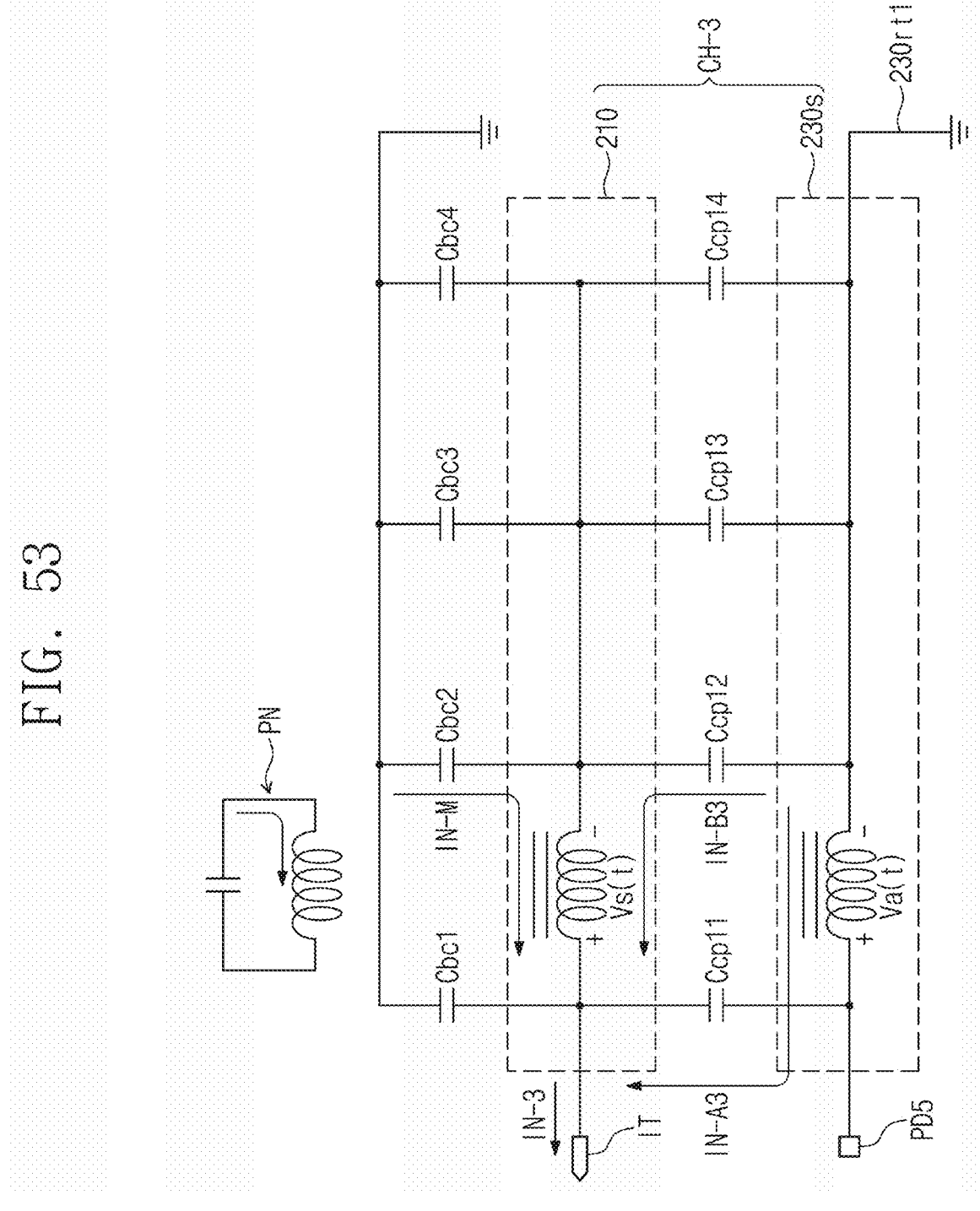
FIG. 53 is an equivalent circuit diagram illustrating a relationship between one channel and a pen according to an embodiment of the present disclosure.

FIG. 52 is a diagram illustrating one channel CH-3 according to an embodiment of the present disclosure. FIG. 53 is an equivalent circuit diagram illustrating a relationship between one channel CH-3 and a pen PN according to an embodiment of the present disclosure.

Referring to FIGS. 52 and 53, one first channel CH-3 is illustrated. For example, the first channel CH-3 may include the first electrode 210, and the first auxiliary electrode 230s capacitive-coupled to the first electrode 210. The first electrode 210 and the first auxiliary electrode 230s may overlap with each other when viewed in the third direction DR3 (e.g., in a plan view).

The first auxiliary electrode 230s may be electrically connected to the fifth pad PD5 and the third trace line 230rt1. In an embodiment of the present disclosure, the fifth pad PD5 may be floated, and the third trace line 230rt1 may be grounded. However, the present disclosure is not limited thereto. For example, the third trace line 230rt1 may be grounded (e.g., may be coupled to ground) through a bias capacitor.

The capacitors Cbc1, Cbc2, Cbc3, and Cbc4 may be defined in the first electrode 210. The capacitors Cbc1, Cbc2, Cbc3, and Cbc4 may be referred to as "parasitic capacitors" or "base capacitors". According to an embodiment of the present disclosure, the capacitors Cbc1, Cbc2, Cbc3, and Cbc4 may also be used to make a signal magnitude greater.

When the pen PN is close to the first channel CH-3, the first induced electromotive force Vs(t) may be generated in the first electrode 210 by the magnetic field generated by the pen PN, and the second induced electromotive force Va(t) may be generated in the first auxiliary electrode 230s by the magnetic field generated by the pen PN. The first induced current IN-M and a third induced current IN-B3 may be generated by the first induced electromotive force Vs(t), and a second induced current IN-A3 may be generated by the second induced electromotive force Va(t). Accordingly, a total induced current IN-3 flowing to the input terminal IT may correspond to a sum of the first to third induced currents IN-M, IN-A3, and IN-B3.

For example, it is assumed that the capacitance of each of the capacitors Cbc1, Cbc2, Cbc3, and Cbc4 is Cb, and it is assumed that the capacitance of each of the first coupling capacitors Ccp11, Ccp12, Ccp13, and Ccp14 is Cc.

In this case, first induced current IN-M over time may be expressed by the $$3Cb\frac{dVs(t)}{dt}$$

The second induced current IN-A3 over time may be expressed by the Equation below.

$$Cc\frac{dVa(t)}{dt}$$

The third induced current IN-B3 over time may be expressed by the Equation below.

$$3Cc\frac{dVs(t)}{dt}$$

Figures 54A, 54B:
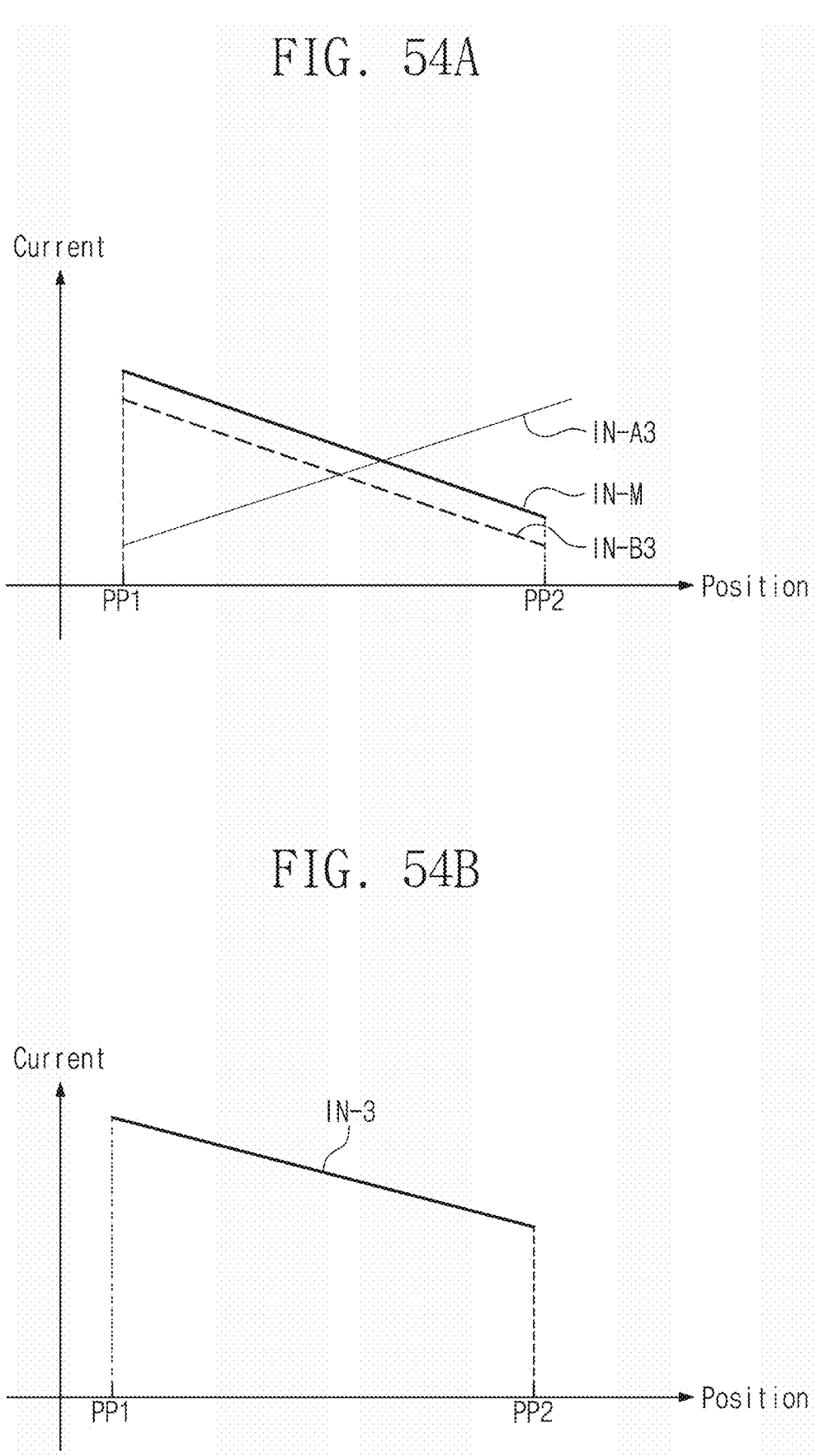
FIG. 54A is a graph illustrating a current magnitude according to a pen position with regard to one channel.
FIG. 54B is a graph illustrating a current magnitude according to a pen position with regard to one channel.

FIG. 54A is a graph illustrating a current magnitude according to a pen position with regard to one channel. FIG. 54B is a graph illustrating a current magnitude according to a pen position with regard to one channel.

Referring to FIGS. 52, 53, and 54A, because opposite ends of the capacitors present between the input terminal IT and the pen PN from among the capacitors Cbc1, Cbc2, Cbc3, and Cbc4 are grounded (e.g., are coupled to ground), a current may not flow. Accordingly, when a position of the pen PN moves from the first point PP1 to the second point PP2, the first induced current IN-M may gradually decrease. Also, the second induced current IN-A3 may gradually increase, and the third induced current IN-B3 may gradually decrease.

Referring to FIGS. 52, 53, and 54B, as the position of the pen PN moves from the first point PP1 to the second point PP2, the total induced current IN-3 may gradually decrease. However, as described above, the total induced current IN-3 may correspond to a sum of the first to third induced currents IN-M, IN-A3, and IN-B3, and the magnitude of the total induced current IN-3 at the second point PP2 may be secured by as much as a value (e.g., a given or predetermined value) or more.

Figure 55:
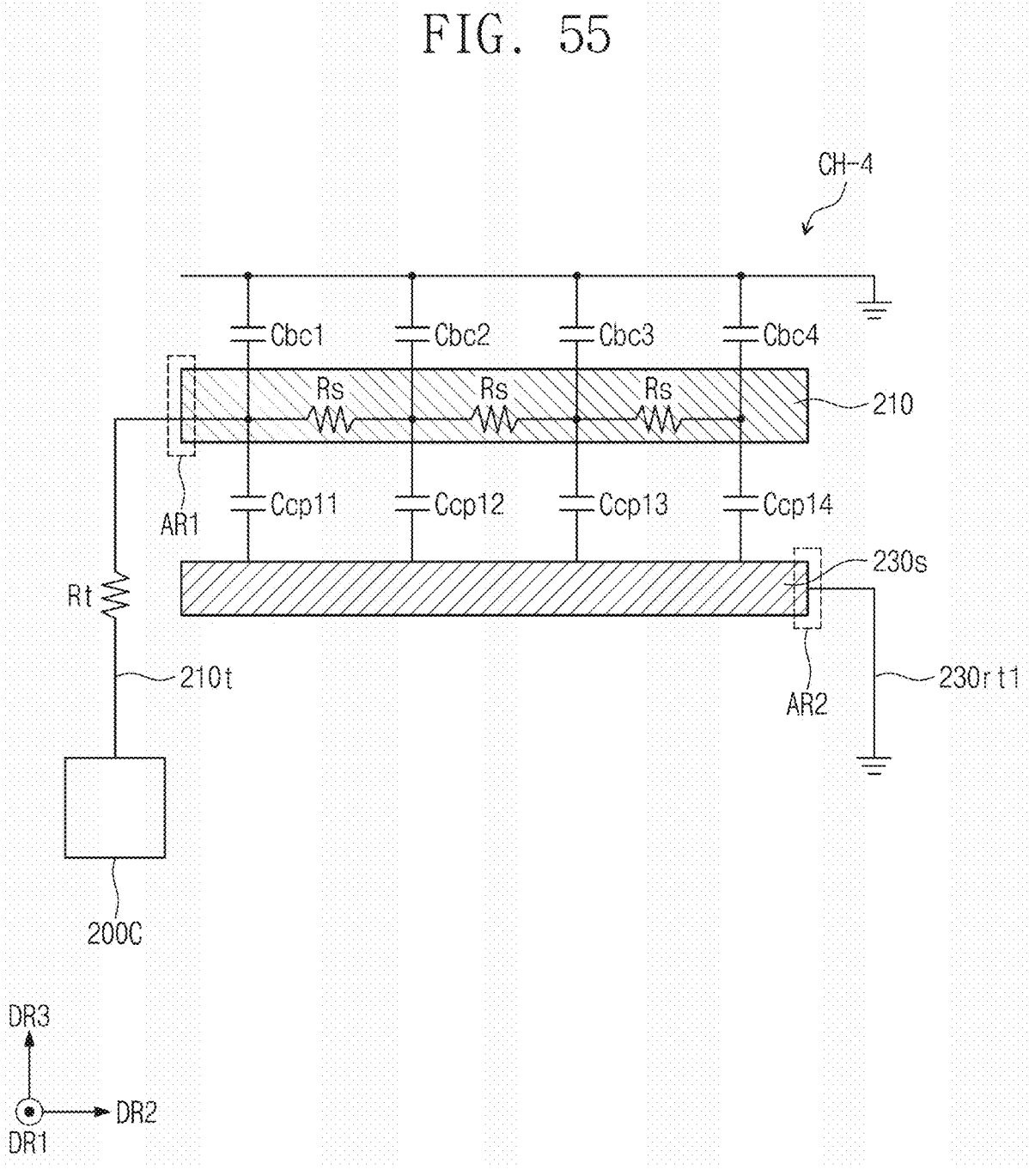
FIG. 55 is an equivalent circuit diagram illustrating a relationship between one channel and a pen according to an embodiment of the present disclosure.

FIG. 55 is an equivalent circuit diagram illustrating a relationship between one channel CH-4 and a pen according to an embodiment of the present disclosure.

Referring to FIG. 55, one first channel CH-4 is illustrated. For example, the first channel CH-4 may include the first electrode 210, and the first auxiliary electrode 230s capacitive-coupled to the first electrode 210. Compared to the embodiment illustrated in FIG. 52, in FIG. 55, a first resistor Rt between the sensor driver 200C and the first electrode 210 and second resistors Rs of the first electrode 210 are additionally illustrated.

The capacitors Cbc1, Cbc2, Cbc3, and Cbc4 may be defined in the first electrode 210. The first electrode 210 and the first auxiliary electrode 230s may overlap with each other when viewed in the third direction DR3 (e.g., in a plan view). The plurality of first coupling capacitor Ccp11, Ccp12, Ccp13, and Ccp14 may be defined between the first auxiliary electrode 230s and the first electrode 210. Hereinafter, the first coupling capacitors Ccp11, Ccp12, Ccp13, and Ccp14 may be referred to as the "1-1st coupling capacitor Ccp11", the "1-2nd coupling capacitor Ccp12", the "1-3rd coupling capacitor Ccp13", and the "1-4th coupling capacitor Ccp14", respectively.

The first auxiliary electrode 230s may be electrically connected to the third trace line 230rt1. In an embodiment of the present disclosure, a first end of the first auxiliary electrode 230s may be floated, and a second end of the first auxiliary electrode 230s, for example, such as a portion of the first auxiliary electrode 230s connected to the third trace line 230rt1, may be grounded. However, the present disclosure is not limited thereto. For example, the third trace line 230rt1 may be grounded (e.g., may be coupled to ground) through a bias capacitor.

The magnitude of an induced current flowing from the first auxiliary electrode 230s to the first electrode 210 may be proportional to a sum of the capacitances of the first coupling capacitors Ccp11, Ccp12, Ccp13, and Ccp14. Accordingly, the capacitances of the first coupling capacitors Ccp11, Ccp12, Ccp13, and Ccp14 may be variously adjusted as needed or desired.

In an embodiment of the present disclosure, the first coupling capacitors Ccp11, Ccp12, Ccp13, and Ccp14 may have the same or substantially the same capacitance as each other. In this case, a ratio of the capacitances of the first coupling capacitors Ccp11, Ccp12, Ccp13, and Ccp14 may be 1:1:1:1.

In an embodiment of the present disclosure, some of the capacitances of the first coupling capacitors Ccp11, Ccp12, Ccp13, and Ccp14 may be different from others thereof. For example, for the enhancement of the RC delay, the capacitance of the 1-1st coupling capacitor Ccp11 being the closest to the sensor driver 200C from among the first coupling capacitors Ccp11, Ccp12, Ccp13, and Ccp14 may be adjusted to be the greatest. For example, the capacitance of the 1-1st coupling capacitor Ccp11 may be greater than the capacitance of the 1-2nd coupling capacitor Ccp12. In this case, because the RC delay decreases, a frequency band capable of being used in the sensor layer 200 may increase.

When a ratio of the capacitances of the first coupling capacitors Ccp11, Ccp12, Ccp13, and Ccp14 is 4:3:2:1, the RC delay may be enhanced by as much as about 3%, compared to the case where the ratio of the capacitances of the first coupling capacitors Ccp11, Ccp12, Ccp13, and Ccp14 is 1:1:1:1. When a ratio of the capacitances of the first coupling capacitors Ccp11, Ccp12, Ccp13, and Ccp14 is 10:0:0:0, the RC delay may be enhanced as much as about 11%, compared to the case where the ratio of the capacitances of the first coupling capacitors Ccp11, Ccp12, Ccp13, and Ccp14 is 1:1:1:1. However, the above capacitance ratios are provided as an example, and the present disclosure is not limited thereto.

Figure 56A:
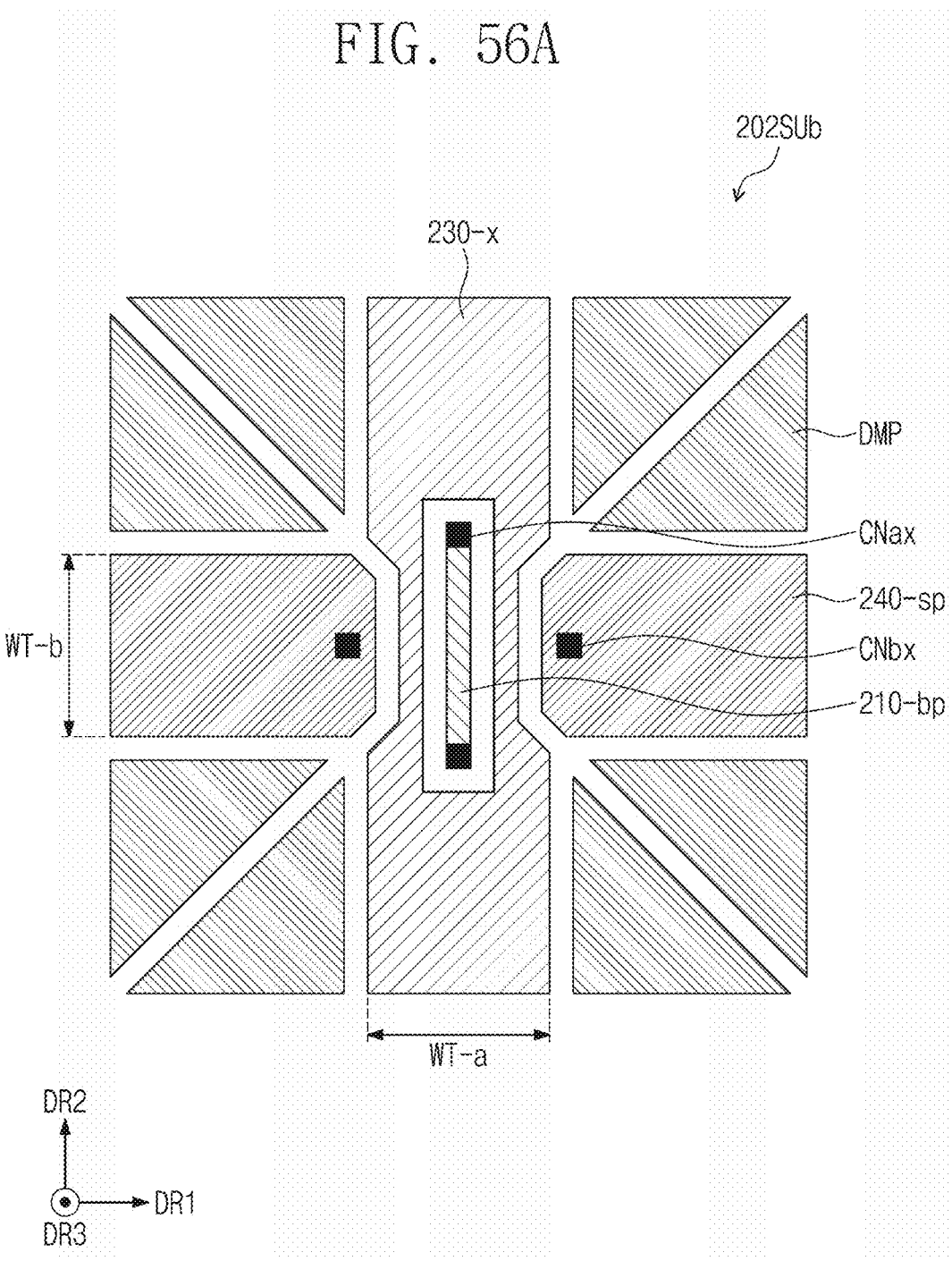
FIG. 56A is a plan view illustrating a first conductive layer of a sensing unit according to an embodiment of the present disclosure.
Figure 56B:
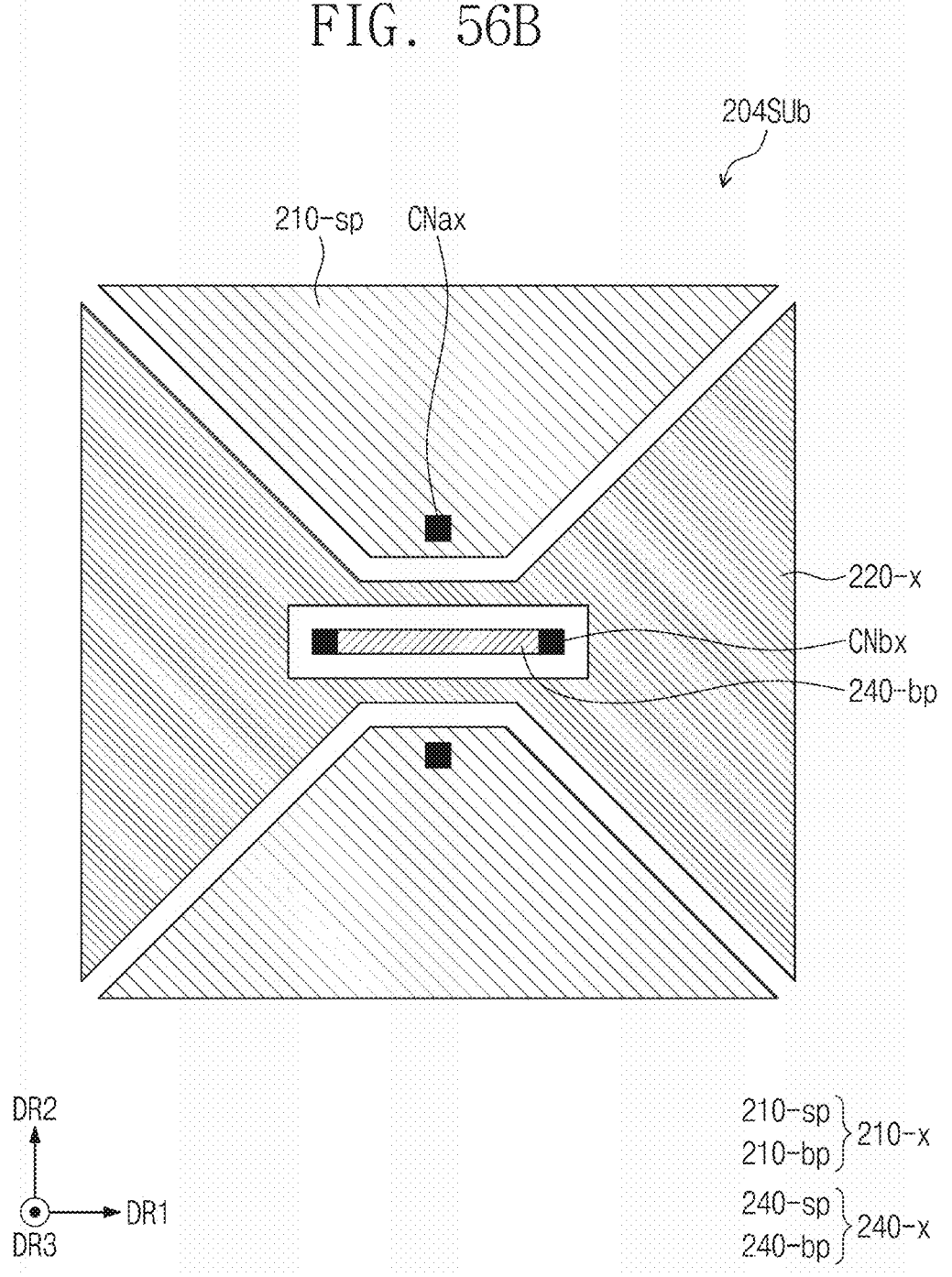
FIG. 56B is a plan view illustrating a second conductive layer of a sensing unit according to an embodiment of the present disclosure.

FIG. 56A is a plan view illustrating a first conductive layer (e.g., a first layer) 202SUb of a sensing unit according to an embodiment of the present disclosure. FIG. 56B is a plan view illustrating a second conductive layer (e.g., a second layer) 204SUb of a sensing unit according to an embodiment of the present disclosure.

Referring to FIGS. 56A and 56B, a first sensing electrode 210-x may include first sensing patterns (e.g., patterns) 210-sp and a first bridge pattern 210-bp. The first sensing patterns 210-sp and the first bridge pattern 210-bp may be electrically connected to each other through a first contact CNax. A second sensing electrode 220-x may be disposed at (e.g., in or on) the same layer as that of the first sensing patterns 210-sp. For example, the first sensing patterns 210-sp may be spaced from each other, with the second sensing electrode 220-x interposed therebetween. The first bridge pattern 210-bp may be disposed at (e.g., in or on) a layer different from that of the second sensing electrode 220-x, and may be insulated from and cross the second sensing electrode 220-x.

A first auxiliary electrode (e.g., a first electrode) 230-x may be disposed at (e.g., in or on) the same layer as that of the first bridge pattern 210-bp. An opening surrounding (e.g., around a periphery of) the first bridge pattern 210-bp may be defined in the first auxiliary electrode 230-x. The first auxiliary electrode 230-x may overlap with the first sensing patterns 210-sp. For example, one of the first sensing patterns 210-sp may include a first region overlapping with the first auxiliary electrode 230-x. Accordingly, a coupling capacitor (e.g., a first capacitor) may be defined between the first sensing electrode 210-x (e.g., one of the first sensing patterns 210-sp) and the first auxiliary electrode 230-x.

A second auxiliary electrode (e.g., a second electrode) 240-x may include second sensing patterns (e.g., patterns) 240-sp, and a second bridge pattern 240-bp. The second sensing patterns 240-sp and the second bridge pattern 240-bp may be electrically connected to each other through a second contact CNbx. The first auxiliary electrode 230-x may be disposed at (e.g., in or on) the same layer as that of the second sensing patterns 240-sp. For example, the second sensing patterns 240-sp may be spaced from each other with the first auxiliary electrode 230-x interposed therebetween. The second auxiliary electrode 240-x may overlap with the second sensing electrode 220-x. For example, one of the second sensing patterns 240-sp may include a second region overlapping with the second sensing electrode 220-x. Accordingly, a coupling capacitor (e.g., a second capacitor) may be defined between the second sensing electrode 220-x and the second auxiliary electrode 240-x (e.g., one of the second sensing patterns 240-sp). In some embodiments, an area (e.g., a first area) of the first region may be less than (e.g., smaller than) an area (e.g., a second area) of the second region. Accordingly, in some embodiments, the first capacitor may have a capacitance less than that of the second capacitor. The second bridge pattern 240-bp may be disposed at (e.g., in or on) a layer different from that of the first auxiliary electrode 230-x, and may be insulated from and cross the first auxiliary electrode 230-x. The maximum width WT-a of the first auxiliary electrode 230-x in the first direction DR1 may be less than or equal to the maximum width WT-b of the second auxiliary electrode 240-x or the second sensing pattern 240-sp in the second direction DR2.

In an embodiment of the present disclosure, the first conductive layer 202SUb may include the first bridge pattern 210-bp, the first auxiliary electrode 230-x, and the second sensing patterns 240-sp. The second conductive layer 204SUb may include the first sensing patterns 210-sp, the second sensing electrode 220-x, and the second bridge pattern 240-bp. Also, in an embodiment of the present disclosure, the first conductive layer 202SUb may further include the dummy patterns DMP. Each of the dummy patterns DMP may be electrically floated or may be electrically grounded. In an embodiment of the present disclosure, the dummy patterns DMP may be omitted as needed or desired.

In some embodiments, as shown in FIG. 56A, the first auxiliary electrode (e.g., the first electrode) 230-x may include patterns (or pattern portions) at opposite ends of the first bridge pattern 210-bp in the second direction DR2 and connection portions (bridge patterns) spaced from each other in the first direction DR1, and the connection portions are located between the pattern portions and between the second sensing patterns 240-sp, the connection portions and the pattern portions are connected to each other and are located at a same layer as each other, and each of the patterns of the first auxiliary electrode 230-x may have a width that is parallel to or substantially parallel to the first direction DR1. In some embodiments, the width of each of the patterns of the first auxiliary electrode 230-x may be less than a width WT-b of the second auxiliary electrode 240-x or the second sensing patterns 240-sp that is parallel to or substantially parallel to the second direction DR2. The patterns of the first auxiliary electrode 230-x may be connected to each other via at least one bridge pattern extending parallel to or substantially parallel to the first bridge pattern 210-bp. For example, as shown in FIG. 56A, the patterns of the first auxiliary electrode 230-x may be connected to each other via two bridge patterns located at opposite sides of the first bridge pattern 210-bp in the first direction DR1. However, the present disclosure is not limited thereto, and in some embodiments, the bridge pattern of the first auxiliary electrode 230-x may overlap with the first bridge pattern 210-bp. For example, in some embodiments, the first bridge pattern 210-bp may overlap with an opening of the bridge pattern of the first auxiliary electrode 230-x. A width of the bridge pattern of the first auxiliary electrode 230-x in the first direction DR1 may be less than a width of the pattern of the first auxiliary electrode 230-x in the first direction DR1.

In some embodiments, as shown in FIG. 56B, the second sensing electrode 220-x may include patterns at opposite ends of the second bridge pattern 240-bp in the first direction DR1, and the patterns of the second sensing electrode 220-x may be connected to each other via at least one bridge pattern extending parallel to or substantially parallel to the second bridge pattern 240-bp, and the pattern and the bridge pattern of the second sensing electrode 220-x are located at the same layer as each other. For example, as shown in FIG. 56B, the patterns of the second sensing electrode 220-x may be connected to each other via two bridge patterns located at opposite sides of the second bridge pattern 240-bp in the second direction DR2.

Figure 57A:
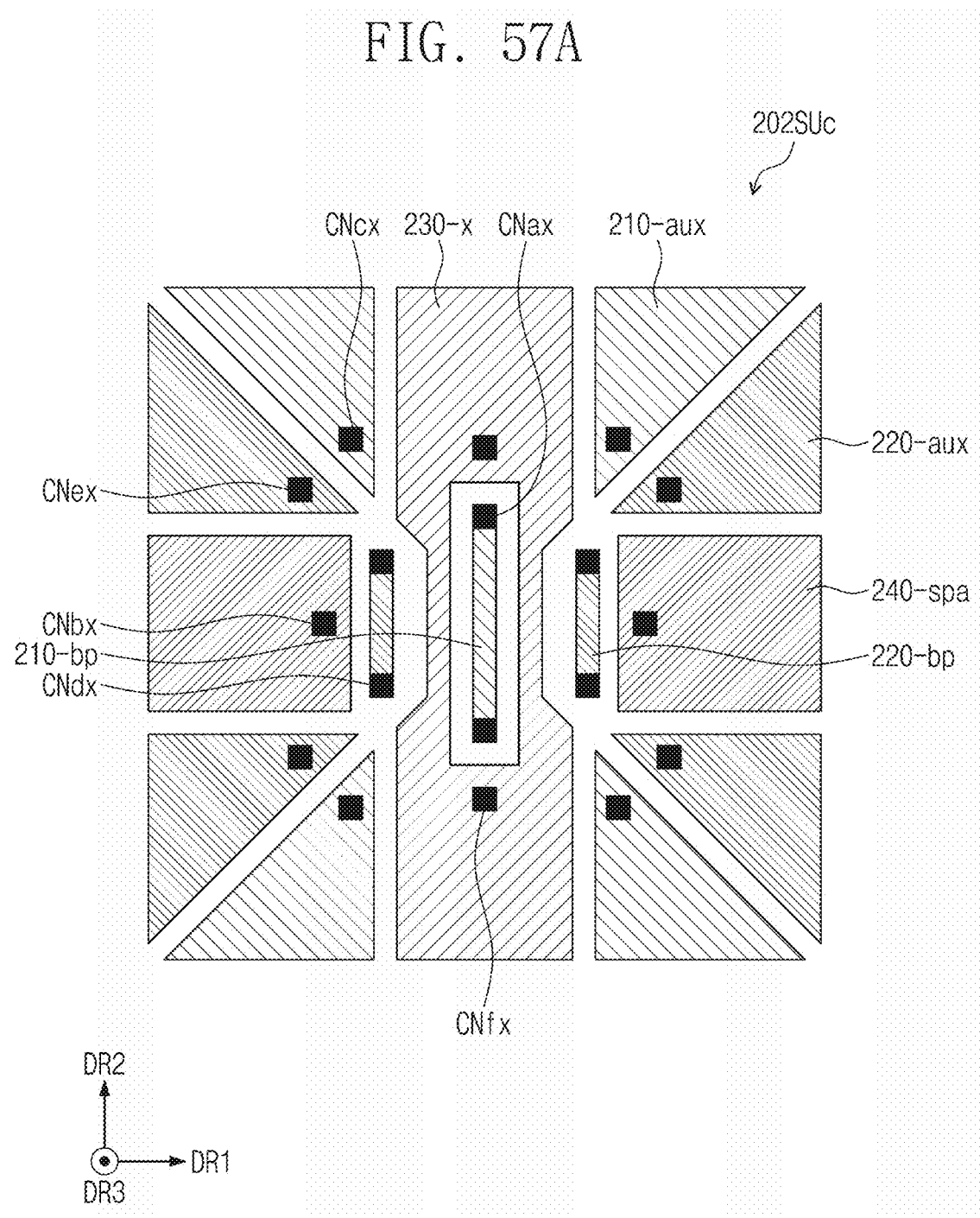
FIG. 57A is a plan view illustrating a first conductive layer of a sensing unit according to an embodiment of the present disclosure.
Figure 57B:
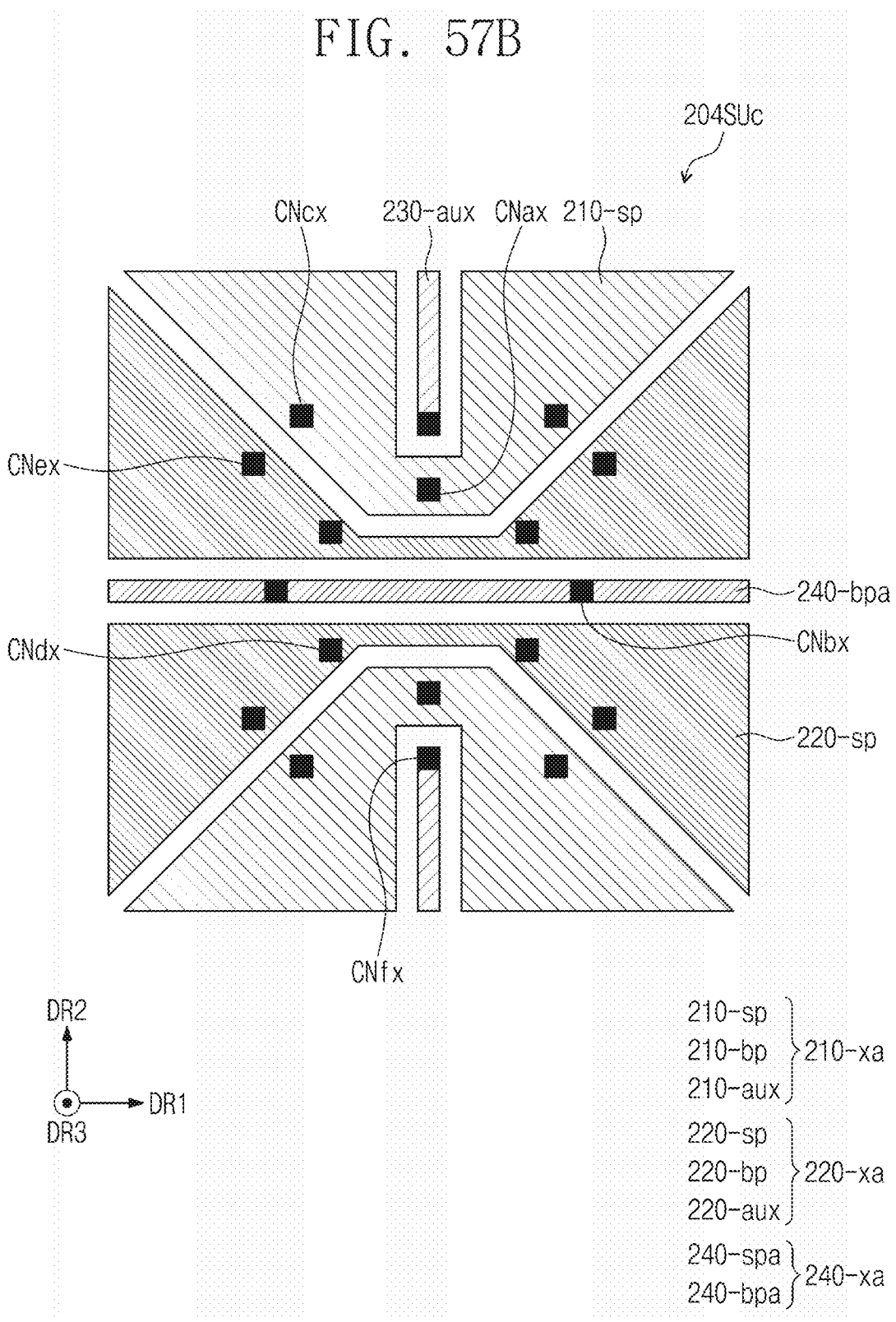
FIG. 57B is a plan view illustrating a second conductive layer of a sensing unit according to an embodiment of the present disclosure.

FIG. 57A is a plan view illustrating a first conductive layer (e.g., a first layer) 202SUc of a sensing unit according to an embodiment of the present disclosure. FIG. 57B is a plan view illustrating a second conductive layer (e.g., a second layer) 204SUc of a sensing unit according to an embodiment of the present disclosure.

Referring to FIGS. 57A and 57B, a first sensing electrode 210-xa may include the first sensing patterns (e.g., patterns) 210-sp, the first bridge pattern 210-bp, and first electrode auxiliary patterns 210-aux. The first sensing patterns 210-sp and the first bridge pattern 210-bp may be electrically connected to each other through the first contact CNax. The first sensing patterns 210-sp and the first electrode auxiliary patterns 210-aux may be electrically connected to each other through a third contact CNcx.

A second sensing electrode 220-xa may include second sensing patterns (e.g., patterns) 220-sp, second bridge patterns 220-bp, and second electrode auxiliary patterns 220-aux. The second sensing patterns 220-sp and the second bridge patterns 220-bp may be electrically connected to each other through a fourth contact CNdx. The second sensing patterns 220-sp and the second electrode auxiliary patterns 220-aux may be electrically connected to each other through a fifth contact CNex.

A first auxiliary electrode (e.g., a first electrode) 230-x may be electrically connected to third auxiliary patterns 230-aux. For example, the first auxiliary electrode 230-x and the third auxiliary patterns 230-aux may be disposed at (e.g., in or on) different layers from each other, and the first auxiliary electrode 230-x and the third auxiliary patterns 230-aux may be electrically connected to each other through a sixth contact CNfx.

A second auxiliary electrode (e.g., a second electrode) 240-xa may include third sensing patterns (e.g., patterns) 240-spa and a third bridge pattern 240-bpa. The third sensing patterns 240-spa may be referred to as "auxiliary patterns", and the third bridge patterns 240-bpa may be referred to as "auxiliary bridge patterns". The third sensing patterns 240-spa and the third bridge pattern 240-bpa may be electrically connected to each other through the second contact CNbx. The third bridge pattern 240-bpa may be in the shape of a line extending in the first direction DR1, and the third sensing patterns 240-spa may be spaced from each other in the first direction DR1. The second sensing patterns 220-sp may be spaced from each other, with the third bridge pattern 240-bpa interposed therebetween.

In an embodiment of the present disclosure, the first conductive layer 202SUc may include the first bridge pattern 210-bp, the first electrode auxiliary patterns 210-aux, the second bridge patterns 220-bp, the second electrode auxiliary patterns 220-aux, the first auxiliary electrode 230-x, and the third sensing patterns 240-spa. The second conductive layer 204SUc may include the first sensing patterns 210-sp, the second sensing patterns 220-sp, the third auxiliary patterns 230-aux, and the third bridge pattern 240-bpa.

Figure 58A:
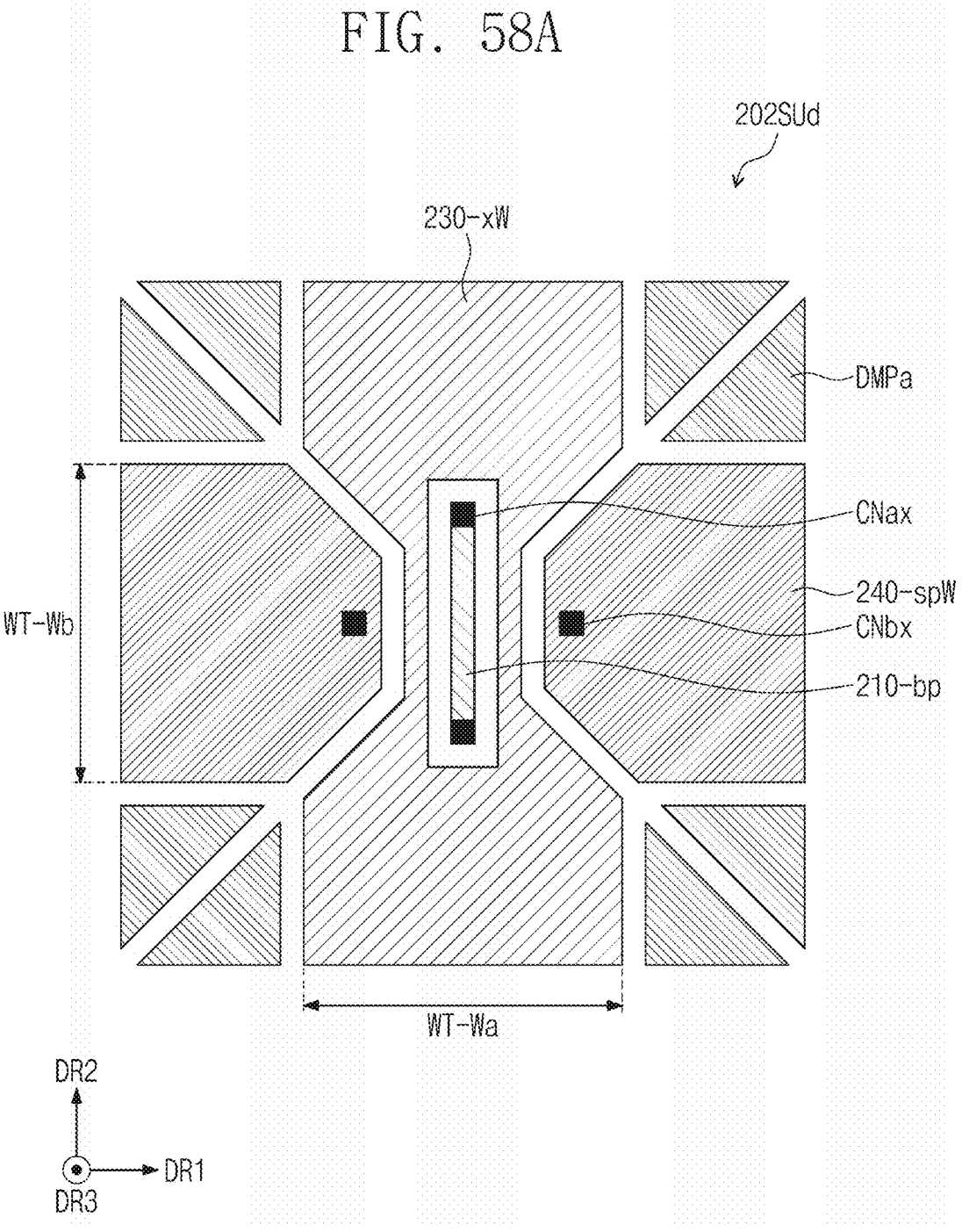
FIG. 58A is a plan view illustrating a first conductive layer of a sensing unit according to an embodiment of the present disclosure.
Figure 58B:
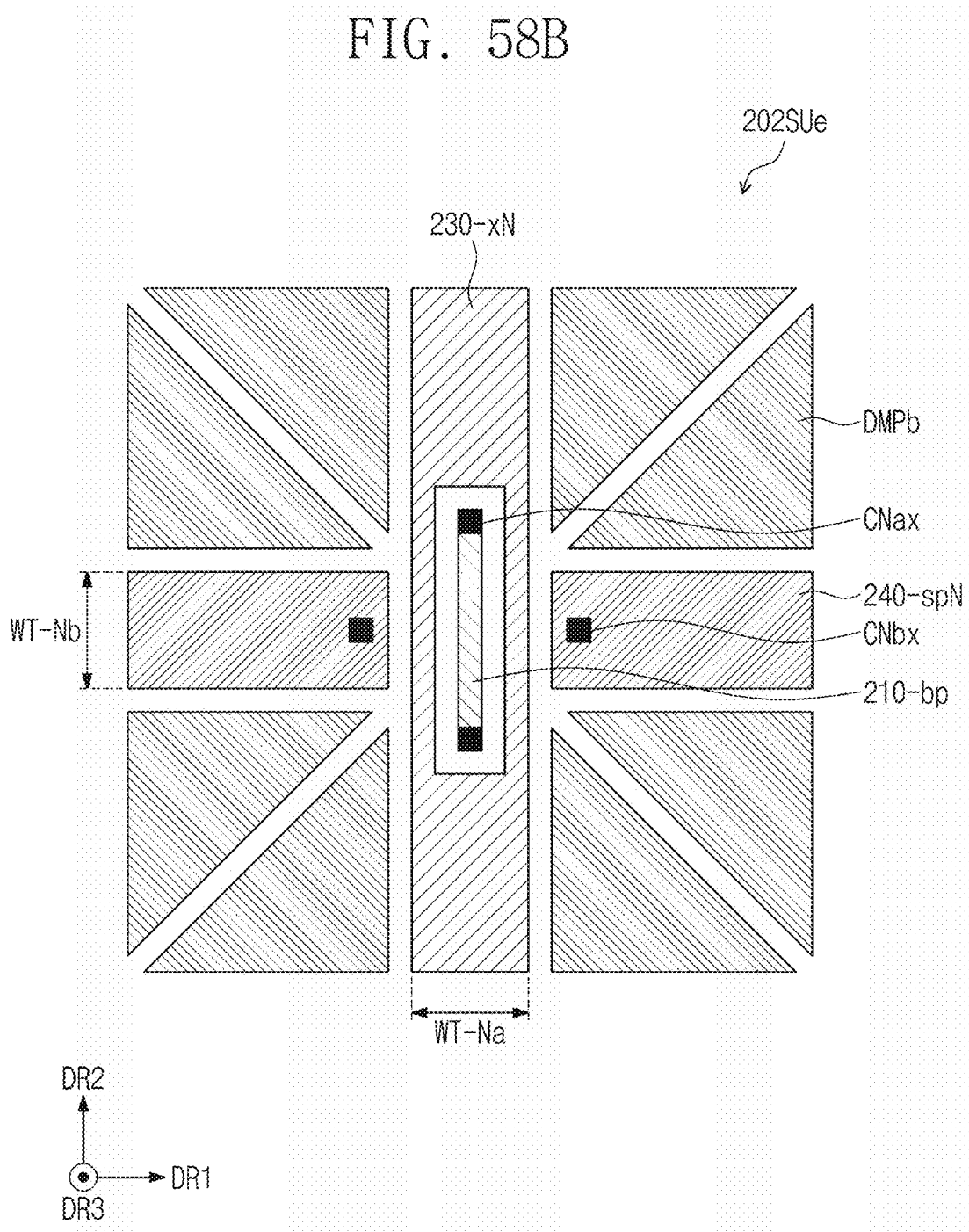
FIG. 58B is a plan view illustrating a first conductive layer of a sensing unit according to an embodiment of the present disclosure.

FIG. 58A is a plan view illustrating a first conductive layer (e.g., a first layer) 202SUd of a sensing unit according to an embodiment of the present disclosure. FIG. 58B is a plan view illustrating a first conductive layer (e.g., a first layer) 202SUe of a sensing unit according to an embodiment of the present disclosure.

Referring to FIGS. 55, 56A, 58A, and 58B, at least some of the capacitances of the first coupling capacitors Ccp11, Ccp12, Ccp13, and Ccp14 may be different from those of others thereof. For example, for the enhancement of the RC delay, the capacitance of the 1-1st coupling capacitor Ccp11 being the closest to the sensor driver 200C from among the first coupling capacitors Ccp11, Ccp12, Ccp13, and Ccp14 may be adjusted to be the greatest. For example, the capacitance of the 1-1st coupling capacitor Ccp11 may be greater than the capacitance of the 1-2nd coupling capacitor Ccp12. Also, the capacitance of the 1-2nd coupling capacitor Ccp12 may be greater than the capacitance of the 1-4th coupling capacitor Ccp14. In this case, because the RC delay decreases, a frequency band capable of being used in the sensor layer 200 may increase.

Referring to FIGS. 56A, 58A, and 58B, widths WT-a, WT-Wa, and WT-Na of the first auxiliary electrode 230-x, 230-xW, and 230-xN may be different from each other. The portions 230-xW and 230-xN illustrated in FIGS. 58A and 58B may be a portion of the first auxiliary electrode 230-x illustrated in FIG. 56A, and the remaining portions of the same first auxiliary electrode 230-x, which are spaced from each other in the second direction DR2. The widths WT-a, WT-Wa, and WT-Na may be widths in the first direction DR1.

Hereinafter, the portion of the first auxiliary electrode 230-x illustrated in FIG. 56A, the portion 230-xW illustrated in FIG. 58A, and the portion 230-xN illustrated in FIG. 58B may be referred to as a "first portion", a "second portion", and a "third portion", respectively. The second portion 230-xW may be a portion of the first auxiliary electrode 230-x being the closest to the first area AR1 (e.g., refer to FIG. 55), and the third portion 230-xN may be a portion of the first auxiliary electrode 230-x being the closest to the second area AR2.

According to an embodiment of the present disclosure, as the widths WT-a, WT-Wa, and WT-Na of the first to third portions 230-x, 230-xW, and 230-xN are differently implemented, the capacitances of the first coupling capacitors Ccp11, Ccp12, Ccp13, and Ccp14 may be differently implemented. The width WT-Na of the third portion 230-xN may be the smallest, and the width WT-Wa of the second portion 230-xW may be the greatest. The width WT-a of the first portion 230-x may be between the width WT-Na of the third portion 230-xN and the width WT-Wa of the second portion 230-xW. For example, the first conductive layer 202SUb illustrated in FIG. 56A may be included in a sensing unit forming the 1-2nd coupling capacitor Ccp12, the first conductive layer 202SUd illustrated in FIG. 58A may be included in a sensing unit forming the 1-1st coupling capacitor Ccp11, and the first conductive layer 202SUe illustrated in FIG. 58B may be included in a sensing unit forming the 1-4th coupling capacitor Ccp14.

According to an embodiment of the present disclosure, when the widths WT-a, WT-Wa, and WT-Na of the first auxiliary electrodes 230-x, 230-xW, and 230-xN are adjusted, widths WT-b, WT-Wb, and WT-Nb of second sensing patterns 240-sp, 240-spW, and 240-spN may also be adjusted to correspond to the adjusted widths of the first auxiliary electrodes 230-x, 230-xW, and 230-xN. Hereinafter, a portion of the second sensing pattern 240-sp illustrated in FIG. 56A, a portion 240-spW illustrated in FIG. 58A, and a portion 240-spN illustrated in FIG. 58B are referred to as a "fourth portion", a "fifth portion", and a "sixth portion", respectively. For example, the width WT-Nb of the sixth portion 240-spN adjacent to the third portion 230-xN may be the smallest, and the width WT-Wb of the fifth portion 240-spW adjacent to the second portion 230-xW may be the greatest. The width WT-b of the fourth portion 240-sp adjacent to the first portion 230-x may be between the width WT-Nb of the sixth portion 240-spN and the width WT-Wb of the fifth portion 240-spW.

Dummy patterns DMP, DMPa, and DMPb may have different shapes from each other, so as to correspond to shapes of the first auxiliary electrodes 230-x, 230-xW, and 230-xN and the shapes of the second sensing patterns 240-sp, 240-spW, and 240-spN.

In an embodiment of the present disclosure, all of the second sensing patterns 240-sp, 240-spW, and 240-spN illustrated in FIGS. 56A, 58A, and 58B may have the shape of the second sensing pattern 240-sp illustrated in FIG. 56A, regardless of the adjustment of the widths WT-a, WT-Wa, and WT-Na of the first auxiliary electrodes 230-x, 230-xW, and 230-xN.

Figure 59:
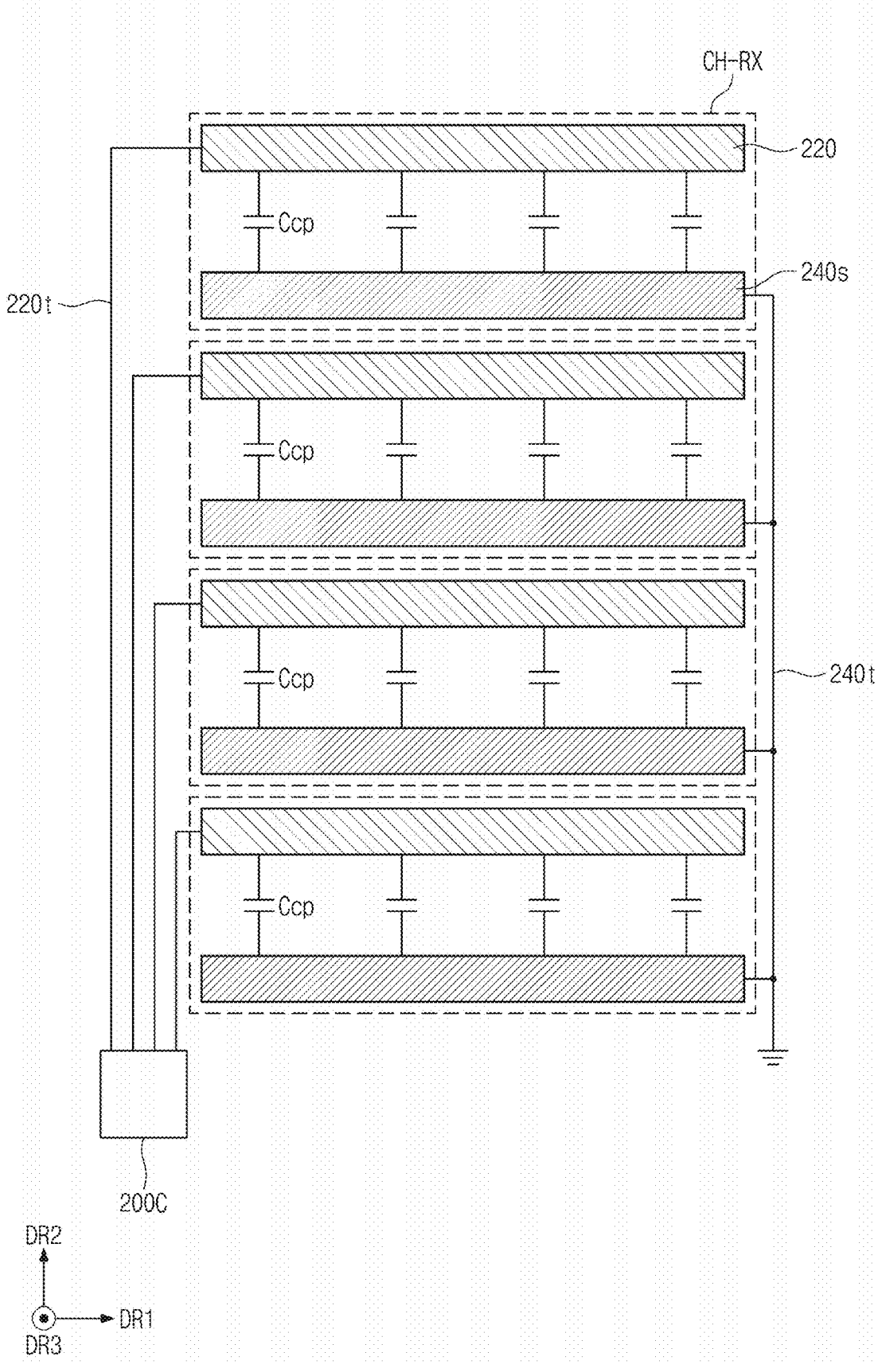
FIG. 59 is a diagram illustrating four channels according to an embodiment of the present disclosure.

FIG. 59 is a diagram illustrating four channels CH-RX according to an embodiment of the present disclosure.

Referring to FIGS. 9 and 59, each of four channels CH-RX may include a corresponding second electrode 220 and a corresponding second auxiliary electrode 240s. The second trace lines 220t may be electrically connected to the second electrodes 220 in a one-to-one correspondence. The four second auxiliary electrodes 240s may be connected to the fourth trace line 240t. Accordingly, the four second auxiliary electrodes 240s may be electrically connected to each other. The fourth trace line 240t may be grounded (e.g., may be coupled to ground).

In an embodiment of the present disclosure, the fourth trace line 240t may be spaced from the second trace lines 220t, with the channels CH-RX interposed therebetween. In other words, an area in which one second electrode 220 constituting one channel CH-RX outputs a signal to the sensor driver 200C and an area in which one second auxiliary electrode 240s is grounded (e.g., is coupled to ground) may be defined in opposite directions from each other (e.g., may face away from each other). In this case, in the pen sensing driving mode, the sensor driver 200C may additionally receive the induced currents flowing toward the second electrodes 220 from the second auxiliary electrodes 240s through the coupling capacitors Ccp. Accordingly, a magnitude of a signal received from the second electrodes 220 may become greater. As such, the sensor driver 200C may stably receive a signal from an electrode regardless of a distance between an input terminal and an area where a pen input is provided.

Figure 60:
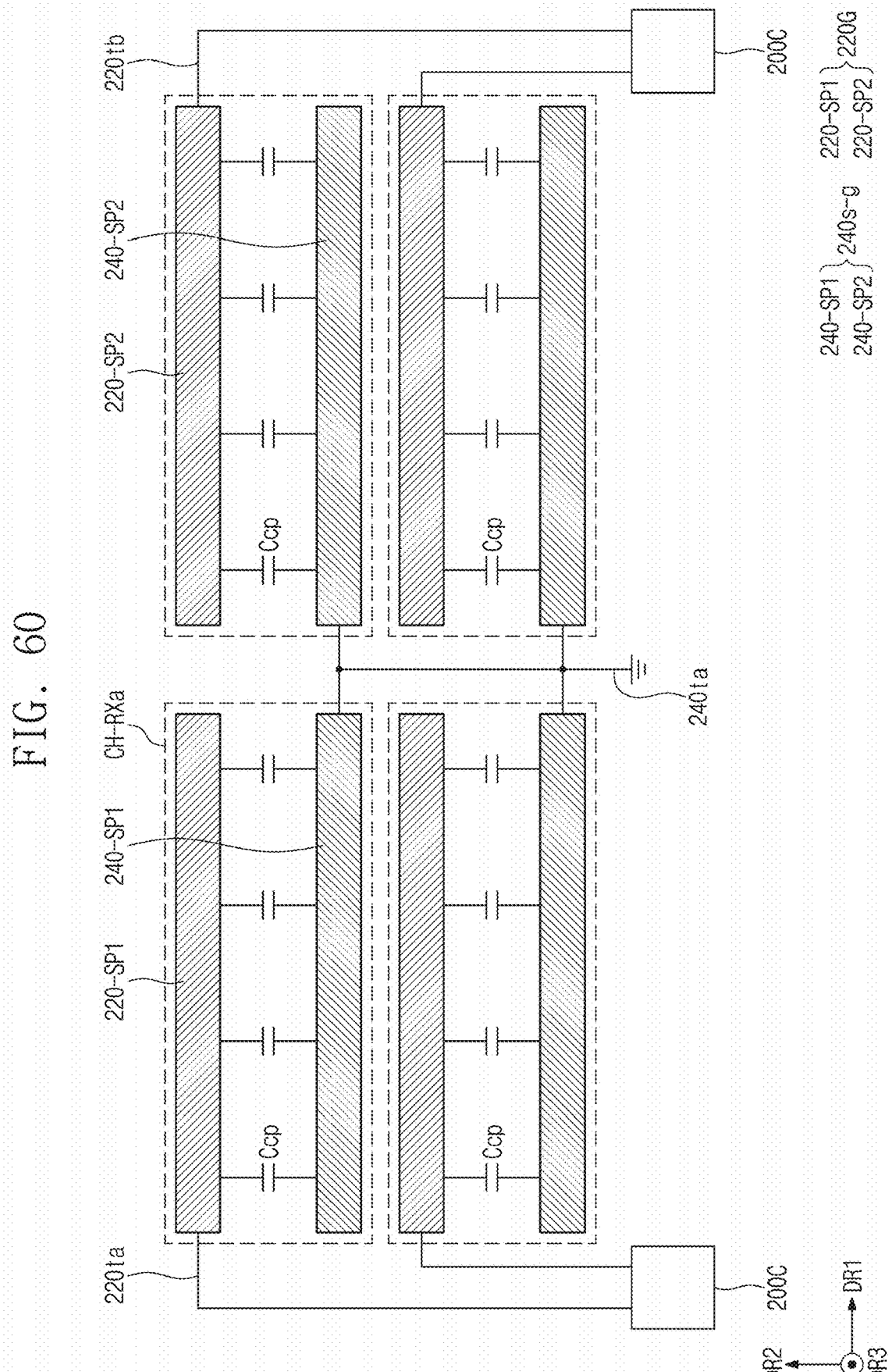
FIG. 60 is a diagram illustrating four channels according to an embodiment of the present disclosure.

FIG. 60 is a diagram illustrating four channels CH-RXa according to an embodiment of the present disclosure.

Referring to FIG. 60, a second electrode group 220G may include a first division electrode 220-SP1 and a second division electrode 220-SP2 that are spaced from each other in the first direction DR1 and are electrically separated from each other. The first division electrode 220-SP1 and the second division electrode 220-SP2 may be referred to as a "first sub-electrode 220-SP1" and a "second sub-electrode 220-SP2", respectively. A second auxiliary electrode 240s-g may overlap with the second electrode group 220G. The second auxiliary electrode 240s-g may include a first auxiliary division electrode 240-SP1 and a second auxiliary division electrode 240-SP2. One channel CH-RXa may be defined as including one division electrode 220-SP1 or 220-SP2 and one auxiliary division electrode 240-SP1 or 240-SP2.

The first division electrode 220-SP1 may overlap with the first auxiliary division electrode 240-SP1. An example in which the first division electrode 220-SP1 and the first auxiliary division electrode 240-SP1 are spaced from each other in the second direction DR2 is illustrated to show the coupling capacitors Ccp defined between the first division electrode 220-SP1 and the first auxiliary division electrode 240-SP1, but the first division electrode 220-SP1 and the first auxiliary division electrode 240-SP1 may overlap with each other in the third direction DR3. Also, the second division electrode 220-SP2 and the second auxiliary division electrode 240-SP2 may overlap with each other in the third direction DR3.

Second trace lines 220ta and 220tb may include the first division trace line 220ta connected to the first division electrode 220-SP1, and the second division trace line 220tb connected to the second division electrode 220-SP2. The first division trace line 220ta and the second division trace line 220tb may be spaced from each other, with the first division electrode 220-SP1 and the second division electrode 220-SP2 interposed therebetween.

A fourth trace line 240ta may be electrically connected to the first auxiliary division electrode 240-SP1 and the second auxiliary division electrode 240-SP2, and may be grounded (e.g., may be coupled to ground). In an embodiment of the present disclosure, the fourth trace line 240ta may be disposed between the first auxiliary division electrode 240-SP1 and the second auxiliary division electrode 240-SP2.

Figure 61:
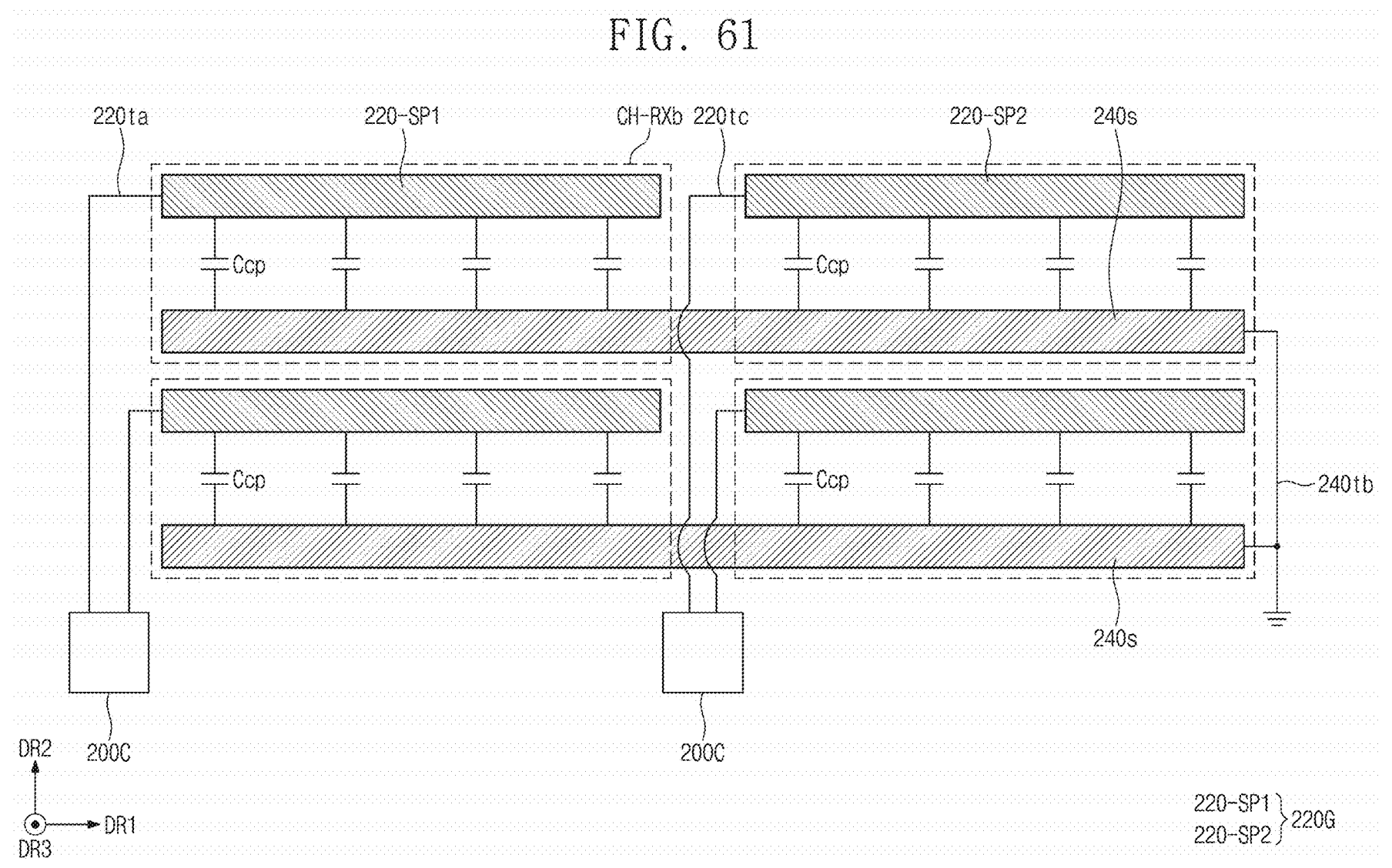

FIG. 61 is a diagram illustrating four channels CH-RXb according to an embodiment of the present disclosure.

Referring to FIG. 61, the second electrode group 220G may include the first division electrode 220-SP1 and the second division electrode 220-SP2 that are spaced from each other in the first direction DR1, and are electrically separated from each other. The second auxiliary electrode 240s may overlap with the second electrode group 220G. In other words, one second auxiliary electrode 240s may overlap with both the first division electrode 220-SP1 and the second division electrode 220-SP2. One channel CH-RXb may be defined as including one division electrode and a portion of one second auxiliary electrode 240s.

The first and second division electrodes 220-SP1 and 220-SP2 may overlap with one second auxiliary electrode 240s. An example in which the first and second division electrodes 220-SP1 and 220-SP2 and the one second auxiliary electrode 240s are spaced from each other in the second direction DR2 is illustrated to show the coupling capacitors Ccp defined between the first and second division electrodes 220-SP1 and 220-SP2 and the one second auxiliary electrode 240s, but the first and second division electrodes 220-SP1 and 220-SP2 and the one second auxiliary electrode 240s may overlap with each other in the third direction DR3.

Second trace lines 220ta and 220tc may include the first division trace line 220ta connected to the first division electrode 220-SP1, and the second division trace line 220tc connected to the second division electrode 220-SP2. The first division trace line 220ta and the second division trace line 220tc may be spaced from each other, with the first division electrode 220-SP1 interposed therebetween. The second division trace line 220tc may be disposed between the first division electrode 220-SP1 and the second division electrode 220-SP2.

A fourth trace line 240tb may be electrically connected to the second auxiliary electrode 240s, and may be grounded (e.g., may be coupled to ground). In an embodiment of the present disclosure, the fourth trace line 240tb and the second division trace line 220tc may be spaced from each other, with the second division electrode 220-SP2 interposed therebetween. Also, the fourth trace line 240tb and the first division trace line 220ta may be spaced from each other, with the first division electrode 220-SP1 and the second division electrode 220-SP2 interposed therebetween.

Figure 62A:
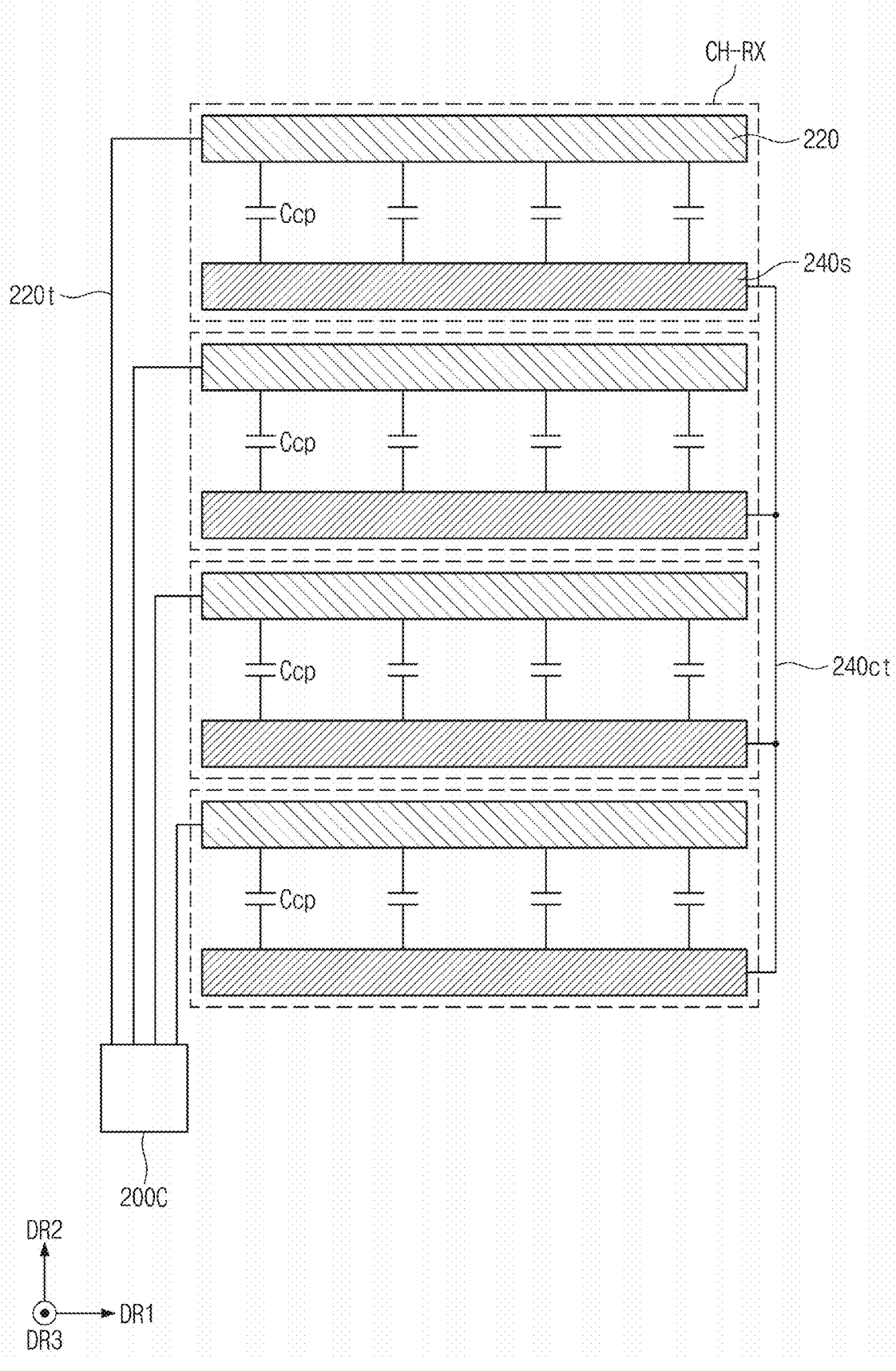
FIG. 62A is a diagram illustrating four channels according to an embodiment of the present disclosure.
Figure 62B:
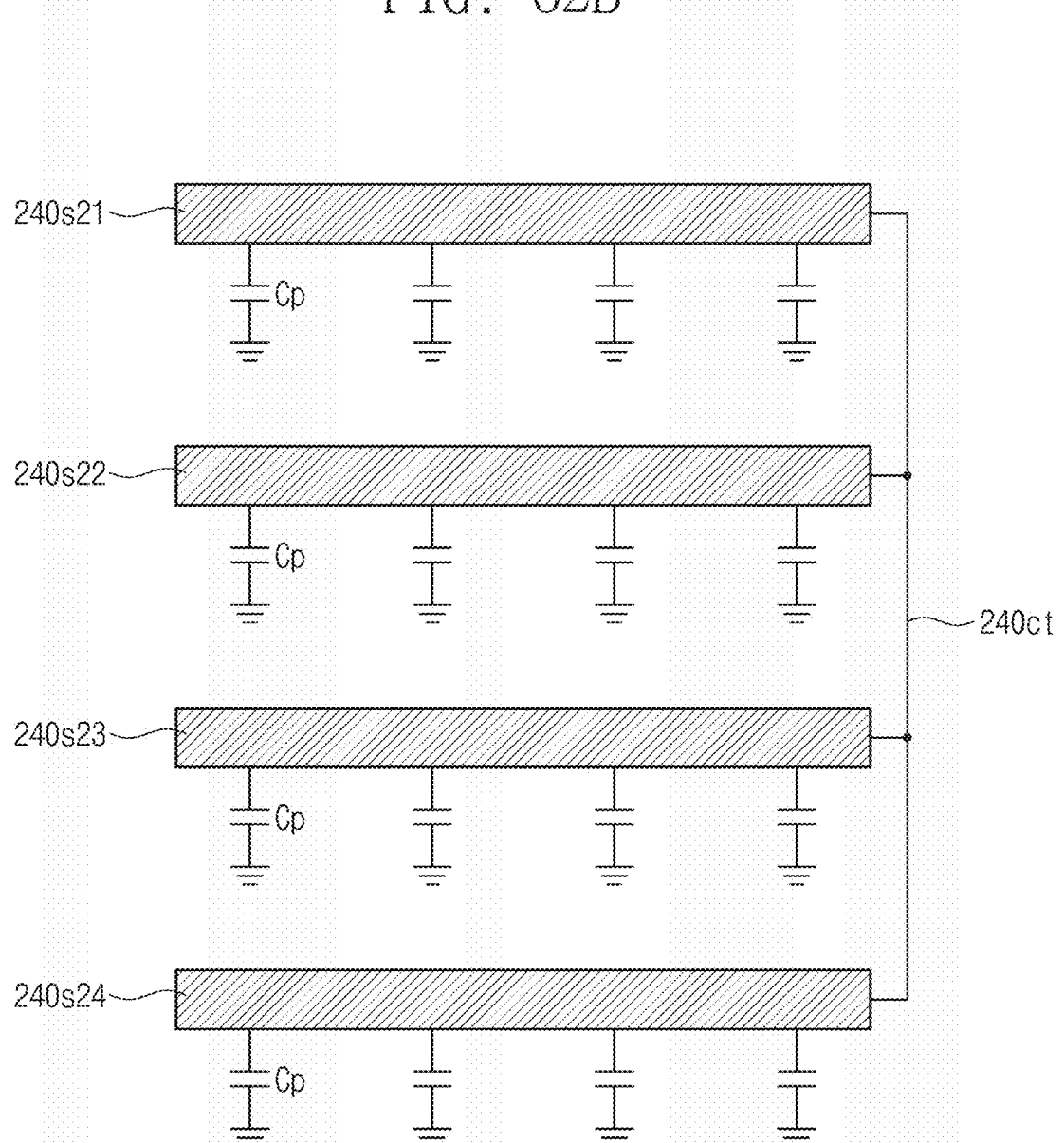
FIG. 62B is a diagram illustrating four second auxiliary electrodes according to an embodiment of the present disclosure.
Figure 62C:
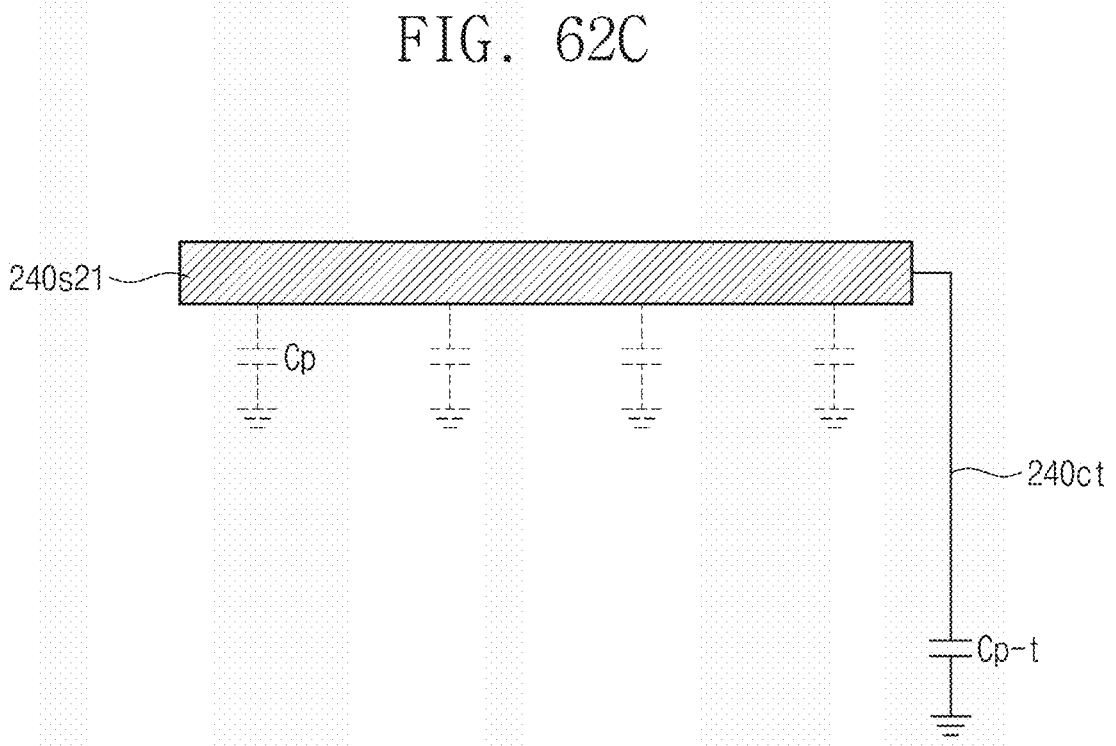
FIG. 62C is a diagram illustrating an equivalent circuit of three second auxiliary electrodes from among four second auxiliary electrodes illustrated in FIG. 62B.

FIG. 62A is a diagram illustrating four channels CH-RX according to an embodiment of the present disclosure. FIG. 62B is a diagram illustrating four second auxiliary electrodes according to an embodiment of the present disclosure. FIG. 62C is a diagram illustrating an equivalent circuit of three second auxiliary electrodes among four second auxiliary electrodes illustrated in FIG. 62B.

Referring to FIGS. 9 and 62A, each of the four channels CH-RX may include the corresponding second electrode 220 and the corresponding second auxiliary electrode 240s. The second trace lines 220t may be electrically connected to the second electrodes 220 in a one-to-one correspondence. The second auxiliary electrodes 240s may be electrically connected to a fourth trace line 240ct. In an embodiment of the present disclosure, the fourth pad PD4 may be omitted.

Referring to FIGS. 62A, 62B, and 62C, the second auxiliary electrodes 240s may include second auxiliary electrodes 240s21, 240s22, 240s23, and 240s24. The second auxiliary electrodes 240s21, 240s22, 240s23, and 240s24 may be electrically connected to each other by the fourth trace line 240ct. Each of the second auxiliary electrodes 240s21, 240s22, 240s23, and 240s24 may be electrically connected to ground (e.g., may be coupled to ground) through a capacitor Cp-t.

The capacitor Cp-t associated with one second auxiliary electrode 240s21 from among the second auxiliary electrodes 240s21, 240s22, 240s23, and 240s24 may correspond to parasitic capacitors Cp of the other remaining second auxiliary electrodes 240s22, 240s23, and 240s24 from among the second auxiliary electrodes 240s21, 240s22, 240s23, and 240s24. For example, assuming that the capacitance of each of the parasitic capacitors Cp is Cp, the capacitance of the capacitor Cp-t may correspond to "12× Cp".

In FIGS. 62A, 62B, and 62C, the second auxiliary electrode 240s is described in more detail, but the same or substantially the same configuration may be applied to the first auxiliary electrodes 230s. For example, referring to FIG. 9, the first auxiliary electrodes 230s may be electrically connected to each other. For example, in the embodiment of FIG. 9, the first auxiliary electrodes 230s may be electrically connected to each other by the first line portion 231t. Opposite ends of the first line portion 231t may be floated. For example, the second line portion 232t and the third line portion 233t may be omitted, or the pads connected to the second line portion 232t and the third line portion 233t may be floated. In this case, each of the first auxiliary electrodes 230s may be electrically connected to ground through a given capacitor, and the given capacitor may correspond to parasitic capacitors of the other remaining first auxiliary electrodes except for the corresponding one auxiliary electrode.

Figure 63:
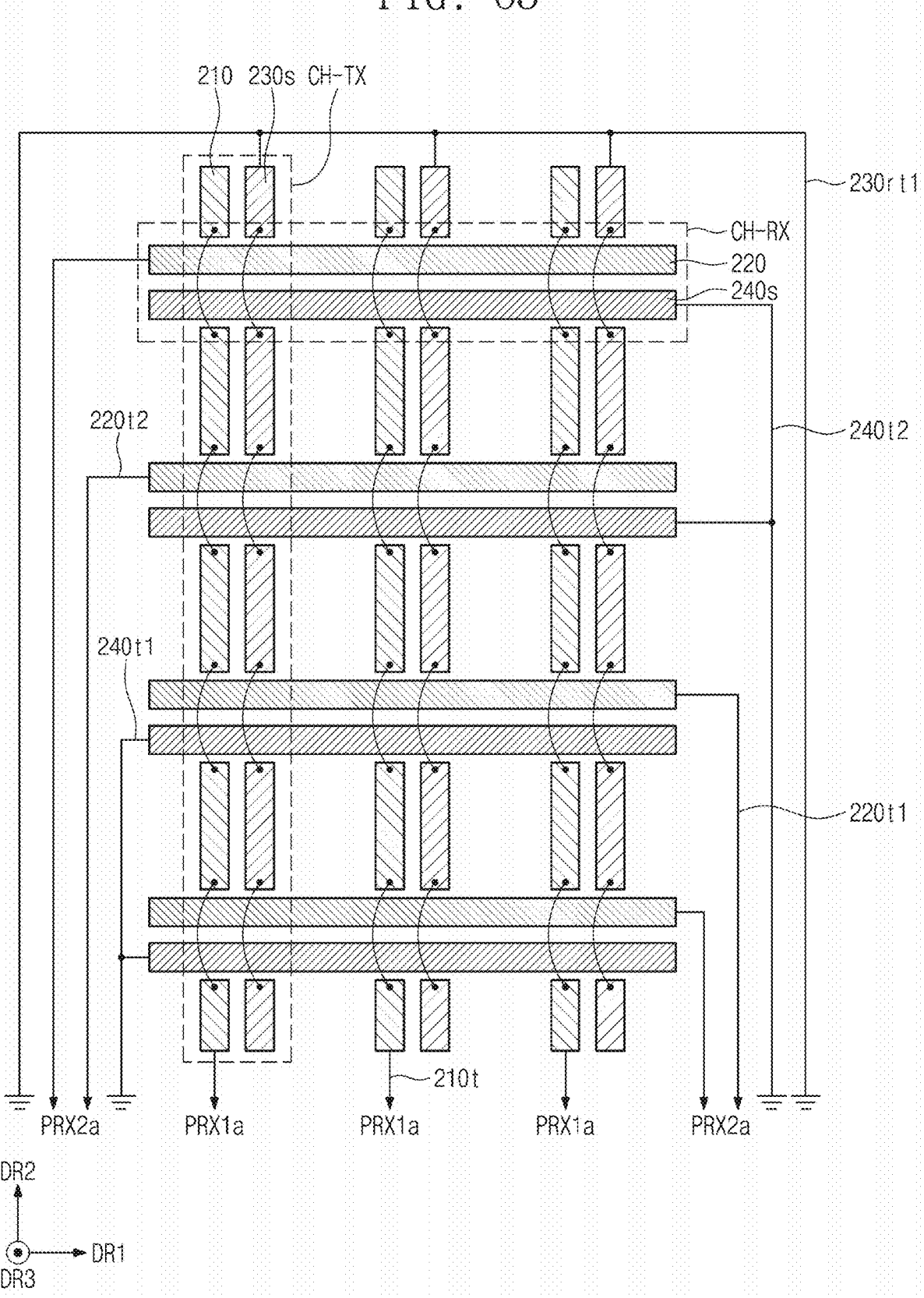
FIG. 63 is a diagram illustrating seven channels according to an embodiment of the present disclosure.

FIG. 63 is a diagram illustrating seven channels according to an embodiment of the present disclosure.

Referring to FIG. 63, three first channels CH-TX and four second channels CH-RX are illustrated as a representative example. The first channels CH-TX may be arranged along the first direction DR1, and each of the first channels CH-TX may extend in the second direction DR2. The second channels CH-RX may be arranged along the second direction DR2, and each of the second channels CH-RX may extend in the first direction DR1.

The first trace lines 210t may be electrically connected to the first channels CH-TX, respectively. The third trace line 230rt1 may be electrically connected to the first channels CH-TX. In more detail, the first trace lines 210t may be connected to the first electrodes 210 included in the first channels CH-TX in a one-to-one correspondence, and the third trace line 230rt1 may be connected to the first auxiliary electrodes 230s included in the first channels CH-TX. The first trace lines 210t and the third trace line 230rt1 may be spaced from each other with the first electrodes 210 and the first auxiliary electrodes 230s interposed therebetween.

Second trace lines 220t1 and 220t2 may be electrically connected to the second channels CH-RX, respectively. Fourth trace lines 240t1 and 240t2 may be electrically connected to the second channels CH-RX. In more detail, the second trace lines 220t1 and 220t2 may be connected to the second electrodes 220 included in the second channels CH-RX in a one-to-one correspondence, and the fourth trace lines 240t1 and 240t2 may be connected to the second auxiliary electrodes 240s included in the second channels CH-RX.

In an embodiment of the present disclosure, the second trace lines 220t1 and 220t2 may be spaced from each other with the second electrodes 220 and the second auxiliary electrodes 240s interposed therebetween. The fourth trace lines 240t1 and 240t2 may be spaced from each other with the second electrodes 220 and the second auxiliary electrodes 240s interposed therebetween. Some of the second trace lines 220t1 from among the second trace lines 220t1 and 220t2 and one fourth trace line 240t1 from among the fourth trace lines 240t1 and 240t2 may be spaced from each other, with the second electrodes 220 and the second auxiliary electrodes 240s being interposed therebetween. The remaining second trace lines 220t2 from among the second trace lines 220t1 and 220t2 and another fourth trace line 240t2 from among the fourth trace lines 240t1 and 240t2 may be spaced from each other, with the second electrodes 220 and the second auxiliary electrodes 240s being interposed therebetween.

The one fourth trace line 240t1 may be disposed between the remaining second trace lines 220t2 and the second electrodes 220. The some of the second trace lines 220t1 may be disposed between another fourth trace line 240t2 and the second electrodes 220.

Figure 64:
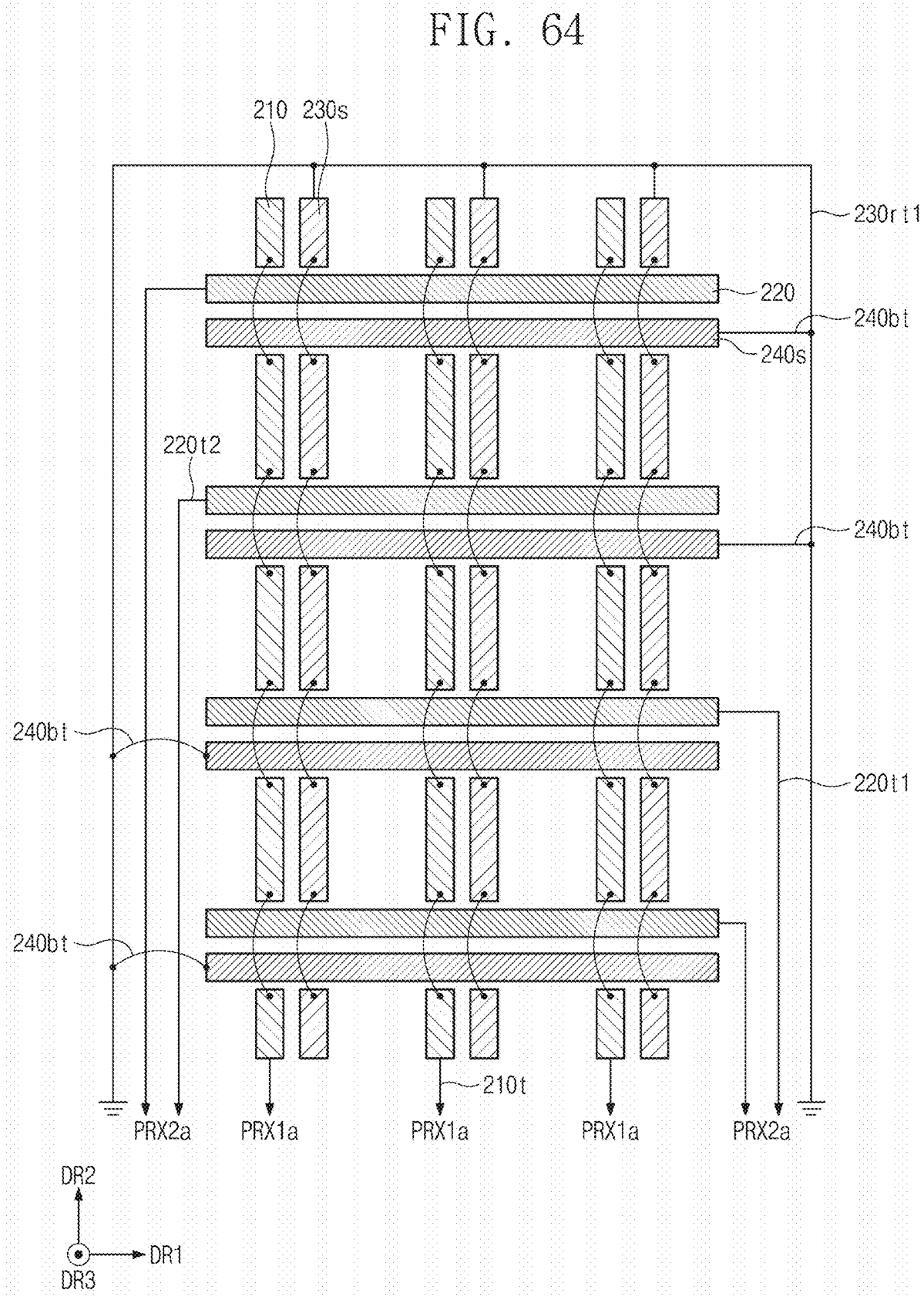
FIG. 64 is a diagram illustrating seven channels according to an embodiment of the present disclosure.

FIG. 64 is a diagram illustrating seven channels according to an embodiment of the present disclosure.

Referring to FIG. 64, the first trace lines 210t may be electrically connected to the first channels CH-TX, respectively. The third trace line 230rt1 may be electrically connected to the first channels CH-TX. In more detail, the first trace lines 210*t* may be connected to the first electrodes 210 included in the first channels CH-TX in a one-to-one correspondence, and the third trace line 230*rt*1 may be connected to the first auxiliary electrodes 230*s* included in the first channels CH-TX. The first trace lines 210*t* and the third trace line 230*rt*1 may be spaced from each other with the first electrodes 210 and the first auxiliary electrodes 230*s* interposed therebetween.

The second trace lines 220*t*1 and 220*t*2 may be electrically connected to the second channels CH-RX, respectively. Fourth trace lines 240*bt* may be electrically connected to the second channels CH-RX. In more detail, the second trace lines 220*t*1 and 220*t*2 may be connected to the second electrodes 220 included in the second channels CH-RX in a one-to-one correspondence, and the fourth trace lines 240*bt* may be connected to the second auxiliary electrodes 240*s* included in the second channels CH-RX in a one-to-one correspondence.

In an embodiment of the present disclosure, the fourth trace lines 240*bt* may be electrically connected to the third trace line 230*rt*1. In the pen sensing driving mode, the third trace line 230*rt*1 may be grounded (e.g., may be coupled to ground).

Figure 65:
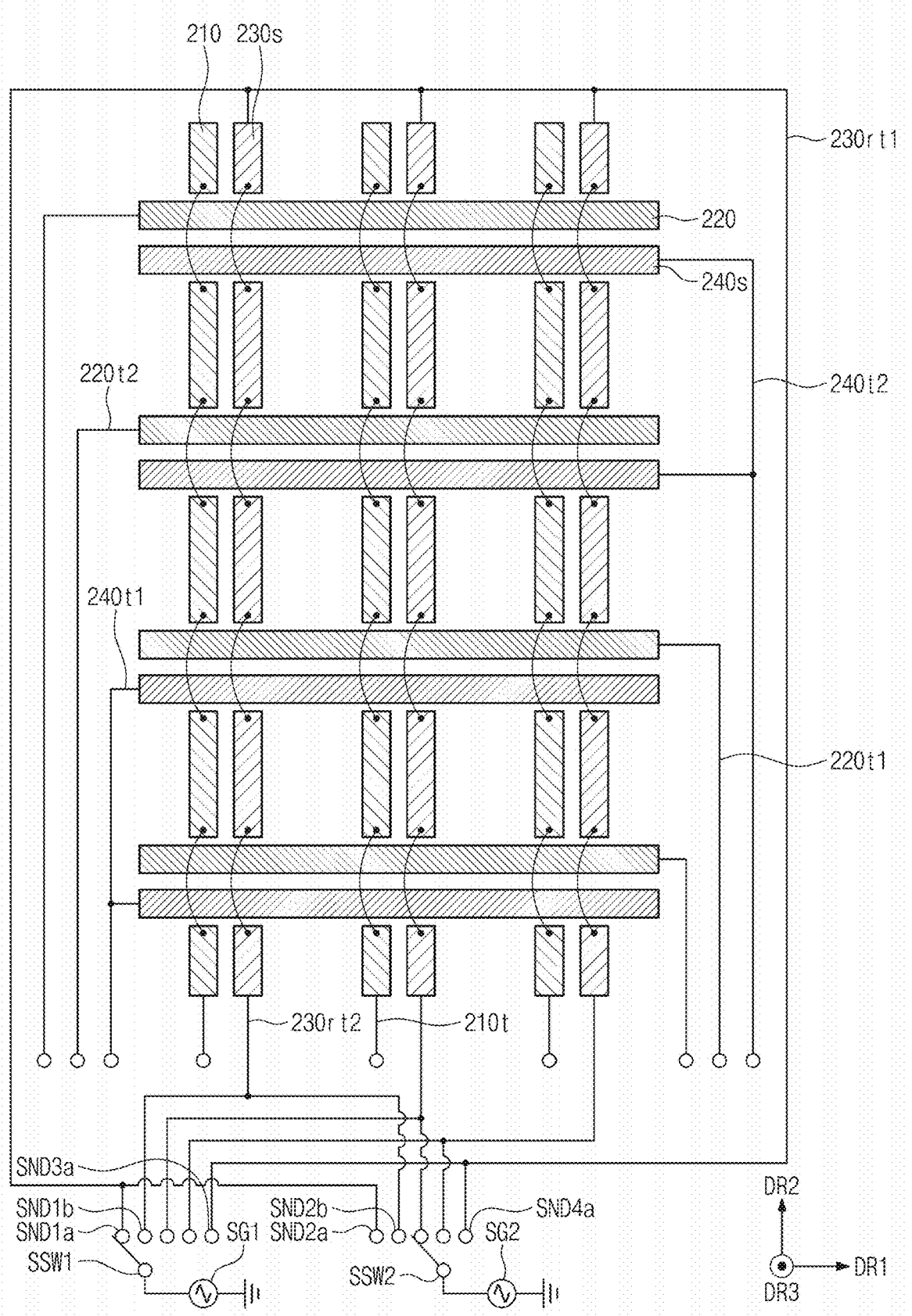
FIG. 65 is a diagram illustrating seven channels according to an embodiment of the present disclosure.

FIG. 65 is a diagram illustrating seven channels according to an embodiment of the present disclosure.

Referring to FIG. 65, the sensor layer 200 may further include the plurality of fifth trace lines 230*rt*2 that are connected to the first auxiliary electrodes 230*s* in a one-to-one correspondence. The third trace line 230*rt*1 may be connected to first ends of the first auxiliary electrodes 230*s* in a one-to-one correspondence, and the fifth trace lines 230*rt*2 may be connected to second ends of the first auxiliary electrodes 230*s* in a one-to-one correspondence.

The sensor driver 200C may apply the first signal SG1 to at least one of a plurality of pads connected to the third trace line 230*rt*1 and the fifth trace lines 230*rt*2, and to apply the second signal SG2 to at least another thereto, in the charging driving mode. For example, the sensor driver 200C may include a first switch SSW1 and a second switch SSW2. For example, the sensor driver 200C may transfer the first signal SG1 to the first switch SSW1, and may transfer the second signal SG2 to the second switch SSW2. Each of the first signal SG1 and the second signal SG2 may be a sinusoidal signal or a square wave signal. Also, a phase of the second signal SG2 may be opposite to a phase of the first signal SG1.

A first end of the third trace line 230*rt*1 may be electrically connected to a first terminal SND1*a* and a second terminal SND2*a*, and a second end of the third trace line 230*rt*1 may be electrically connected to a third terminal SND3*a* and a fourth terminal SND4*a*. Each of the fifth trace lines 230*rt*2 may be electrically connected to a fifth terminal SND1*b* and a sixth terminal SND2*b*.

The first switch SSW1 may be electrically connected to at least one of the first terminal SND1*a*, the third terminal SND3*a*, and/or the fifth terminal SND1*b*. The second switch SSW2 may be electrically connected to at least one of the second terminal SND2*a*, the fourth terminal SND4*a*, and/or the sixth terminal SND2*b*. In more detail, the sensor driver 200C may be electrically connected in various suitable manners within a range where a current path of a loop coil pattern is implemented.

According to one or more embodiments described above, a touch input and a pen input may be sensed by using a sensor layer. Accordingly, because a separate component (e.g., a digitizer) for sensing a pen may not be included in an electronic device, issues due to the addition of the digitizer, such as an increase in the thickness of the electronic device, an increase in the weight of the electronic device, and a decrease in flexibility of the electronic device, may not occur. Also, routing directions of an electrode and an auxiliary electrode of the sensor layer, which overlap with each other, may be different from each other. In a pen sensing driving mode, an auxiliary electrode may be grounded (e.g., may be coupled to ground), or may be electrically connected to any other suitable auxiliary electrodes adjacent thereto. In this case, an induced current may be transferred from the auxiliary electrode to the electrode. Accordingly, a magnitude of a signal received from the electrode may become greater. As such, the sensor driver that stably receives the signal from the electrode, regardless of a distance between an input terminal and an area where a pen input is provided, may be provided.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. An electronic device comprising:
   a substrate;
   a circuit layer on the substrate, and comprising a transistor;
   a light emitting element layer on the circuit layer, and comprising a light-emitting element electrically connected to the transistor; and
   a sensor layer on the light emitting element layer, and comprising:
      a first sensing electrode comprising first patterns, and extending in a first direction;
      a second sensing electrode comprising second patterns extending in a second direction crossing the first direction;
      a first electrode extending in the first direction; and
      a second electrode comprising third patterns, and extending in the second direction,
   wherein:
      one of the first patterns comprises a first region overlapping with the first electrode;
      one of the third patterns comprises a second region overlapping with the second sensing electrode; and
      a first area of the first region is different from a second area of the second region.

2. The electronic device of claim 1, wherein a length of the first sensing electrode is longer than a length of the second sensing electrode, and wherein a length of the first electrode is longer than a length of the second electrode.

3. The electronic device of claim 1, wherein the third patterns are spaced from each other in the second direction, with the first electrode located therebetween, wherein the first patterns are spaced from each other in the first direction, with the second sensing electrode located therebetween, and wherein a maximum width of the first electrode in the second direction is less than or equal to a maximum width of the third patterns in the first direction.

4. The electronic device of claim 1, wherein the first sensing electrode further comprises a first bridge pattern electrically connected to the first patterns, and wherein the second electrode further comprises a second bridge pattern electrically connected to the third patterns.

5. The electronic device of claim 4, wherein the first bridge pattern, the third patterns, and the first electrode are located at a first layer, and wherein the second bridge pattern, the first patterns, and the second sensing electrode are located at a second layer.

6. The electronic device of claim 5, wherein the second layer is spaced farther away from the light emitting element layer than the first layer.

7. The electronic device of claim 4, wherein the first electrode comprises:

connection portions spaced from each other in the second direction; and pattern portions spaced from each other in the first direction, with the connection portions located therebetween, and wherein the connection portions and the pattern portions are connected to each other, and are located at a same layer as each other.

8. The electronic device of claim 7, wherein the third patterns are spaced from each other, with the connection portions located therebetween, and wherein the second bridge pattern overlaps with the connection portions.

9. The electronic device of claim 1, wherein the sensor layer is configured to operate in:

a first mode in which a first driving signal is provided to the first sensing electrode or the second sensing electrode to sense a touch input; or a second mode in which a second driving signal is provided to the first electrode or the second electrode to sense a pen input.

10. An electronic device comprising:

a substrate;

a circuit layer on the substrate, and comprising a transistor;

a light emitting element layer on the circuit layer, and comprising a light-emitting element electrically connected to the transistor; and a sensor layer on the light emitting element layer, and comprising:

a first sensing electrode comprising first patterns;

a second sensing electrode crossing the first sensing electrode, and comprising second patterns;

a first electrode comprising third patterns; and a second electrode comprising fourth patterns, wherein a first width of one of the third patterns is different from a second width of the second electrode, and wherein the first width is parallel to a first direction, and the second width is parallel to a second direction crossing the first direction.

11. The electronic device of claim 10 wherein a maximum width of the first electrode in the first direction is less than a maximum width of the second electrode in the second direction.

12. The electronic device of claim 10, wherein a length of the first sensing electrode is longer than a length of the second sensing electrode, and wherein a length of the first electrode is longer than a length of the second electrode.

13. The electronic device of claim 10, wherein the sensor layer is configured to operate in:

a first mode in which a first driving signal is provided to the first sensing electrode or the second sensing electrode to sense a touch input; or a second mode in which a second driving signal is provided to the first electrode or the second electrode to sense a pen input.

14. An electronic device comprising:

a pen; and a panel configured to detect an input provided by the pen, wherein the panel comprises:

a substrate;

a circuit layer on the substrate, and comprising a transistor;

a light emitting element layer on the circuit layer, and comprising a light-emitting element electrically connected to the transistor; and a sensor layer on the light emitting element layer, and comprising:

a first sensing electrode;

a second sensing electrode crossing the first sensing electrode;

a first electrode overlapping with the first sensing electrode; and a second electrode overlapping with the second sensing electrode, and wherein:

the first sensing electrode comprises first patterns;

the second electrode comprises second patterns;

the first electrode and the second patterns are each located at a first layer;

the first patterns and the second sensing electrode are each located at a second layer.

15. The electronic device of claim 14, wherein the sensor layer is configured to operate in:

a first mode in which a first driving signal is provided to the first sensing electrode or the second sensing electrode to sense a touch input; or a second mode in which a second driving signal is provided to the first electrode or the second electrode to sense the input provided by the pen.

16. The electronic device of claim 14, wherein:

the sensor layer has a sensing area defined therein, the first sensing electrode, the second sensing electrode, the first electrode, and the second electrode being located at the sensing area;

a width of the sensing area in a first direction is less than a width of the sensing area in a second direction crossing the first direction;

the first electrode extends in the second direction, and the second electrode extends in the first direction; and a capacitance of a first capacitor defined between one of the first patterns and the first electrode overlapping with the one of the first patterns is less than a capacitance of a second capacitor defined between one of the second patterns and the second sensing electrode overlapping with the one of the second patterns.

17. The electronic device of claim 16, wherein a length of the first sensing electrode is longer than a length of the second sensing electrode, and wherein a length of the first electrode is longer than a length of the second electrode.

18. The electronic device of claim 14, wherein the second layer is spaced farther away from the light emitting element layer than the first layer.

19. The electronic device of claim 14, wherein the first sensing electrode further comprises a first bridge pattern electrically connected to the first patterns, wherein the second electrode further comprises a second bridge pattern electrically connected to the second patterns, wherein the first bridge pattern is located at the first layer, and wherein the second bridge pattern is located at the second layer.

20. The electronic device of claim 19, wherein the first electrode has an opening defined therein, and the first bridge pattern overlaps with the opening.

*   *   *   *   *